US012674093B2

(12) United States Patent
Shim et al.

(10) Patent No.: US 12,674,093 B2
(45) Date of Patent: Jul. 7, 2026

(54) ORGANOELECTROLUMINESCENT DEVICE USING POLYCYCLIC AROMATIC DERIVATIVE COMPOUNDS

(71) Applicant: SFC CO., LTD., Cheongju-si (KR)

(72) Inventors: So-Young Shim, Cheongju-si (KR); Se-jin Yu, Cheongju-si (KR); Jin-hwi Cho, Cheongju-si (KR); Yong-woon Yang, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 939 days.

(21) Appl. No.: 17/912,290

(22) PCT Filed: Mar. 18, 2021

(86) PCT No.: PCT/KR2021/003377

§ 371 (c)(1),
(2) Date: Sep. 16, 2022

(87) PCT Pub. No.: WO2021/187923

PCT Pub. Date: Sep. 23, 2021

(65) Prior Publication Data

US 2023/0165032 A1 May 25, 2023

(30) Foreign Application Priority Data

Mar. 18, 2020 (KR) ........................ 10-2020-0033290

(51) Int. Cl.

| | |
|---|---|
| ***H01L 51/54*** | (2006.01) |
| ***C09K 11/06*** | (2006.01) |
| ***H10K 50/15*** | (2023.01) |
| ***H10K 85/60*** | (2023.01) |
| *H10K 50/12* | (2023.01) |
| *H10K 50/85* | (2023.01) |

(52) U.S. Cl.

CPC .............. *C09K 11/06* (2013.01); *H10K 50/15* (2023.02); *H10K 85/615* (2023.02); *H10K 85/636* (2023.02); *H10K 85/6572* (2023.02); *H10K 85/6574* (2023.02); *H10K 85/658* (2023.02); *H10K 50/12* (2023.02); *H10K 50/85* (2023.02)

(58) Field of Classification Search

None

See application file for complete search history.

(56) References Cited

U.S. PATENT DOCUMENTS

| | | | | |
|---|---|---|---|---|
| 2005/0221124 | A1* | 10/2005 | Hwang ................ | C07D 403/14 548/440 |
| 2016/0301005 | A1 | 10/2016 | Pfister et al. | |
| 2018/0301629 | A1 | 10/2018 | Hatakeyama et al. | |
| 2021/0184121 | A1* | 6/2021 | Suh ........................ | C09K 11/06 |

FOREIGN PATENT DOCUMENTS

| | | | | |
|---|---|---|---|---|
| CN | 110790782 | A | 2/2020 | |
| KR | 10-2005-0097670 | A | 10/2005 | |
| KR | 10-2017-0089094 | A | 8/2017 | |
| KR | 10-2019-0101900 | A | 9/2019 | |
| WO | WO-2019164331 | A1 * | 8/2019 | ............ H10K 50/12 |

OTHER PUBLICATIONS

Extended European search report issued on Feb. 22, 2024, in counterpart European Patent Application No. 21771870.9 (7 pages).

International Search Report issued on Jul. 2, 2021, in counterpart PCT Patent Application No. PCT/KR2021/003377 (4 pages in Korean).

* cited by examiner

*Primary Examiner* — Andrew K Bohaty

(74) *Attorney, Agent, or Firm* — NSIP Law

(57) ABSTRACT

An organoelectroluminescent device according to the present invention can achieve low-voltage driving and high-efficiency luminous characteristics with excellent external quantum efficiency by employing compounds having a characteristic structure as a hole transport material and a dopant material in a hole injection layer or hole transport layer and a light-emitting layer respectively, and thus can be effectively used in industrial applications such as flat display devices, flexible display devices, monochrome or white flat lighting devices, and monochrome or white flexible lighting devices.

20 Claims, No Drawings

ORGANOELECTROLUMINESCENT DEVICE USING POLYCYCLIC AROMATIC DERIVATIVE COMPOUNDS

CROSS REFERENCE TO RELATED APPLICATIONS

This application is a U.S. National Stage Application of International Application No. PCT/KR2021/003377, filed on Mar. 18, 2021, which claims the benefit under 35 USC 119 (a) and 365(b) of Korean Patent Application No. 10-2020-0033290 filed on Mar. 18, 2020 in the Korean Intellectual Property Office, the entire disclosures of which are incorporated herein by reference for all purposes.

TECHNICAL FIELD

The present invention relates to a highly efficient organic light-emitting device that exhibits remarkably improved luminous efficacy using a polycyclic aromatic derivative compound in an organic layer therein.

BACKGROUND ART

An organic light-emitting device is a self-luminous device that emits light when energy is released from excitons which are formed by recombination of electrons injected from an electron injection electrode (cathode) and holes injected from a hole injection electrode (anode) in a light-emitting layer. Such an organic light-emitting device attracts a great deal of attention as a next-generation light source due to applicability to full-color flat panel light-emitting displays based on advantages such as low driving voltage, high luminance, wide viewing angle, and rapid response speed thereof.

In order for the organic light-emitting device to exhibit the characteristics, the structure of the organic layer in the organic light-emitting device should be optimized, and the material constituting each organic layer, namely, a hole injection material, a hole transport material, a light-emitting material, an electron transport material, an electron injection material, or an electron blocking material should be based on stable and efficient ingredients. However, there is a continuing need to develop organic layer structures and respective materials thereof for stable and efficient organic light-emitting devices.

As such, there is a continuing need for the development of the structure of an organic light-emitting device capable of improving the luminous characteristics thereof and the development of novel materials supporting the structure.

DISCLOSURE

Technical Problem

Therefore, the present invention has been made in view of the above problems, and it is one object of the present invention to provide a highly efficient organic light-emitting device that can be operated at a low voltage and exhibits excellent external quantum efficiency based on compounds used for a light-emitting layer and compounds for a hole transport layer or a hole injection layer.

Technical Solution

In accordance with the present invention, the above and other objects can be accomplished by the provision of an organic light-emitting device including a first electrode, a second electrode facing the first electrode, and a hole injection layer or a hole transport layer and a light-emitting layer interposed between the first electrode and the second electrode.

The organic light-emitting device according to the present invention includes (i) at least one compound represented by the following [Formula A] in the hole injection layer or the hole transport layer, and (ii) a compound represented by the following [Formula B] or [Formula C] in the light-emitting layer.

[Formula A]

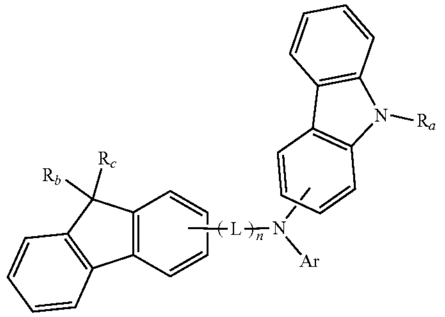

[Formula B]

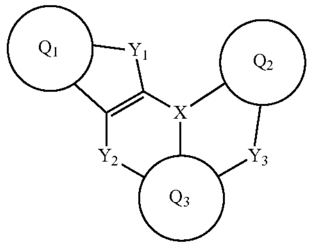

[Formula C]

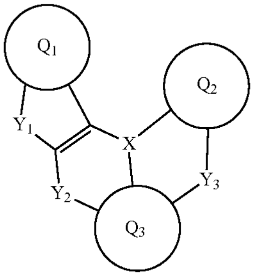

Details of structures of [Formula A] to [Formula C], the compounds obtained thereby, and substituents thereof will be described later.

Advantageous Effects

The organic light-emitting device according to the present invention can be operated at a lower driving voltage, and exhibits excellent external quantum efficiency and thus high luminous efficacy by utilizing the compounds having characteristic structures as the hole transport material and the dopant material, respectively, in the hole injection layer or the hole transport layer, and the light-emitting layer.

BEST MODE

Hereinafter, the present invention will be described in detail with reference to the annexed drawings.

In one aspect, the present invention is directed to an organic light-emitting device including a first electrode, a second electrode facing the first electrode, and a hole injection layer or a hole transport layer and a light-emitting layer interposed between the first electrode and the second electrode, wherein (i) the hole injection layer or the hole transport layer includes at least one compound represented by the following [Formula A] and (ii) the light-emitting layer includes a compound represented by the following [Formula B] or [Formula C]. Based on this configuration, a highly efficient organic light-emitting device can be obtained.

[Formula A]

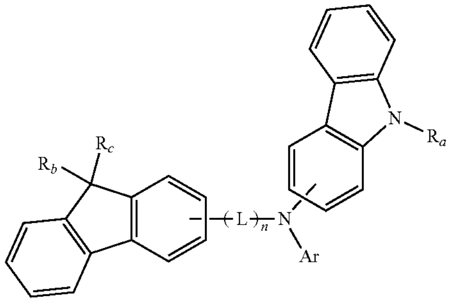

wherein

L is a single bond, a substituted or unsubstituted aromatic C6-C50 hydrocarbon ring, or a substituted or unsubstituted C2-C50 aromatic heterocyclic ring, and n is an integer of 1 to 3, with the proviso that when n is 2 or more, L's are identical to or different from each other.

In an embodiment, in [Formula A], L is a single bond or a substituted or unsubstituted aromatic C6-C50 hydrocarbon ring, wherein the substituted or unsubstituted aromatic C6-C50 hydrocarbon ring is a substituted or unsubstituted phenyl group, a substituted or unsubstituted biphenyl group, a substituted or unsubstituted naphthyl group, a substituted or unsubstituted phenanthryl group, or a substituted or unsubstituted fluorenyl group.

Ar is selected from a substituted or unsubstituted C5-C50 aryl group and a substituted or unsubstituted C2-C50 heteroaryl group.

$R_a$ to $R_c$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group.

Also, $R_b$ and $R_a$ are bonded to each other to further form an alicyclic or aromatic monocyclic or polycyclic ring.

[Formula B]

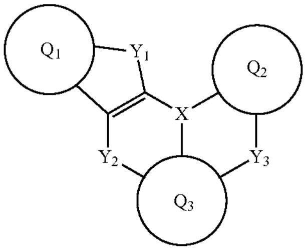

[Formula C]

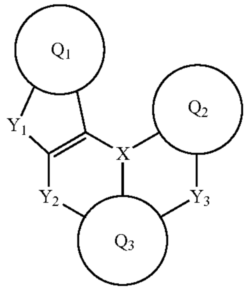

wherein $Q_1$ to $Q_3$ are identical to or different from each other, and are each independently a substituted or unsubstituted aromatic C6-C50 hydrocarbon ring, or a substituted or unsubstituted C2-C50 aromatic heterocyclic group, $Y_1$ to $Y_3$ are identical to or different from each other, and are each independently selected from N—$R_1$, $CR_2R_3$, O, S, Se, and $SiR_4R_5$, X is selected from B, P and P═O and, in a preferred embodiment of the present invention, X is B, and in this case, a polycyclic aromatic derivative compound containing boron (B) is structurally used as a dopant in the light-emitting layer of a device to impart high efficiency to the organic light-emitting device, and $R_1$ to $R_5$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group, with the proviso that each of $R_1$ to $R_5$ is bonded to the ring $Q_1$ to $Q_3$ to further form an alicyclic or aromatic monocyclic or polycyclic ring, and $R_2$ and $R_3$, and $R_4$ and $R_5$ are bonded to each other to further form an alicyclic or aromatic monocyclic or polycyclic ring.

According to an embodiment of the present invention, [Formula B] or [Formula C] may form a skeleton structure such as the following [Formula B-1], [ Formula B-2], [ Formula C-1], [Formula C-2] or [Formula D-2], in particular, various polycyclic aromatic skeleton structures. A highly efficient organic light-emitting device can be realized by satisfying the characteristics required for the compounds for light-emitting layers of organic light-emitting devices based thereon.

[Formula B-1]

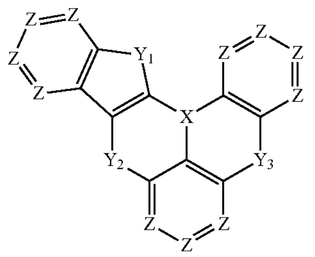

[Formula C-1]

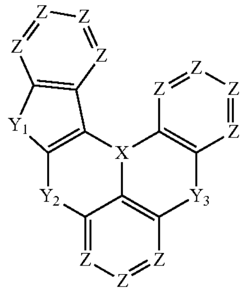

[Formula B-2]

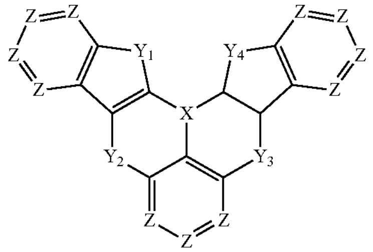

[Formula C-2]

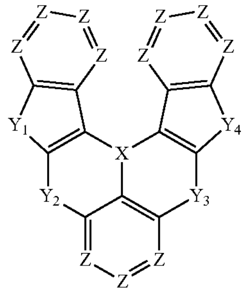

[Formula D-2]

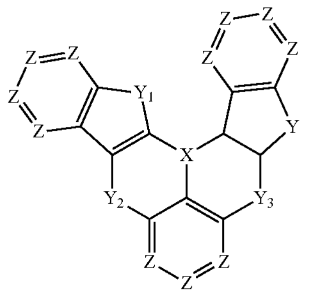

wherein

Z is CR or N, wherein R's are identical to or different from each other and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C6-C30 arylthioxy group, a substituted or unsubstituted C1-C30 alkylsilyl group, a substituted or unsubstituted C6-C30 arylsilyl group, a nitro group, a cyano group, a halogen group and —$N(R_6)(R_7)$.

In an embodiment of the present invention, at least one of R's is —$N(R_6)$ $(R_7)$.

Also, R's are bonded to each other or each thereof is bonded to an adjacent substituent to form at least one alicyclic or aromatic monocyclic or polycyclic ring, and the carbon atom of the formed alicyclic, aromatic monocyclic or polycyclic ring is substituted with at least one heteroatom selected from (N), a sulfur atom (S), and an oxygen atom (O).

$R_6$ and $R_7$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, and a substituted or unsubstituted C2-C50 heteroaryl group, with the proviso that $R_6$ and $R_7$ are bonded to each other to form an alicyclic or aromatic monocyclic or polycyclic ring.

X and $Y_1$ to $Y_3$ are as defined in [Formula B] and [Formula C].

Meanwhile, as used herein, the term "substituted" indicates substitution of various substituents defined in [Formula A] to [Formula C] with one or more substituents selected from deuterium, a cyano group, a halogen group, a hydroxyl group, a nitro group, an alkyl group, a halogenated alkyl group, a cycloalkyl group, an alkenyl group, an alkynyl group, a heteroalkyl group, an aryl group, an arylalkyl group, an alkylaryl group, a heteroaryl group, a heteroarylalkyl group, an alkoxy group, an amine group, a silyl group, an aryloxy group and a mixed aliphatic-aromatic ring group, or substitution with a substituent including two or more of the substituents linked to each other. The term "unsubstituted" in the same definition indicates having no substituent.

In addition, the range of the number of the carbon atoms of the alkyl group or aryl group in the term "substituted or unsubstituted C1-C30 alkyl group", "substituted or unsubstituted C6-C50 aryl group" or the like refers to the total number of carbon atoms constituting the alkyl or aryl moiety when the corresponding group is not substituted without considering the number of carbon atoms in the substituent(s). For example, a phenyl group substituted at the para position with a butyl group corresponds to an aryl group having 6 carbon atoms substituted with a butyl group having 4 carbon atoms.

In addition, as used herein, the expression "a substituent is bonded to an adjacent substituent to form a ring" means that the corresponding substituent is bonded to the adjacent substituent to form a substituted or unsubstituted alicyclic or aromatic ring, and the term "adjacent substituent" may mean a substituent substituted for an atom which is directly attached to an atom substituted with the corresponding substituent, a substituent sterically disposed at the nearest position to the corresponding substituent, or another substituent substituted for an atom which is substituted with the corresponding substituent. For example, two substituents substituted at the ortho position in a benzene ring and two substituents substituted at the same carbon in the aliphatic ring may be considered "adjacent" to each other.

As used herein, the alkyl group may be a linear or branched alkyl group. Examples of the alkyl group include, but are not limited to, a methyl group, an ethyl group, a propyl group, an n-propyl group, an isopropyl group, a butyl group, an n-butyl group, an isobutyl group, a tert-butyl group, a sec-butyl group, a 1-methylbutyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group, and the like.

As used herein, the alkenyl group may include a linear or branched alkenyl group and may be further substituted with another substituent. Specifically, examples of the alkenyl group include, but are not limited to, a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group, and the like.

As used herein, the alkynyl group may also include a linear or branched alkynyl group, and may be further substituted with another substituent, and examples of the substituent may include, but are not limited to, ethynyl, 2-propynyl, and the like.

As used herein, the aromatic hydrocarbon ring or the aryl group may be monocyclic or polycyclic, examples of the monocyclic aryl group include a phenyl group, a biphenyl group, a terphenyl group, a stilbene group, and the like, and examples of the polycyclic aryl group include, but are not limited to, a naphthyl group, an anthracenyl group, a phenanthrenyl group, a pyrenyl group, a perylenyl group, a tetracenyl group, a chrysenyl group, a fluorenyl group, an acenaphthcenyl group, a triphenylene group, a fluoranthene group, and the like, but the scope of the present invention is not limited thereto.

As used herein, the aromatic heterocyclic or heteroaryl group is an aromatic ring containing at least one heteroatom and examples thereof include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups and the like.

As used herein, the aliphatic hydrocarbon ring refers to a non-aromatic ring that contains only carbon and hydrogen atoms, for example, includes a monocyclic or polycyclic ring, and may be further substituted with another substituent. The term "polycyclic" means that the polycyclic group may be directly attached to or fused with at least one other cyclic group, the other cyclic group may be an aliphatic hydrocarbon ring, or a different type of ring group, for example, an aliphatic heterocyclic group, an aryl group, a heteroaryl group, and the like. Specifically, examples thereof include, but are not limited to, cycloalkyls such as a cyclopropyl group, a cyclobutyl group, a cyclopentyl group, an adamantyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, and a cyclooctyl group, cycloalkanes such as cyclohexane and cyclopentane, and cycloalkenes such as cyclohexene and cyclobutene.

As used herein, the aliphatic heterocyclic ring refers to an aliphatic ring that contains at least one of heteroatoms such as O, S, Se, N and Si, also includes a monocyclic or polycyclic ring, and may be further substituted with another substituent. The term "polycyclic" means that the polycyclic group may be directly attached to or fused with at least one other cyclic group, and the other cyclic group may be an aliphatic hydrocarbon ring, or a different type of ring group, for example, an aliphatic heterocyclic group, an aryl group, a heteroaryl group, or the like.

As used herein, the mixed aliphatic-aromatic ring group refers to a ring in which two or more rings are attached to and fused with each other, and aliphatic and aromatic rings are fused together to be overall non-aromatic, and a polycyclic mixed aliphatic-aromatic ring may contain a heteroatom selected from N, O, P and S, in addition to C.

As used herein, specifically, the alkoxy group may be methoxy, ethoxy, propoxy, isobutyloxy, sec-butyloxy, pentyloxy, iso-amyloxy, hexyloxy, or the like, but is not limited thereto.

As used herein, the silyl group is represented by $—SiH_3$, and may be an alkylsilyl group, an arylsilyl group, an alkylarylsilyl group, an arylheteroarylsilyl group, or the like, and specific examples of the silyl group include trimethylsilyl, triethylsilyl, triphenylsilyl, trimethoxysilyl, dimethoxyphenylsilyl, diphenylmethylsilyl, diphenylvinylsilyl, methylcyclobutylsilyl, dimethylfurylsilyl, and the like.

As used herein, the amine group is represented by $—NH_2$, or may be an alkylamine group, an arylamine group, an arylheteroarylamine group, or the like. The arylamine group refers to amine substituted with aryl, the alkylamine group refers to amine substituted with alkyl, and the arylheteroarylamine group refers to an amine substituted with aryl and heteroaryl. For example, the arylamine group includes a substituted or unsubstituted monoarylamine group, a substituted or unsubstituted diarylamine group, or a substituted or unsubstituted triarylamine group. The aryl group and the heteroaryl group in the arylamine group and the arylheteroarylamine group may be a monocyclic aryl group or a monocyclic heteroaryl group, or a polycyclic aryl group or a polycyclic heteroaryl group. The arylamine group and the arylheteroarylamine group that contain two or more aryl groups and two or more heteroaryl groups, respectively, include a monocyclic aryl group (heteroaryl group), a polycyclic aryl group (heteroaryl group), or both of the monocyclic aryl group (heteroaryl group) and the polycyclic aryl group (heteroaryl group). In addition, the aryl group and the heteroaryl group in the arylamine group and the arylheteroarylamine group may be selected from examples of aryl groups and heteroaryl groups described above.

As used herein, examples of the aryl group in the aryloxy group and the arylthioxy group are identical to examples of the aryl group described above and specifically, examples of the aryloxy group include a phenoxy group, a p-tolyloxy group, an m-tolyloxy group, a 3,5-dimethylphenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, and examples of the arylthioxy group include, but are not limited to, a phenylthioxy group, a 2-methylphenylthioxy group, a 4-tert-butylphenylthioxy group, and the like.

In the present invention, examples of the halogen group include fluorine, chlorine, bromine, and iodine.

More specifically, the compound represented by [Formula A] according to the present invention is selected from the following [Compound 1] to [Compound 255], which clearly show specific substituents, but these compounds should not be construed as limiting the scope of [Formula A] according to the present invention.

1

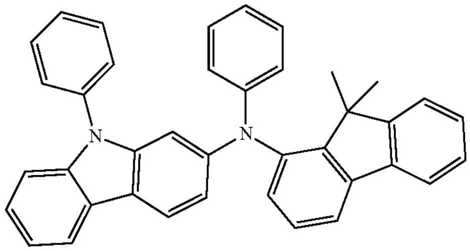

2

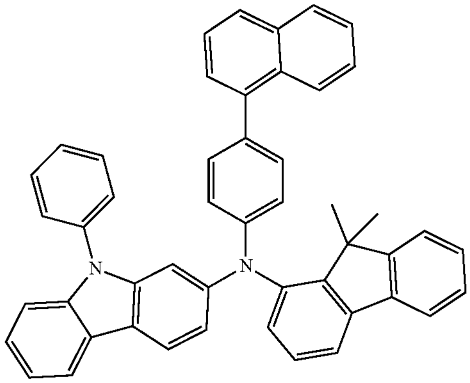

3

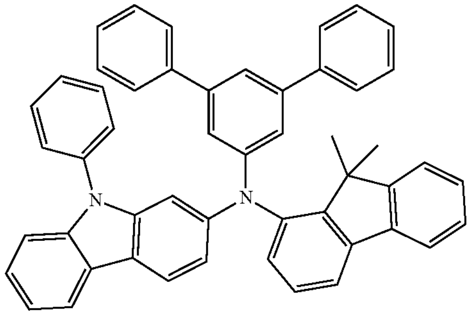

-continued

4

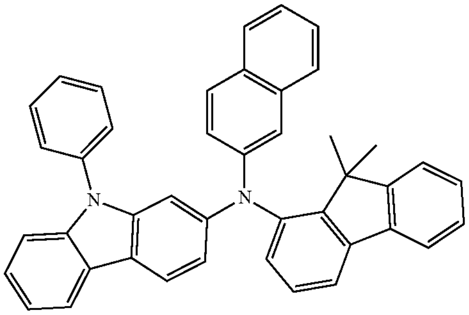

5

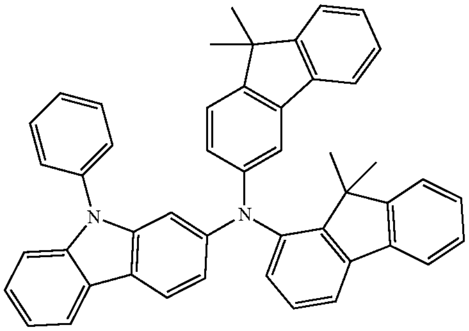

6

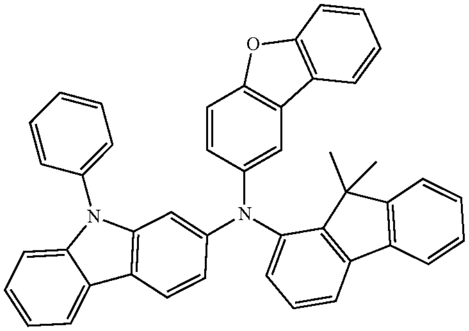

7

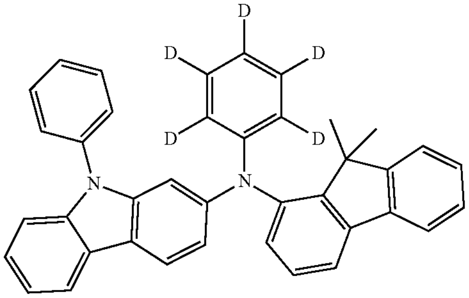

8

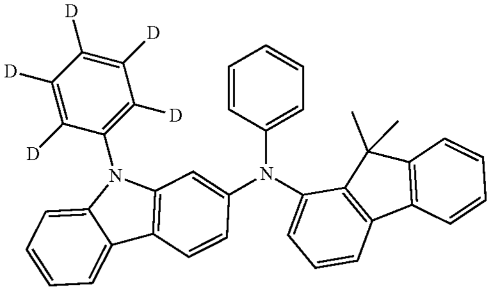

-continued
9
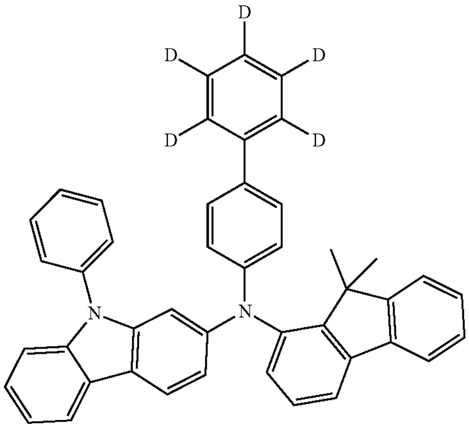
10
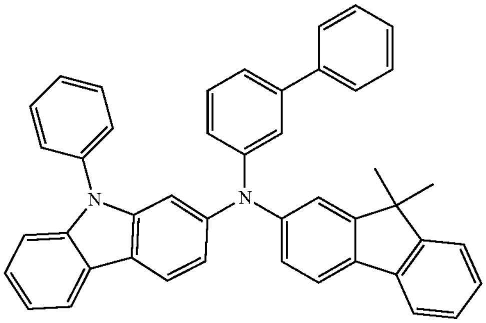
11
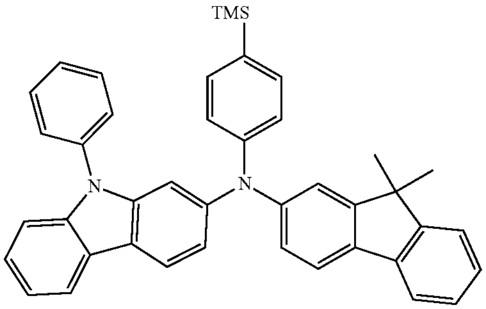
12
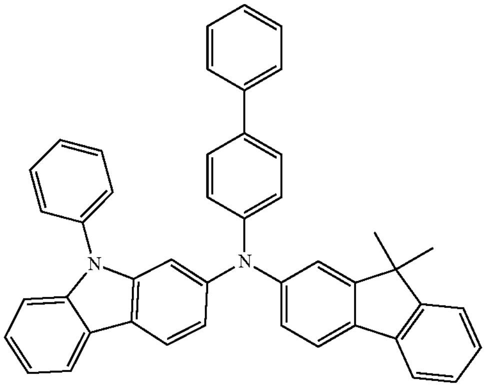
-continued
13
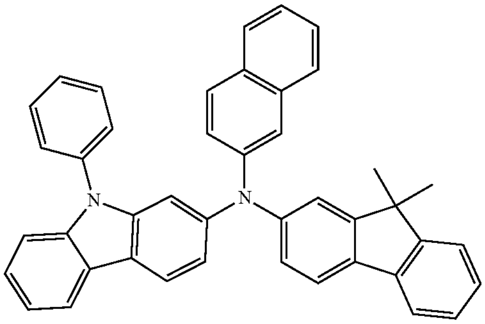
14
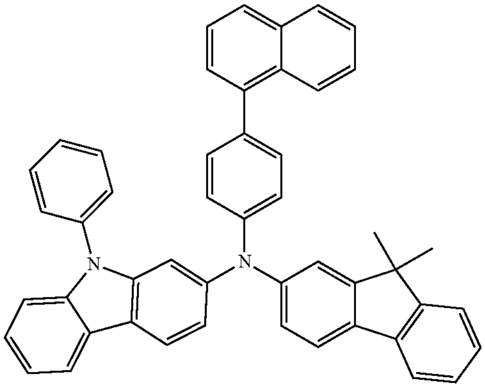
15
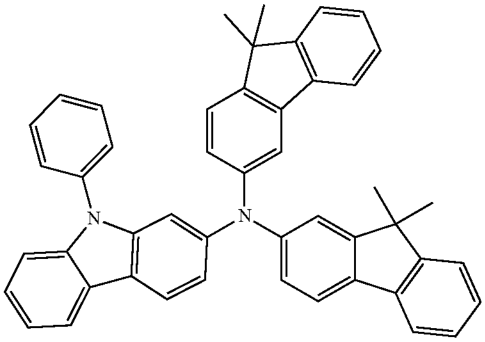
16
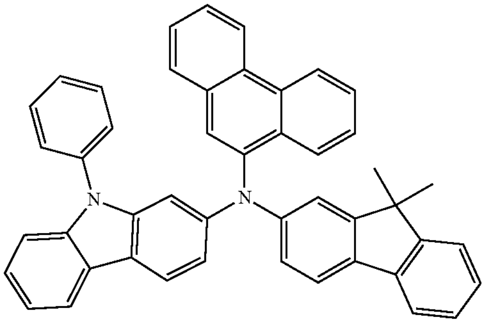

-continued
17
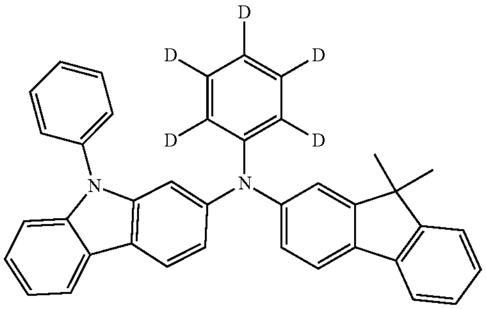
18
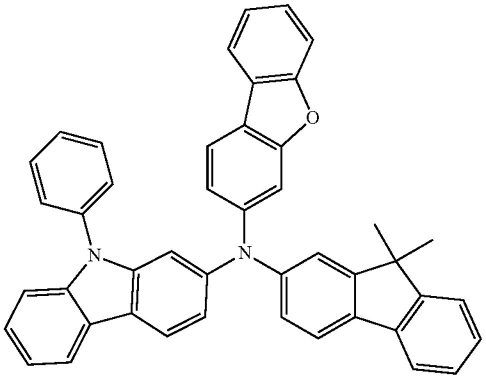
19
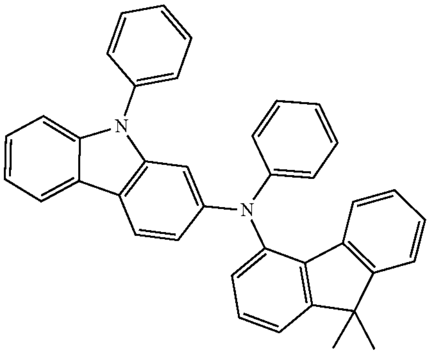
20
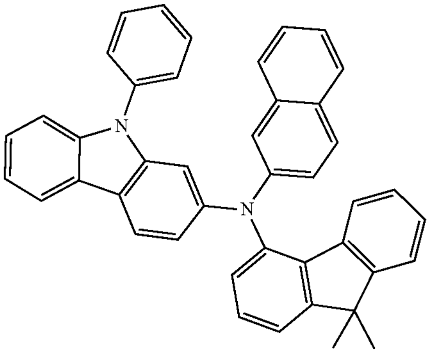
-continued
21
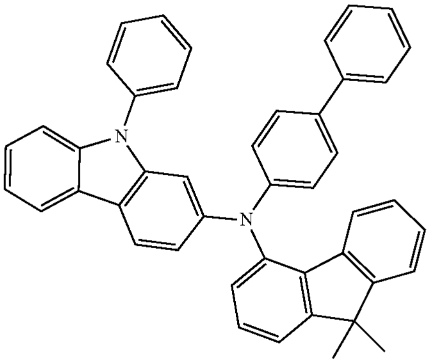
22
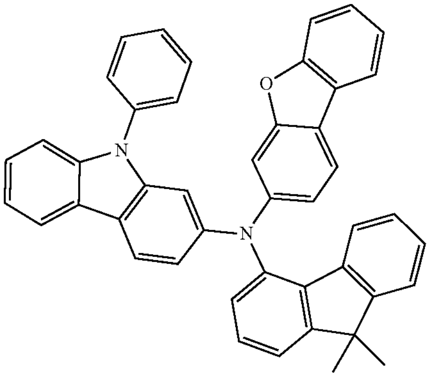
23
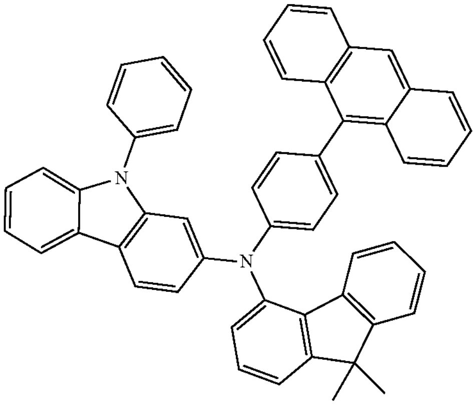
24
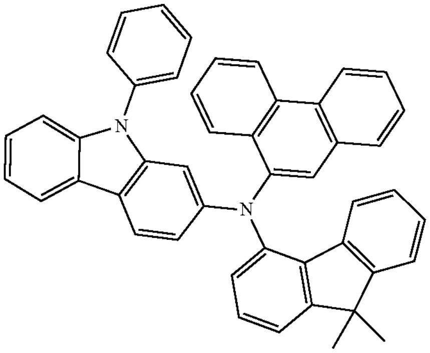

-continued
25
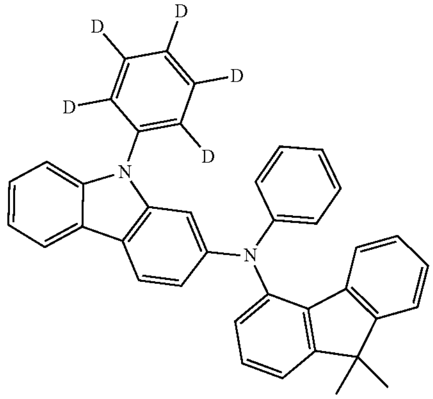
26
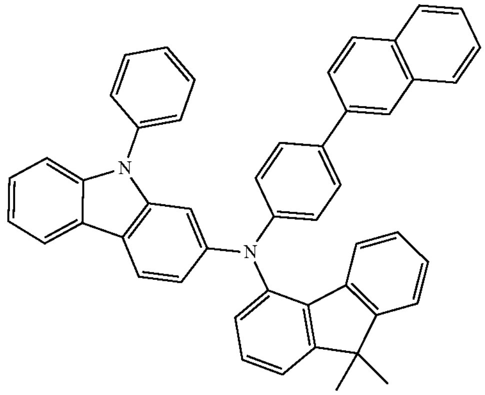
27
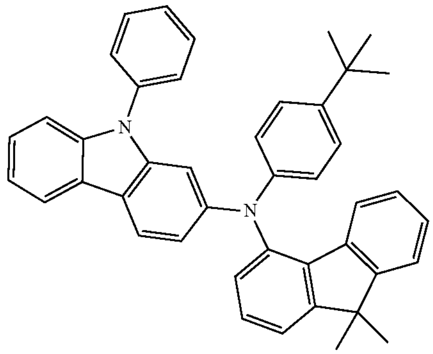
28
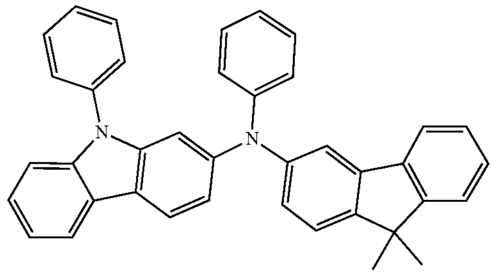
-continued
29
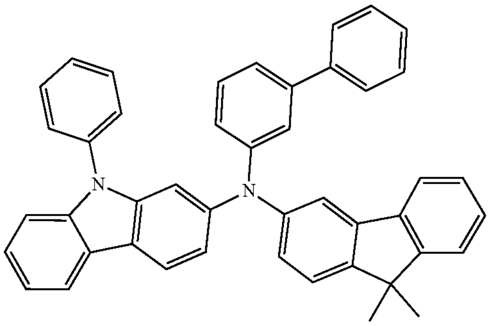
30
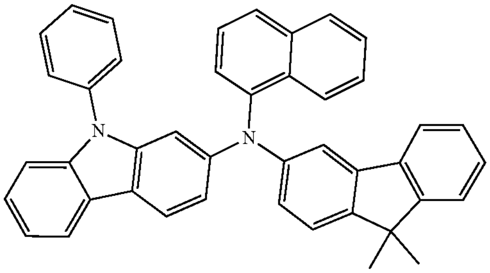
31
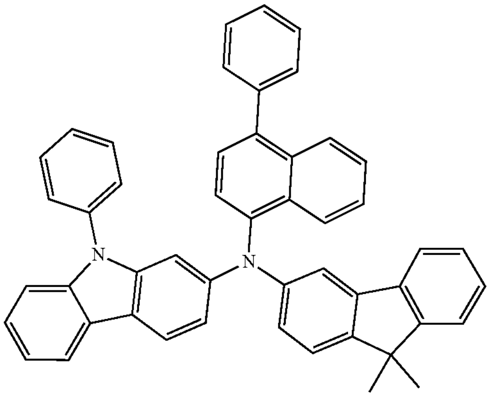
32
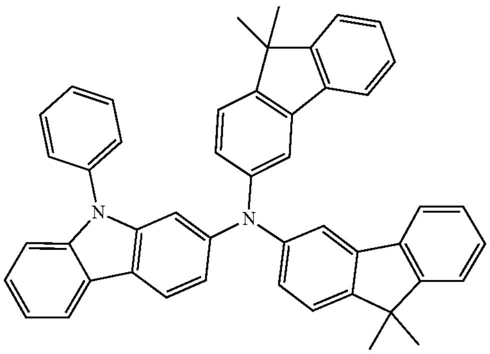

-continued
33
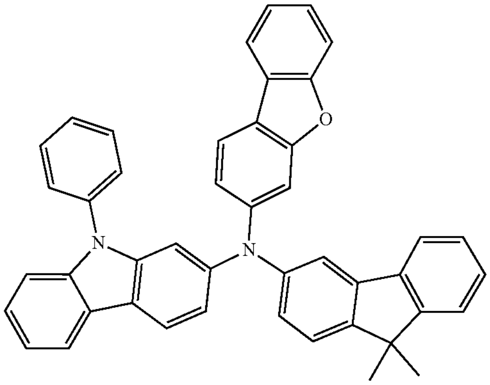
34
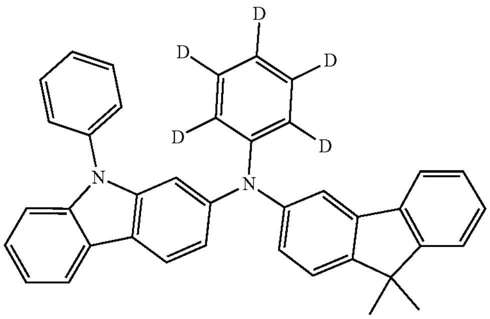
35
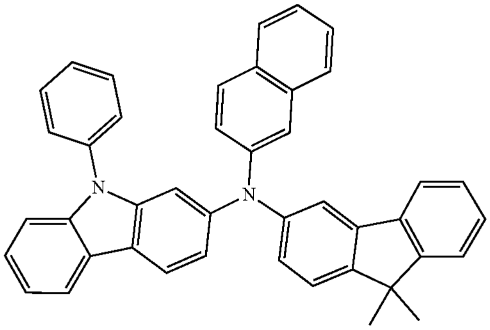
36
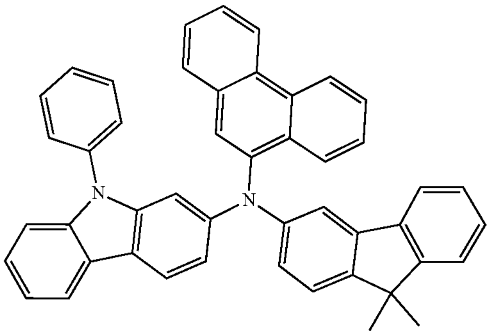
-continued
37
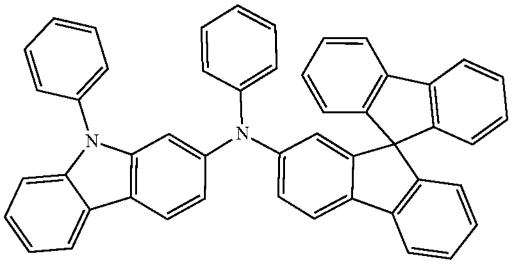
38
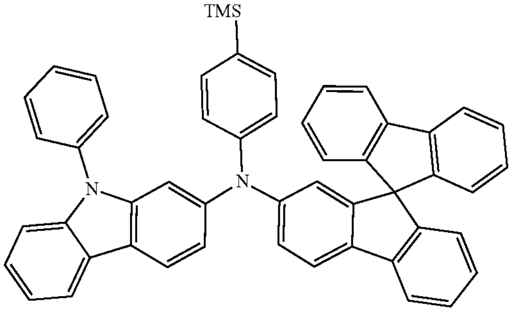
39
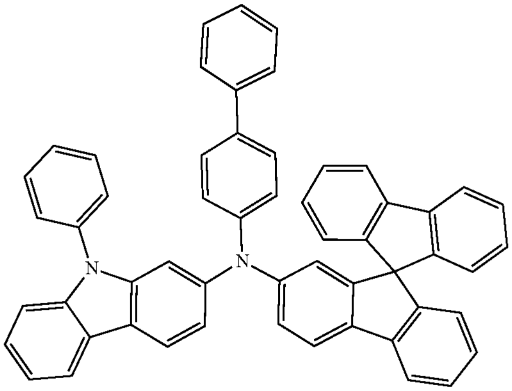
40
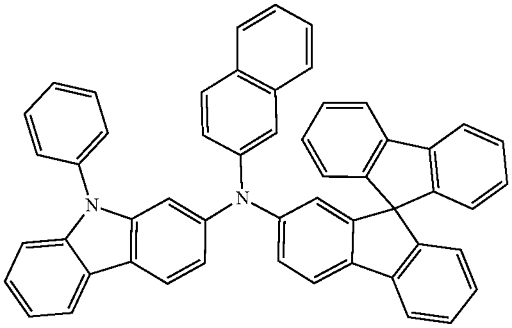

-continued
41
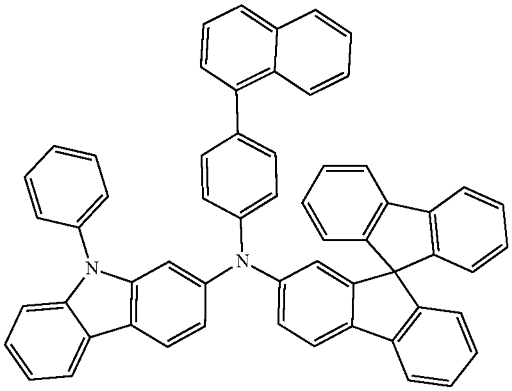
42
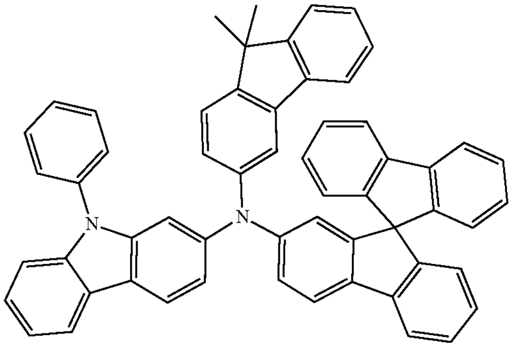
43
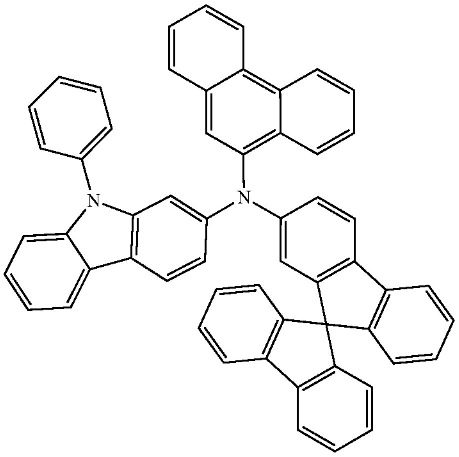
-continued
44
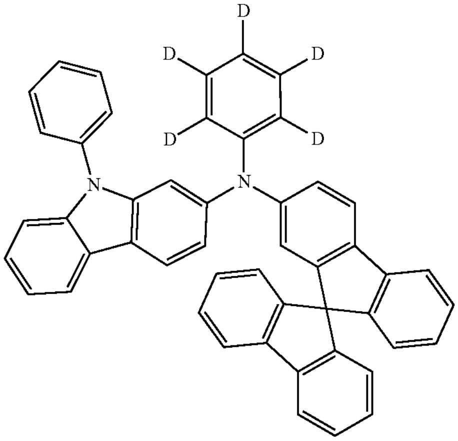
45
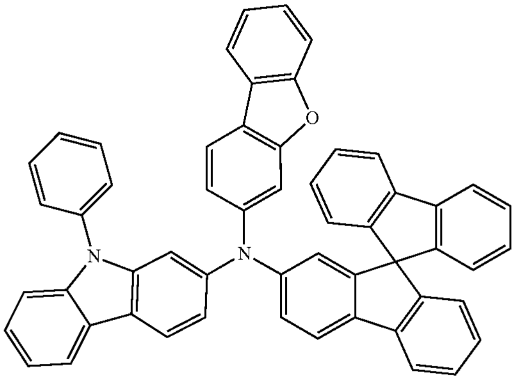
46
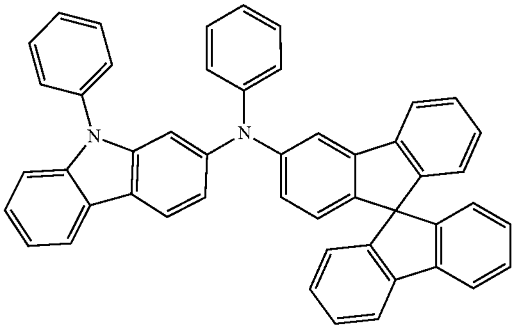
47
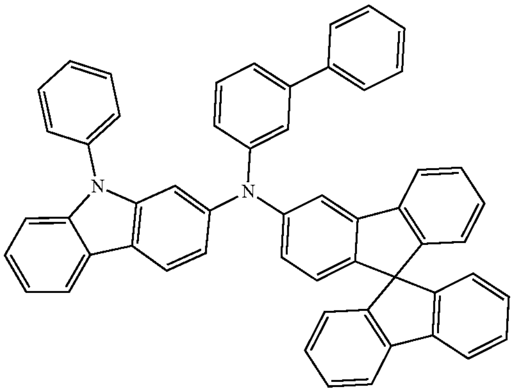

-continued
48
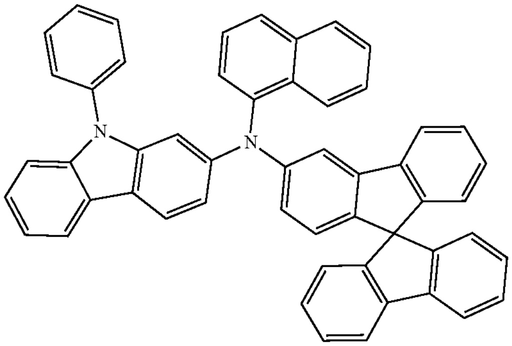
49
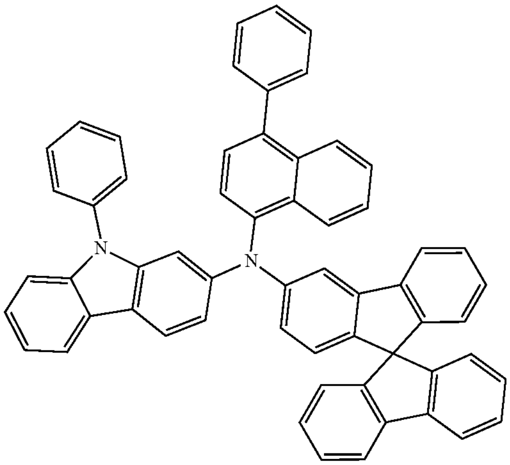
50
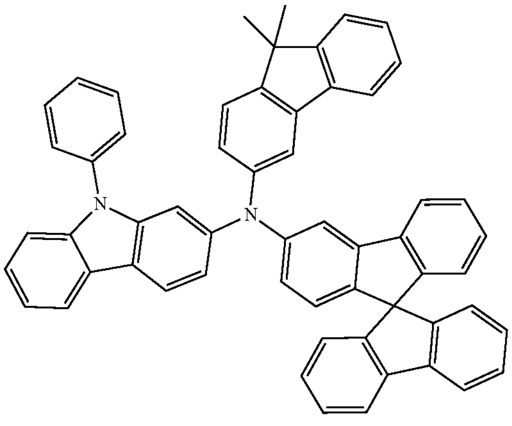
-continued
51
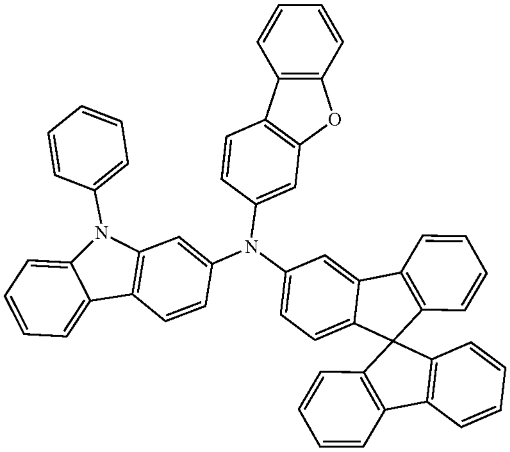
52
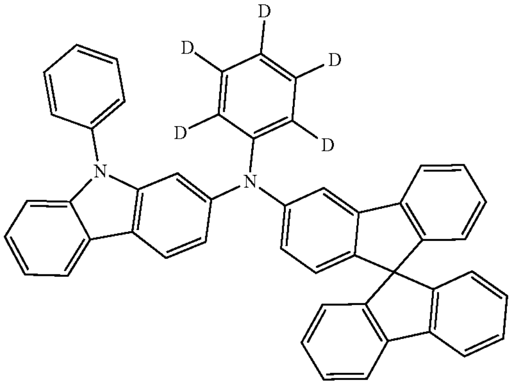
53
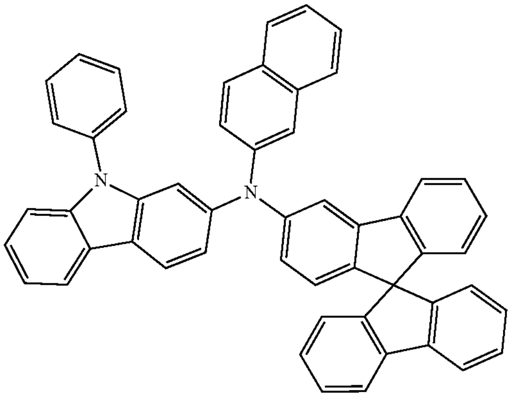

-continued
54
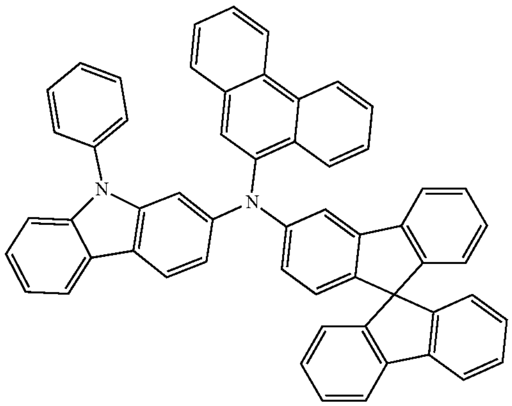
55
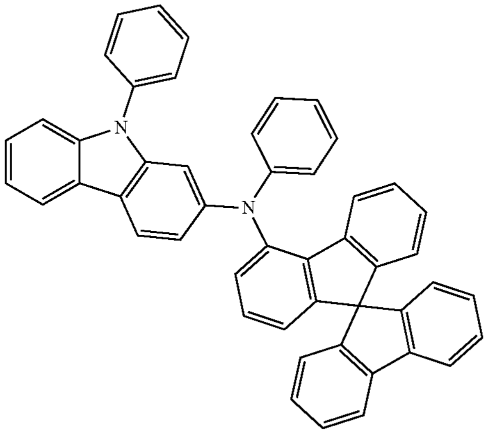
56
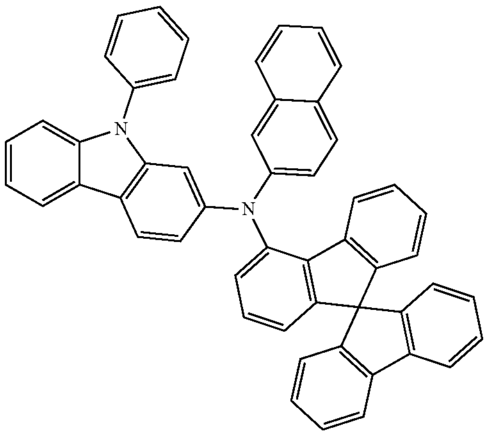
-continued
57
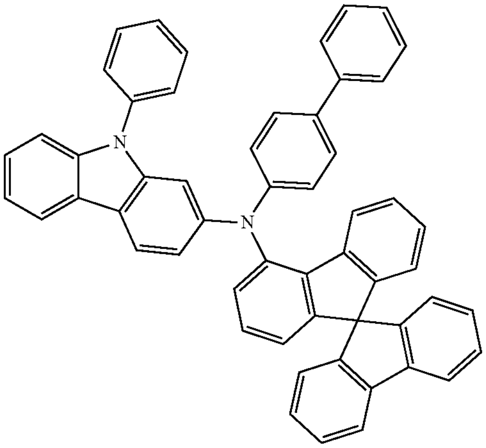
58
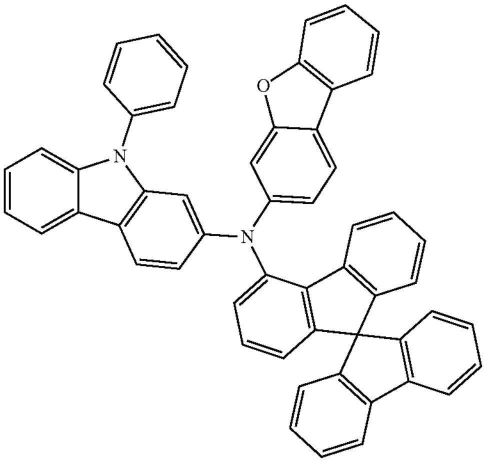
59
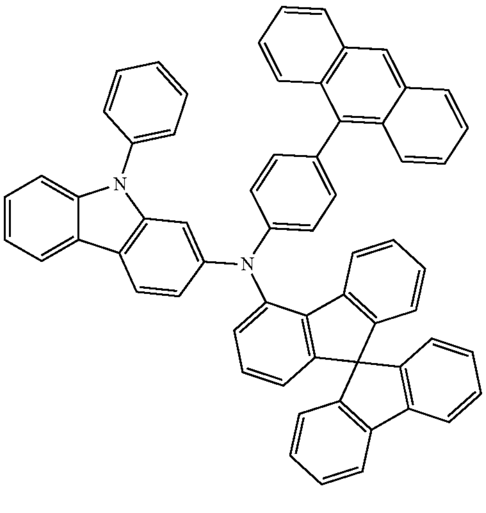

-continued
60
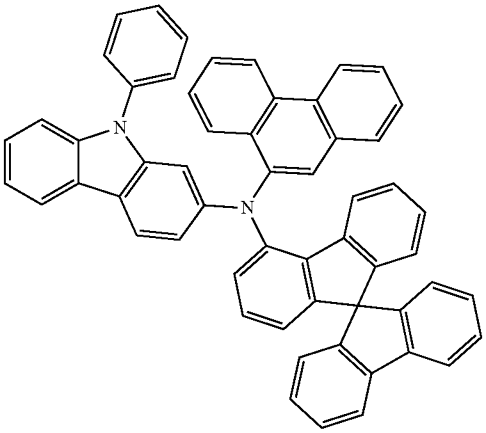
61
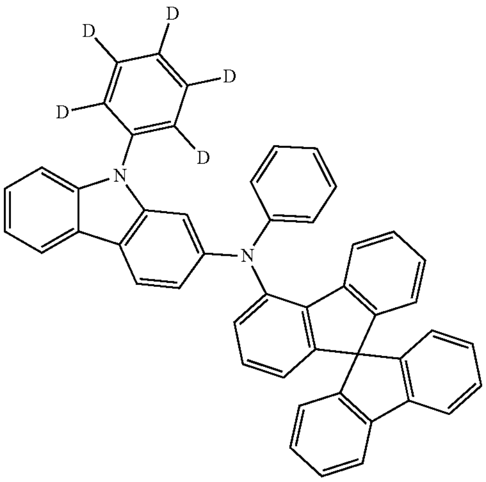
62
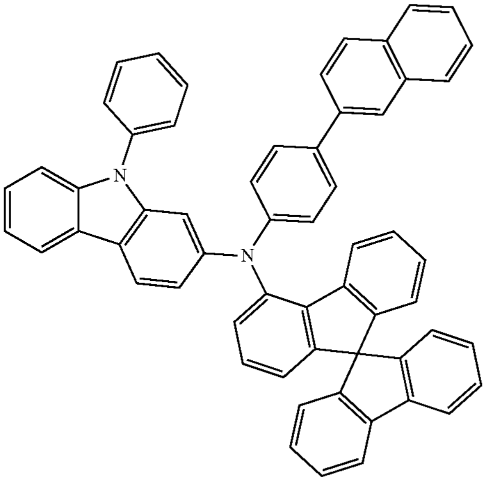
-continued
63
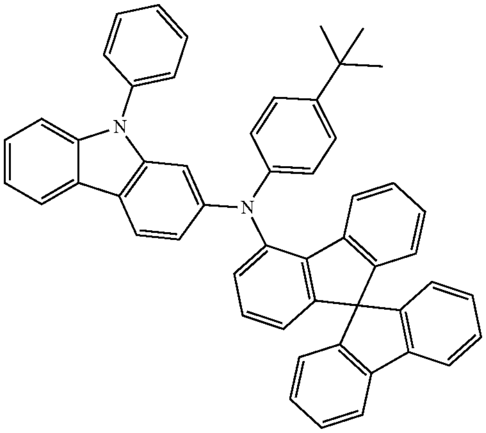
64
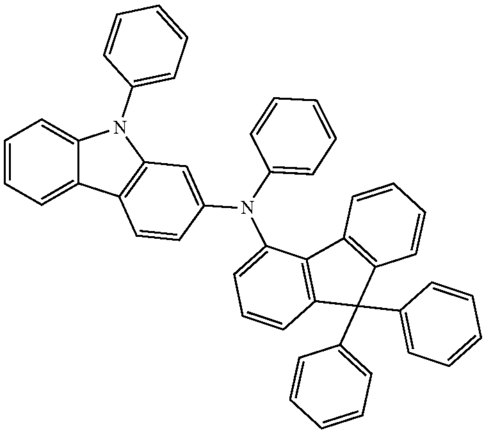
65
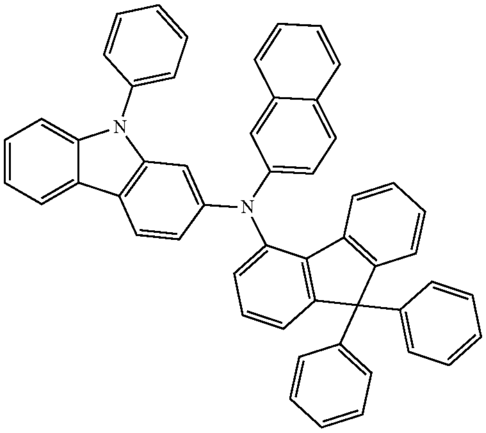

-continued
66
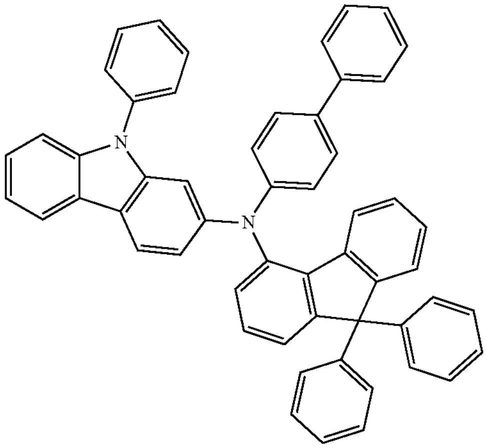
67
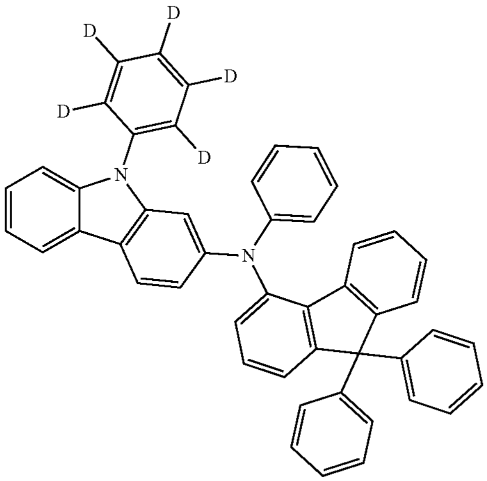
68
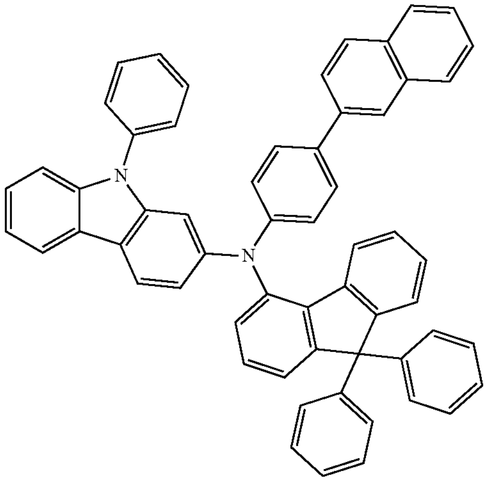
-continued
69
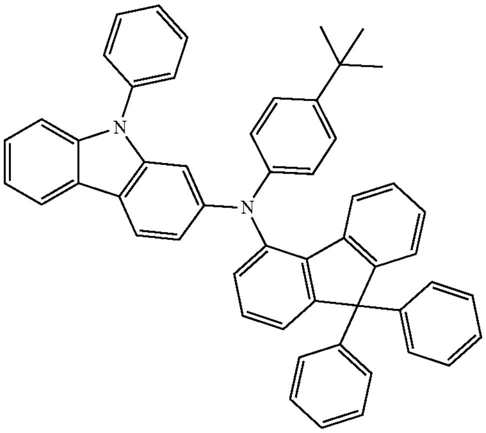
70
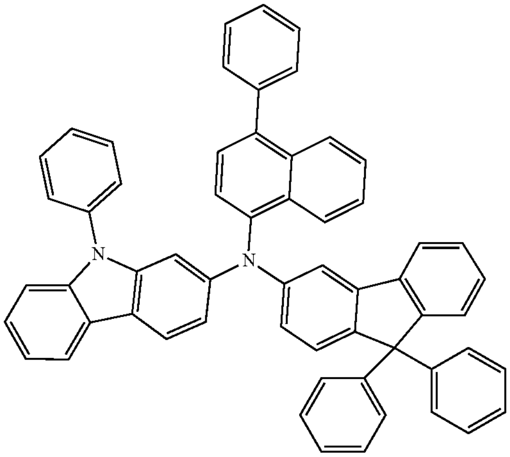
71
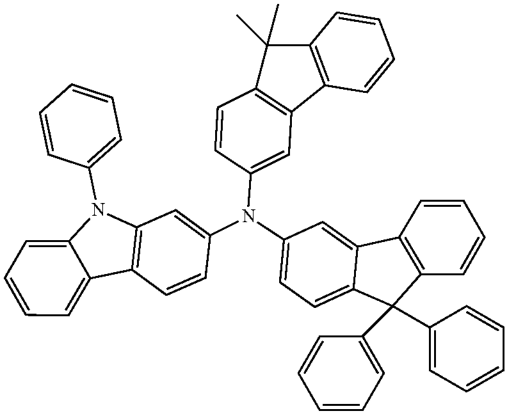

-continued
72
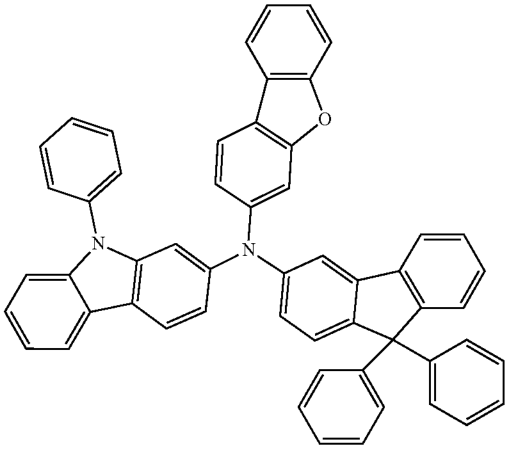
73
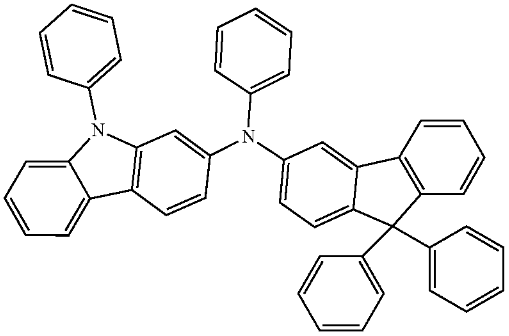
74
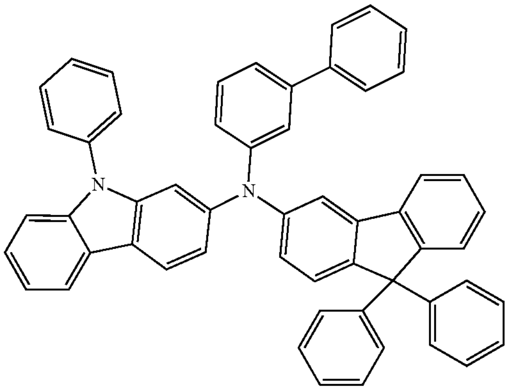
75
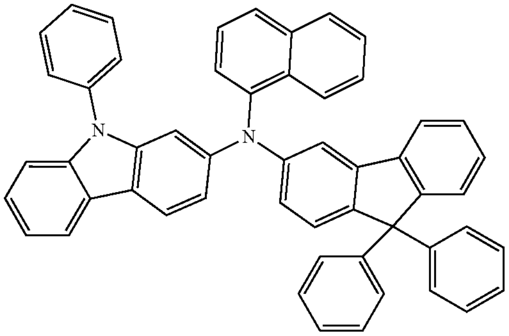
-continued
76
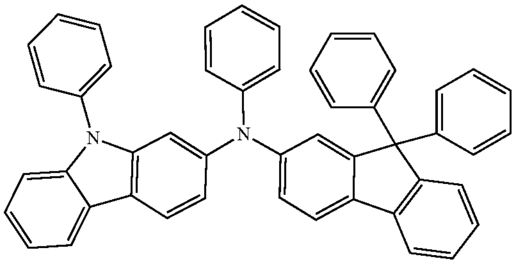
77
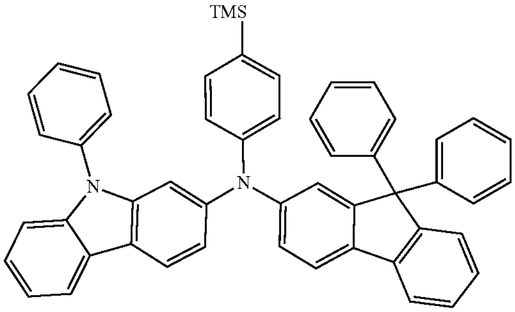
78
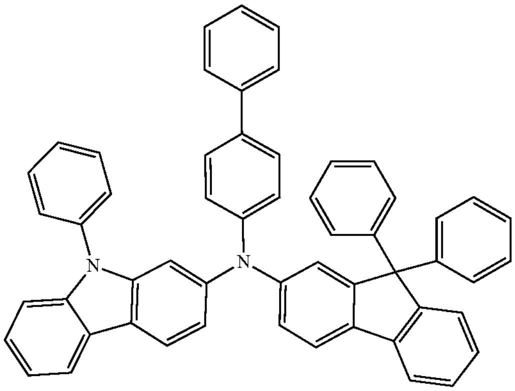
79
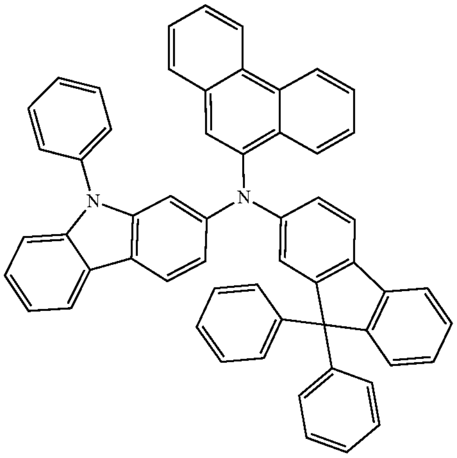

-continued
80
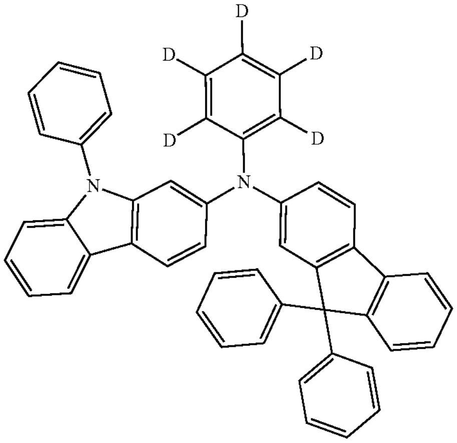
81
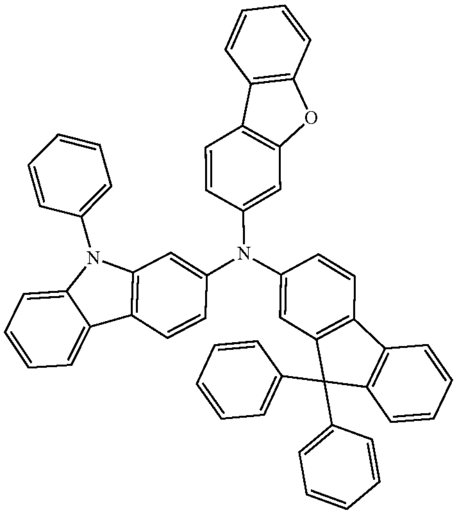
82
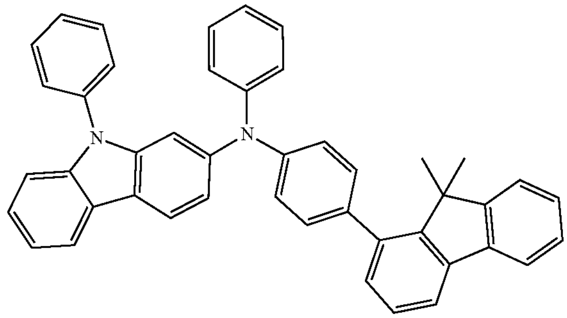
83
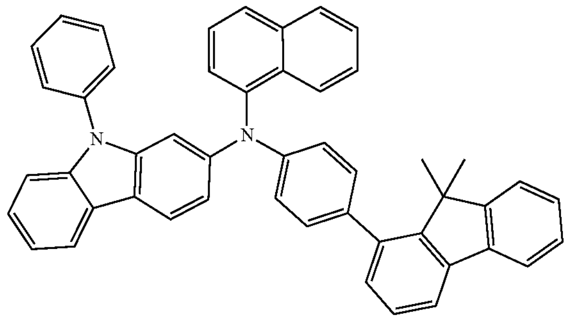
-continued
84
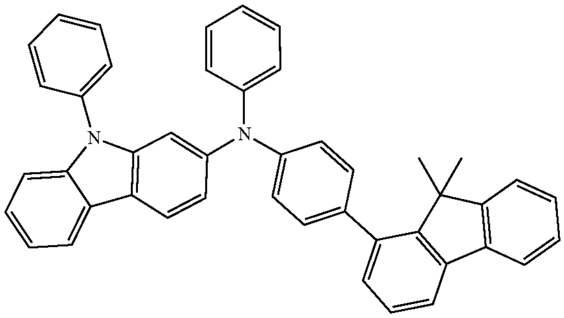
85
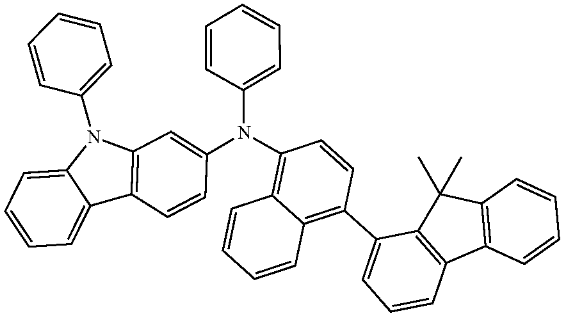
86
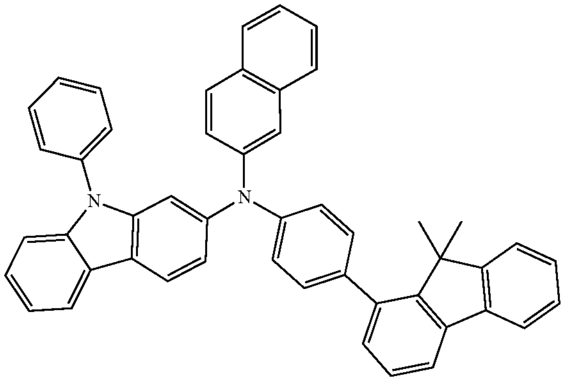
87
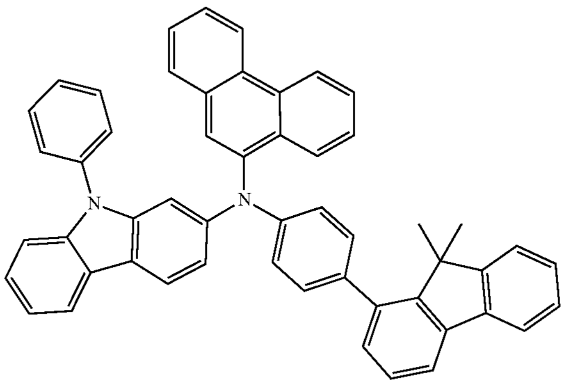

88
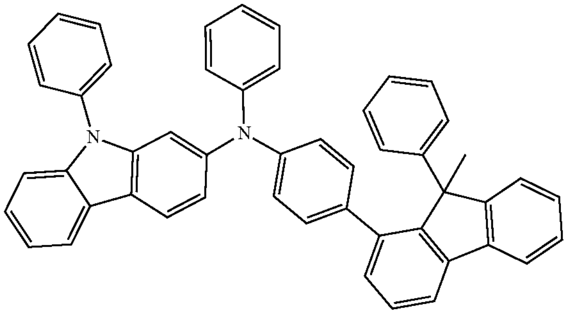
89
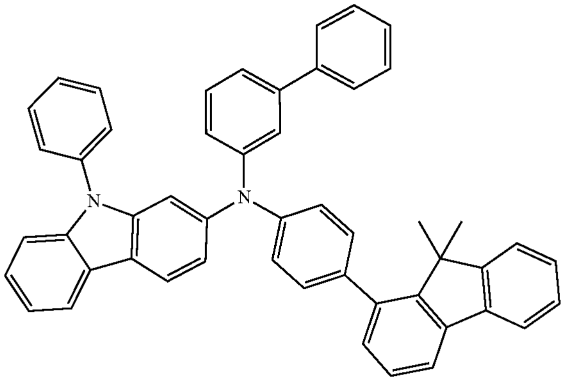
90
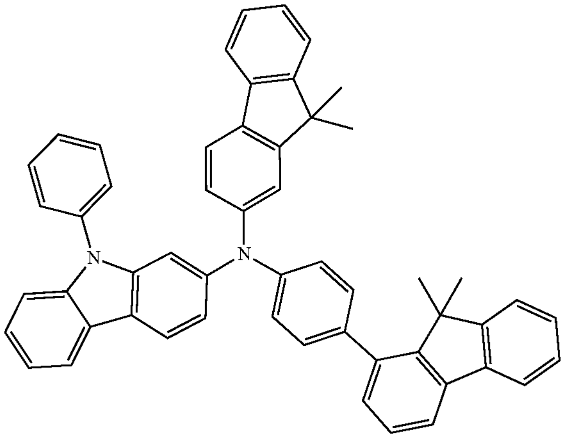
91
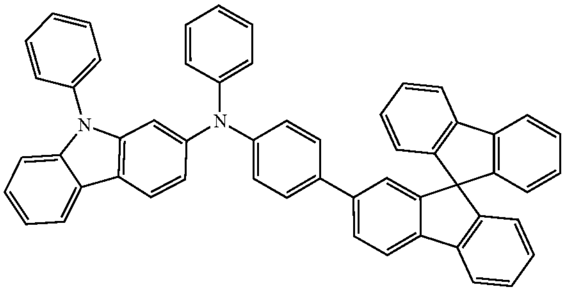
92
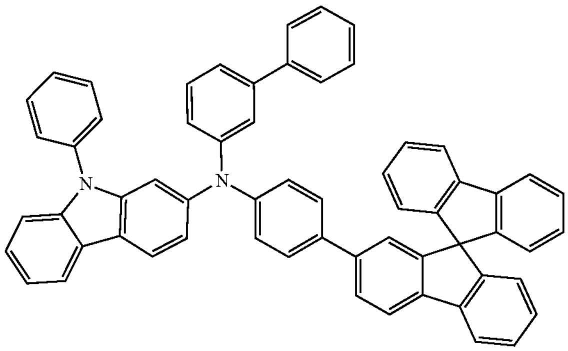
93
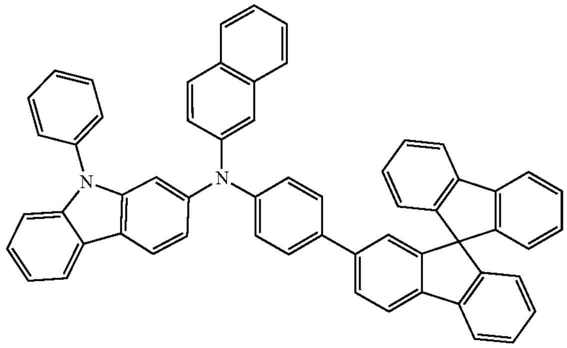
94
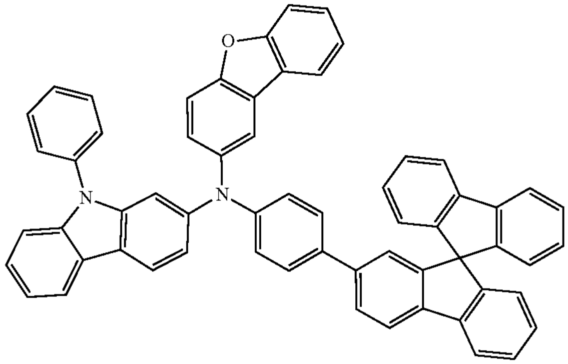
95
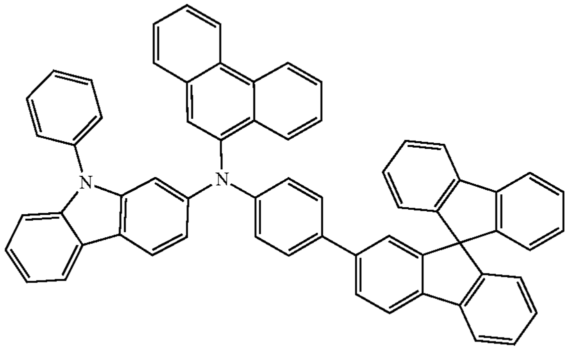

-continued
96
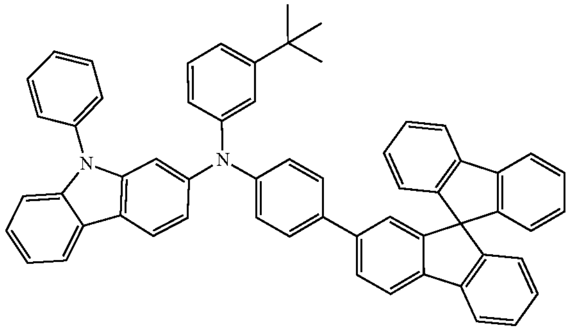
97
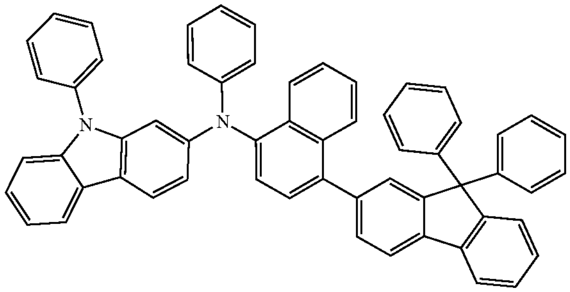
98
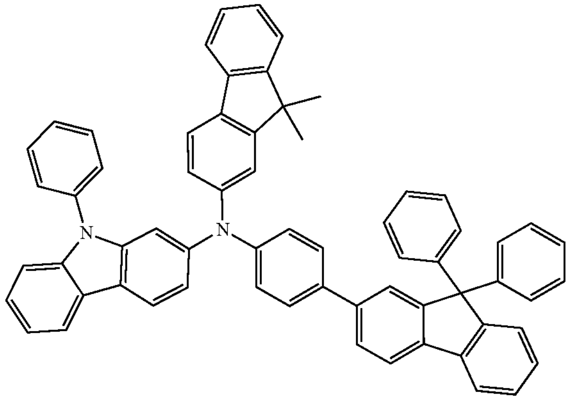
99
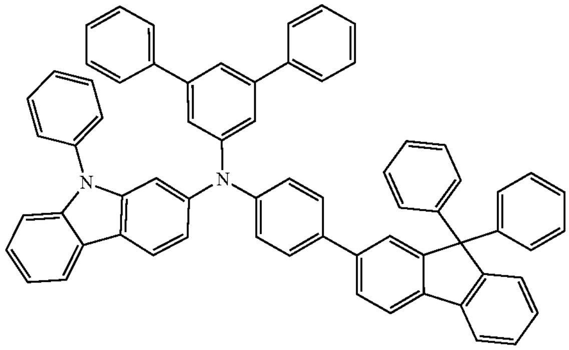
-continued
100
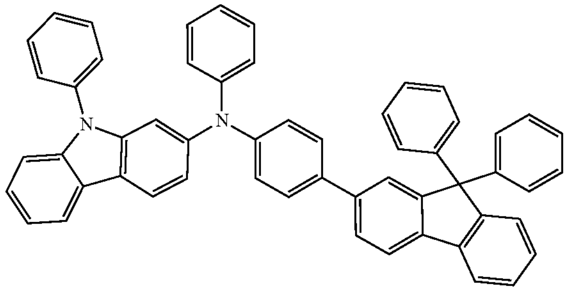
101
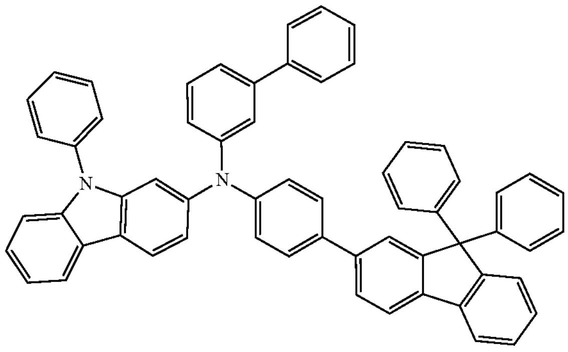
102
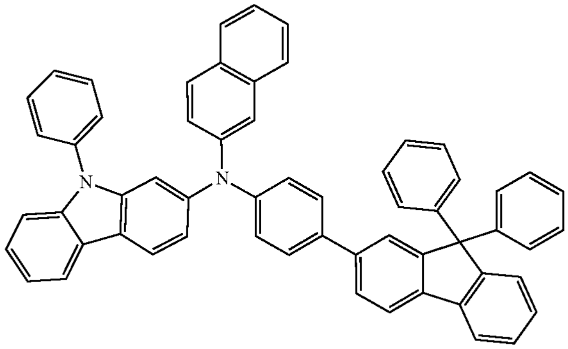
103
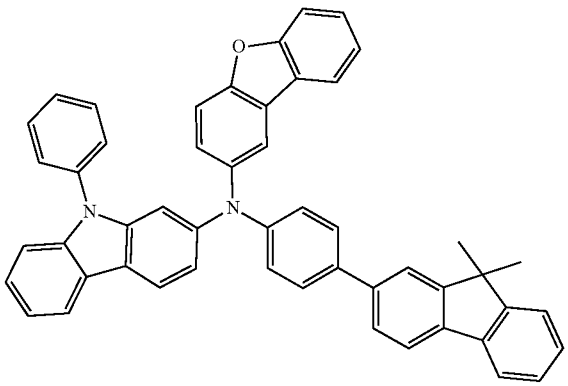

-continued
104
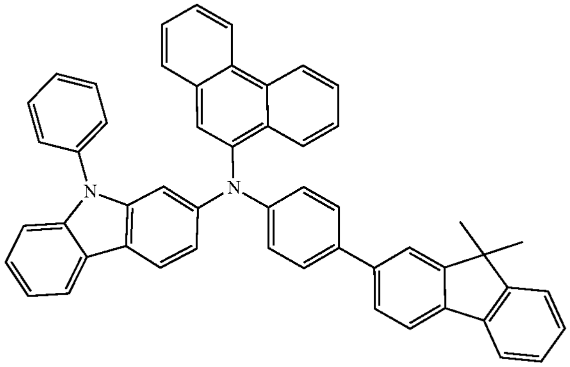
105
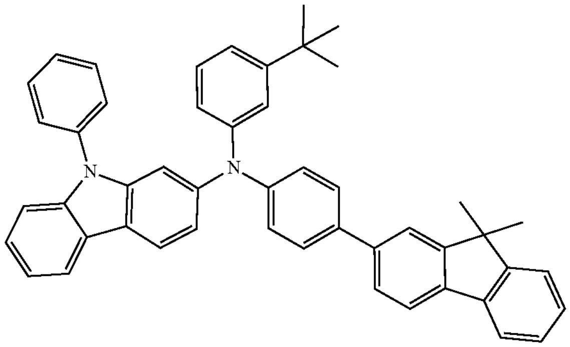
106
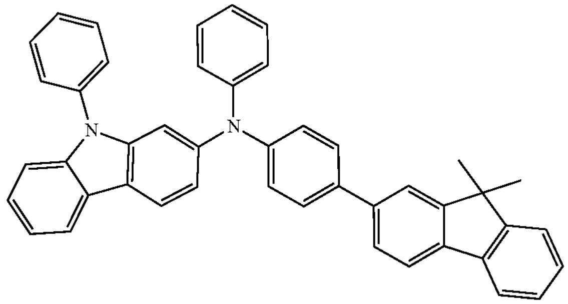
107
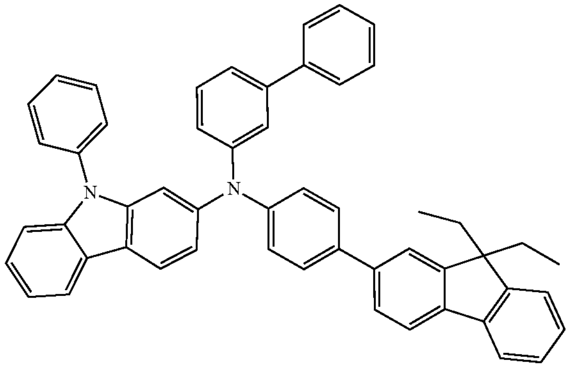
-continued
108
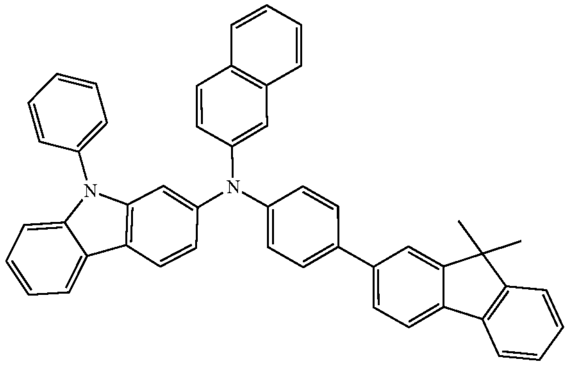
109
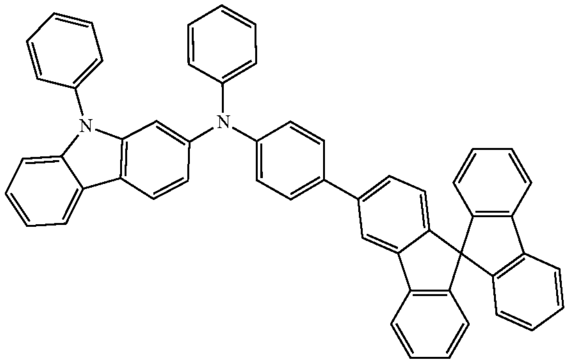
110
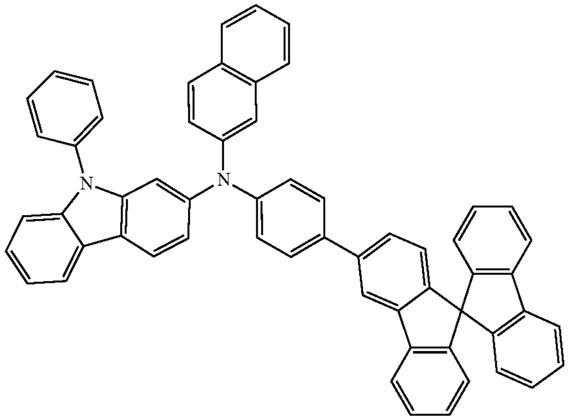
111
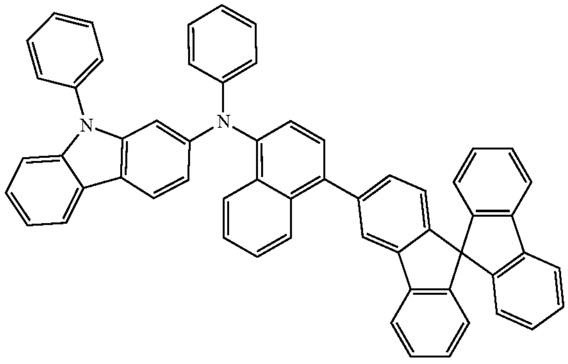

-continued
112
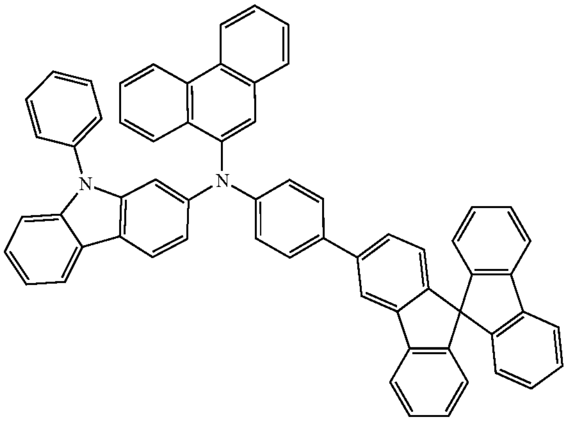
113
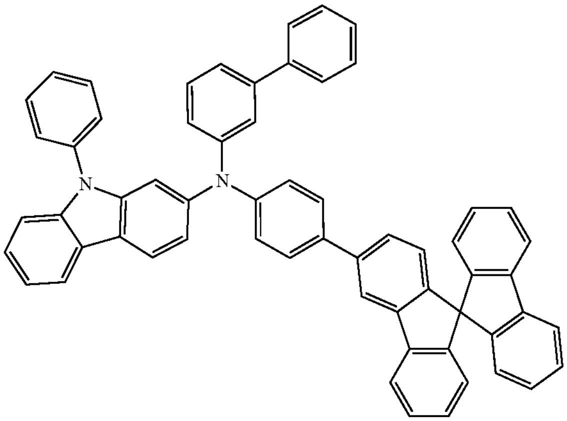
114
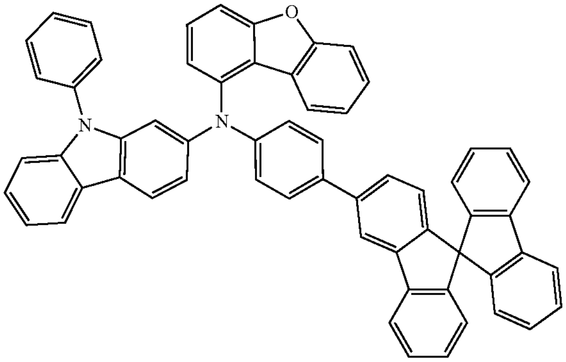
-continued
115
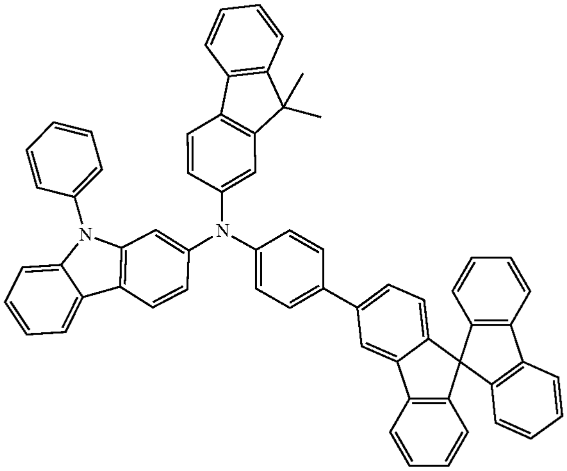
116
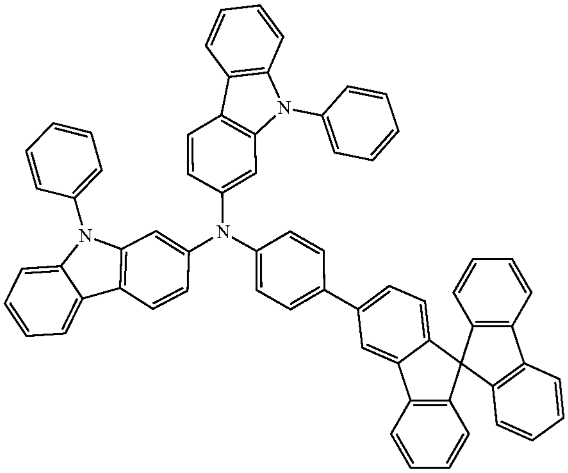
117
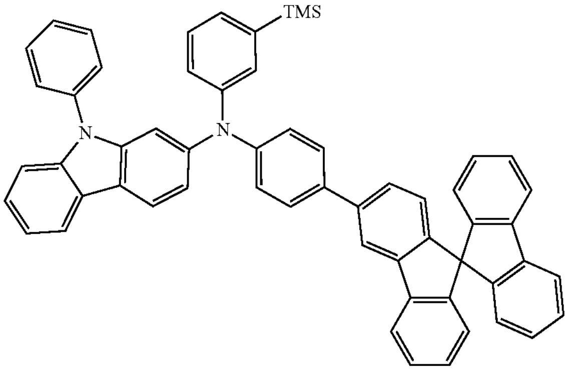

-continued
118
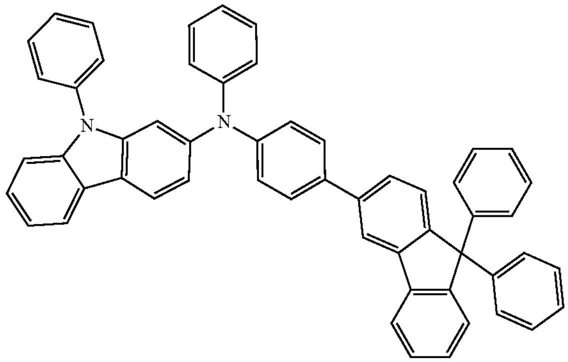
119
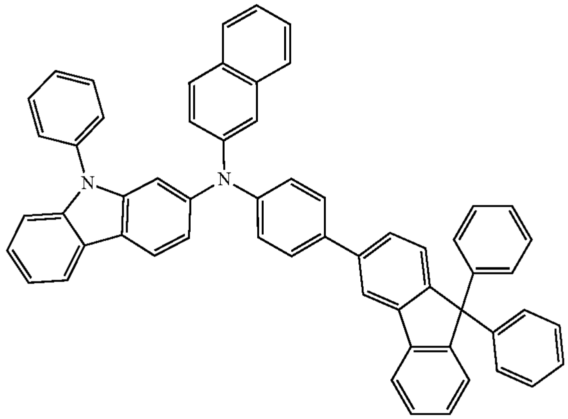
120
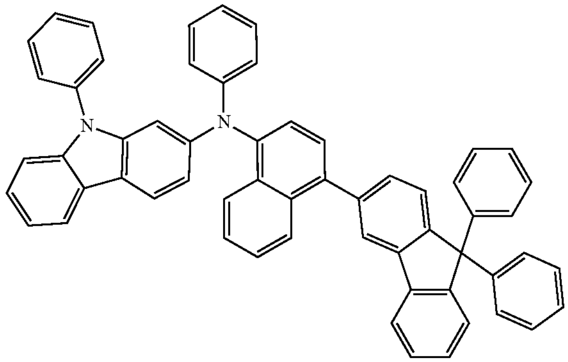
121
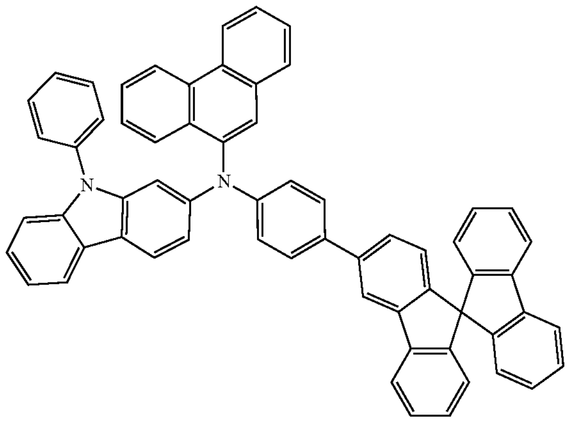
-continued
122
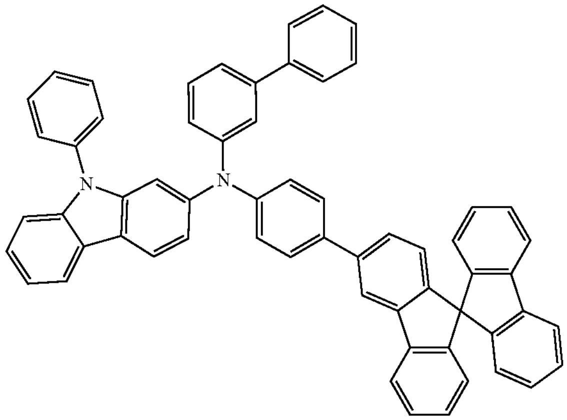
123
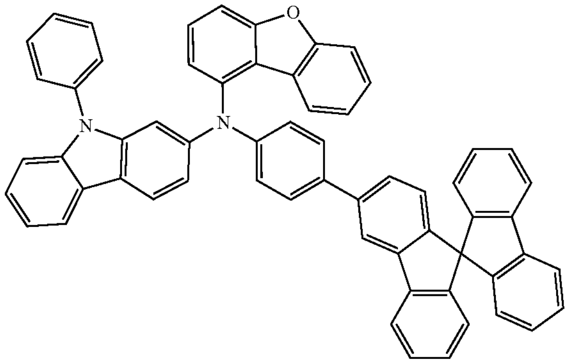
124
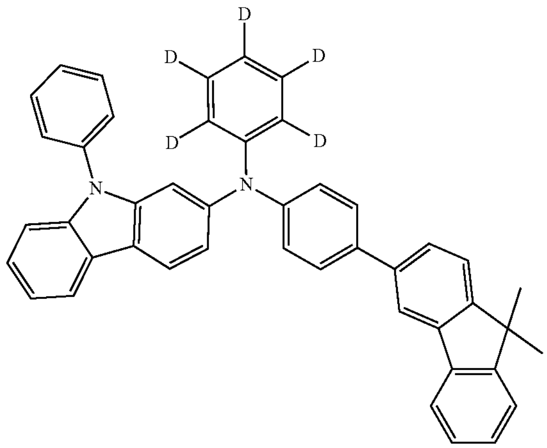

-continued
125
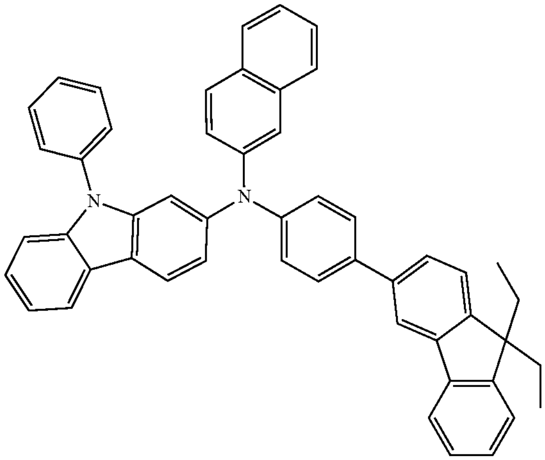
126
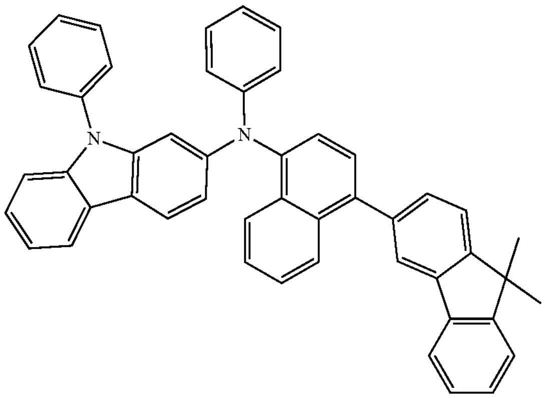
127
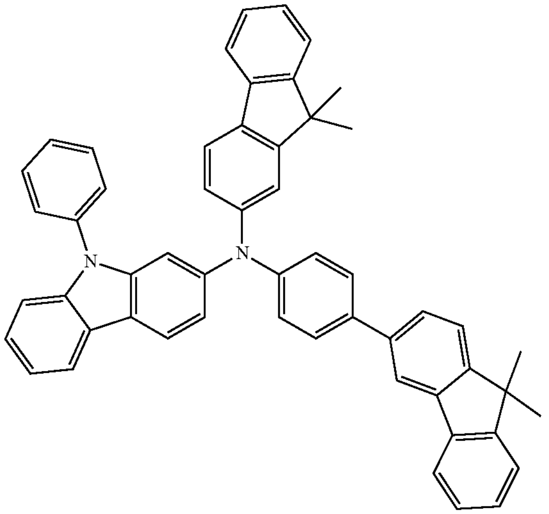
-continued
128
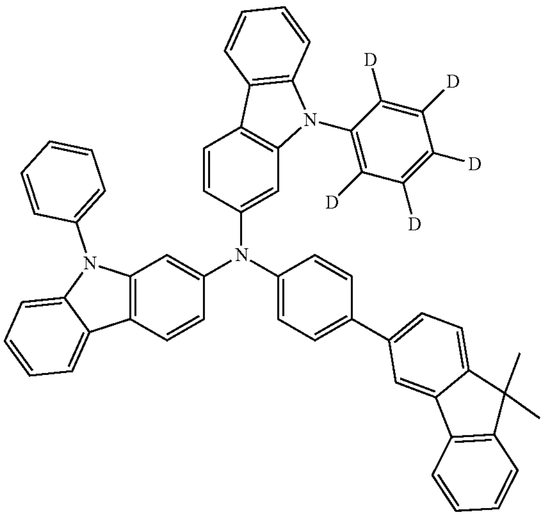
129
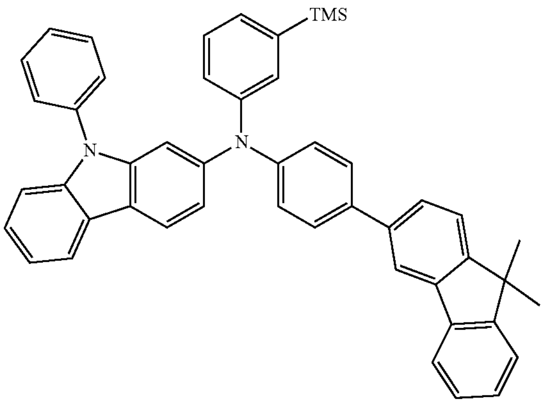
130
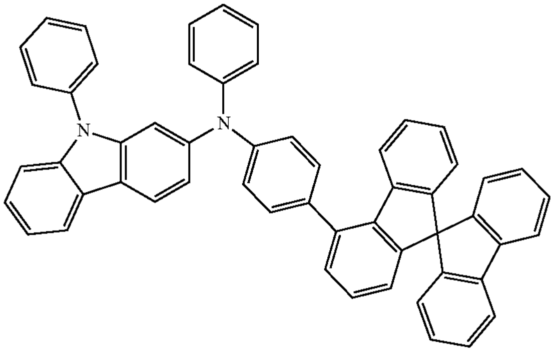

-continued
131
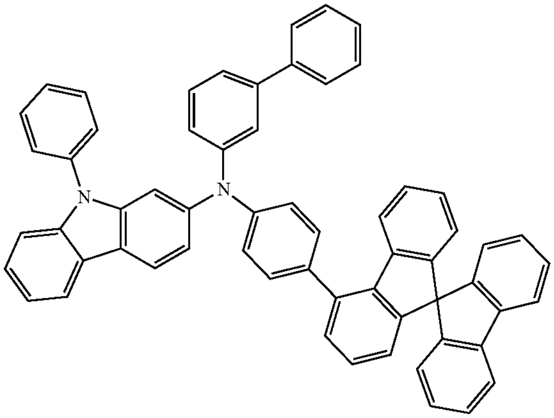
132
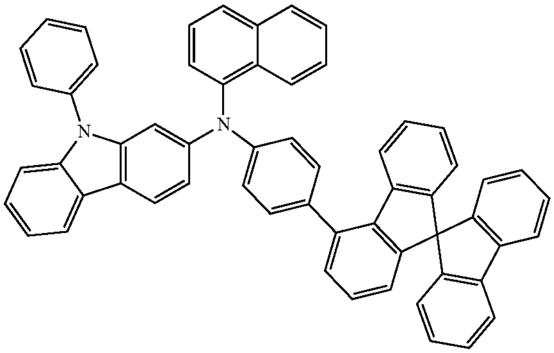
133
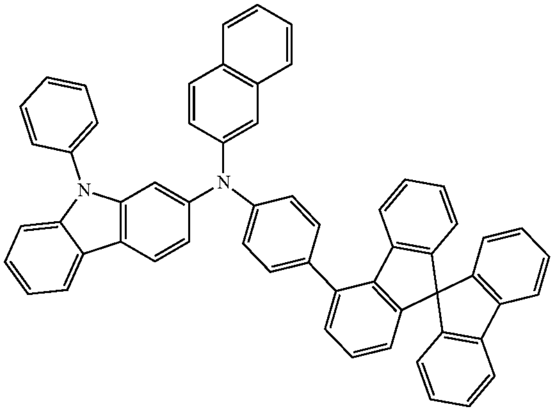
134
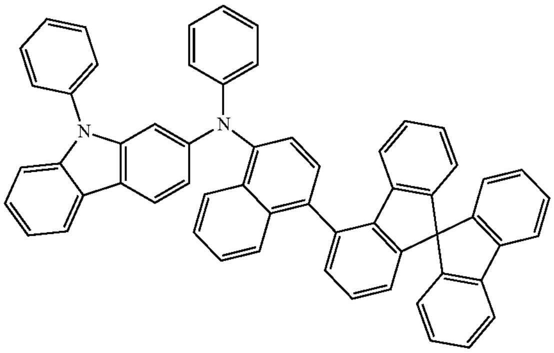
-continued
135
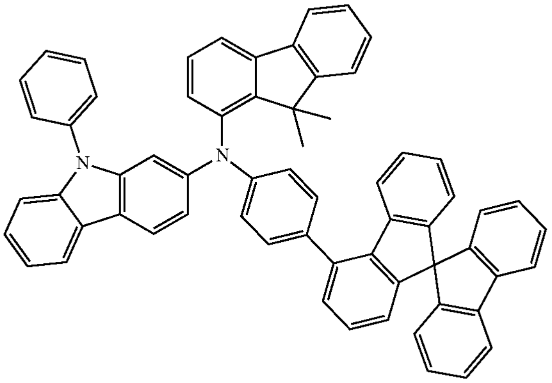
136
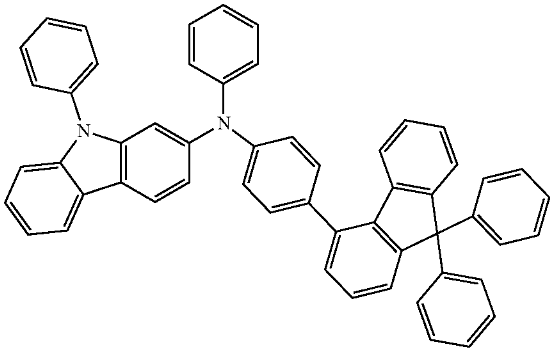
137
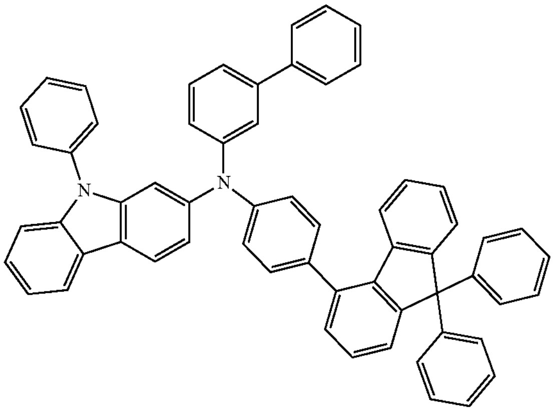
138
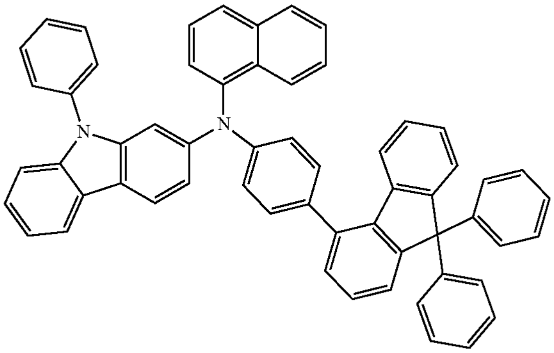

-continued
139
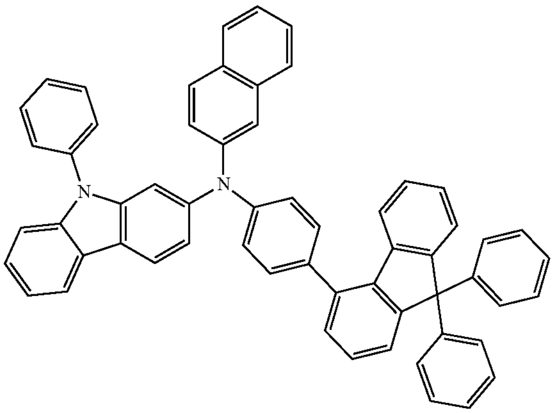
140
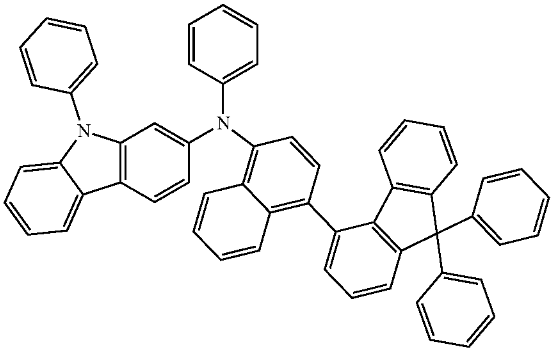
141
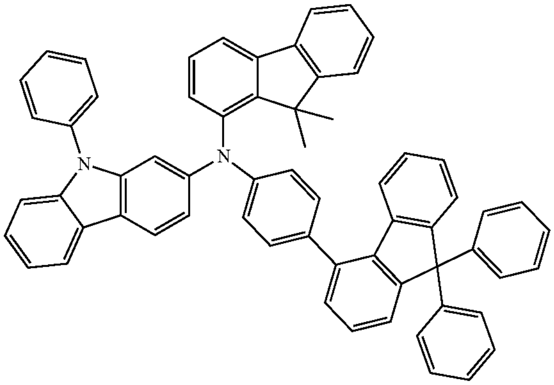
142
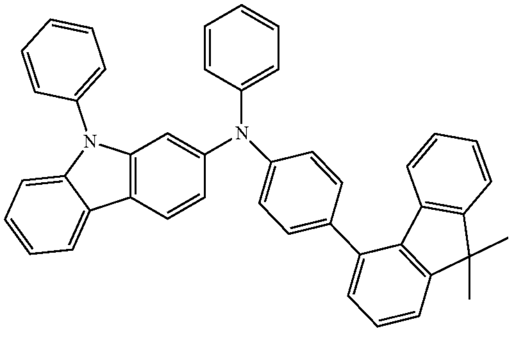
-continued
143
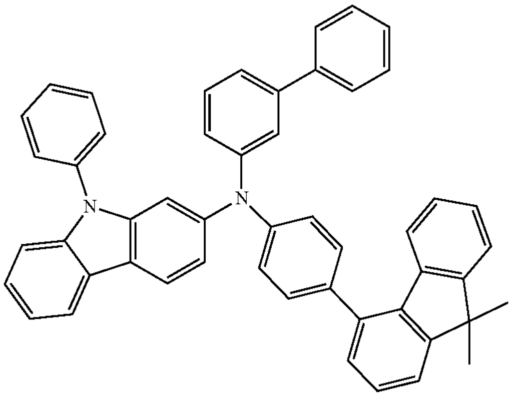
144
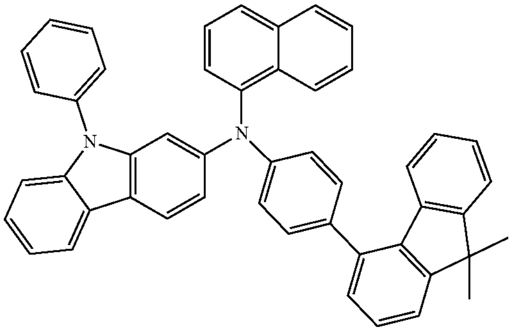
145
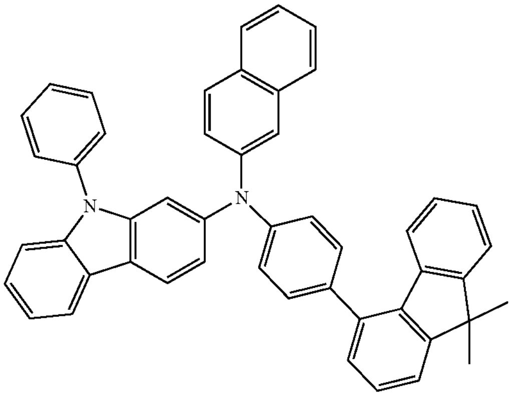
146
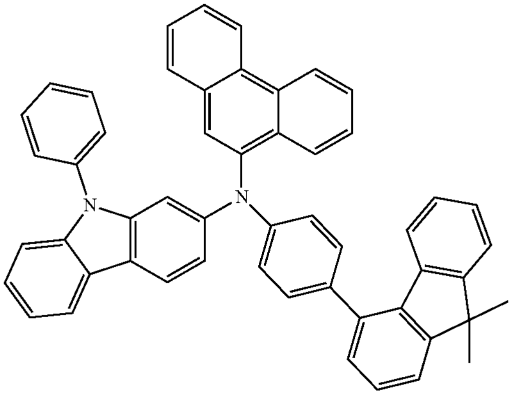

-continued
147
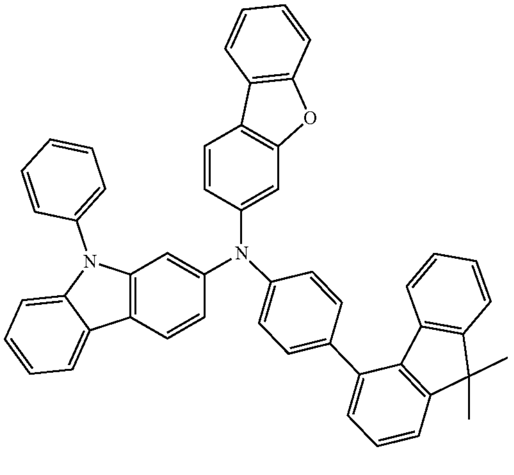
148
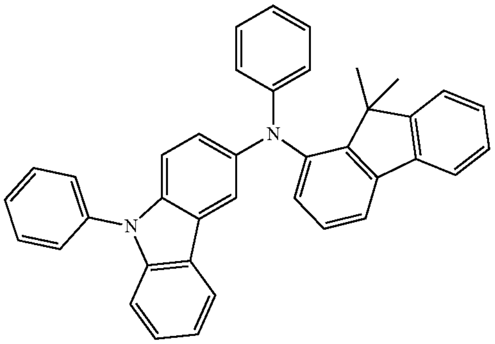
149
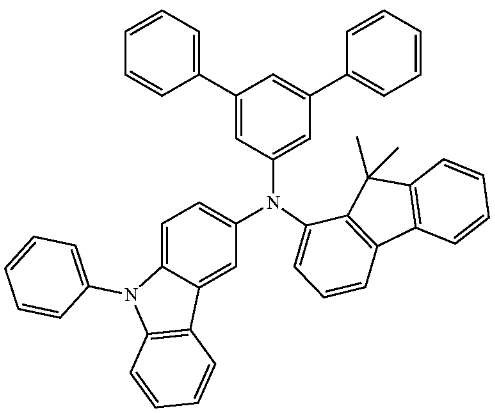
-continued
150
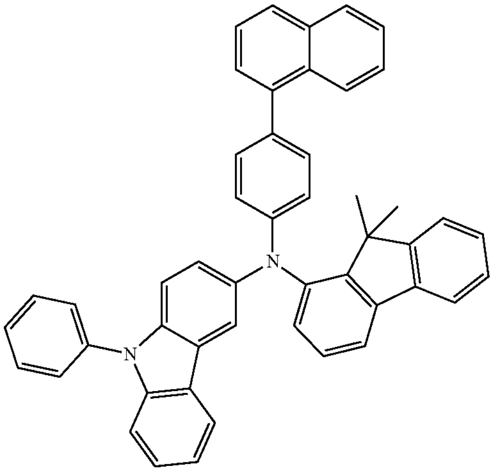
151
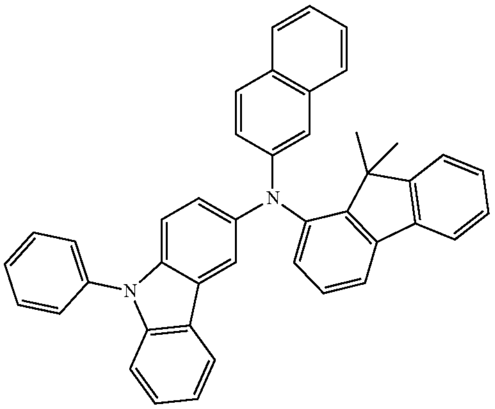
152
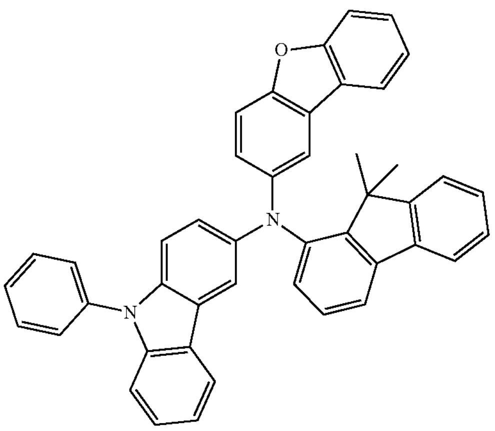

153
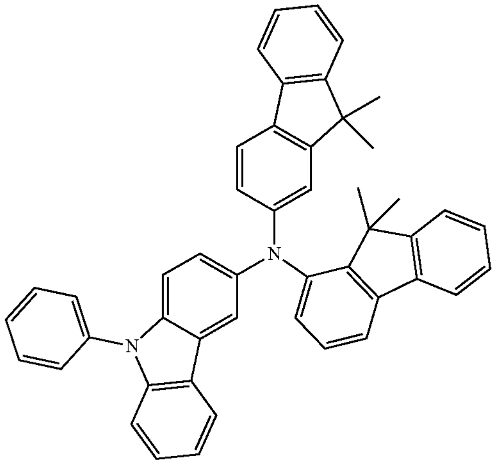
154
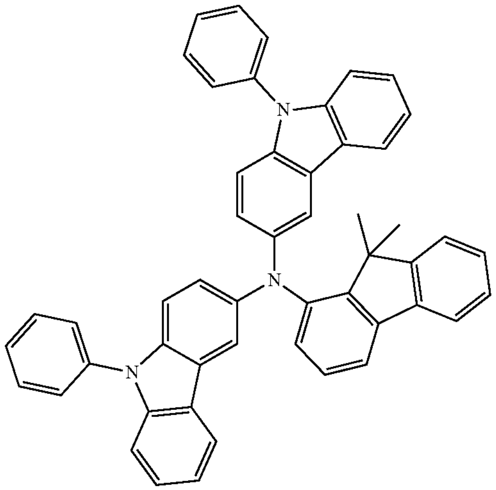
155
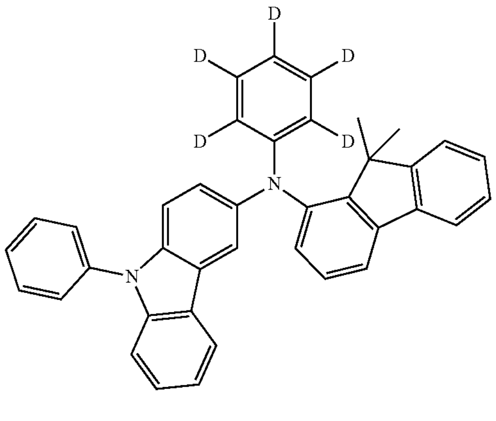
156
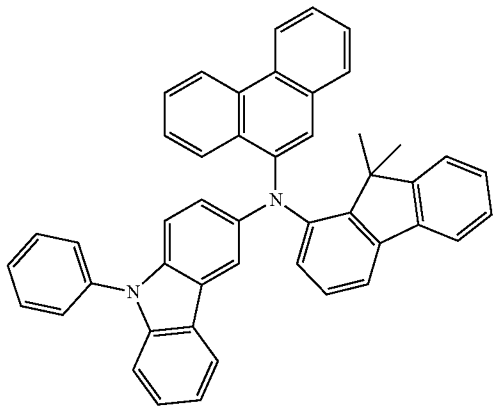
157
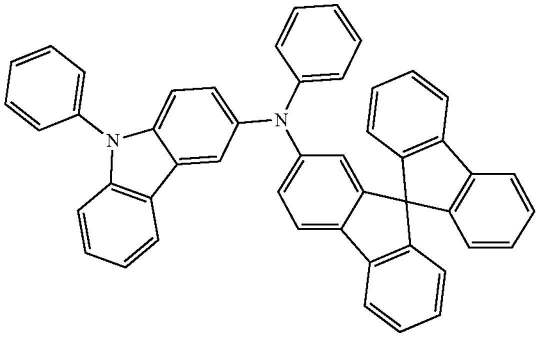
158
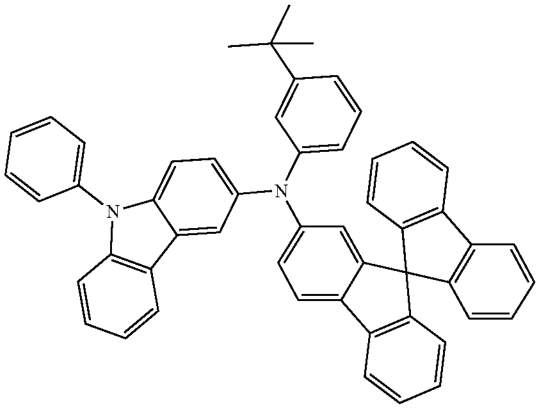

-continued
159
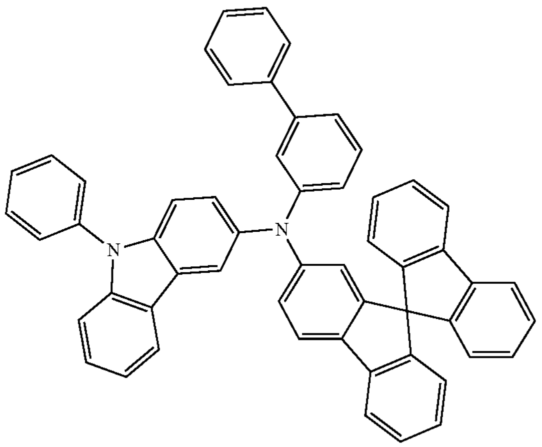
160
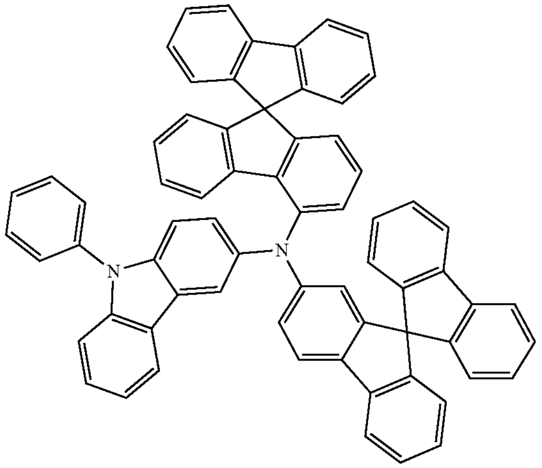
161
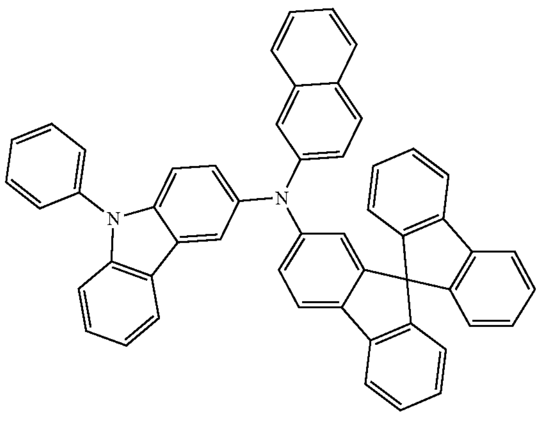
-continued
162
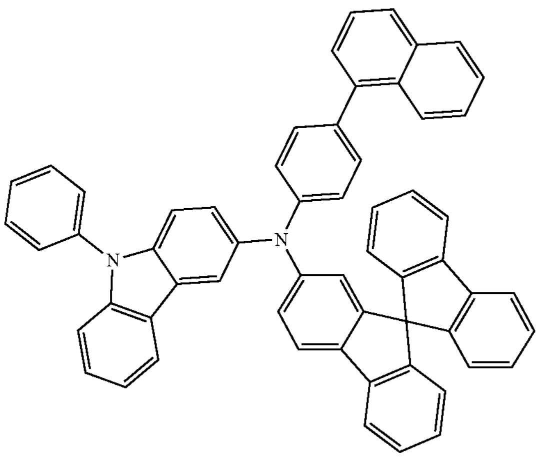
163
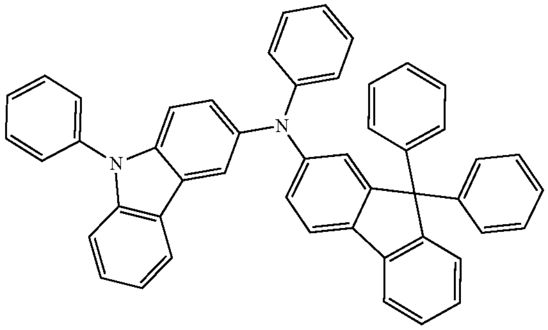
164
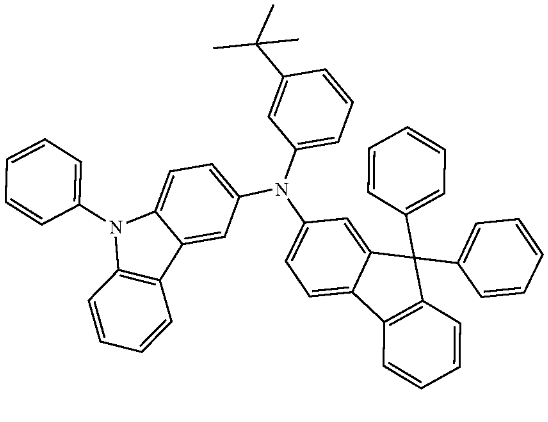

165
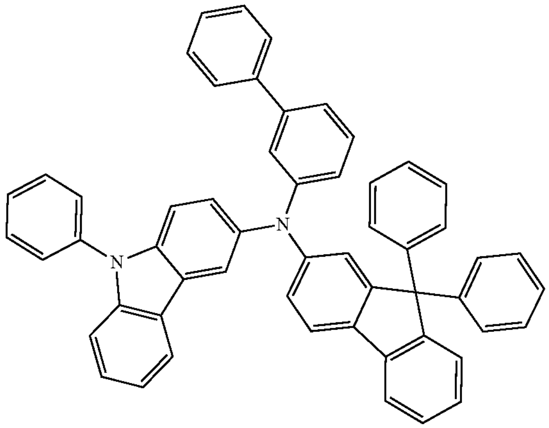
166
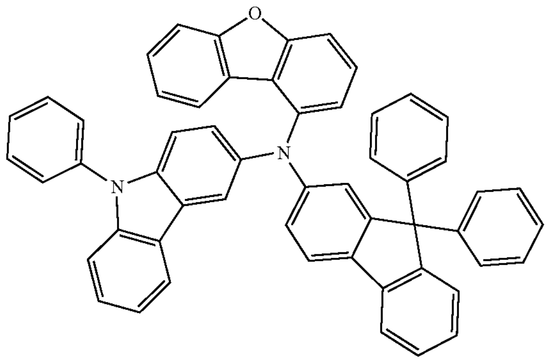
167
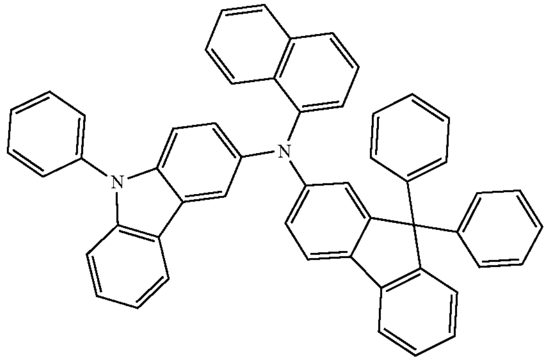
168
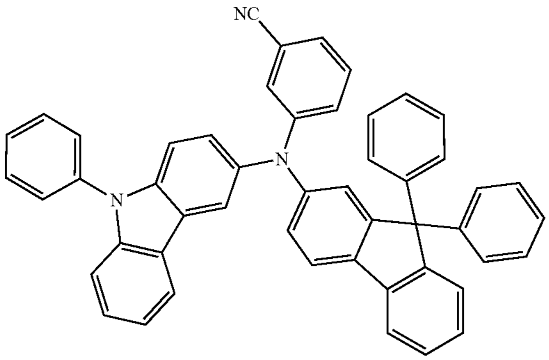
169
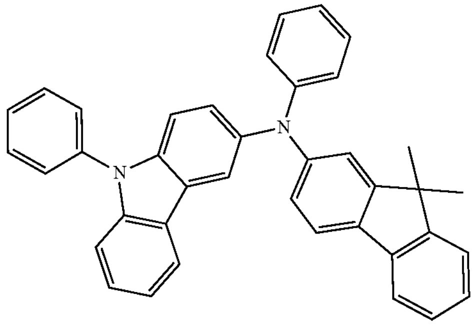
170
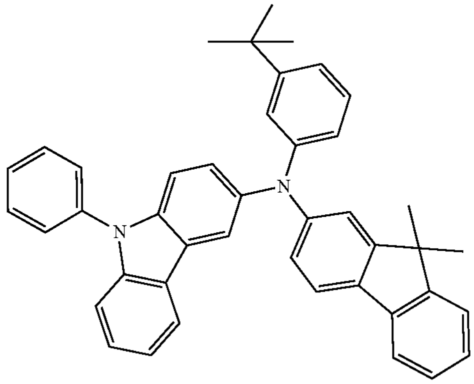
171
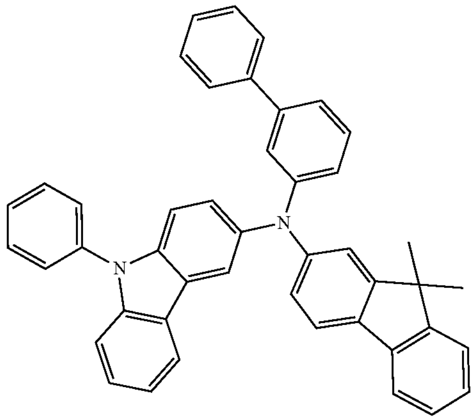
172
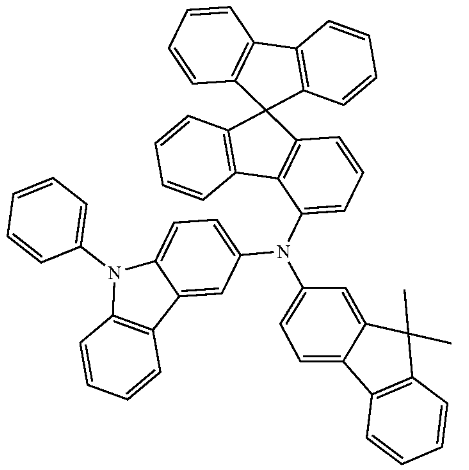

-continued
173
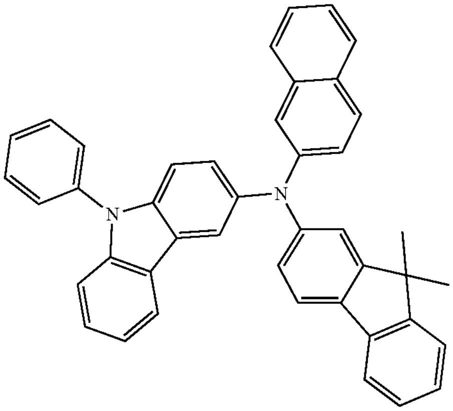
174
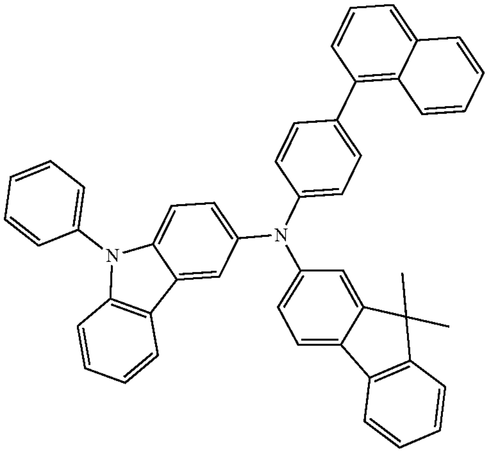
175
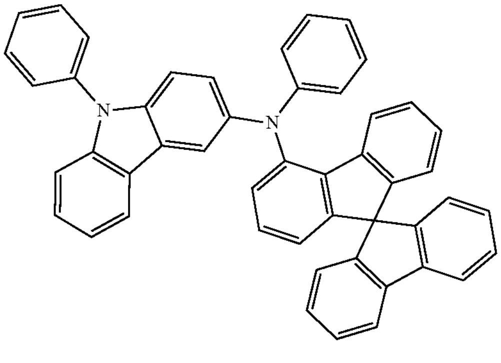
-continued
176
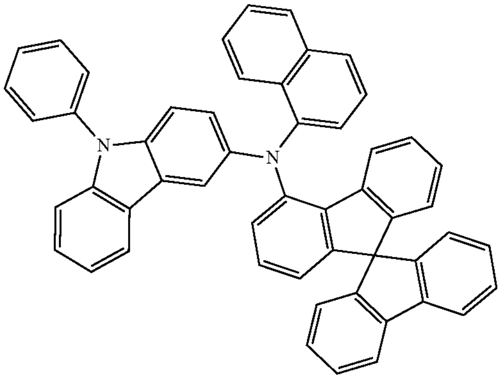
177
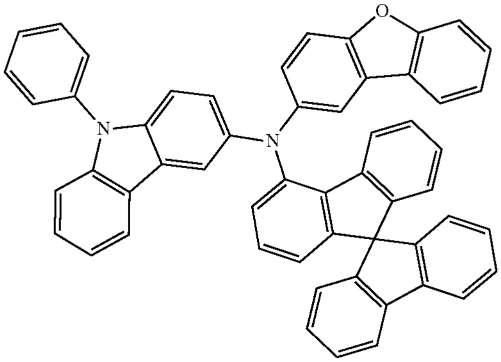
178
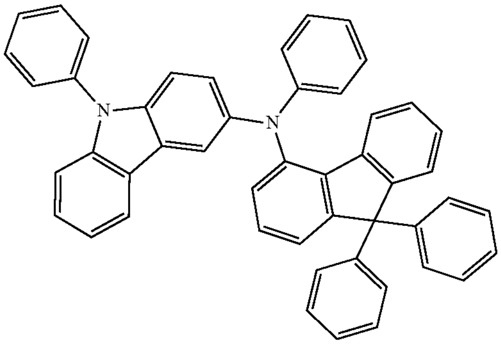
179
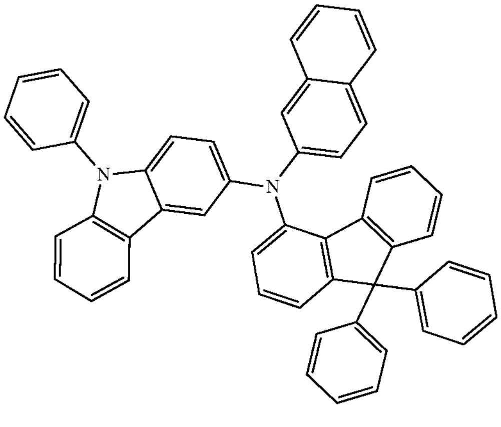

-continued
180
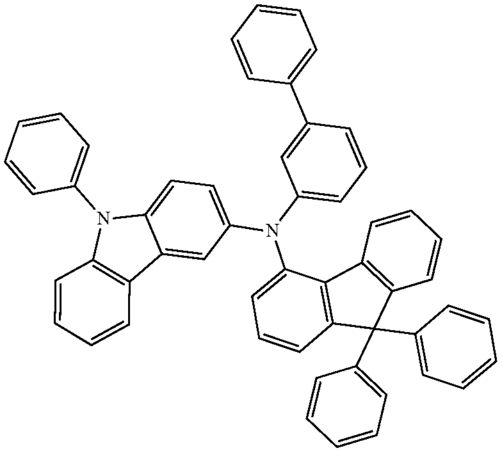
181
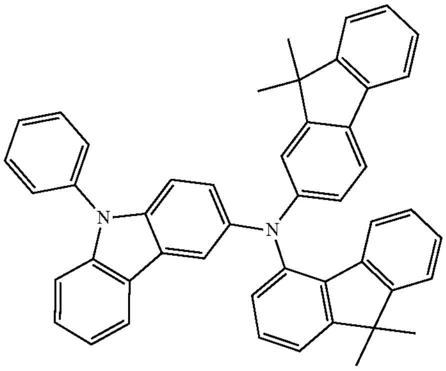
182
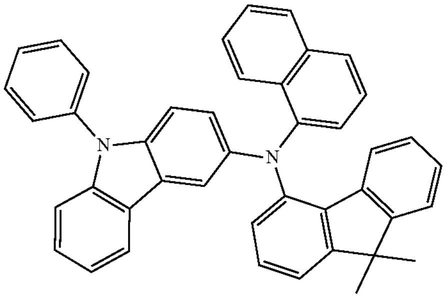
183
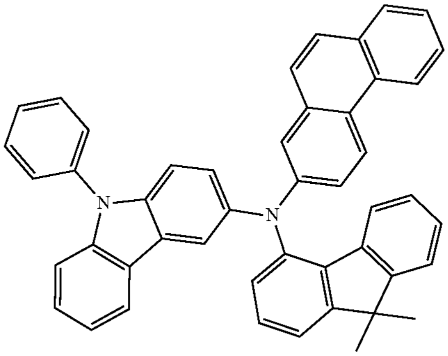
-continued
184
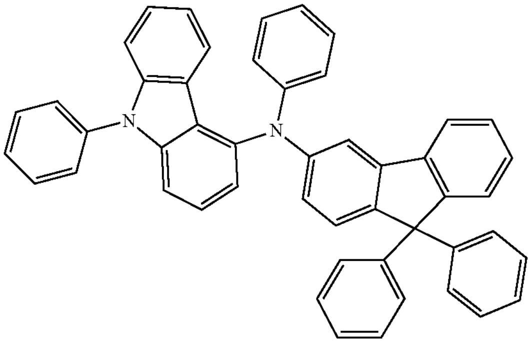
185
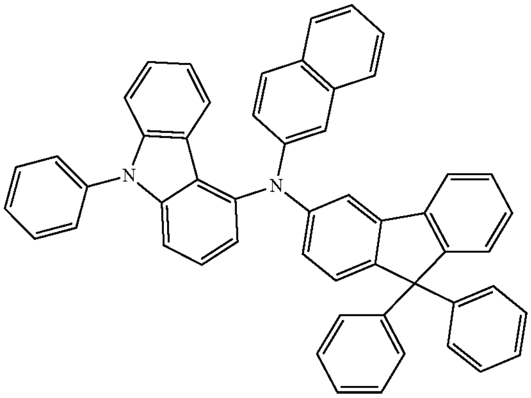
186
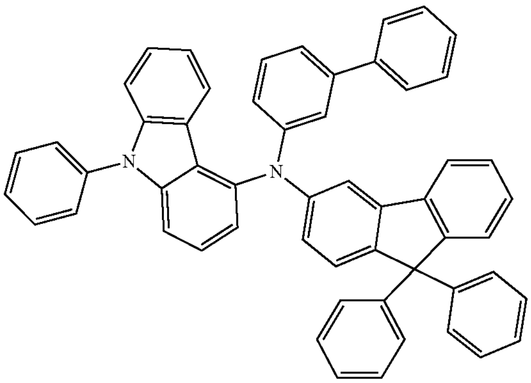
187
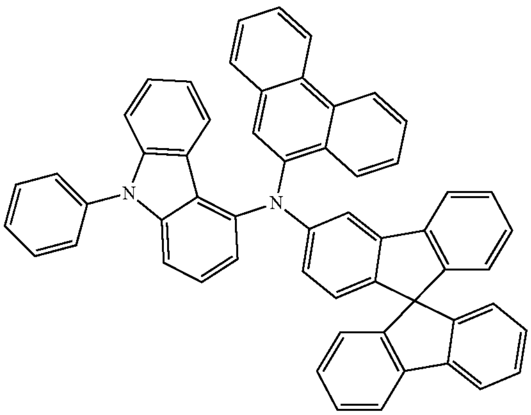

-continued
188
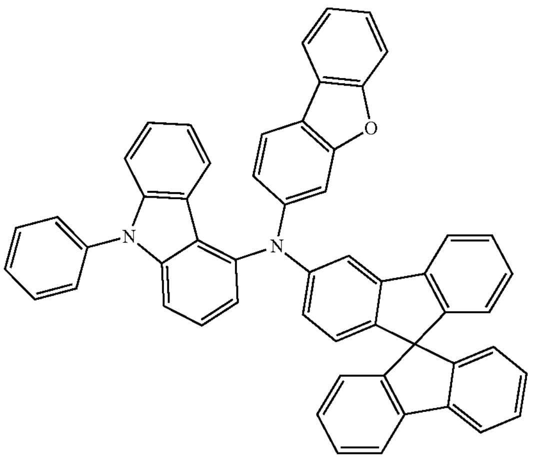
189
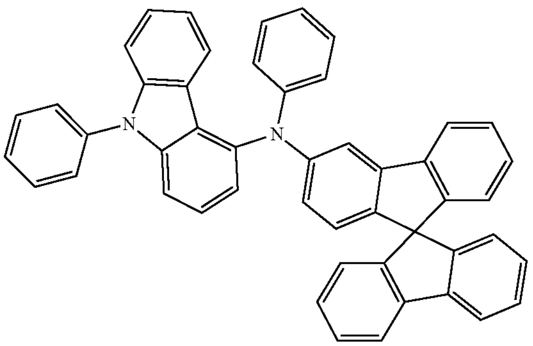
190
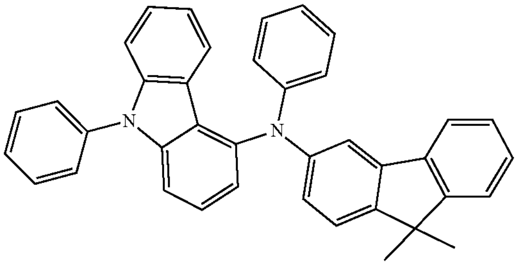
191
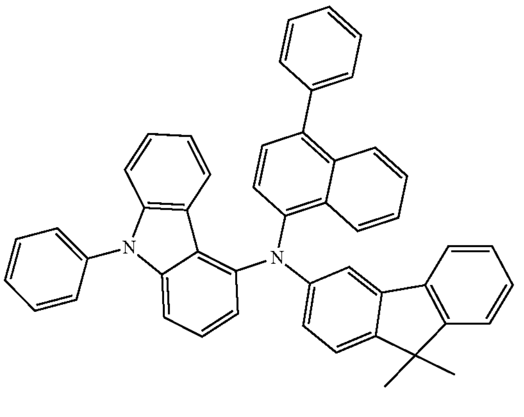
-continued
192
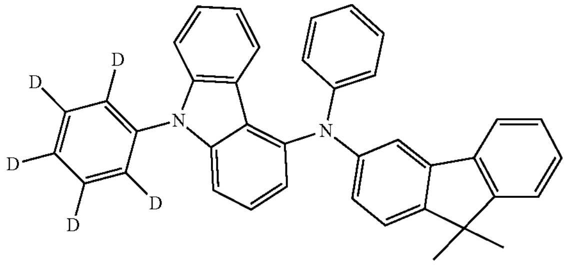
193
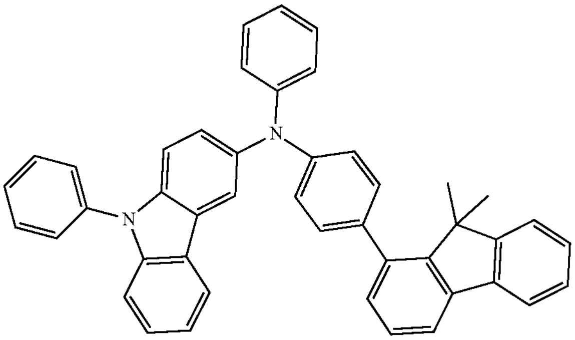
194
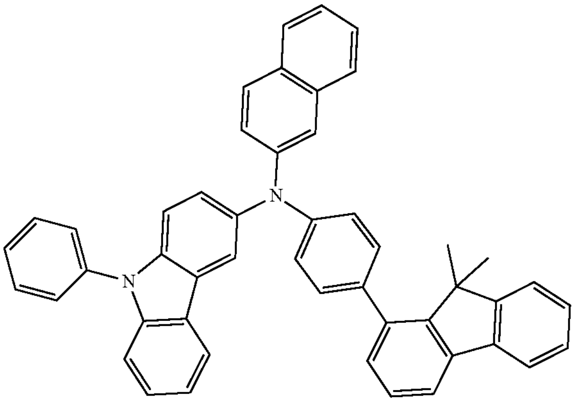
195
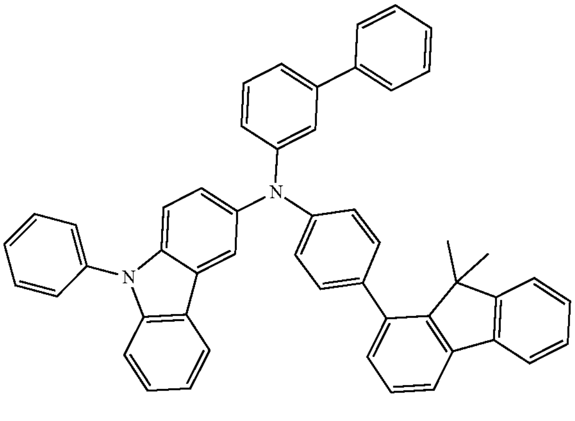

-continued
196
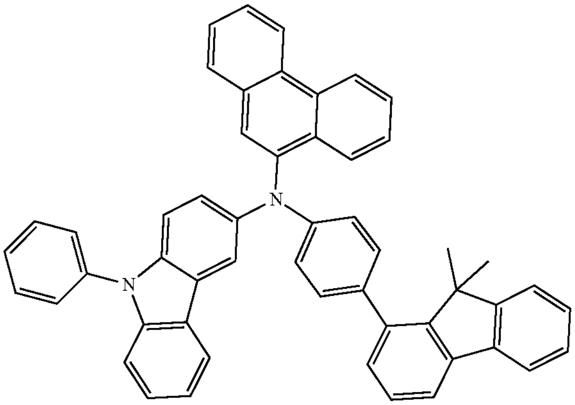
197
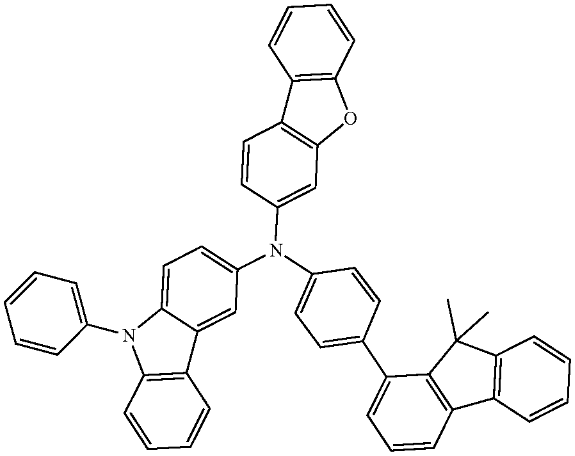
198
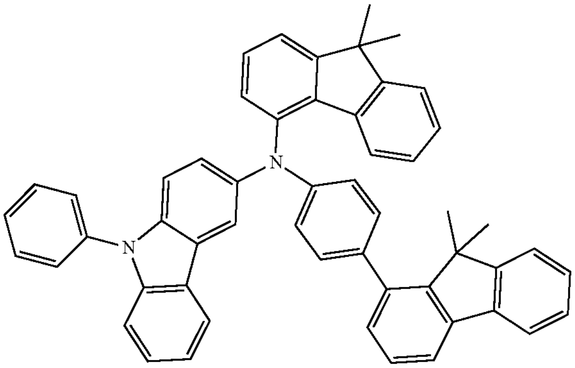
-continued
199
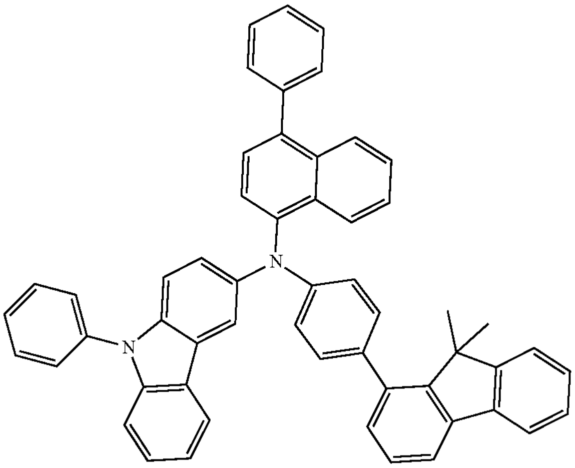
200
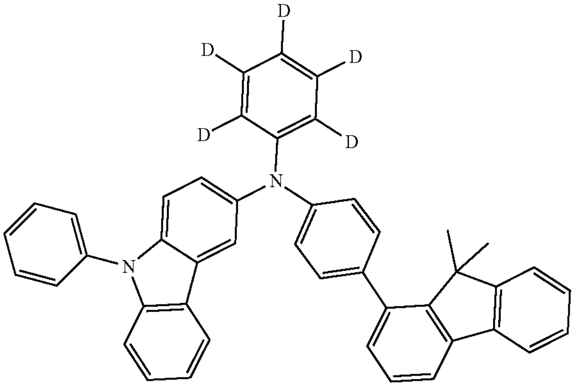
201
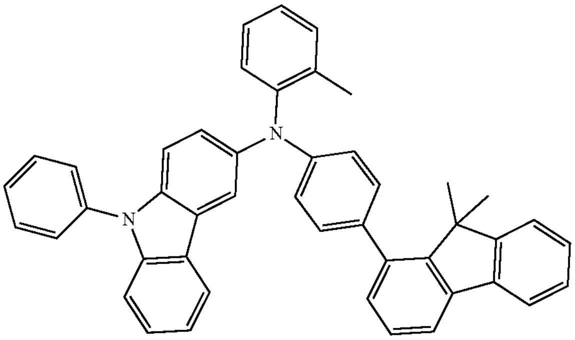
202
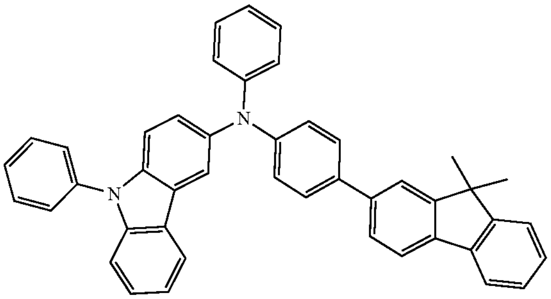

-continued
203
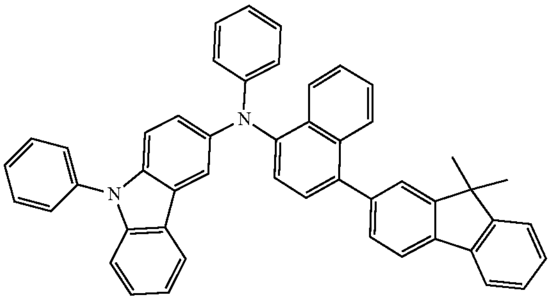
204
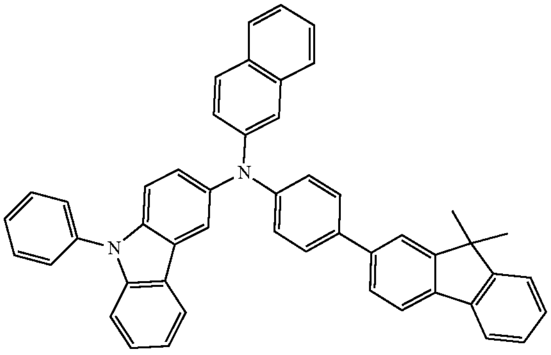
205
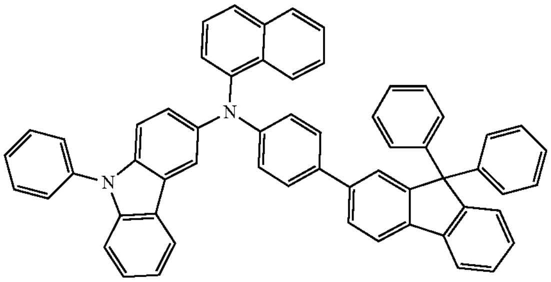
206
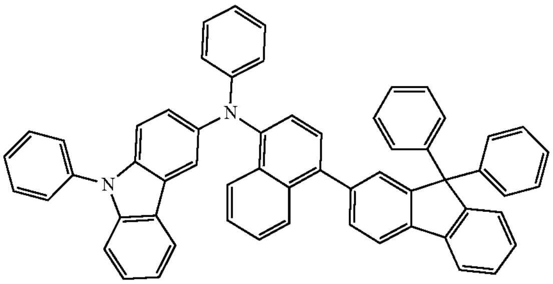
207
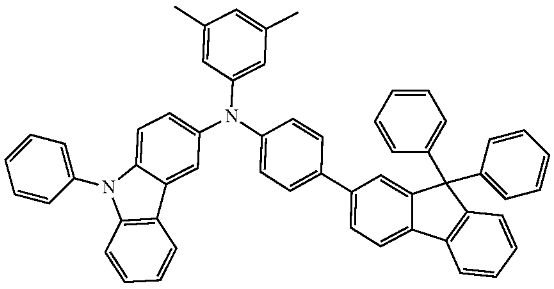
-continued
208
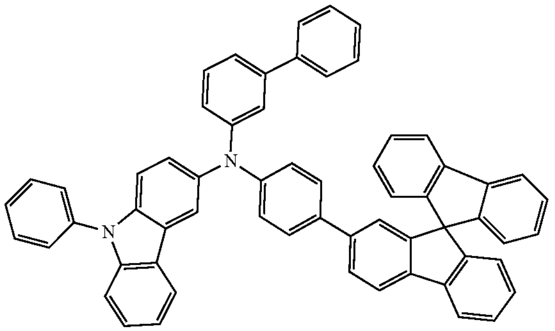
209
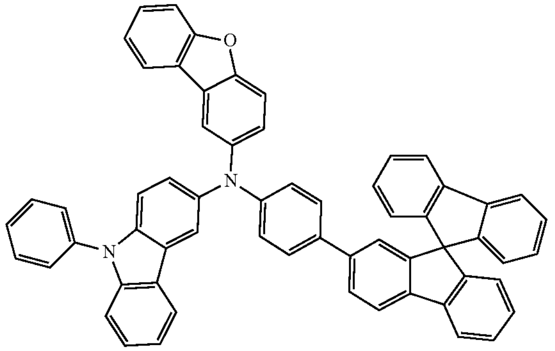
210
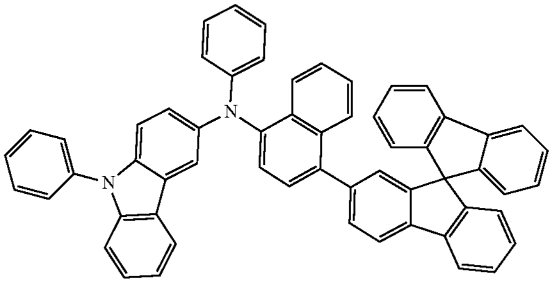
211
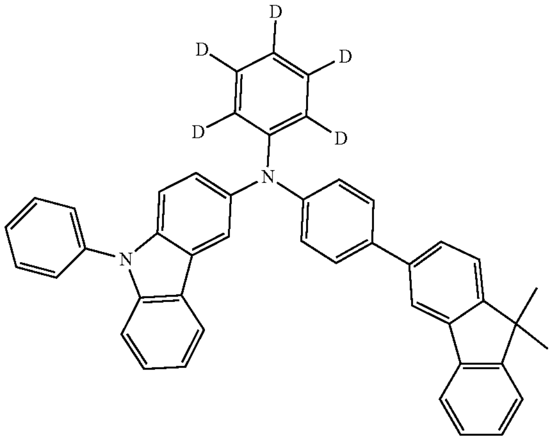

-continued
212
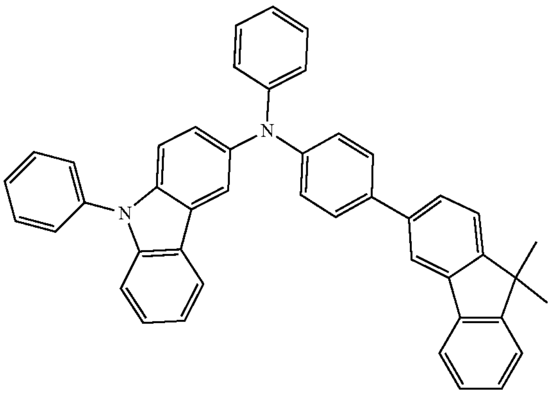
213
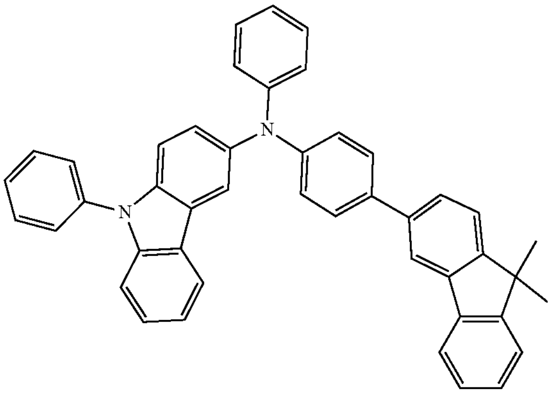
214
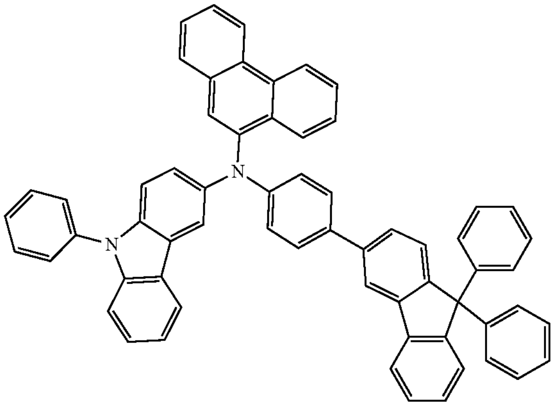
215
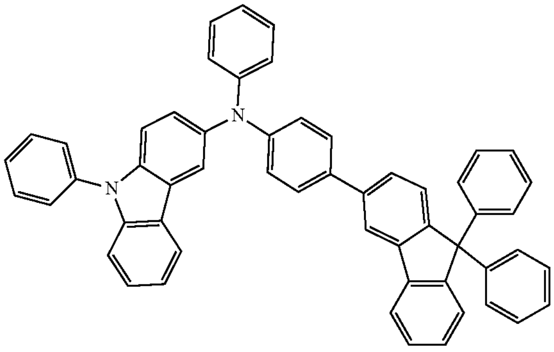
-continued
216
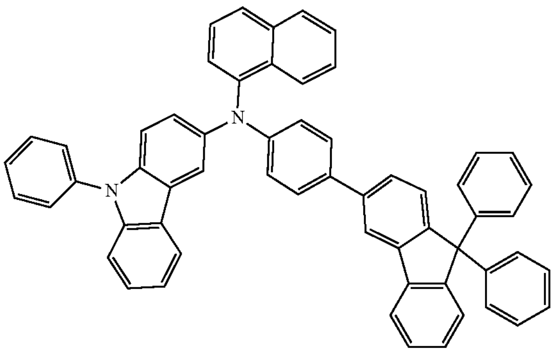
217
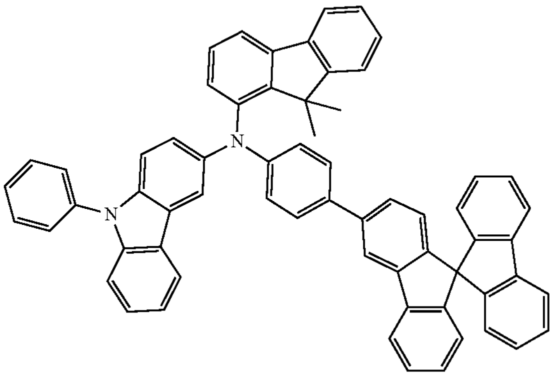
218
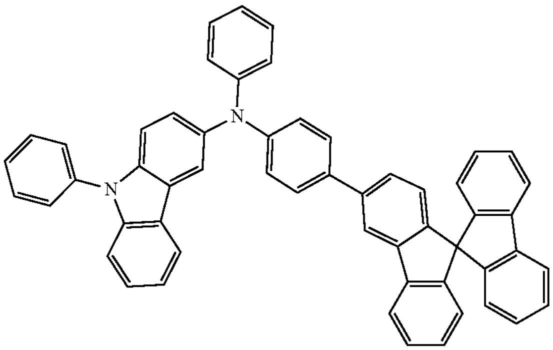
219
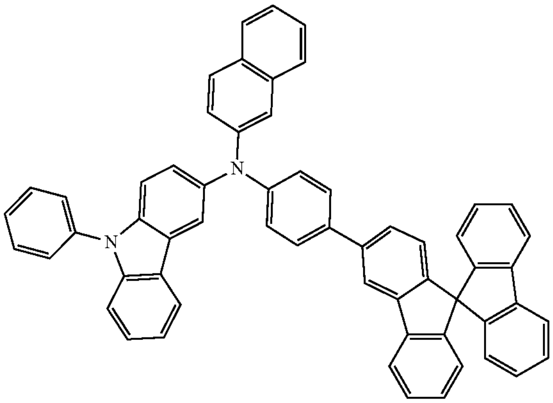

-continued
220
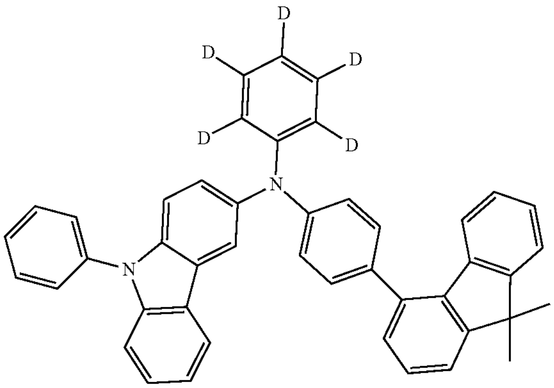
221
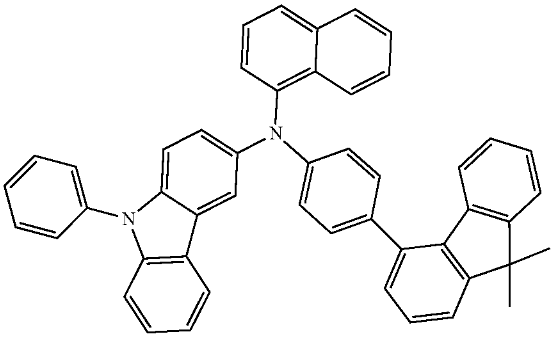
222
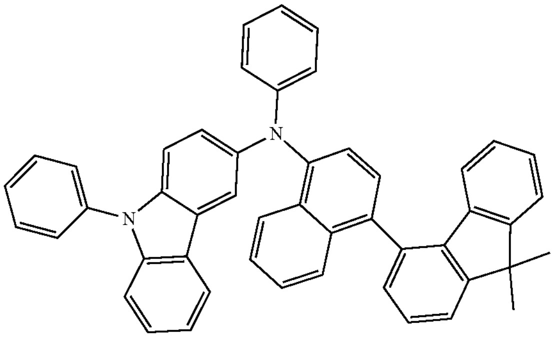
223
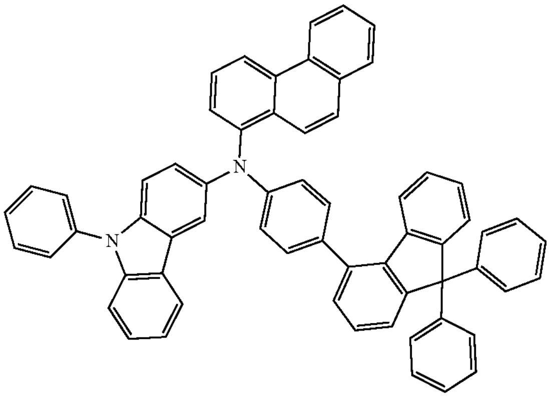
-continued
224
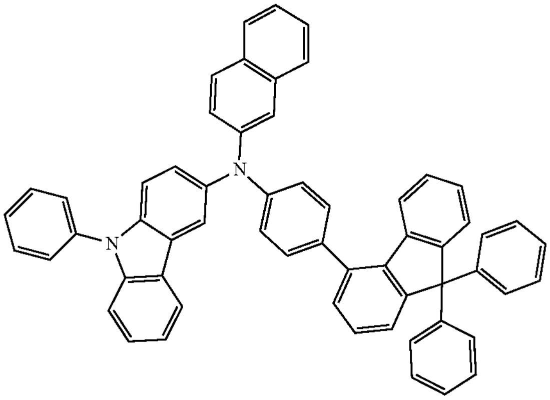
225
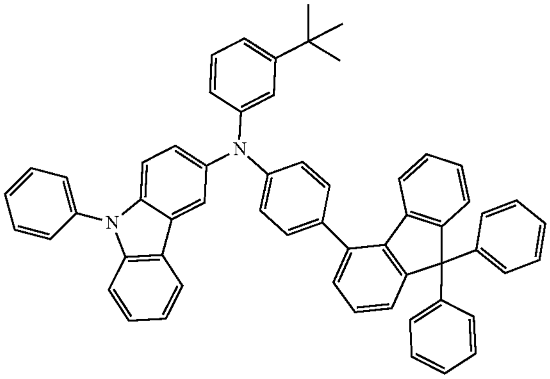
226
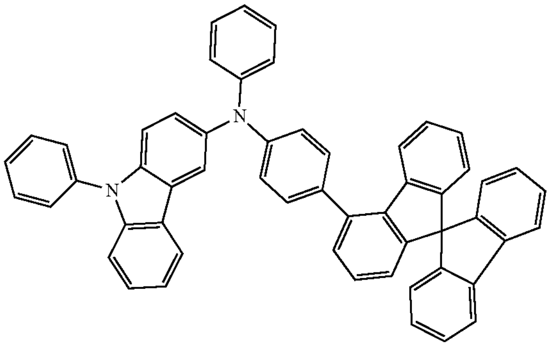
227
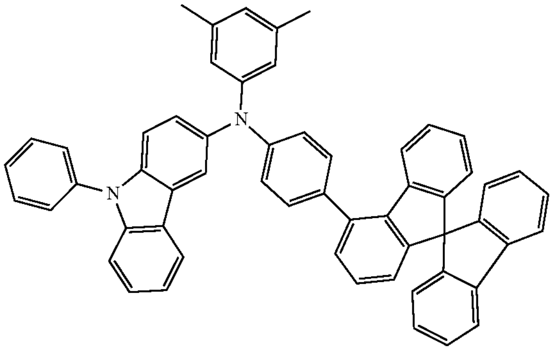

-continued
228
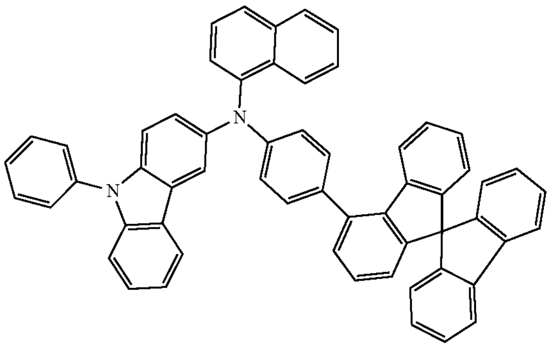
229
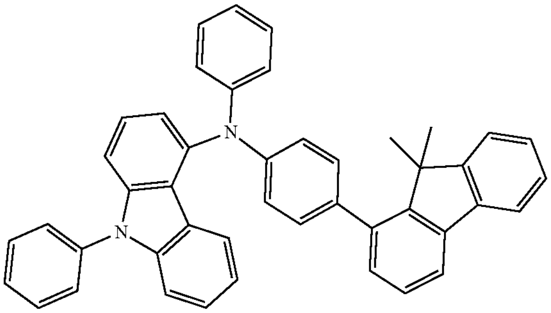
230
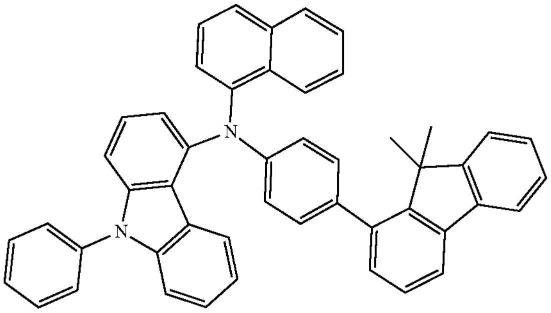
231
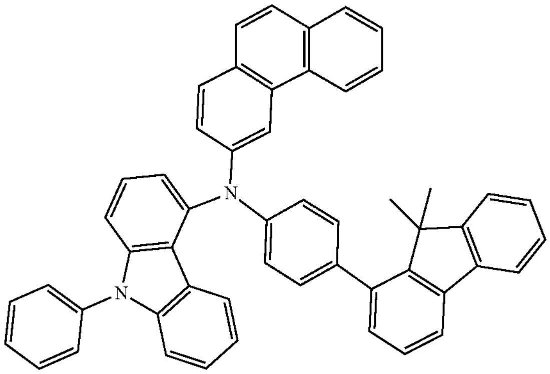
-continued
232
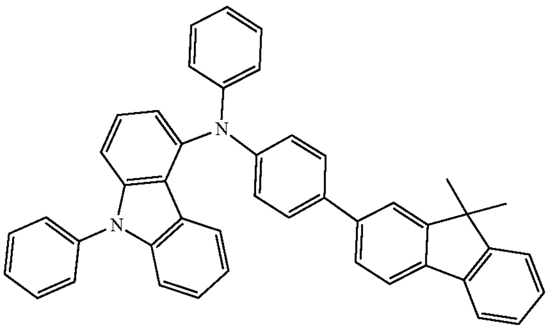
233
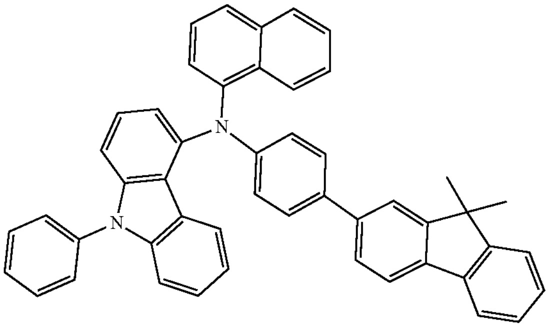
234
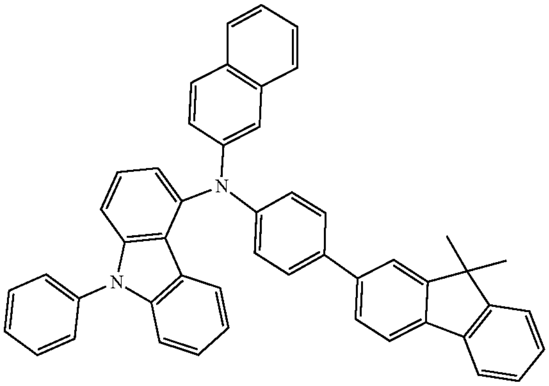
235
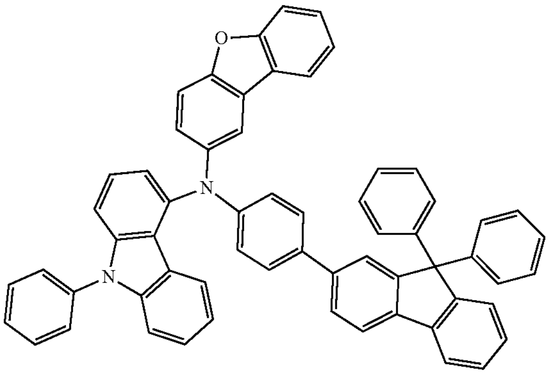

-continued
236
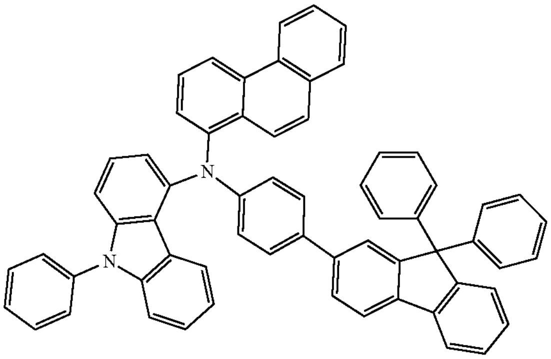
237
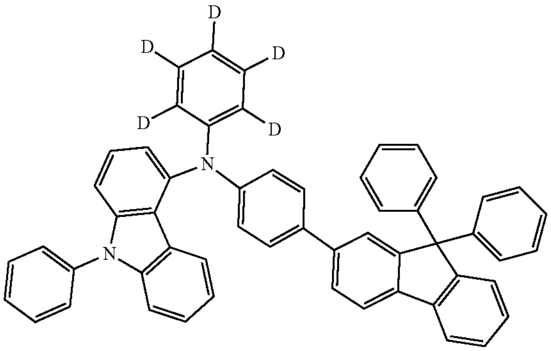
238
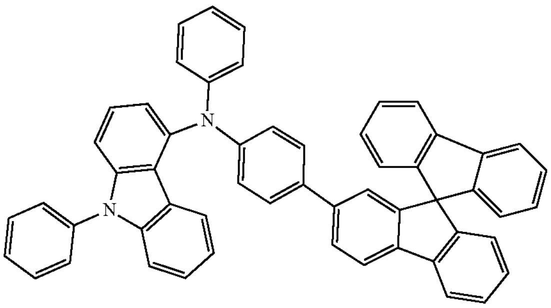
239
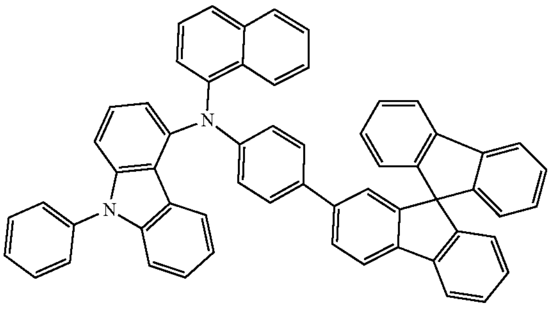
-continued
240
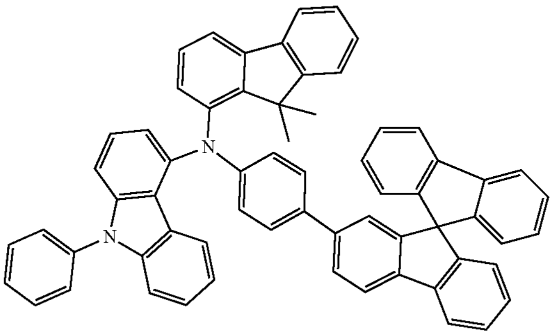
241
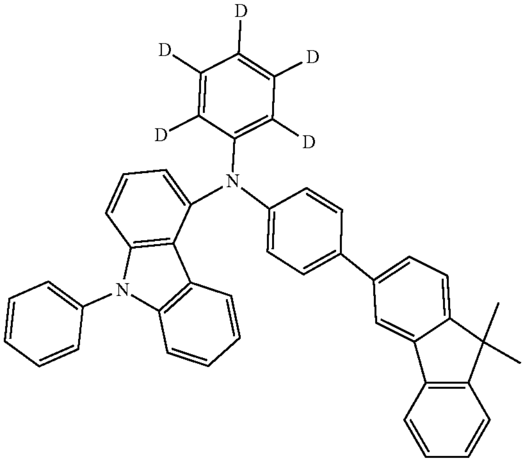
242
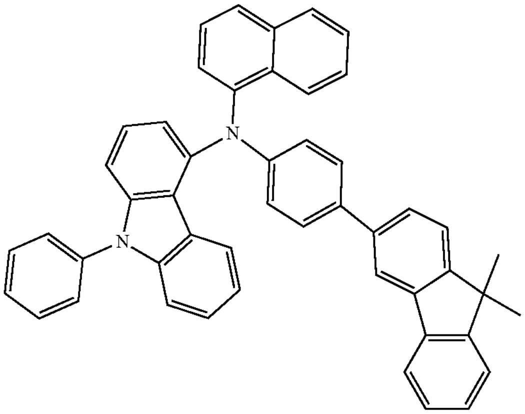

-continued
243
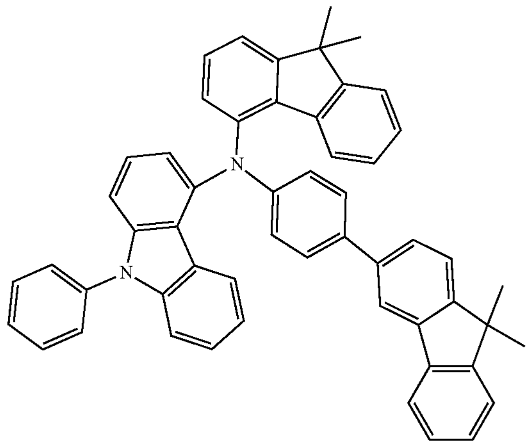
244
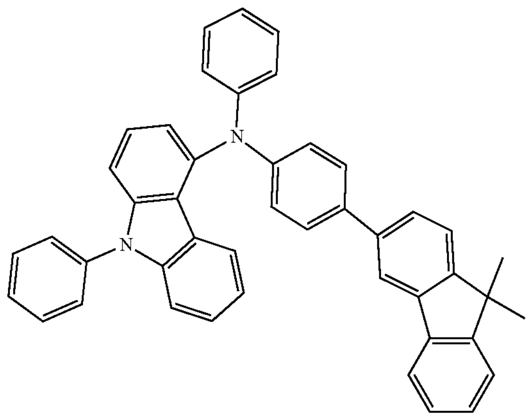
245
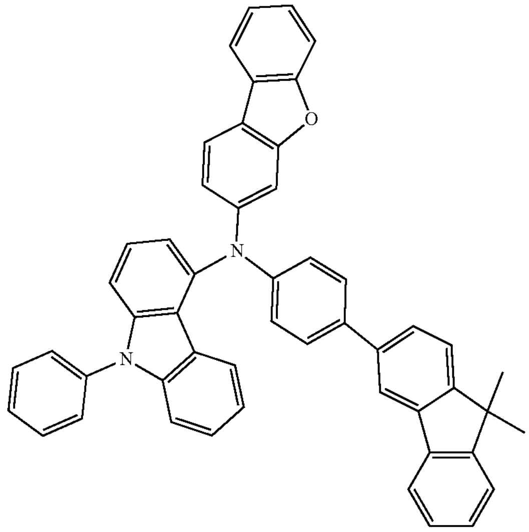
-continued
246
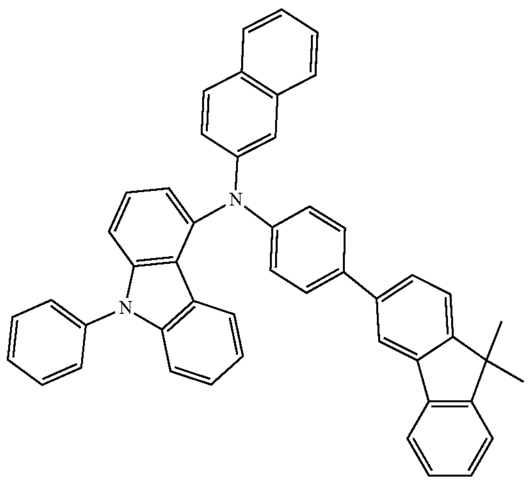
247
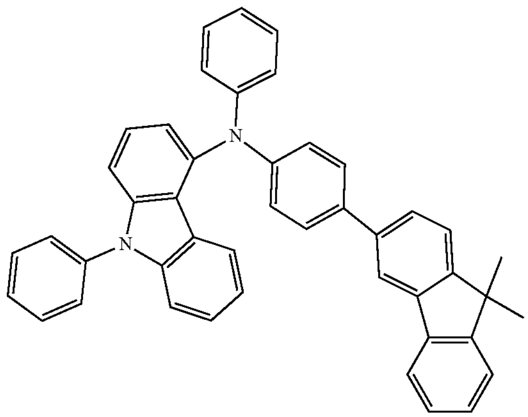
248
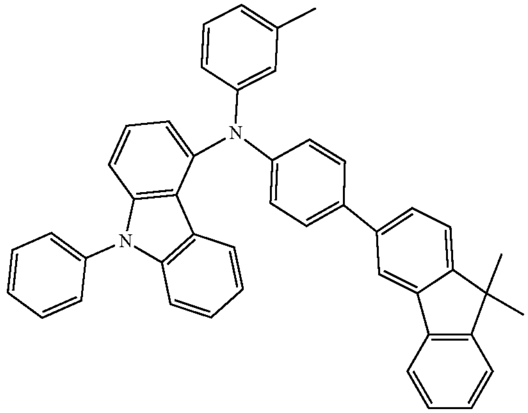

-continued
249
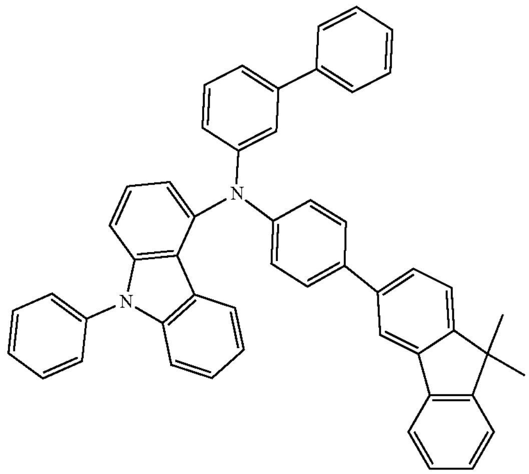
250
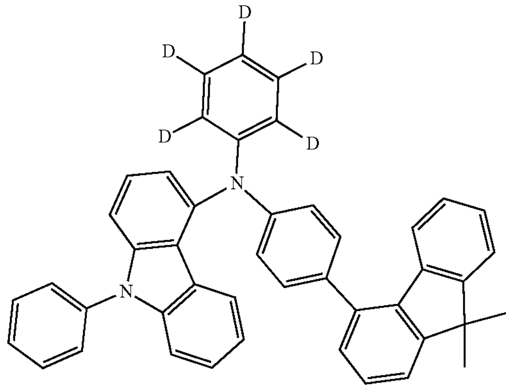
251
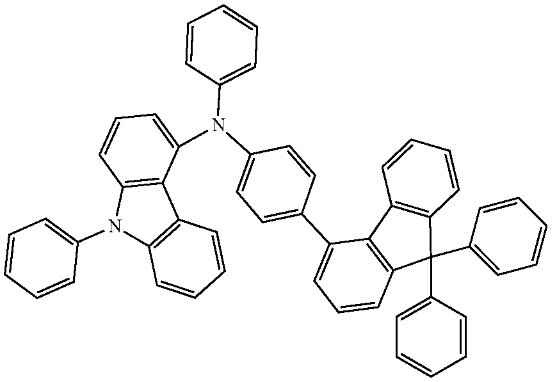
-continued
252
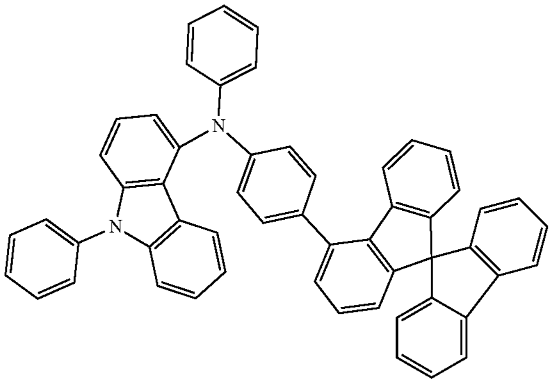
253
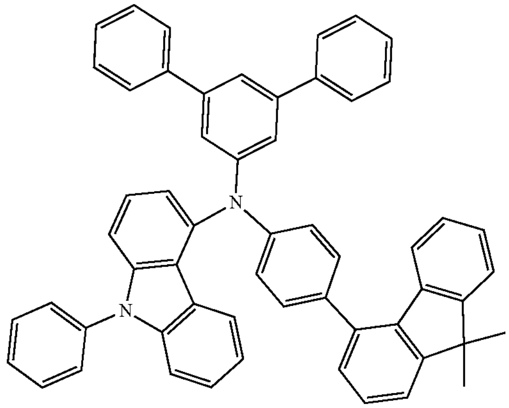
254
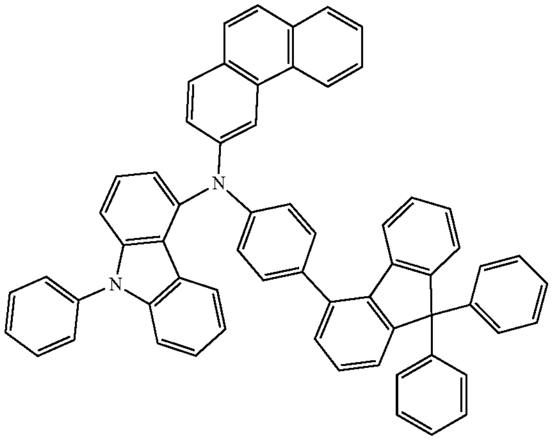

-continued

255

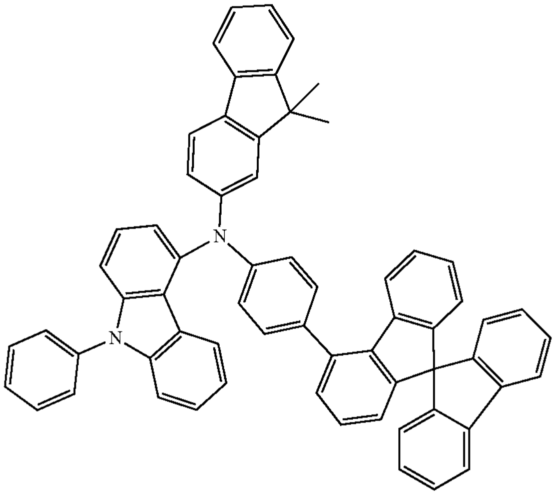

In addition, more specifically, the polycyclic aromatic derivative compound represented by [Formula B] or [Formula C] according to the present invention, used as the dopant for the light-emitting layer, is selected from the following compounds, which clearly show specific substituents, but these compounds should not be construed as limiting the scope of [Formula B] or [Formula C] according to the present invention.

1

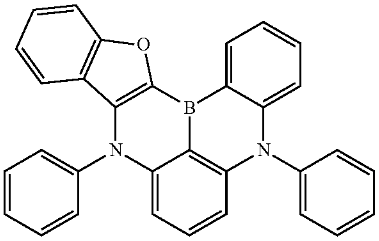

2

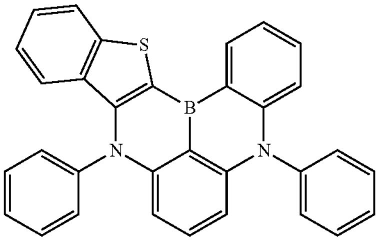

3

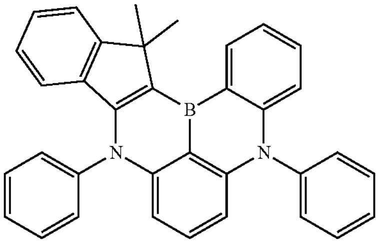

-continued

4

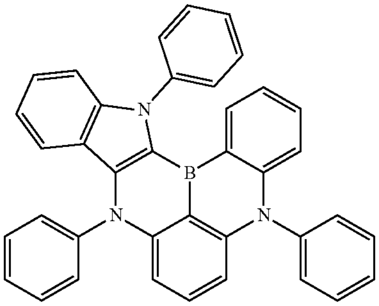

5

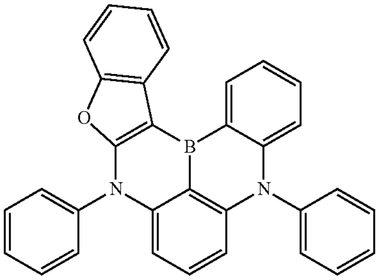

6

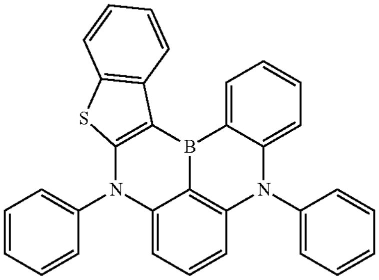

7

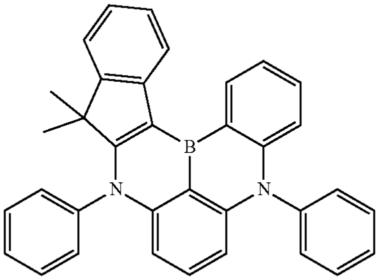

8

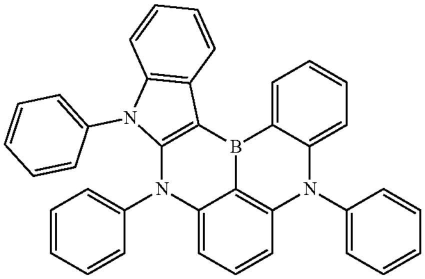

-continued
9
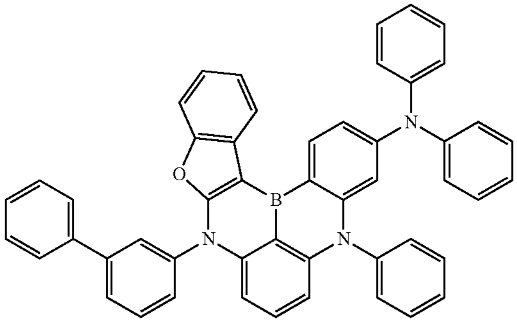
10
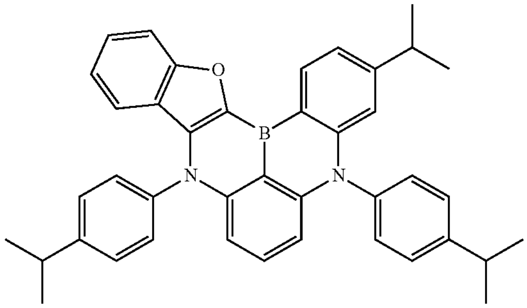
11
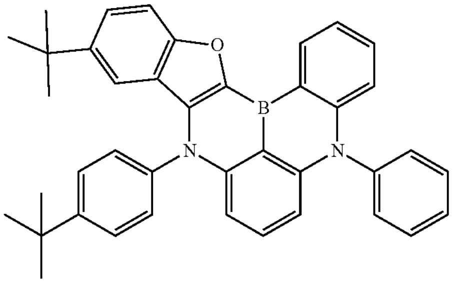
12
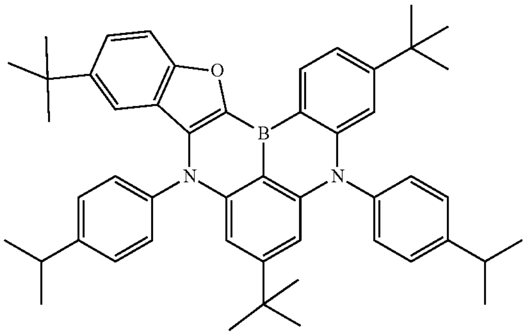
13
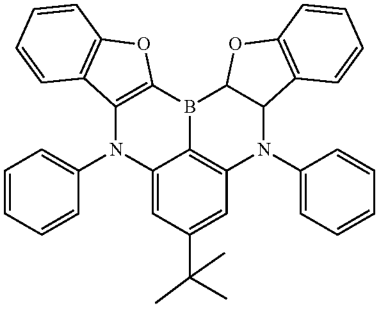
-continued
14
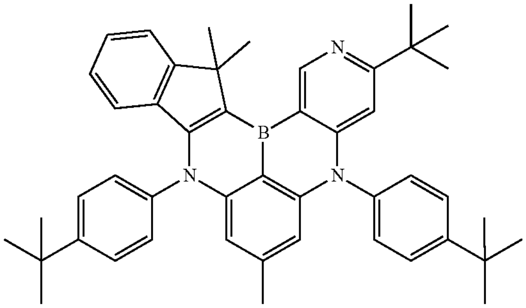
15
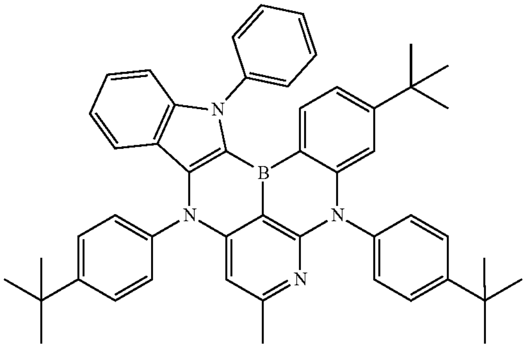
16
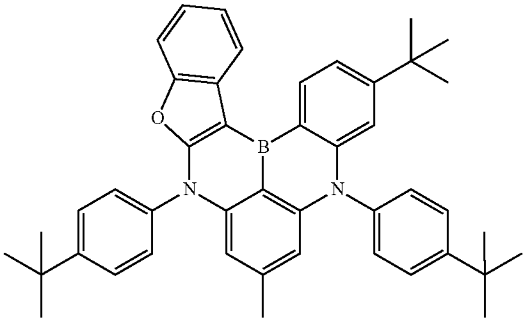
17
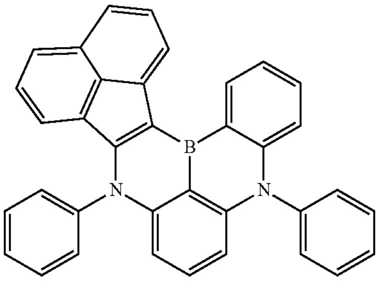

-continued
18
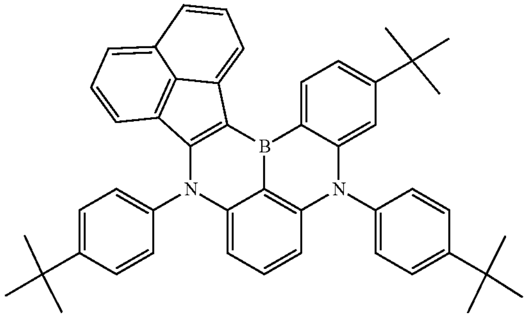
19
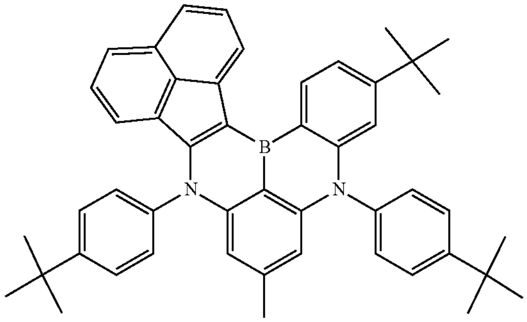
20
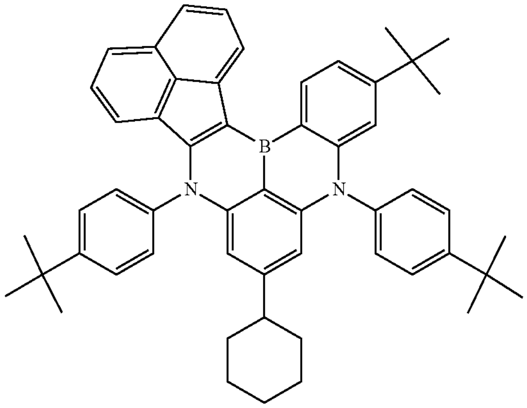
21
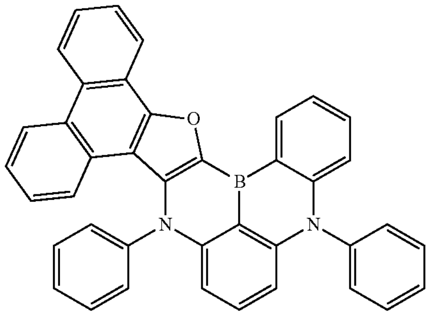
-continued
22
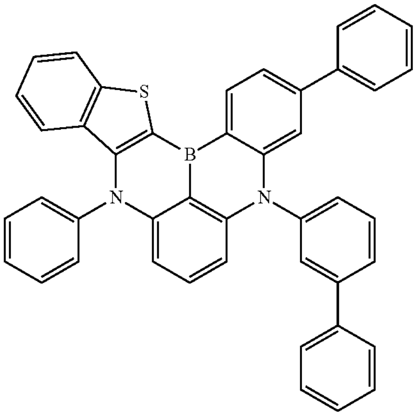
23
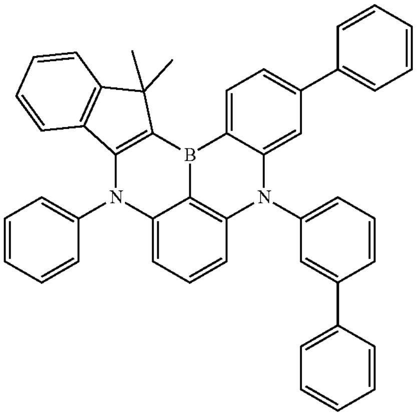
24
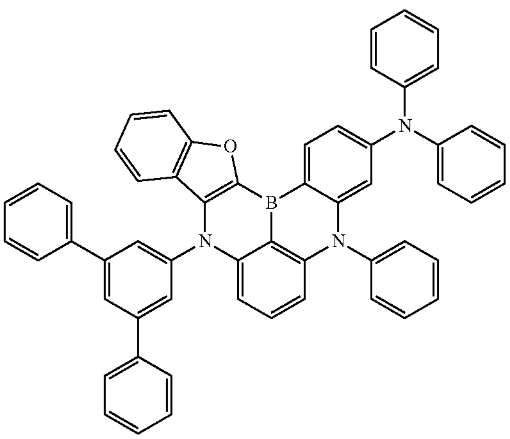

-continued
25
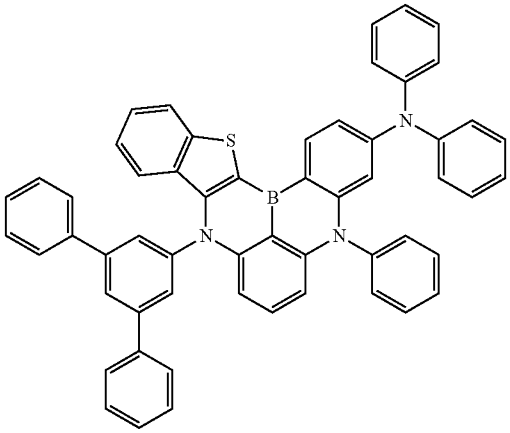
26
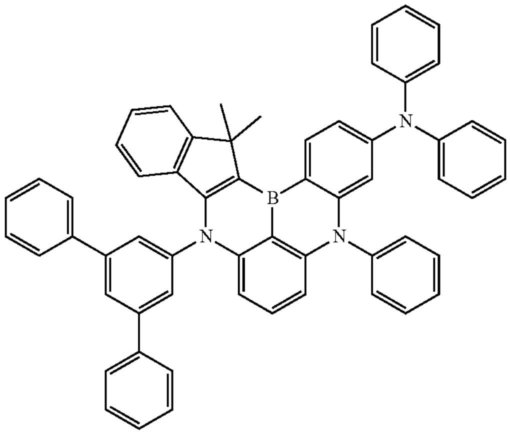
27
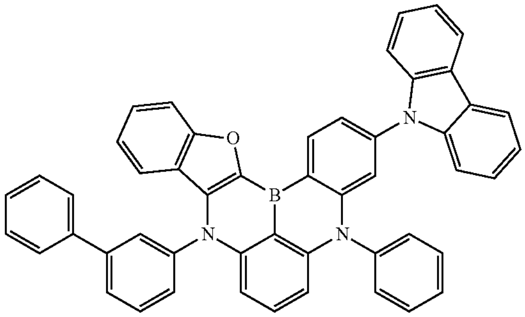
28
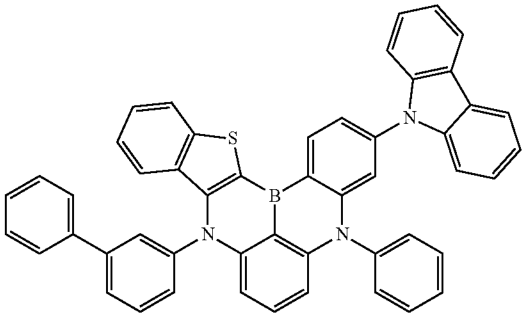
-continued
29
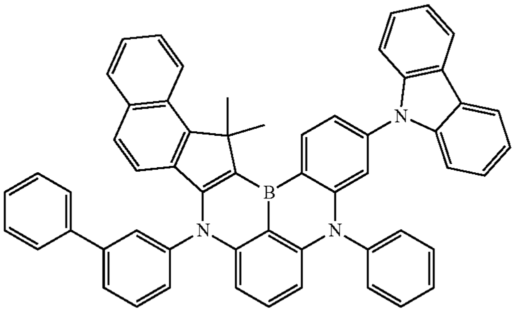
30
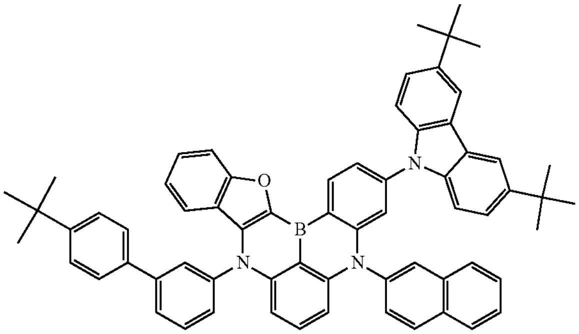
31
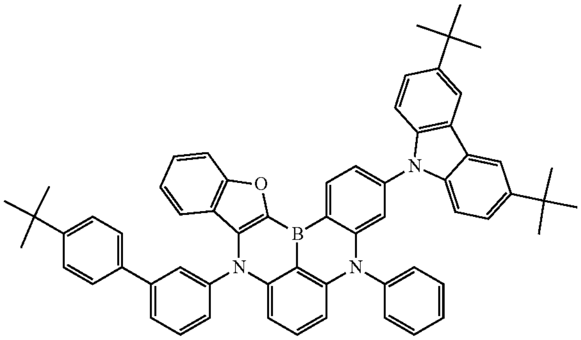
32
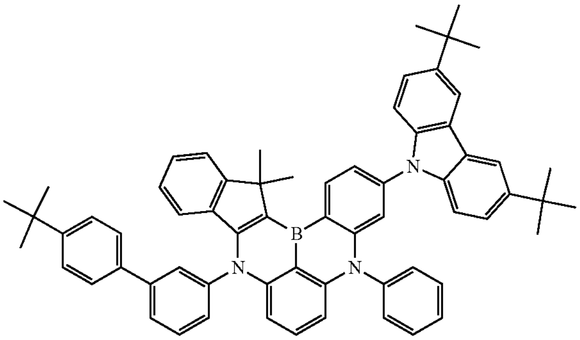

-continued
33
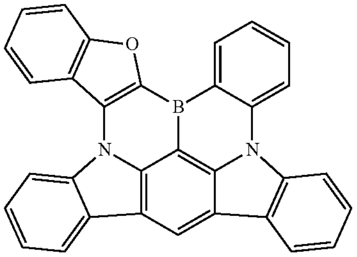
34
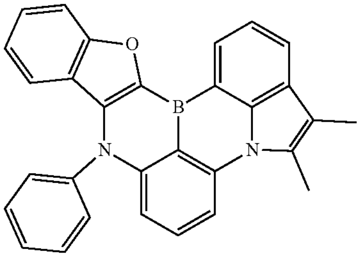
35
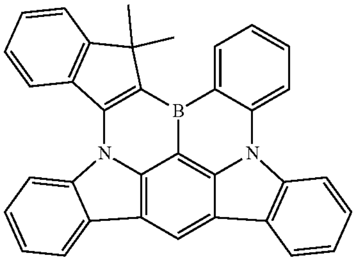
36
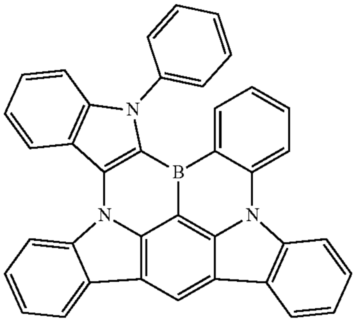
37
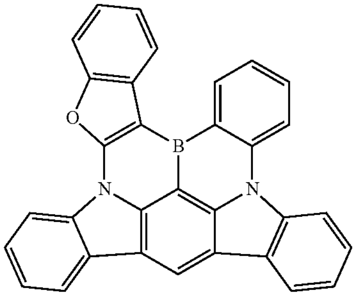
-continued
38
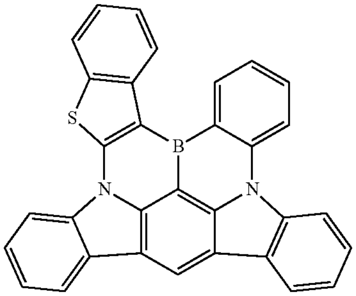
39
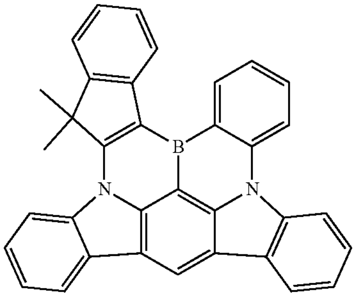
40
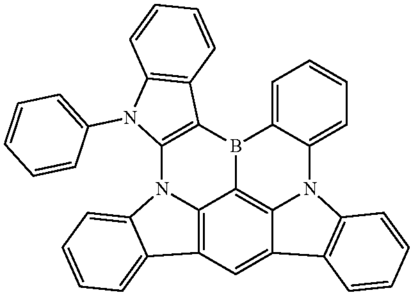
41
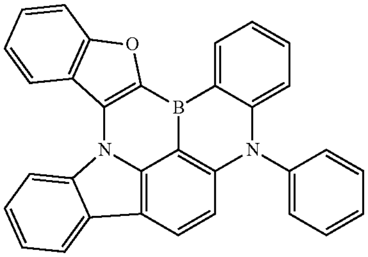
42
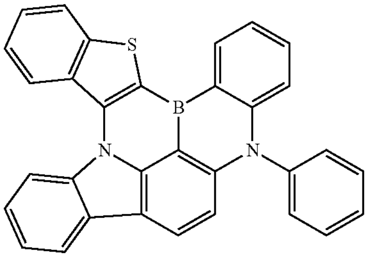

-continued
43
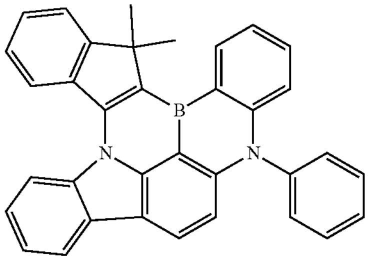
44
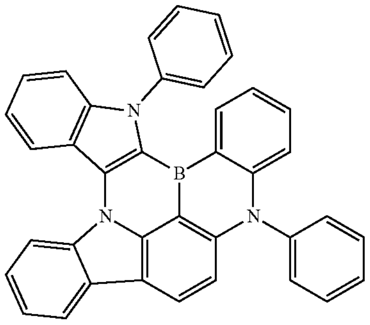
45
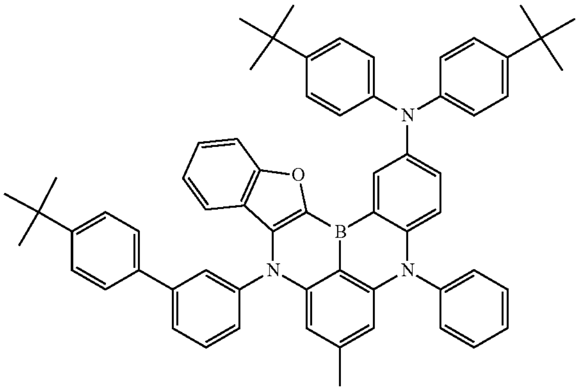
46
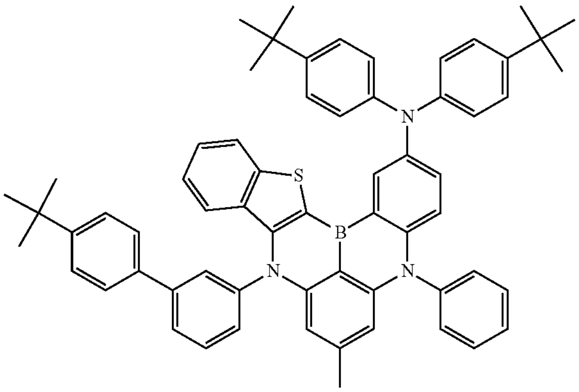
-continued
47
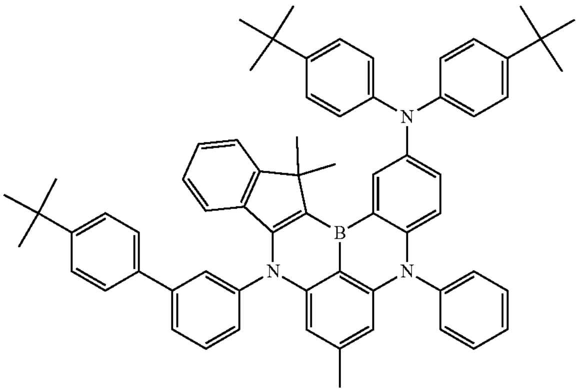
48
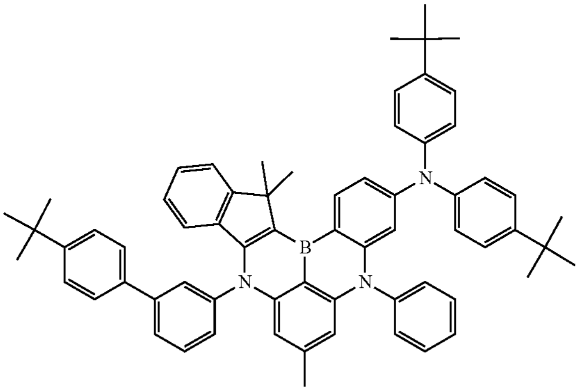
49
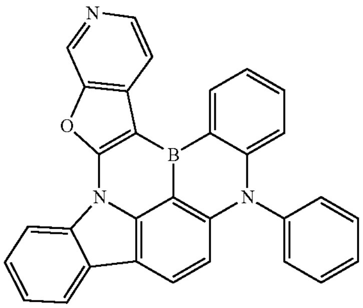
50
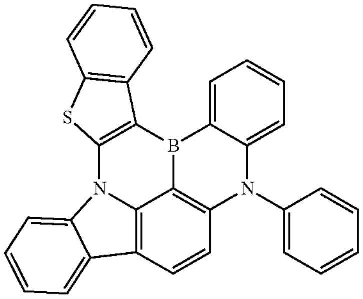

-continued
51
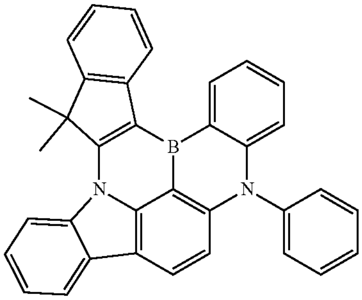
52
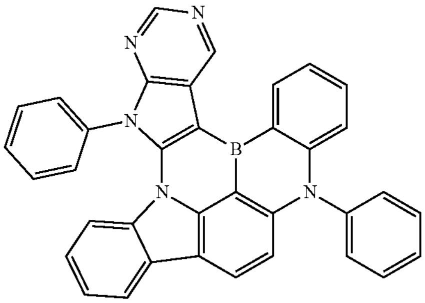
53
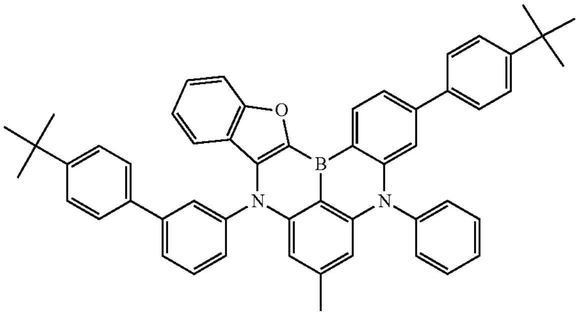
54
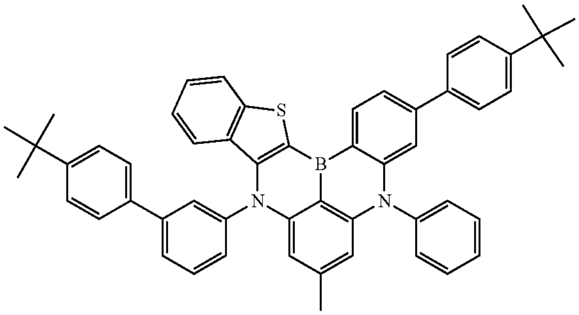
55
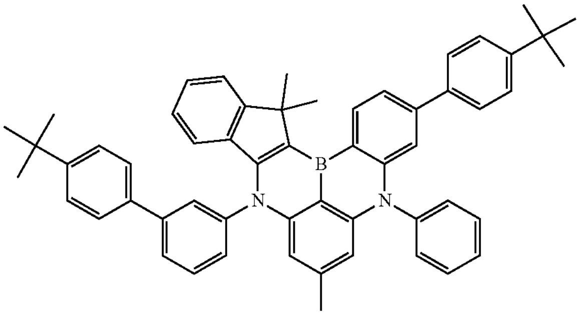
-continued
56
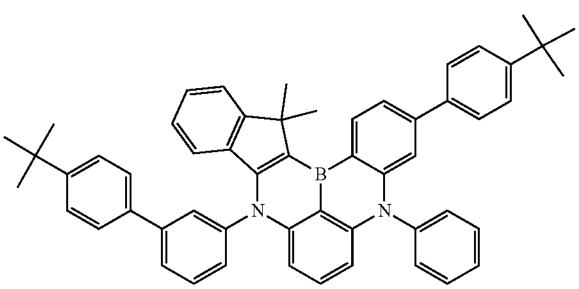
57
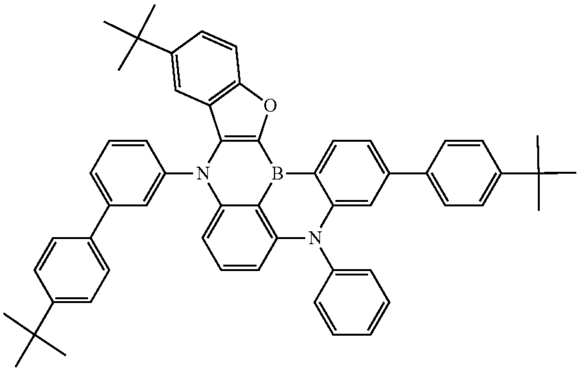
58
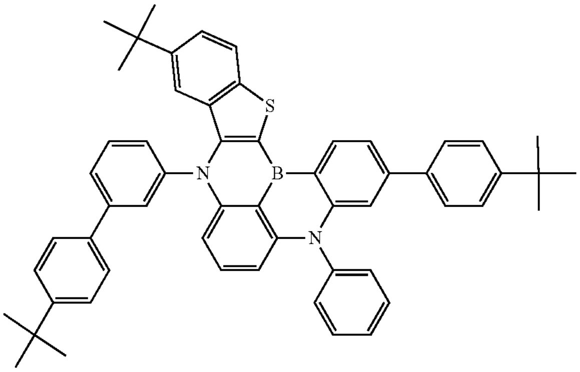
59
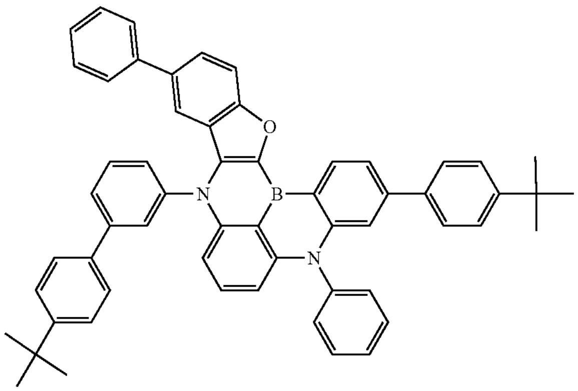

-continued
60
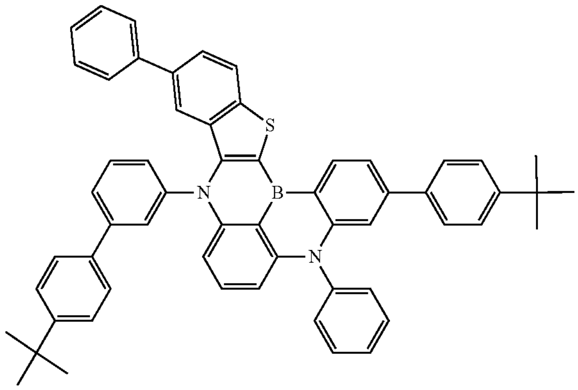
61
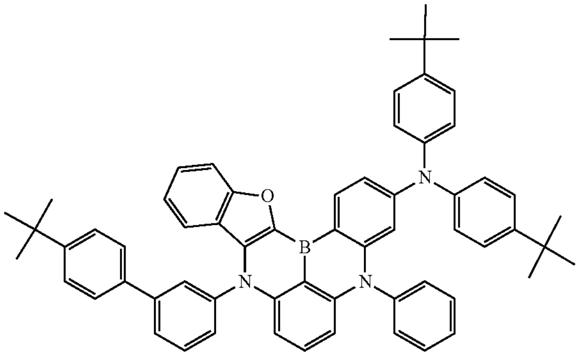
62
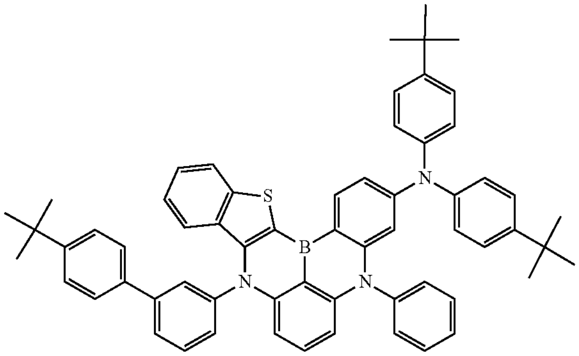
63
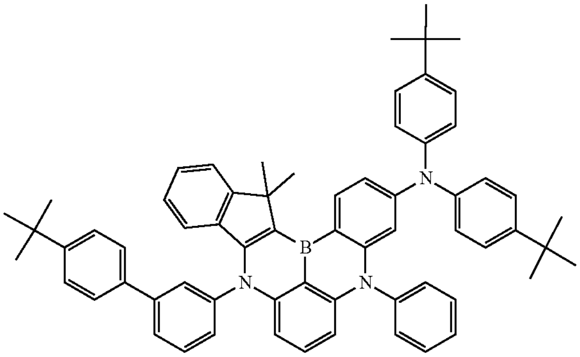
-continued
64
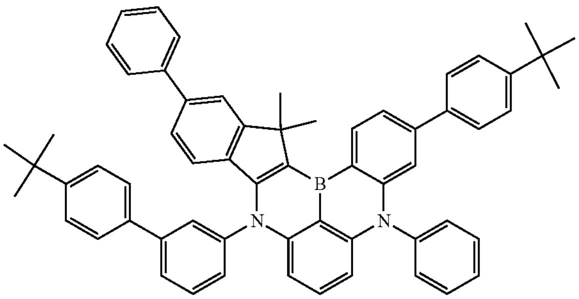
65
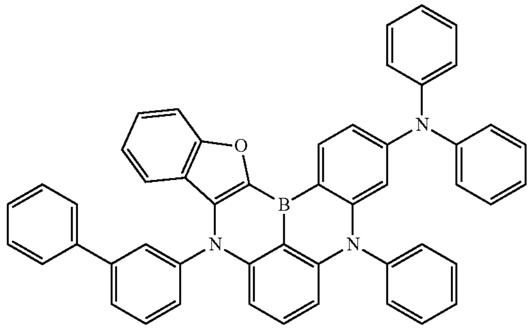
66
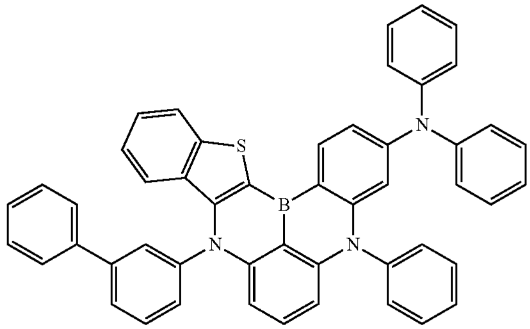
67
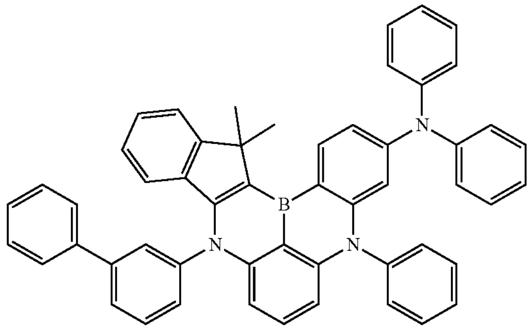

-continued
68
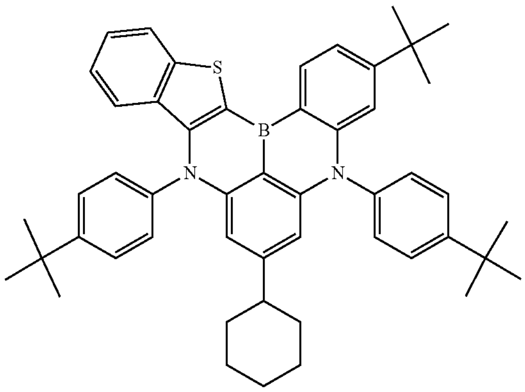
69
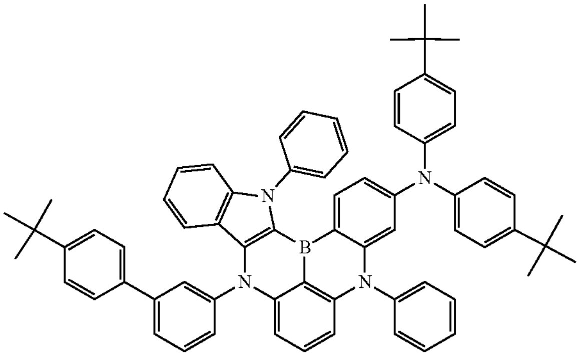
70
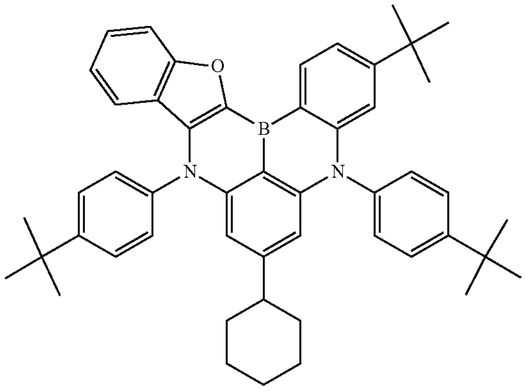
71
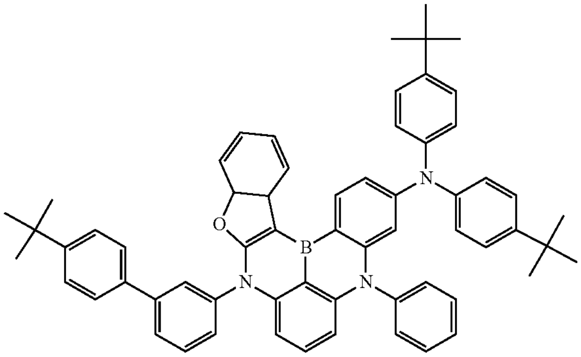
-continued
72
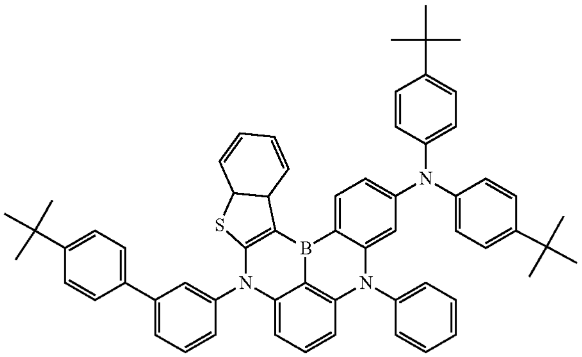
73
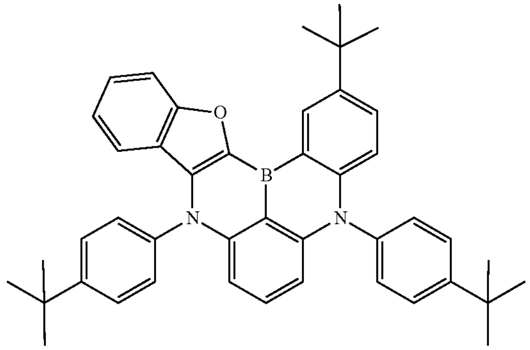
74
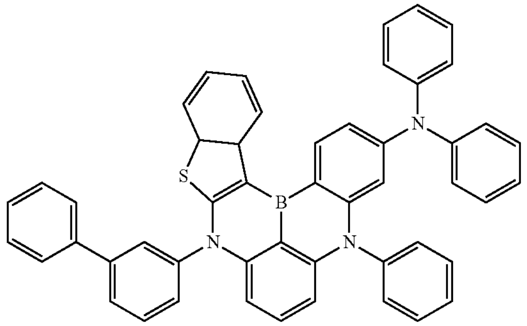
75
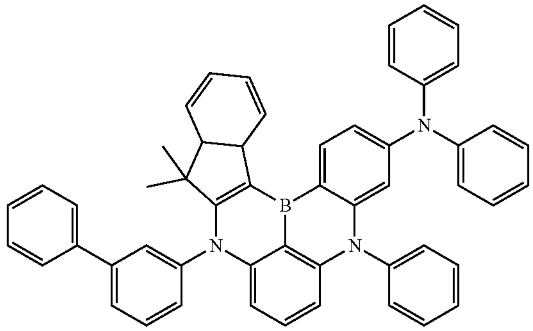

-continued
76
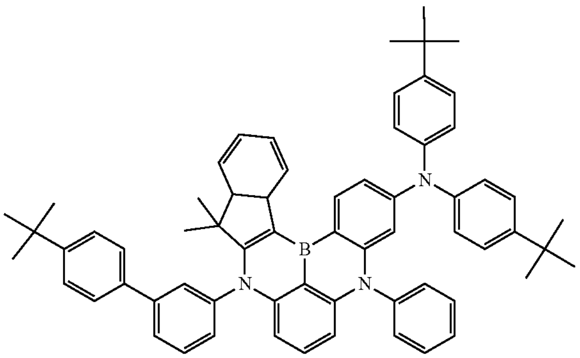
77
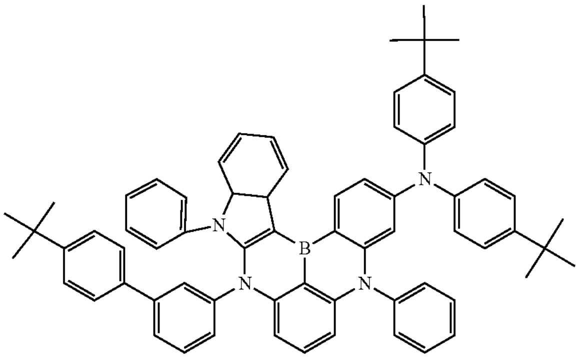
78
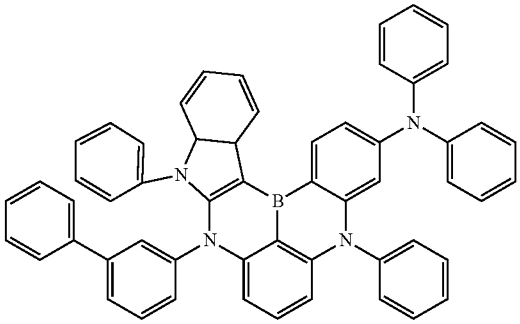
79
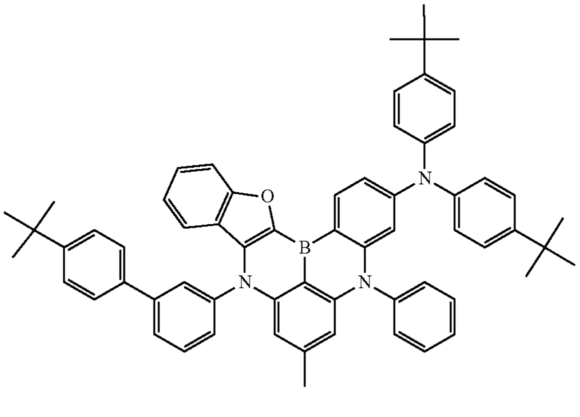
-continued
80
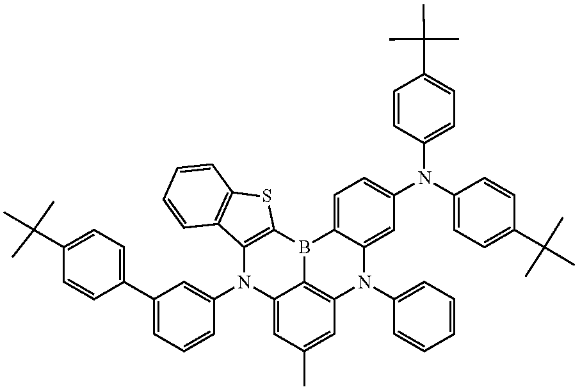
81
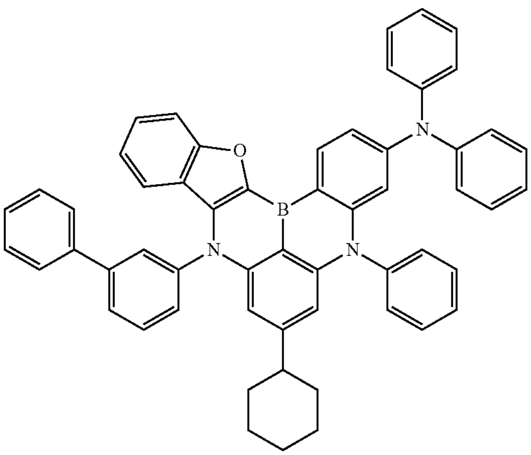
82
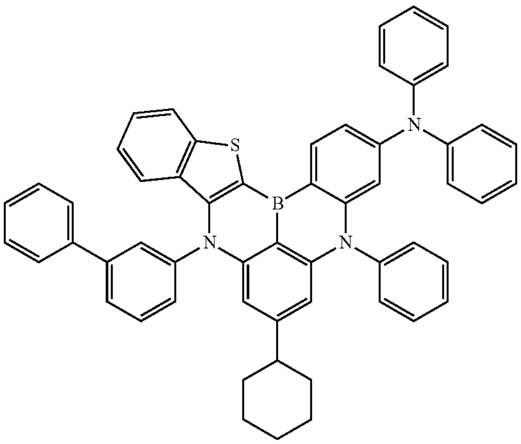

-continued
83
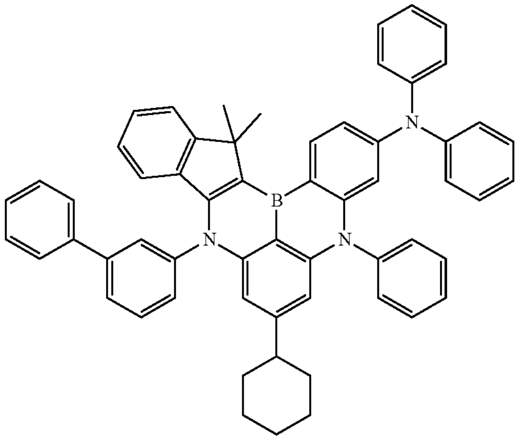
84
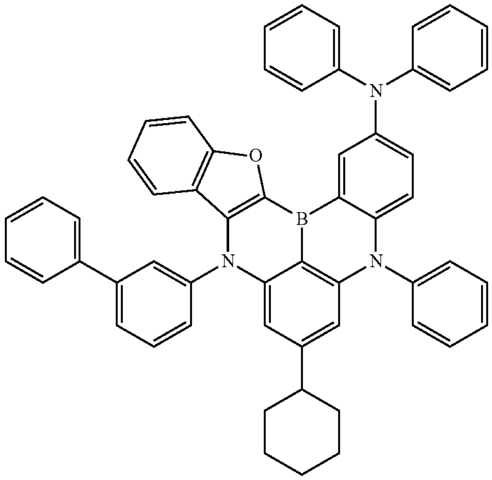
85
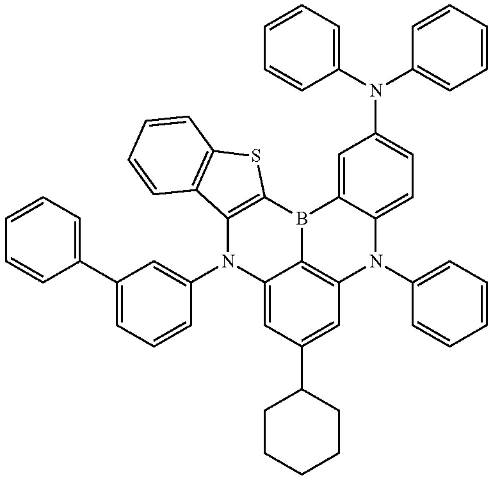
86
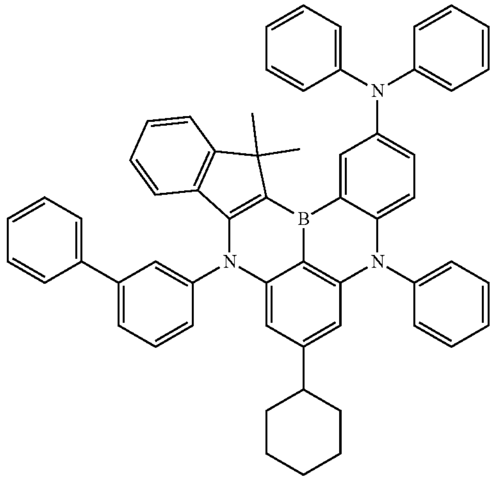
87
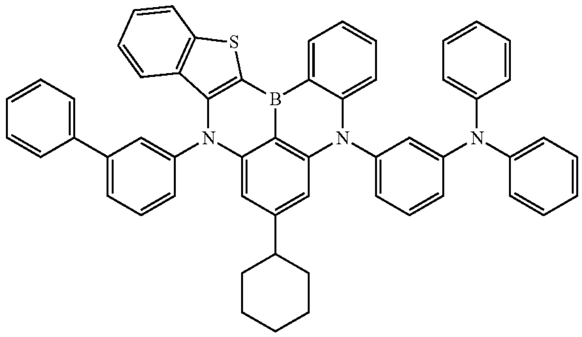
88
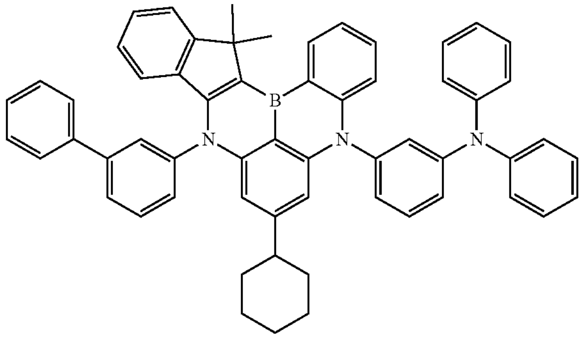
89
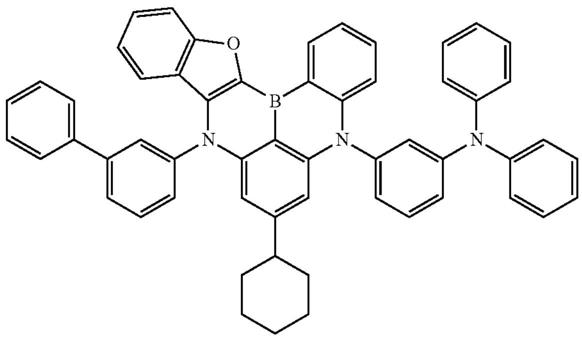

-continued
90
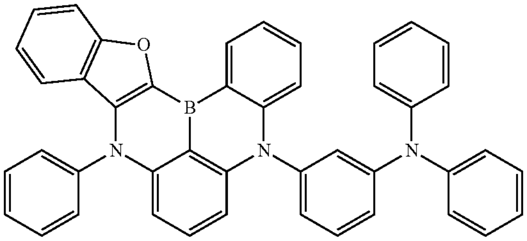
91
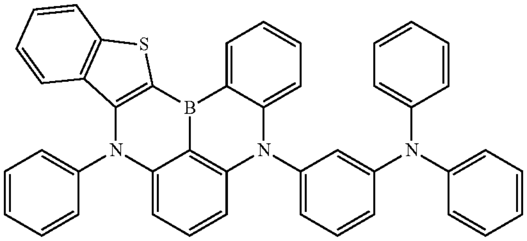
92
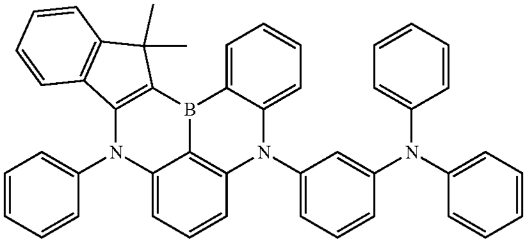
93
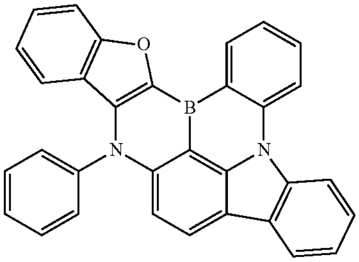
94
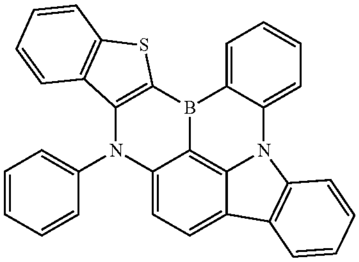
95
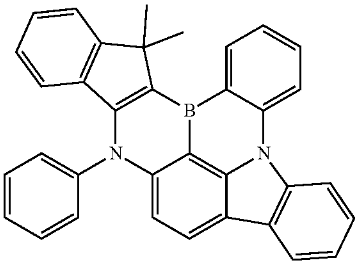
-continued
96
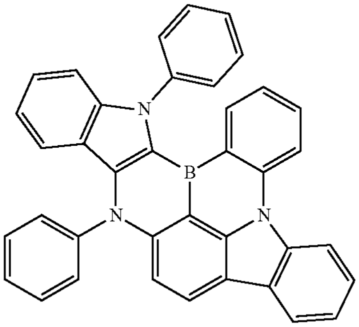
97
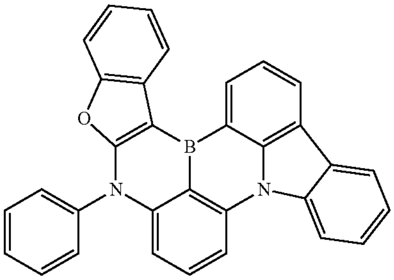
98
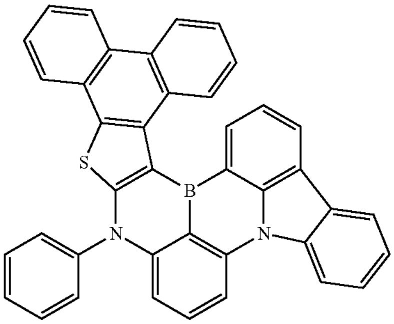
99
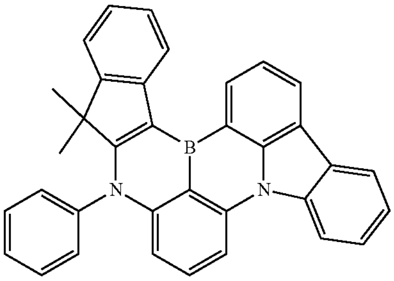
100
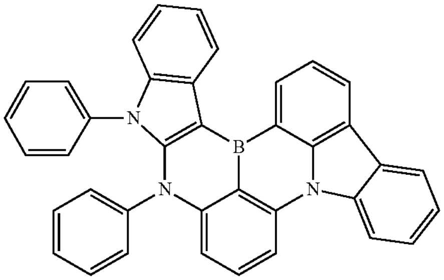

-continued
101
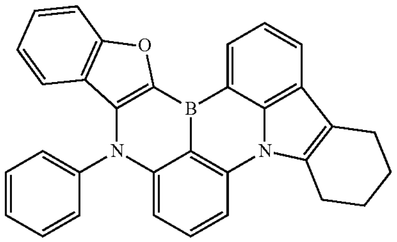
102
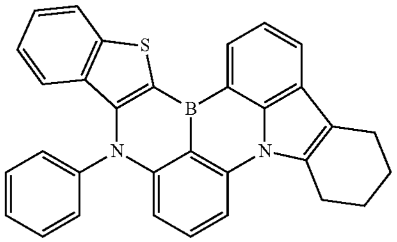
103
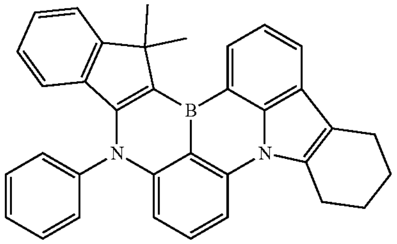
104
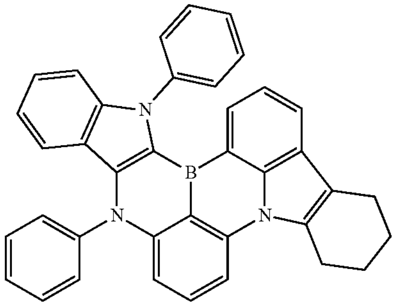
105
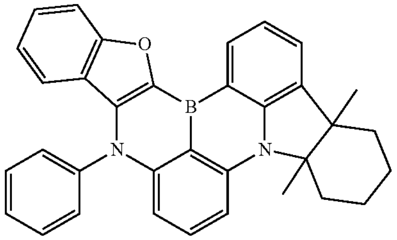
106
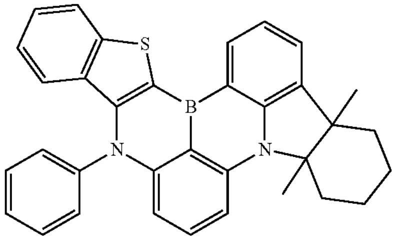
-continued
107
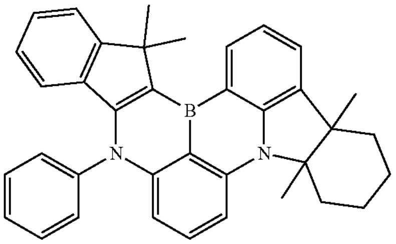
108
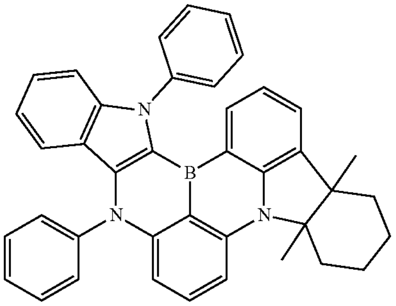
109
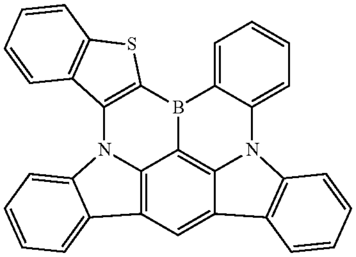
110
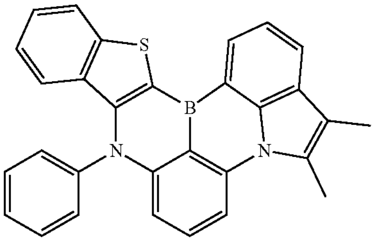
111
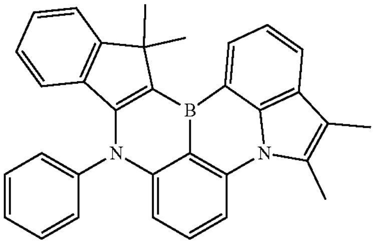
112
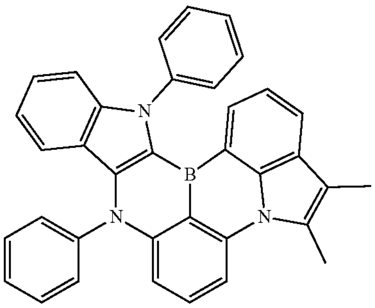

-continued
113
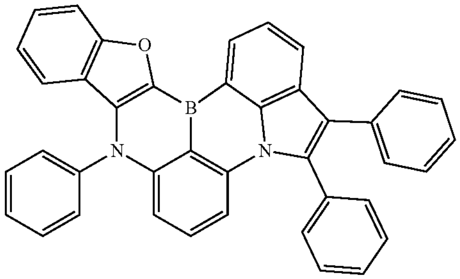
114
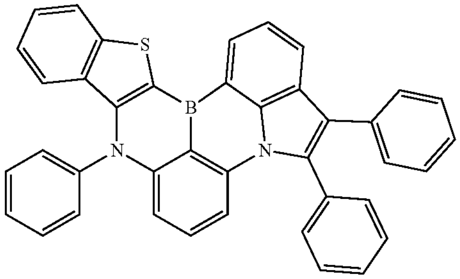
115
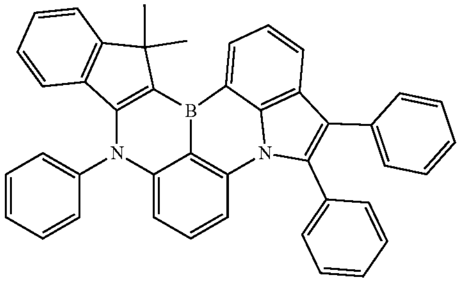
116
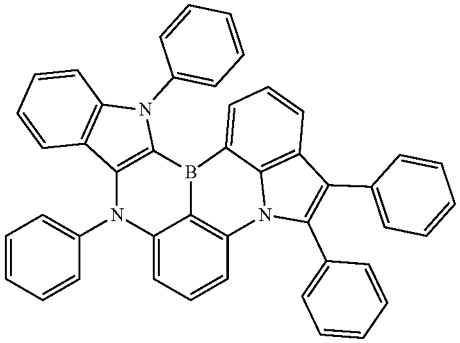
117
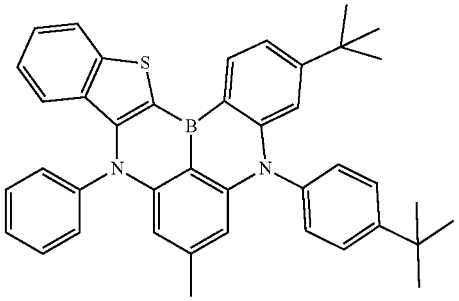
-continued
118
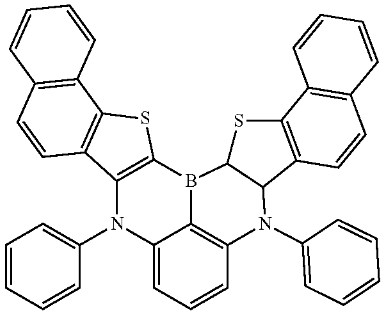
119
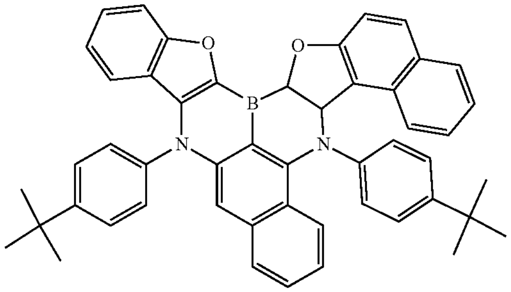
120
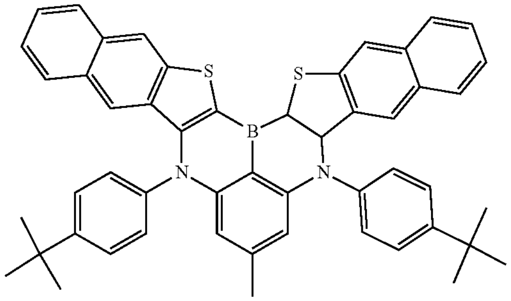
121
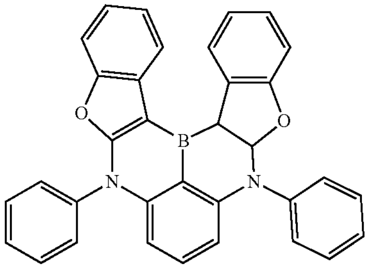
122
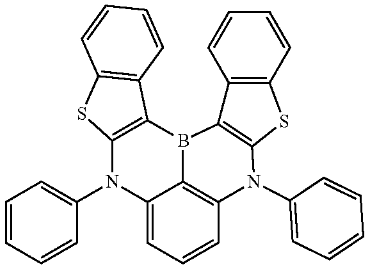

-continued
123
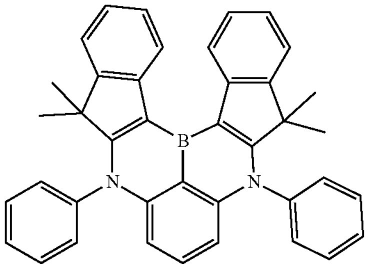
124
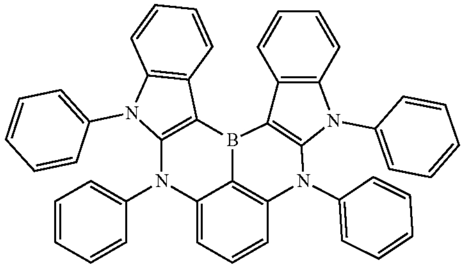
125
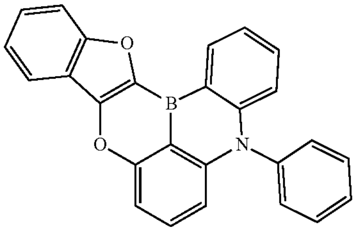
126
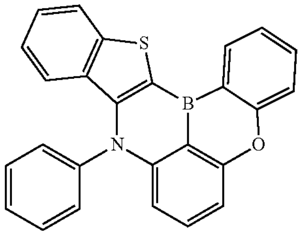
127
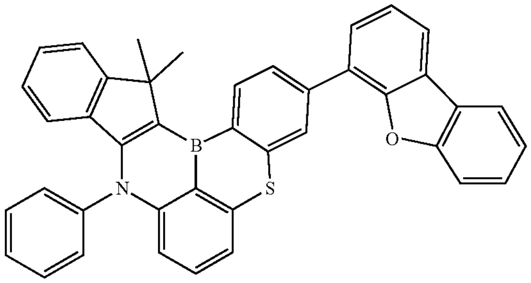
-continued
128
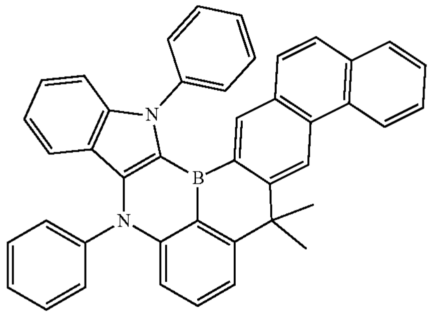
129
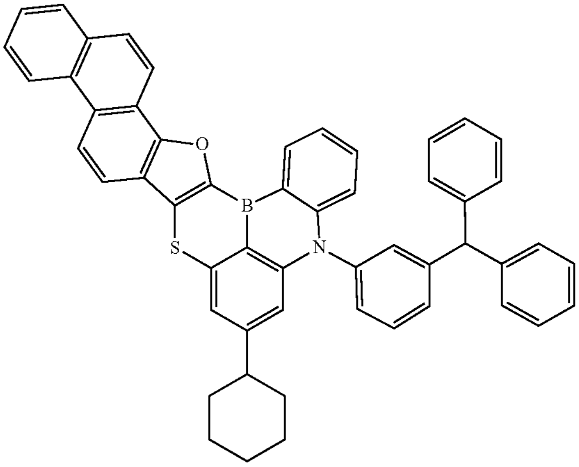
130
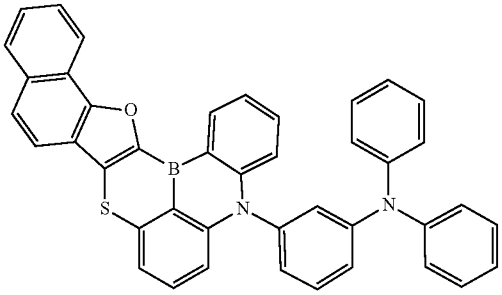
131
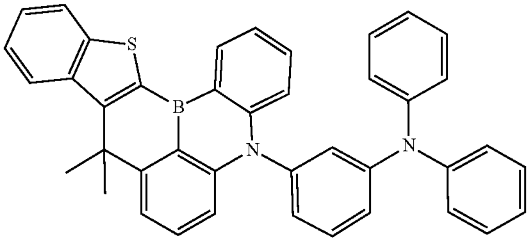

-continued
132
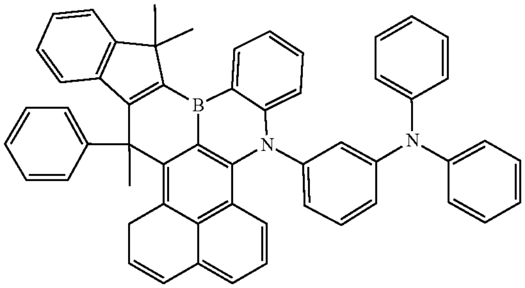
133
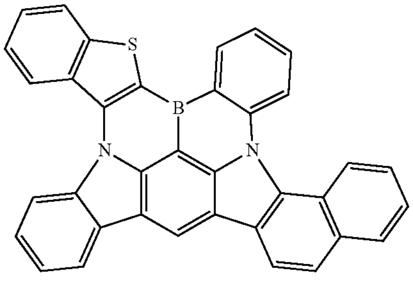
134
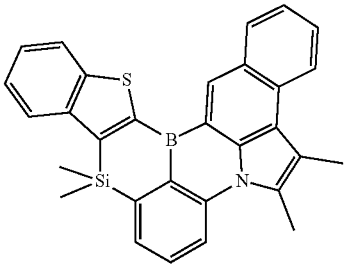
135
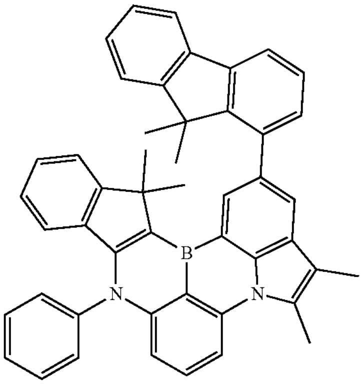
136
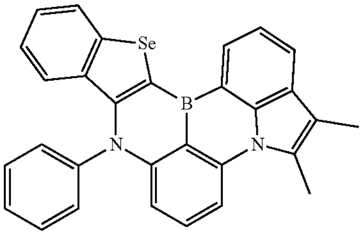
-continued
137
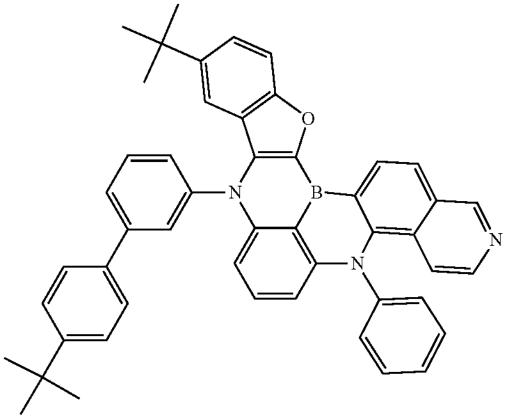
138
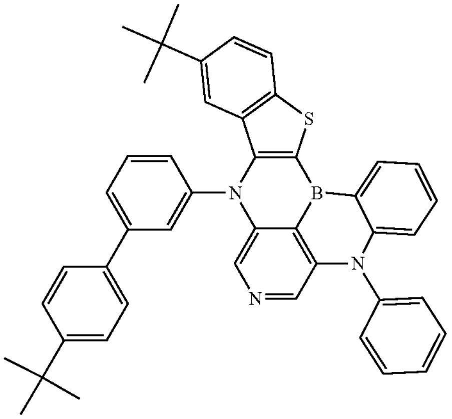
139
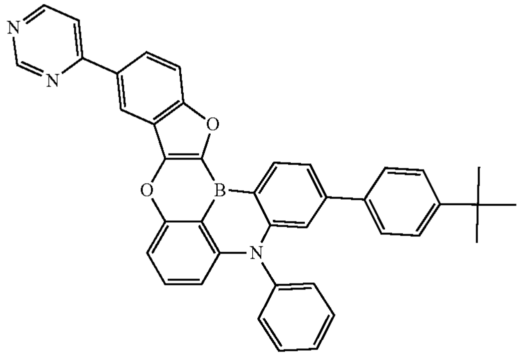
140
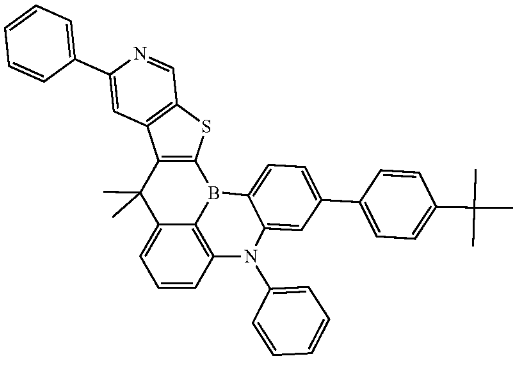

-continued
141
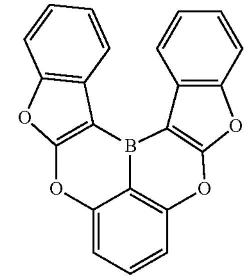
142
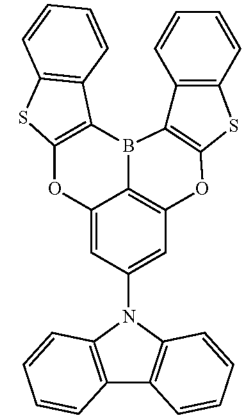
143
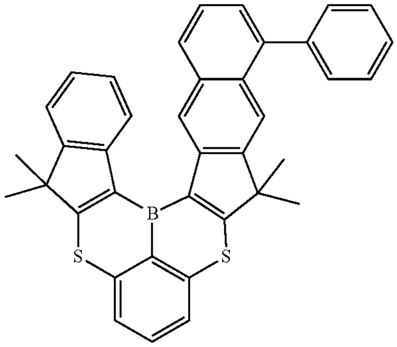
144
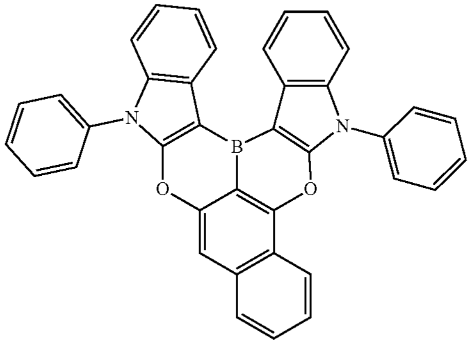
-continued
145
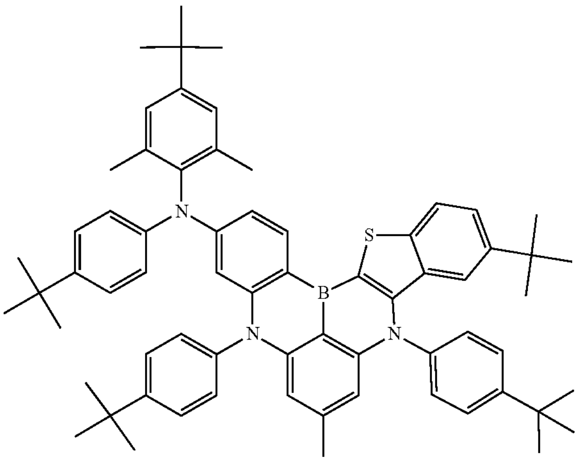
146
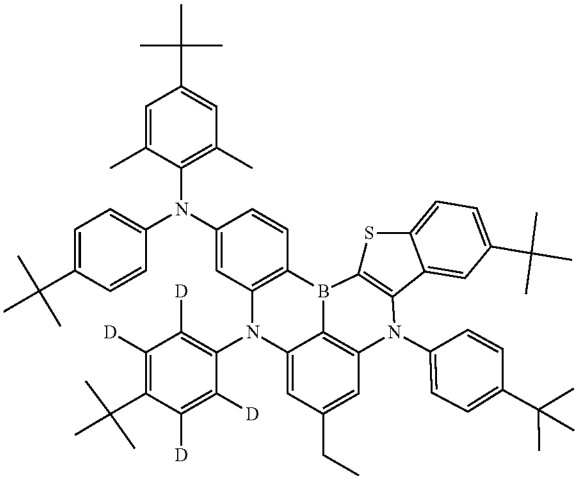
147
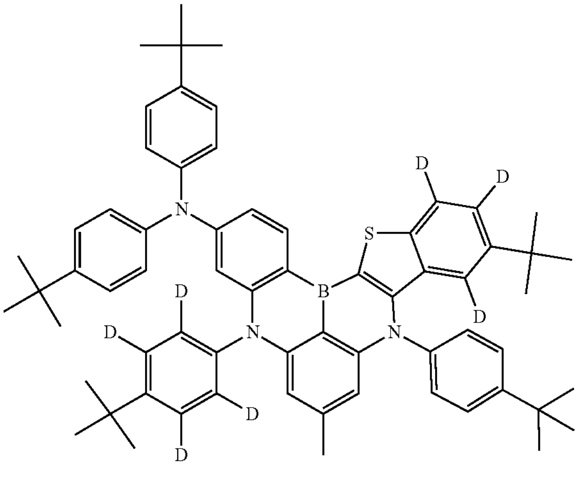

-continued
148
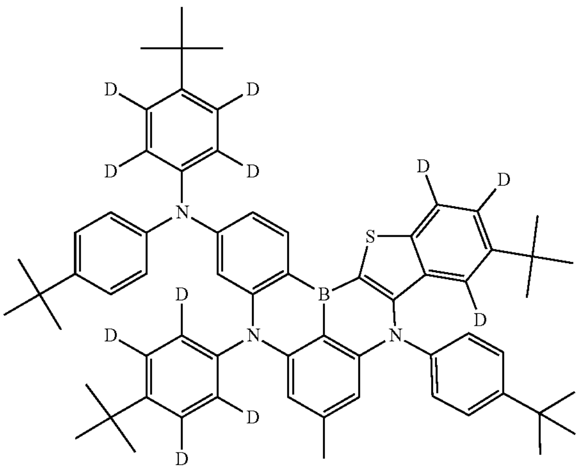
149
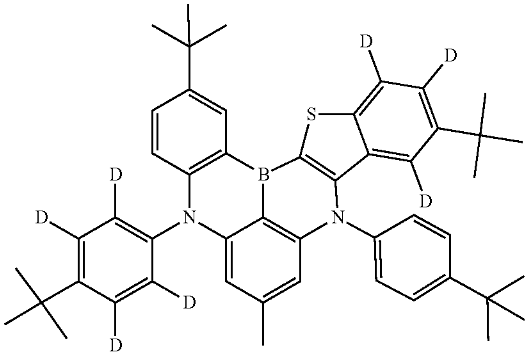
150
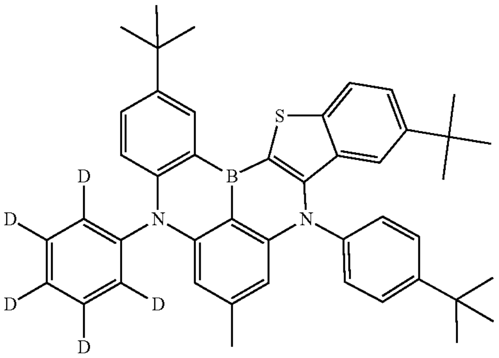
151
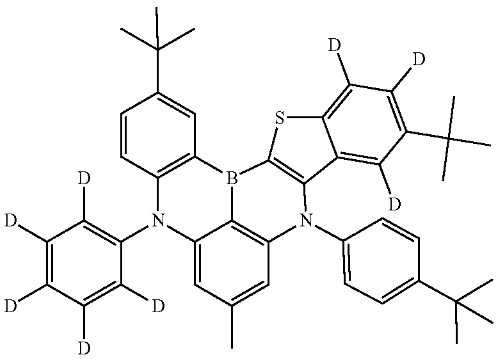
-continued
152
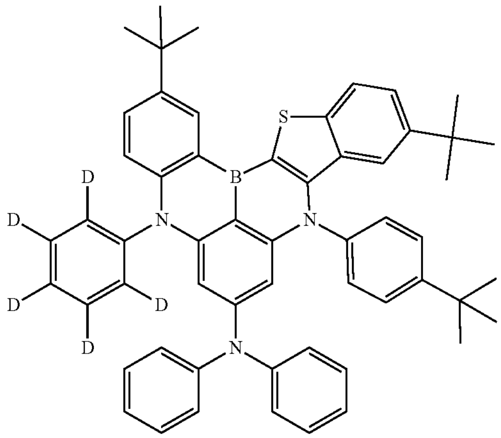
153
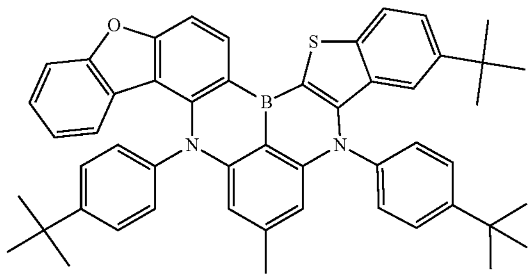
154
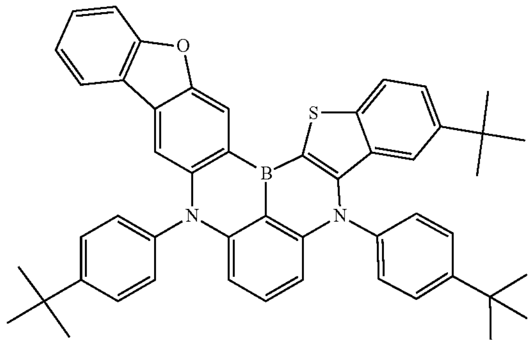
155
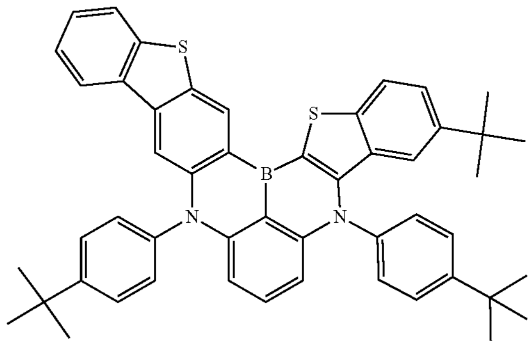

-continued
156
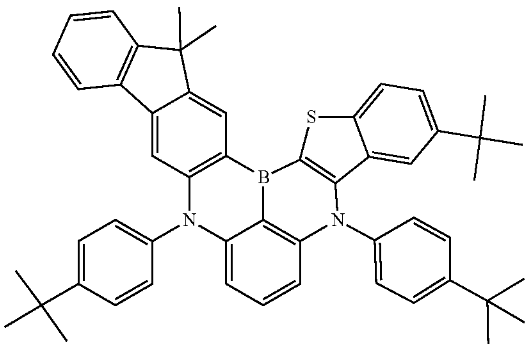
157
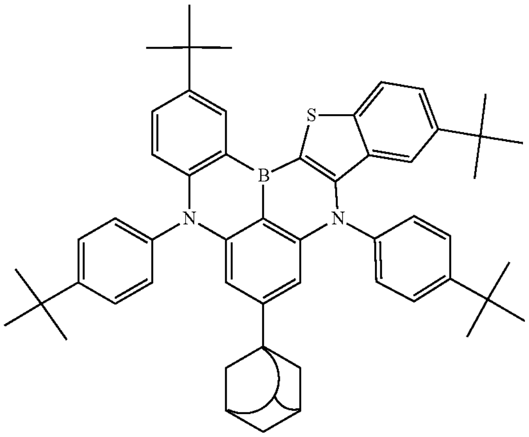
158
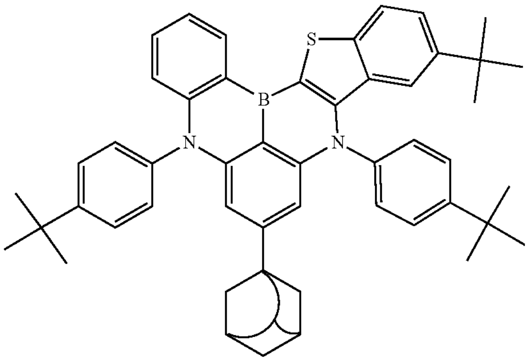
159
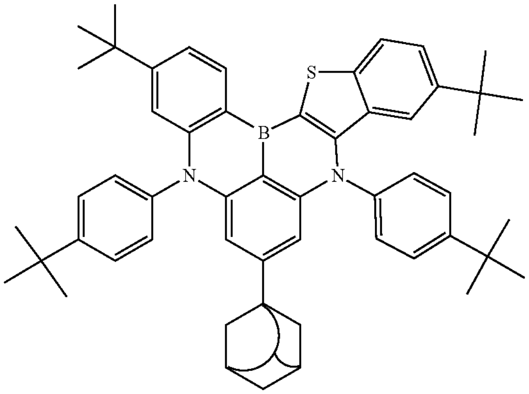
-continued
160
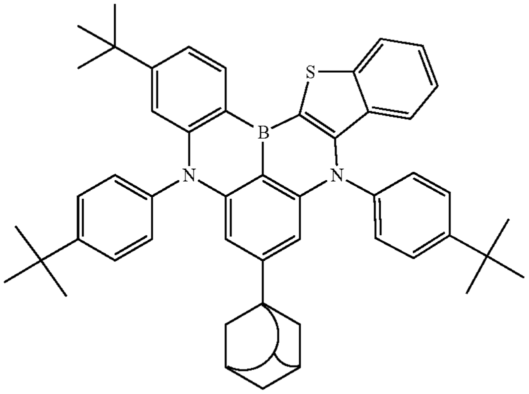
161
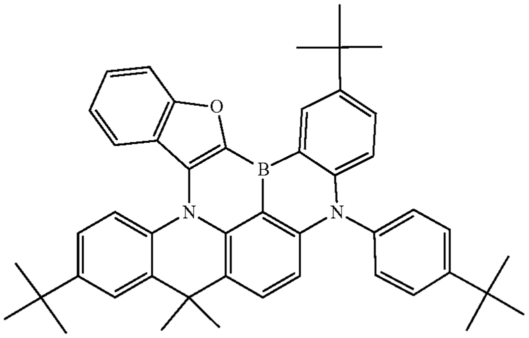
162
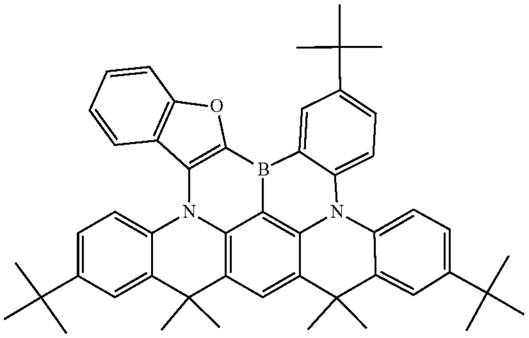
163
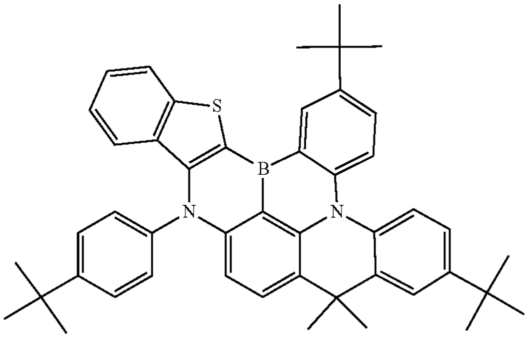

-continued
164
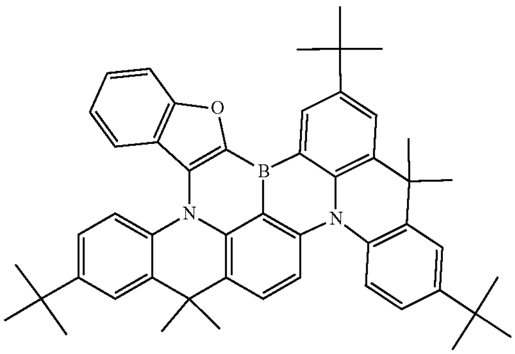
165
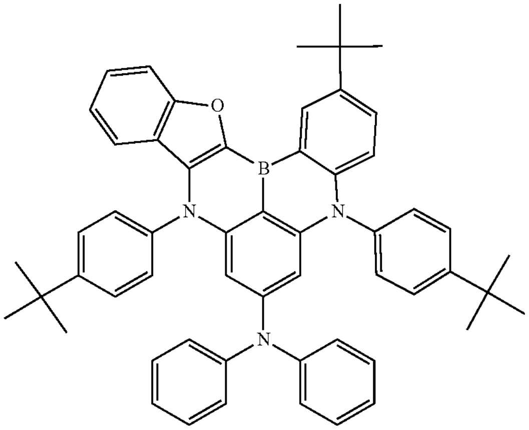
166
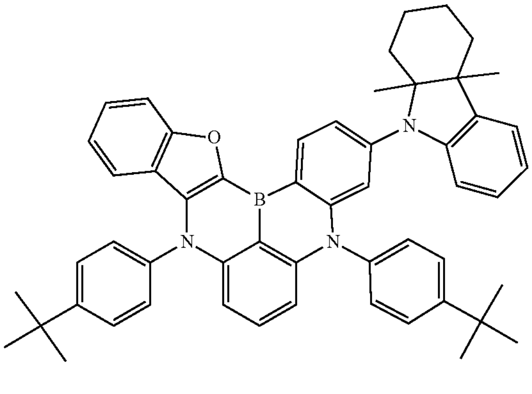
-continued
167
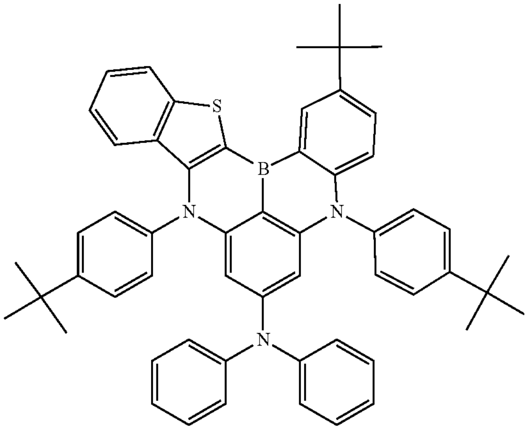
168
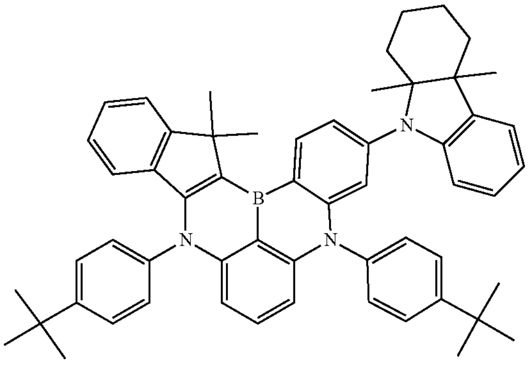
169
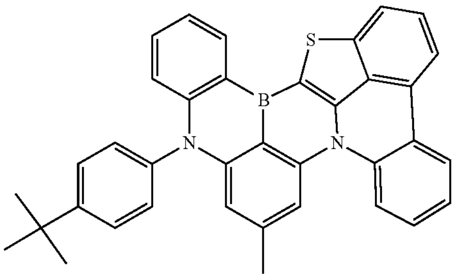
170
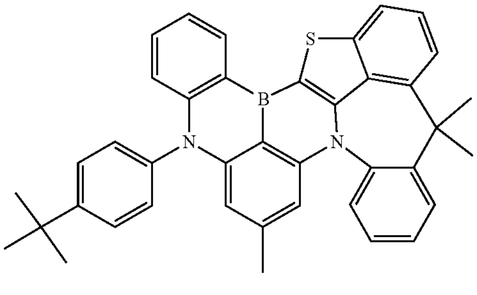

-continued

171

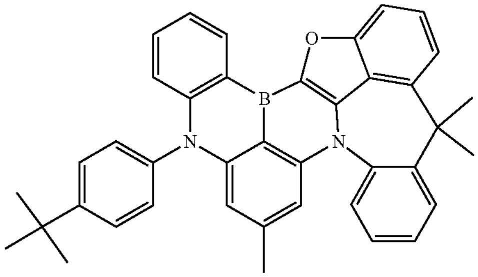

172

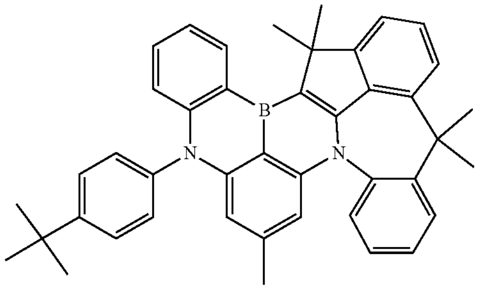

173

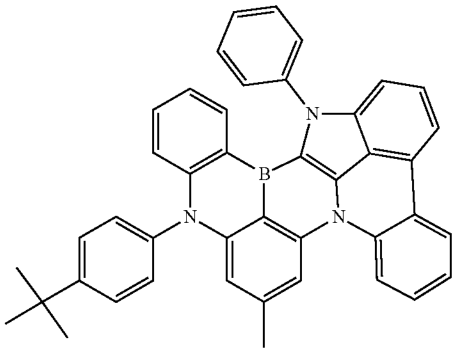

174

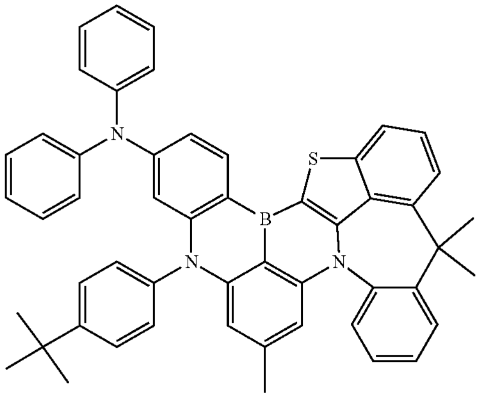

-continued

175

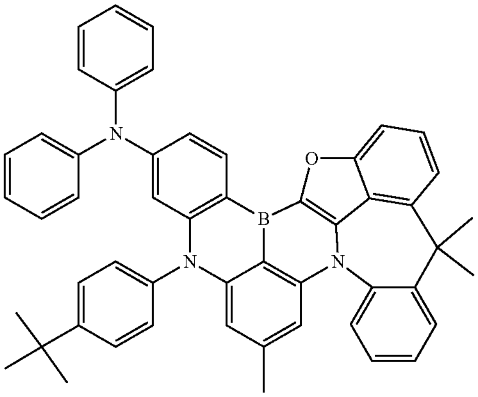

176

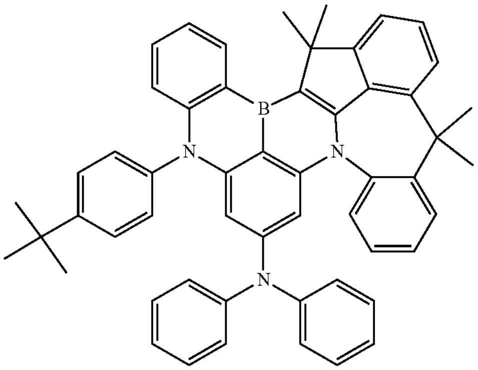

As can be seen from the specific compounds, an organic light-emitting material having the intrinsic properties of the substituent can be synthesized, in particular, a dopant material used in the light-emitting layer can be prepared by forming a polycyclic aromatic structure including B, P, and P═O and introducing substituents therein and a highly efficient organic light-emitting device can be realized by applying the compound represented by [Formula A] according to the present invention to the device.

In addition, in another aspect, the present invention is directed to an organic light-emitting device including a first electrode, a second electrode, and a hole injection layer and/or a hole transport layer and a light-emitting layer interposed between the first electrode and the second electrode, and the organic light-emitting device may be fabricated using a conventional method and materials for fabricating devices using the compound of [Formula A] in the hole injection layer, the hole transport layer, and a functional layer capable of injecting and/or transporting holes, and the compound of [Formula B] or [Formula C] as a dopant in the light-emitting layer.

In addition to the light-emitting layer, the hole injection layer, the hole transport layer, and the functional layer capable of injecting and/or transporting holes, the organic light-emitting device according to the present invention may further include an electron transport layer, an electron injection layer, an electron blocking layer, a hole blocking layer, and the like, and the organic light-emitting device may use materials for the respective layers.

Specifically, the organic light-emitting device according to the present invention may use the following anthracene derivative compound as a host compound for the light-emitting layer.

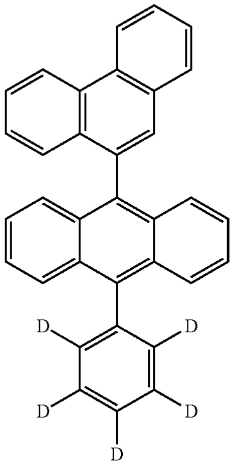
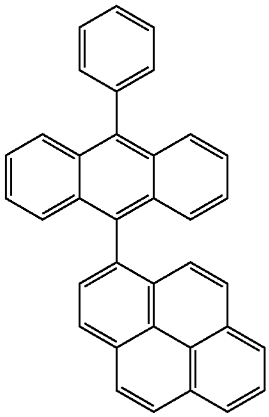
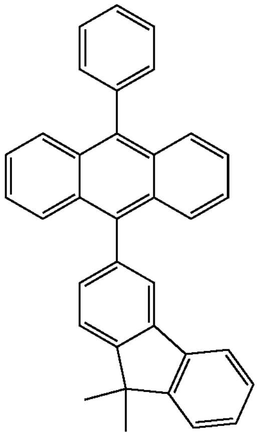
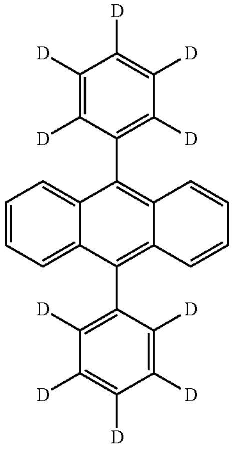
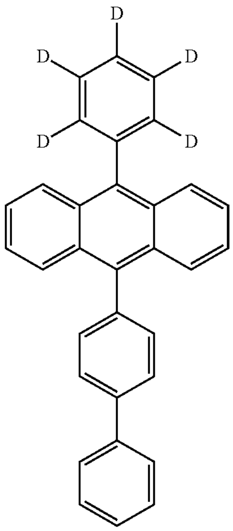
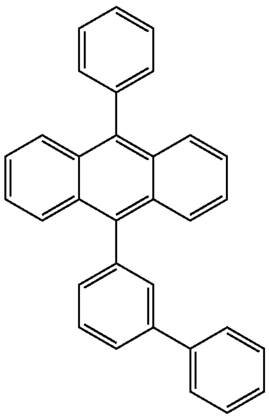
-continued
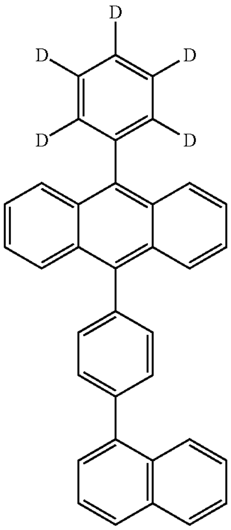
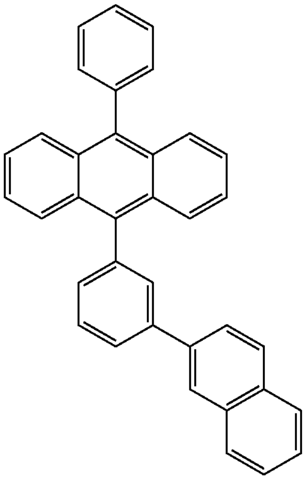
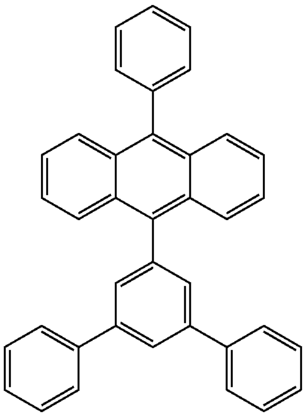

-continued
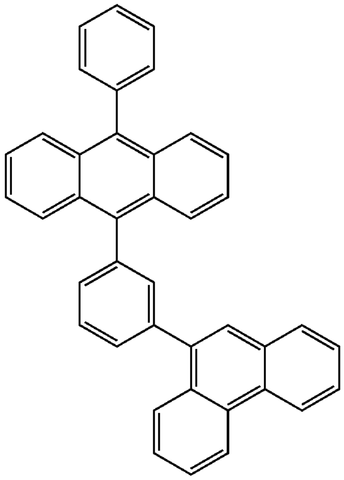
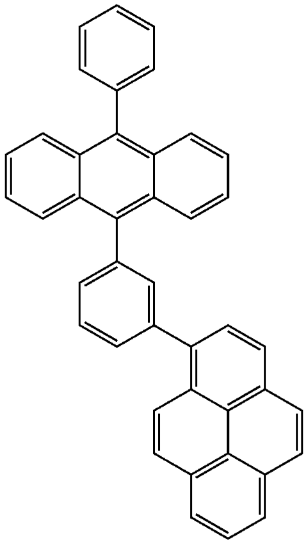
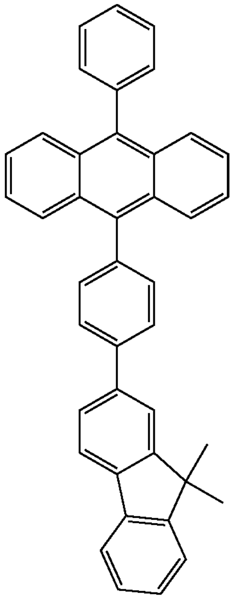
-continued
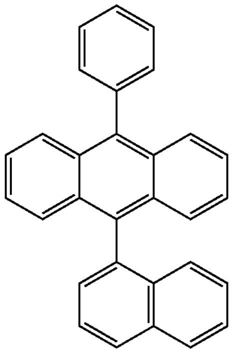
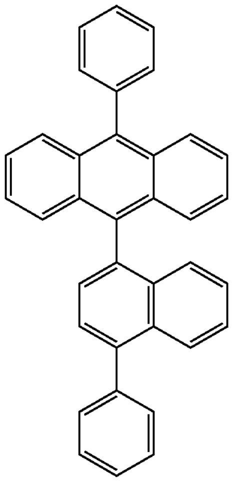
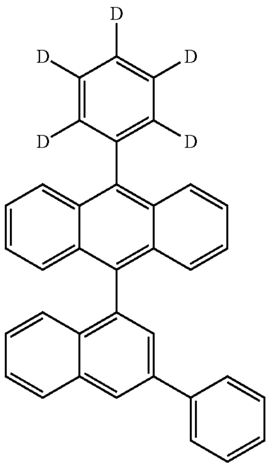

-continued
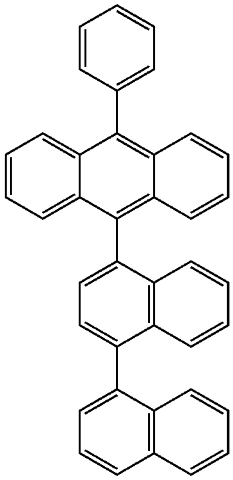
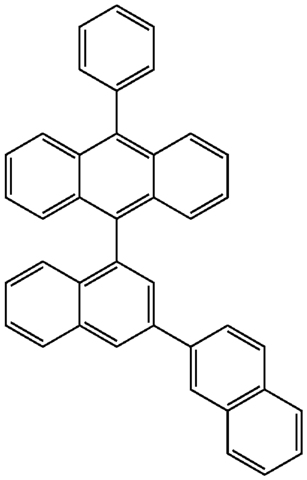
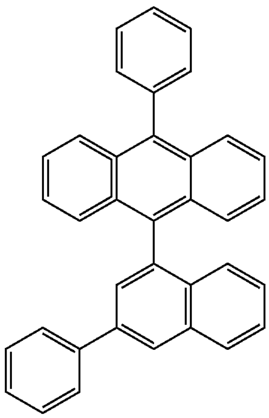
-continued
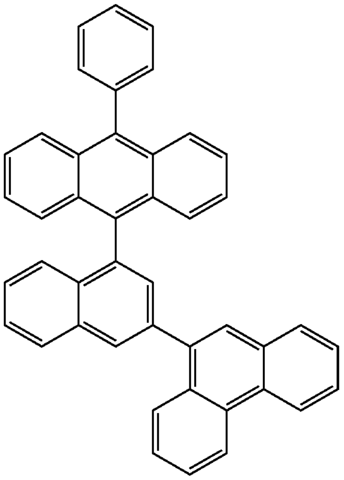
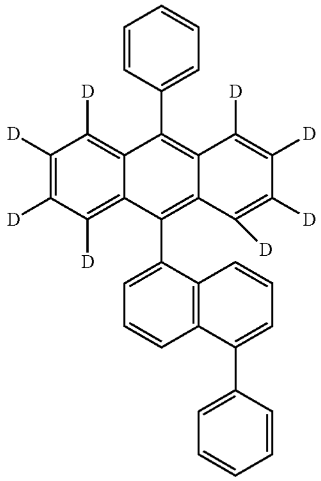
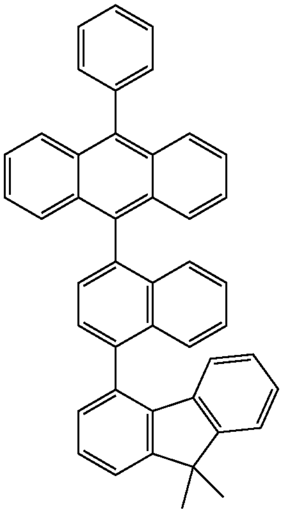

-continued
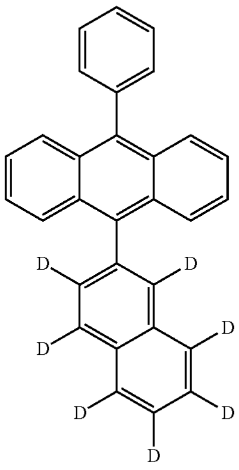
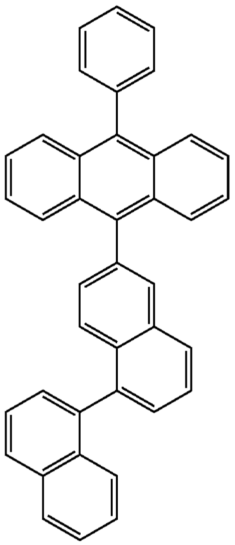
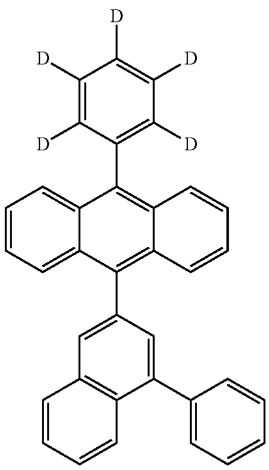
-continued
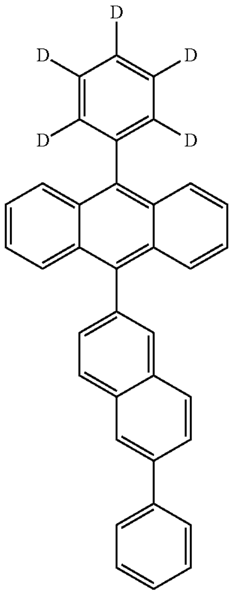
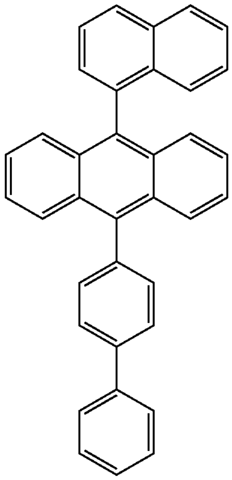
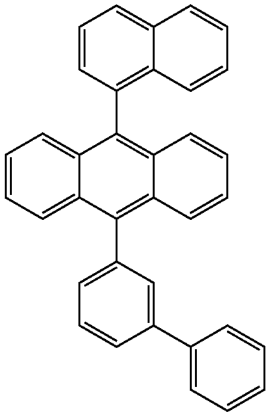

-continued
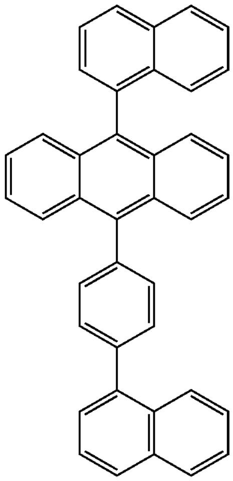
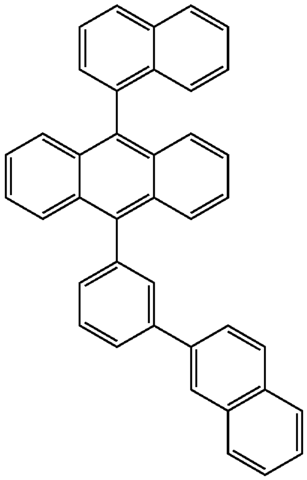
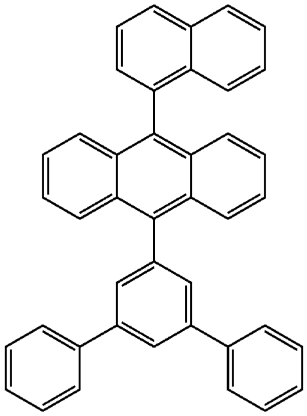
-continued
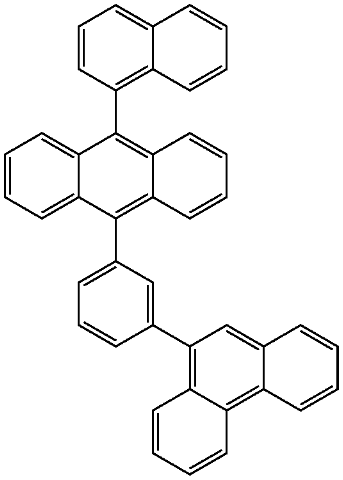
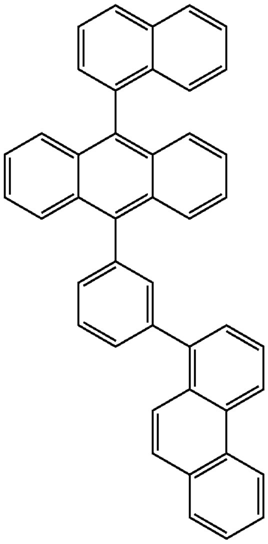
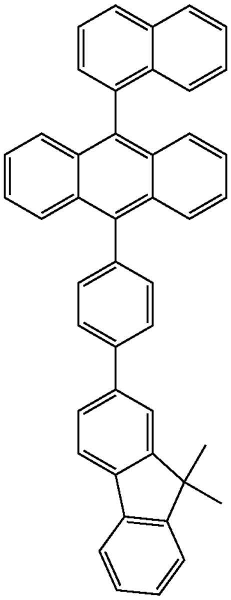

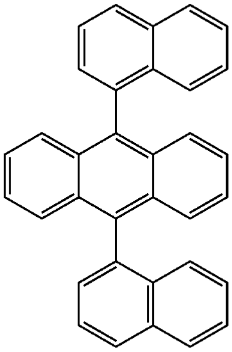
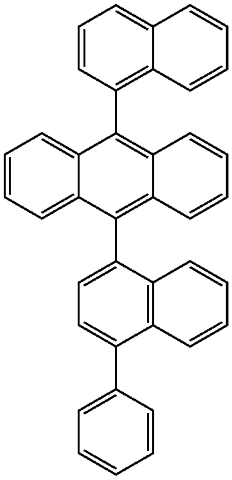
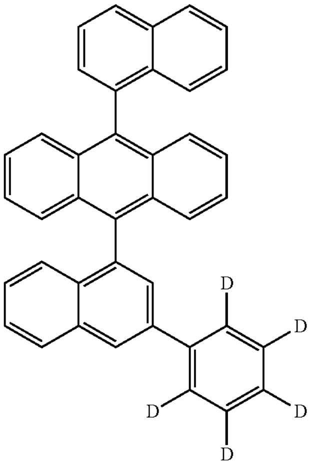
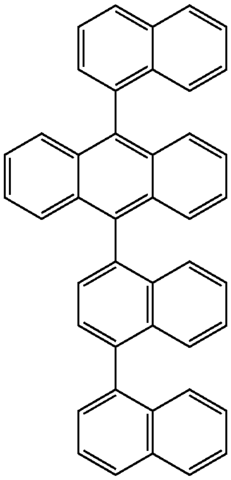
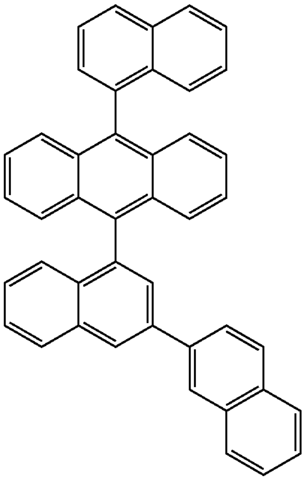
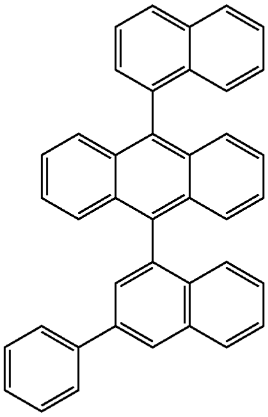

-continued
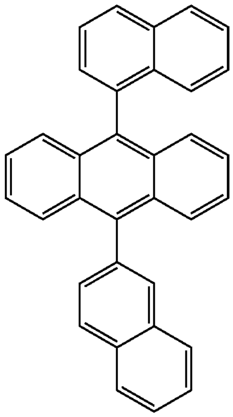
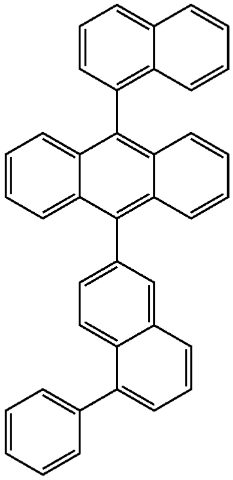
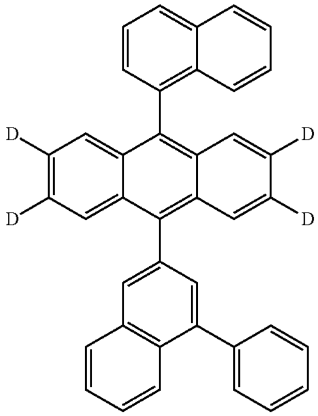
-continued
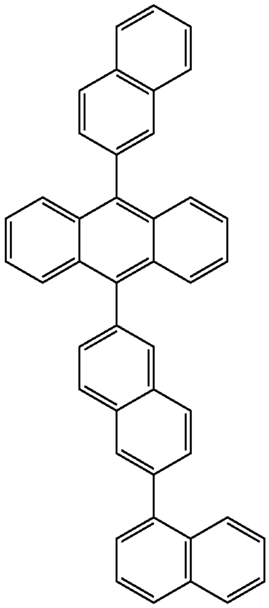
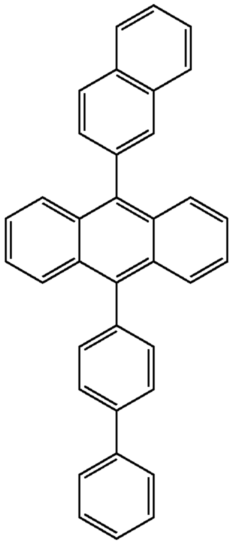
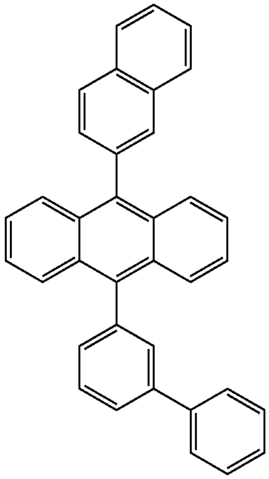

-continued
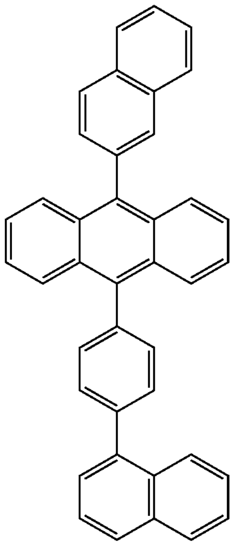
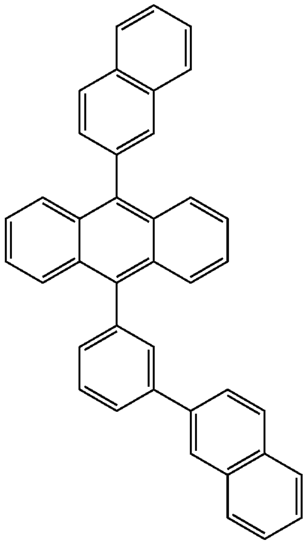
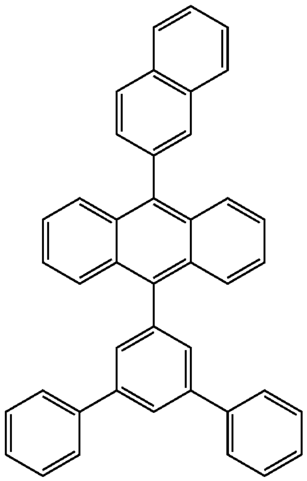
-continued
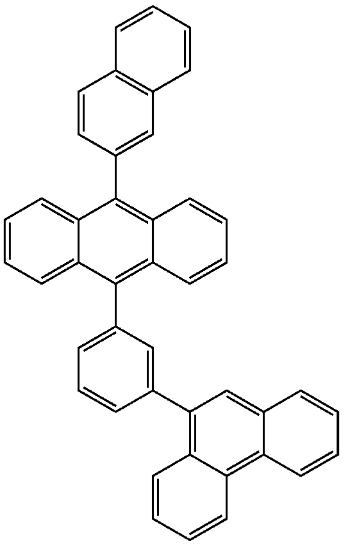
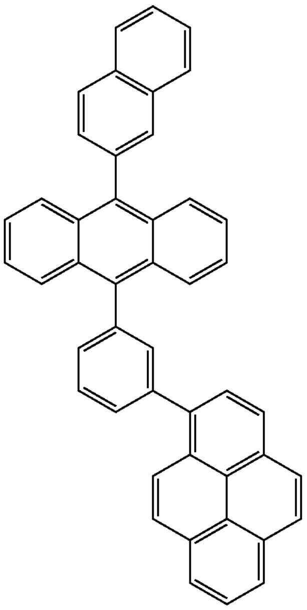

-continued
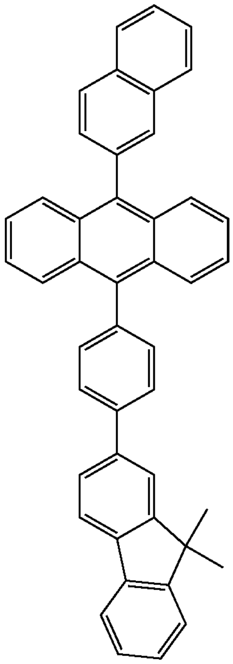
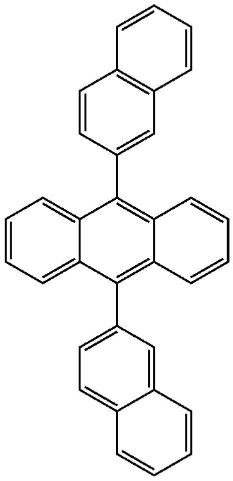
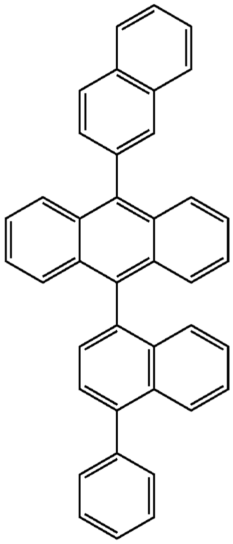
-continued
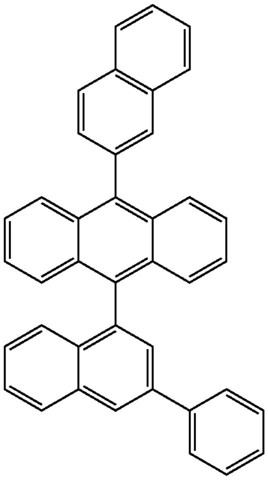
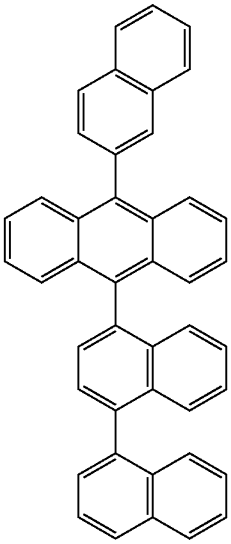
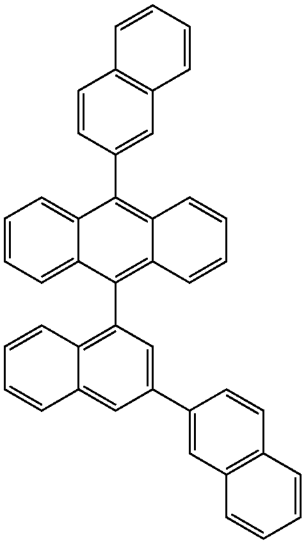

-continued
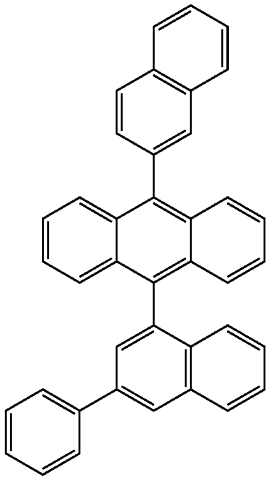
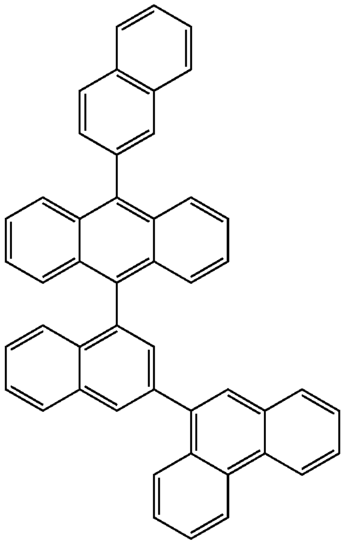
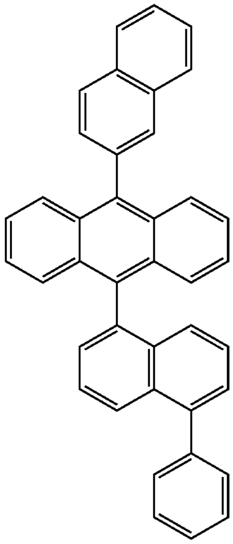
-continued
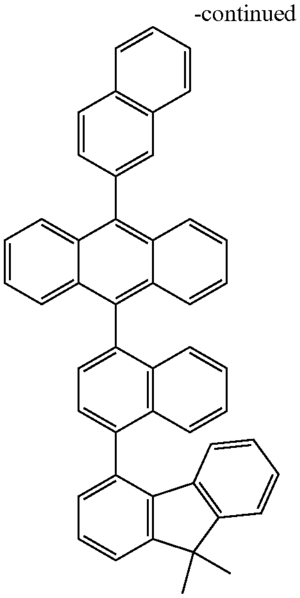
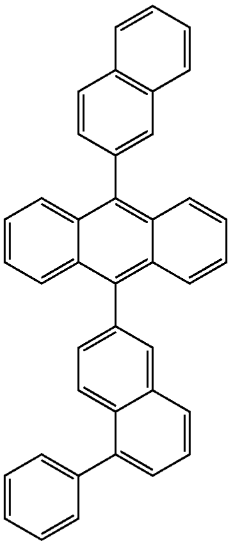
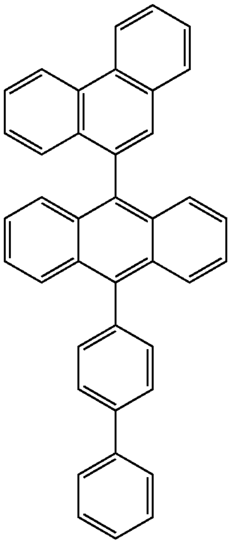

-continued
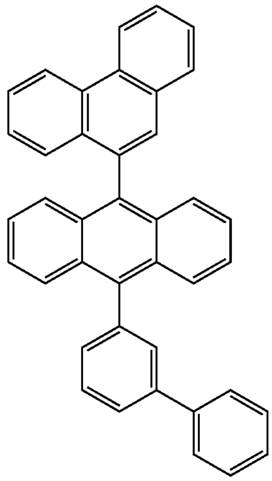
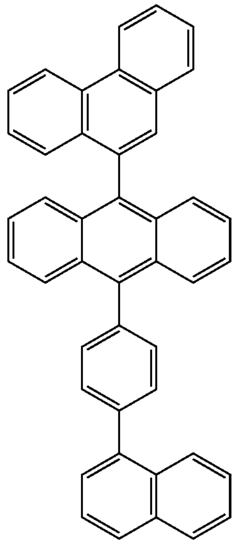
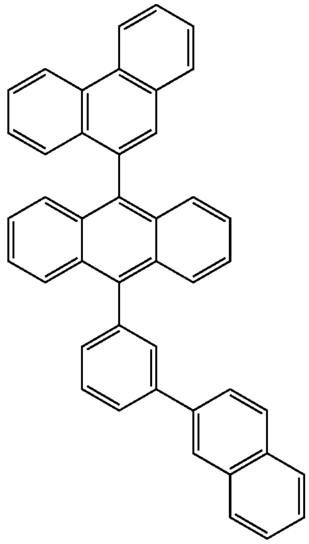
-continued
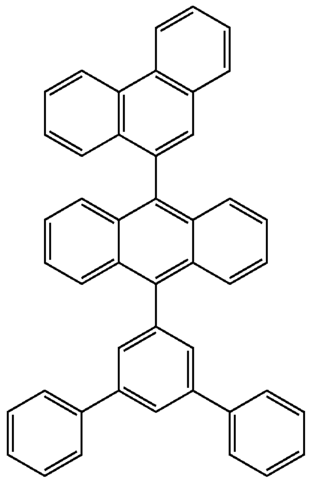
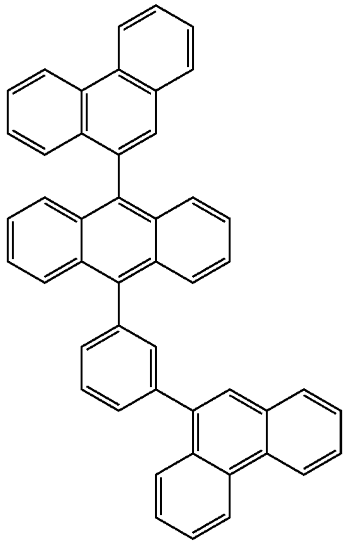
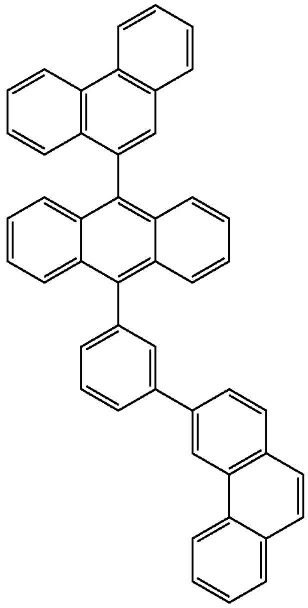

-continued
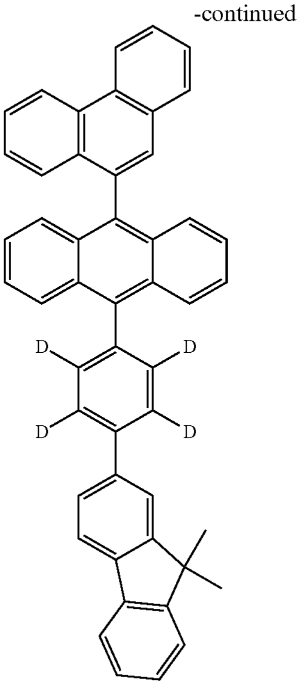
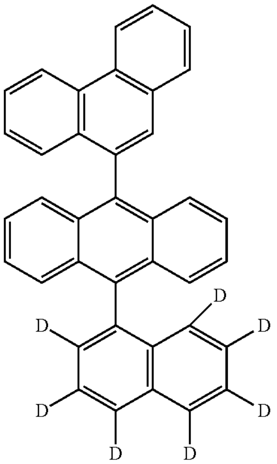
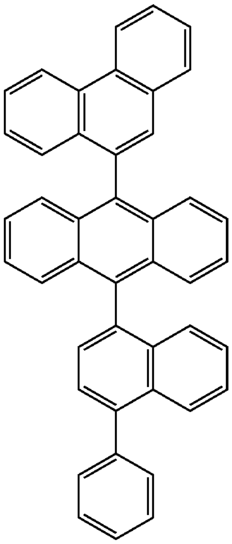
-continued
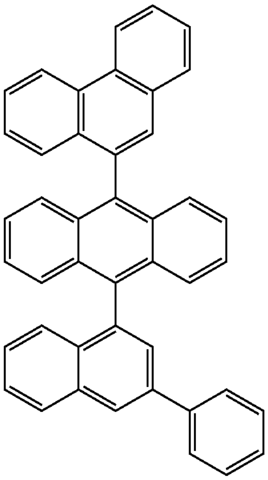
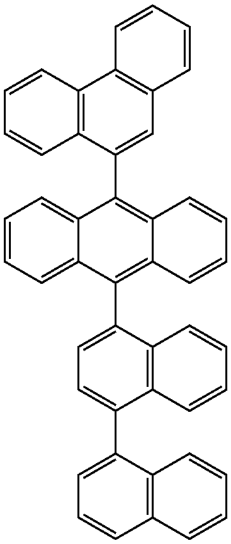
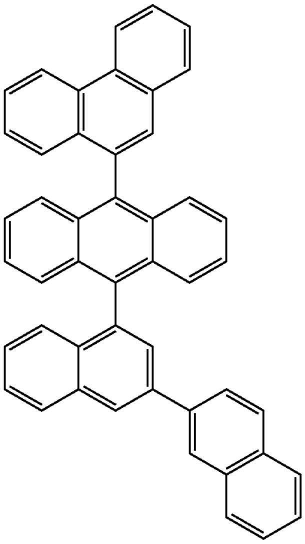

-continued
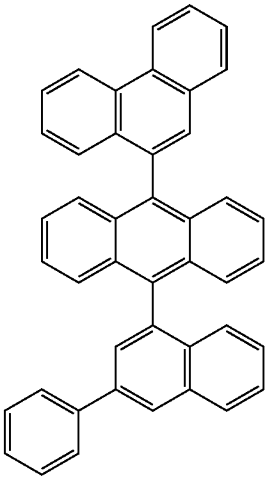
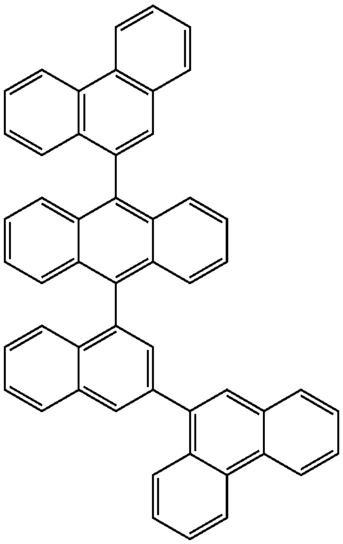
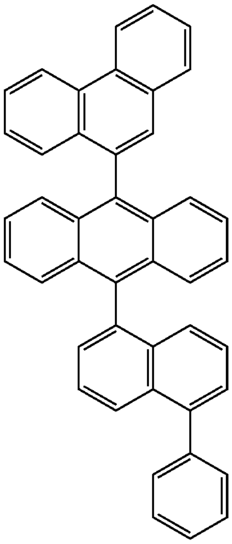
-continued
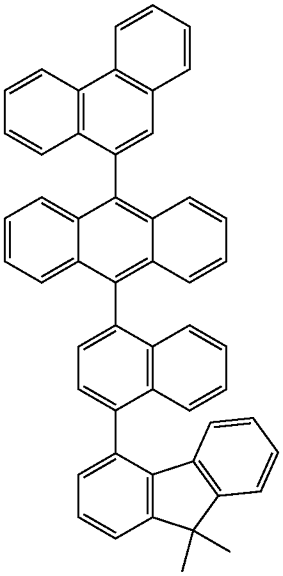
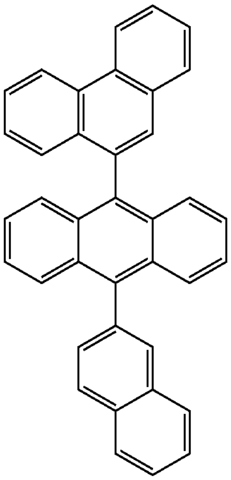
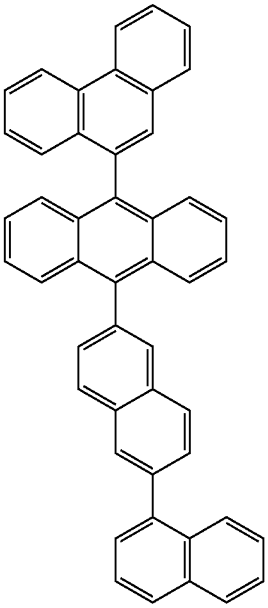

-continued
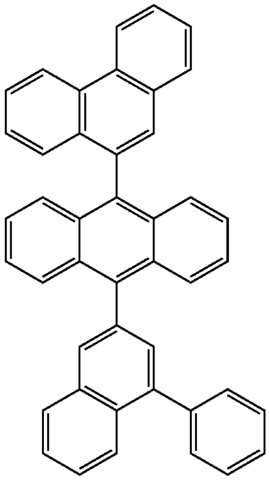
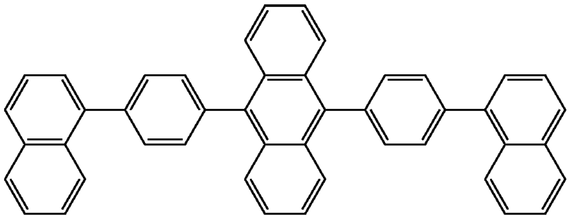
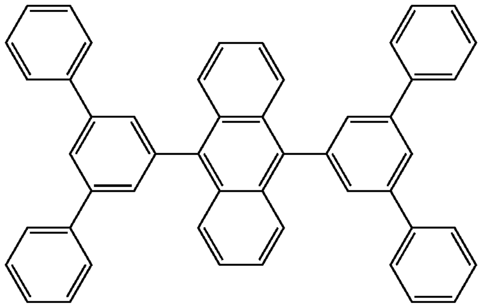
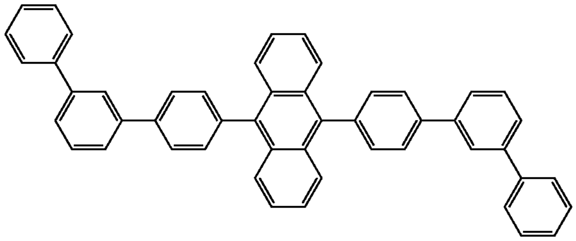
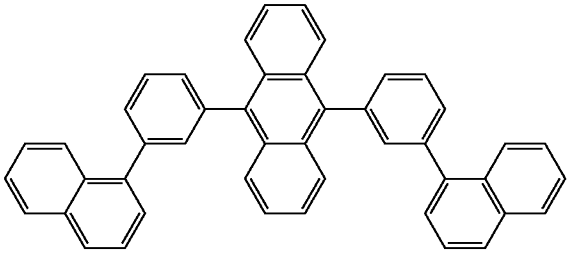
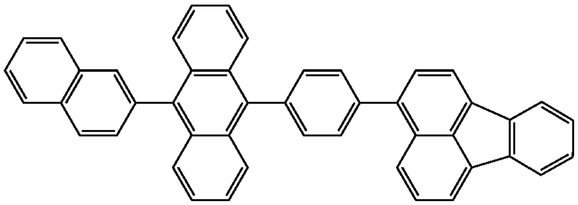
-continued
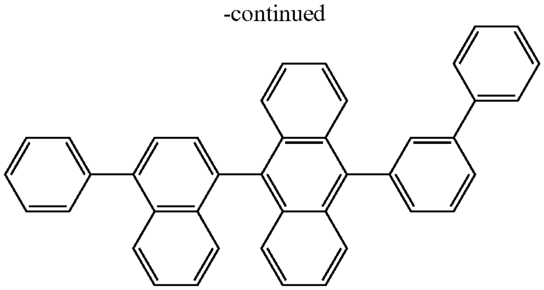
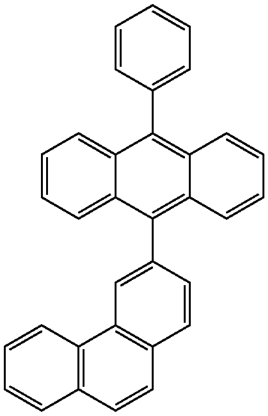
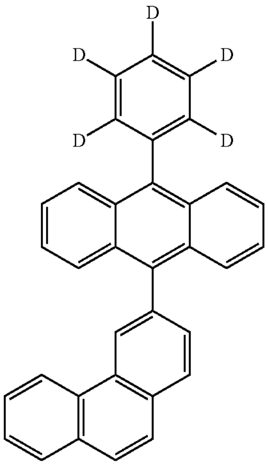
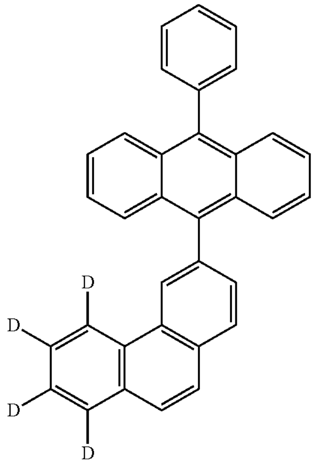

-continued
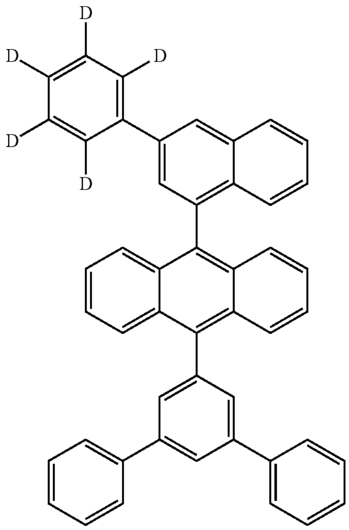
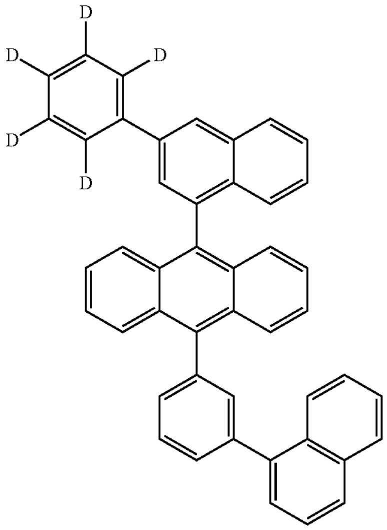
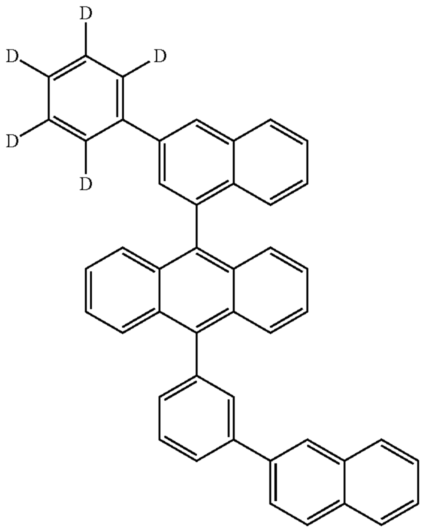
-continued
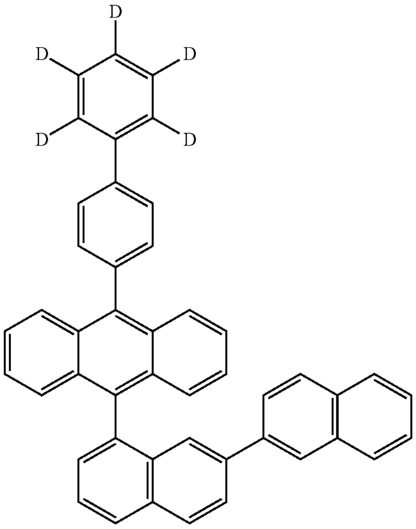
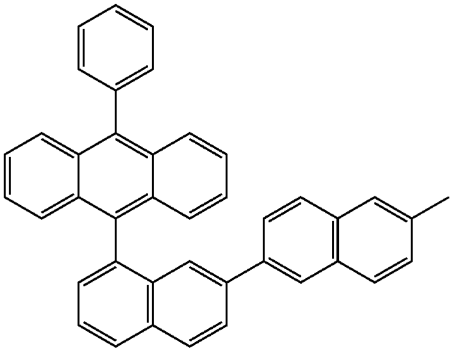
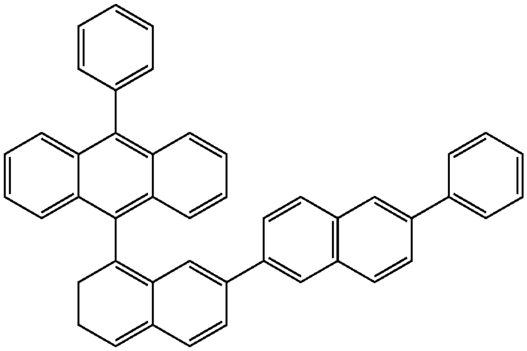

-continued
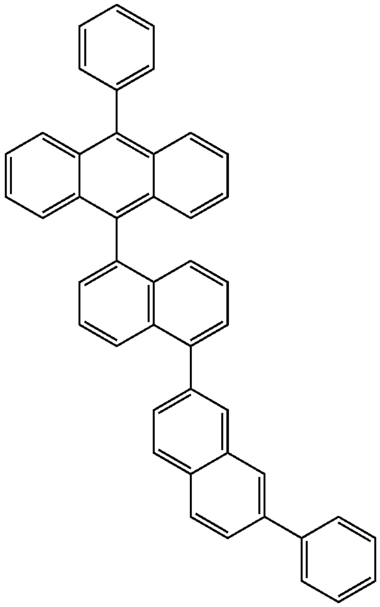
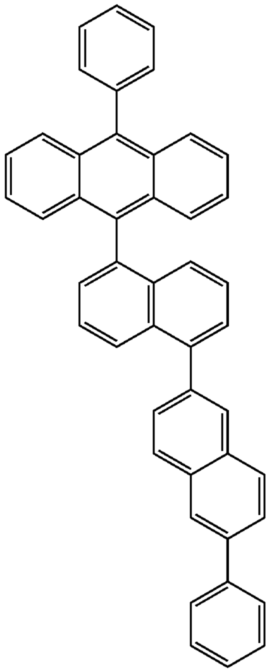
-continued
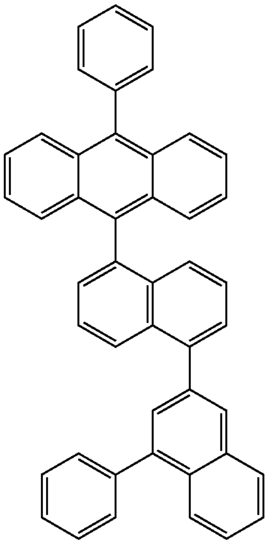
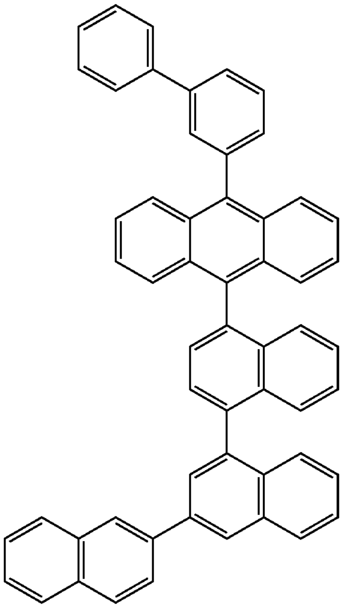
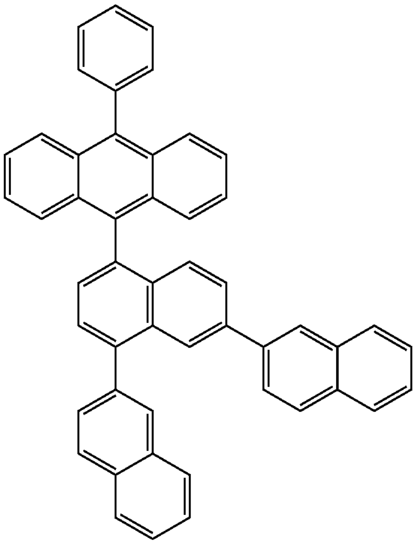

-continued
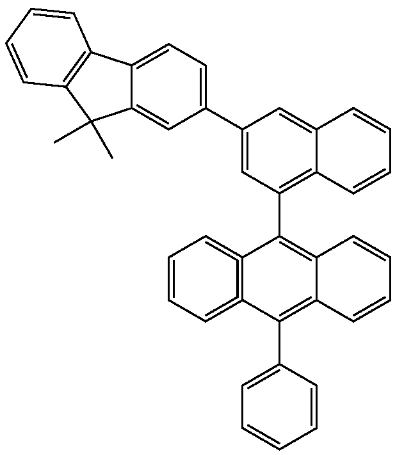
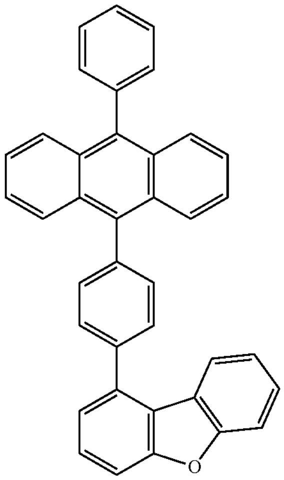
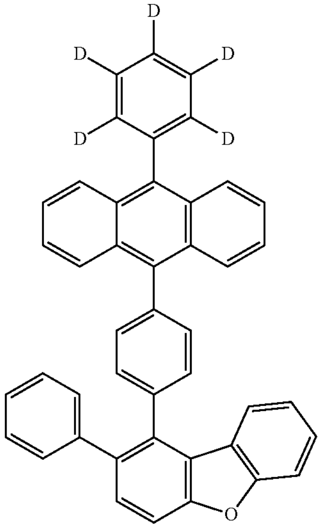
-continued
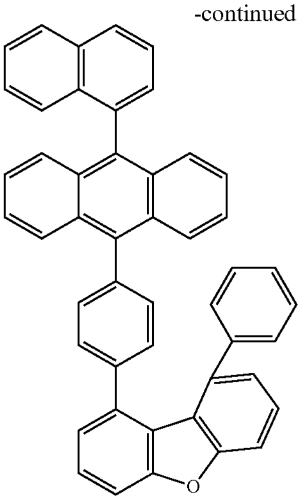
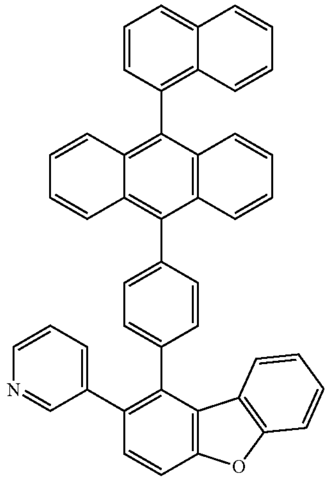
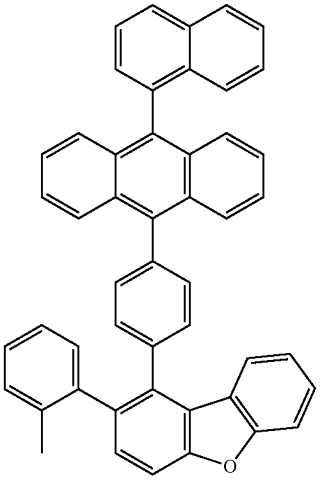

-continued
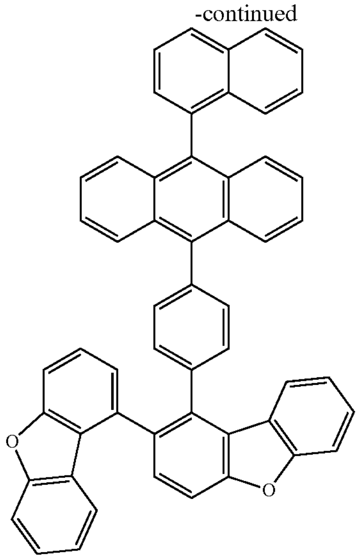
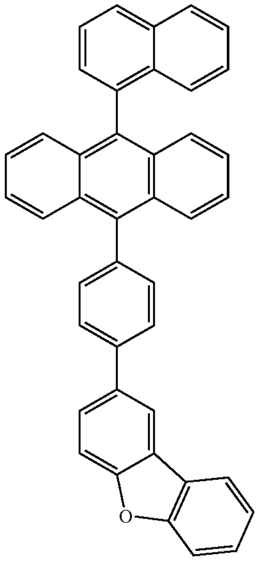
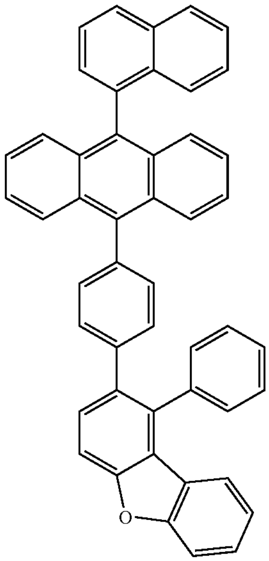
-continued
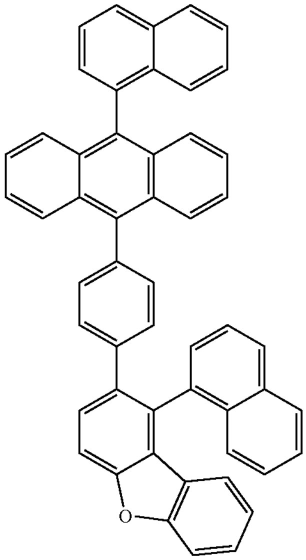
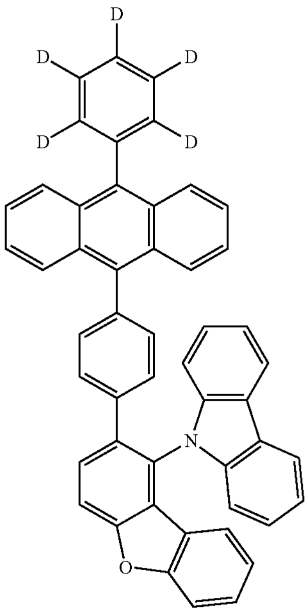

-continued
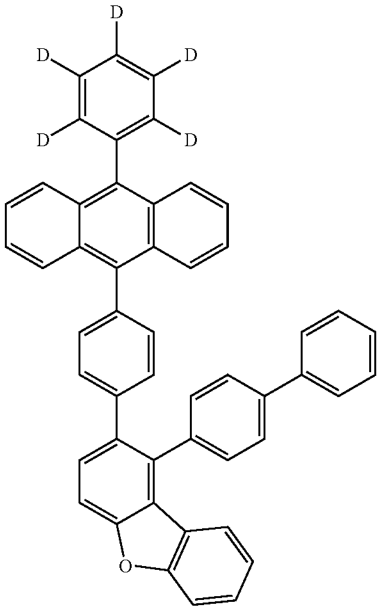
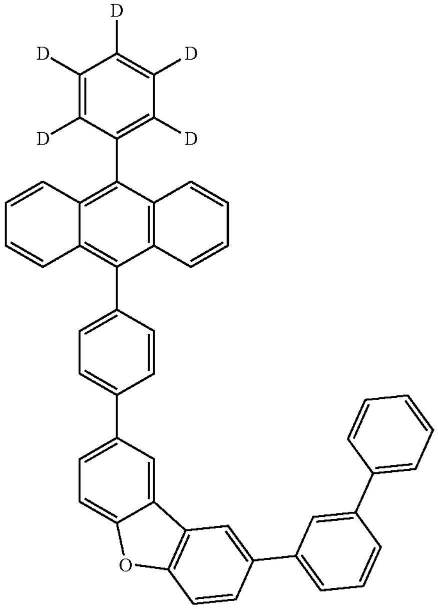
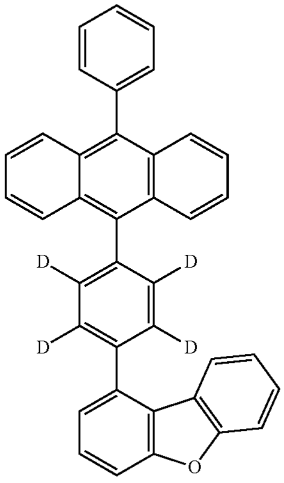
-continued
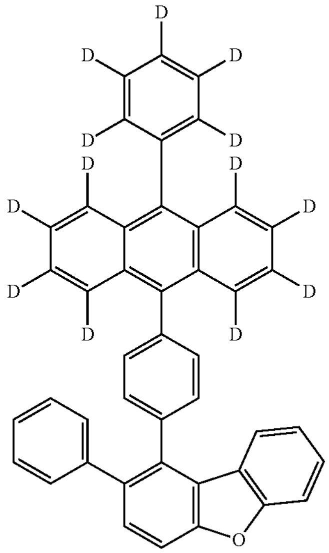
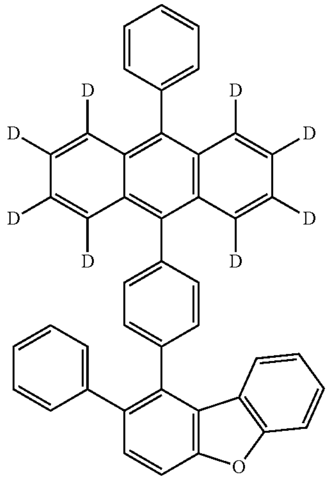
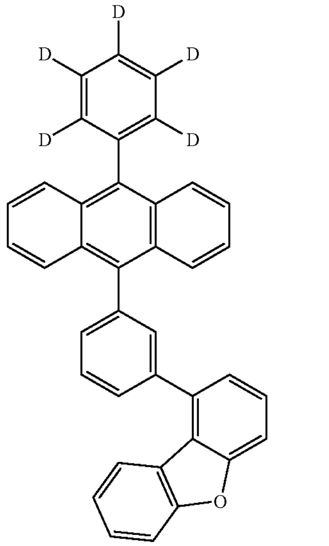

-continued
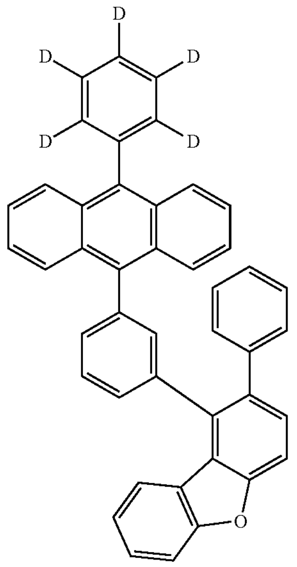
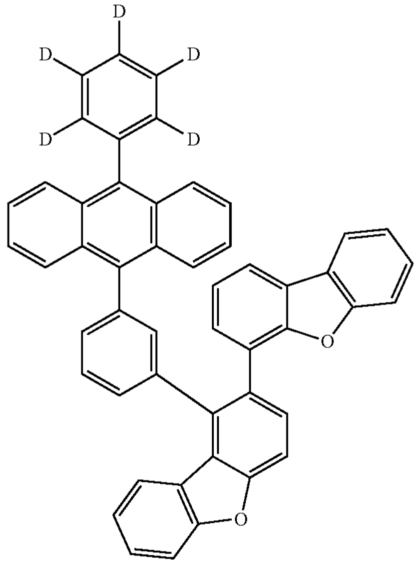
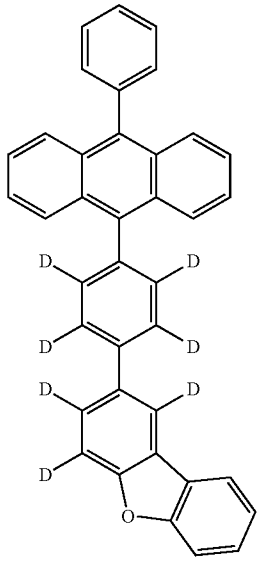
-continued
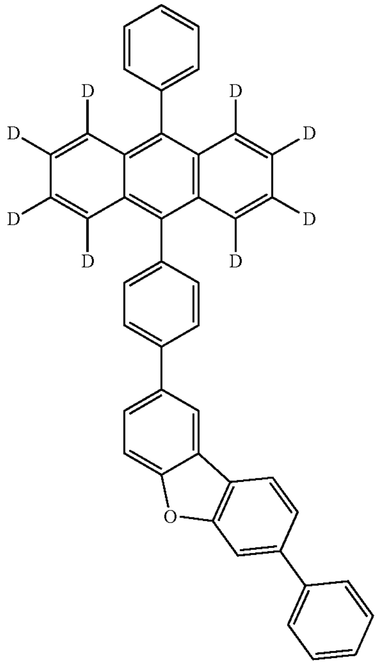
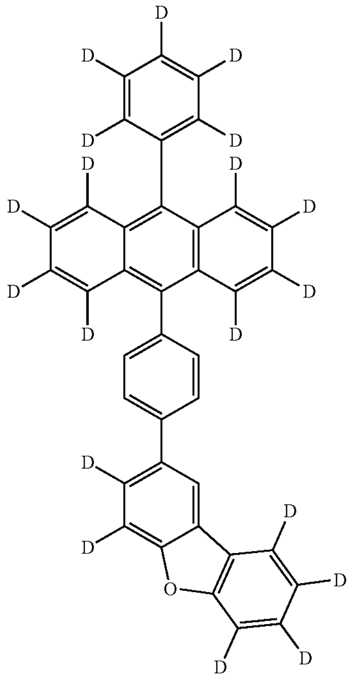
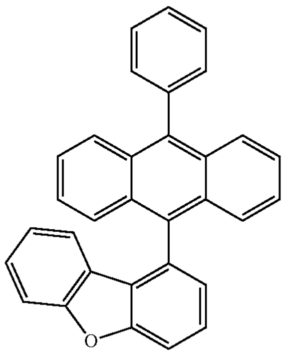

-continued
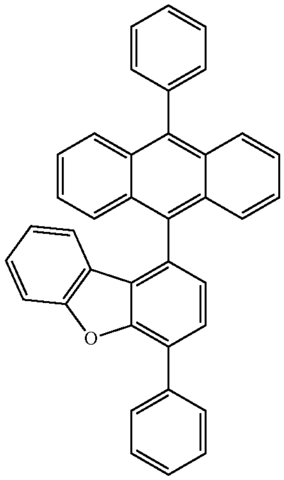
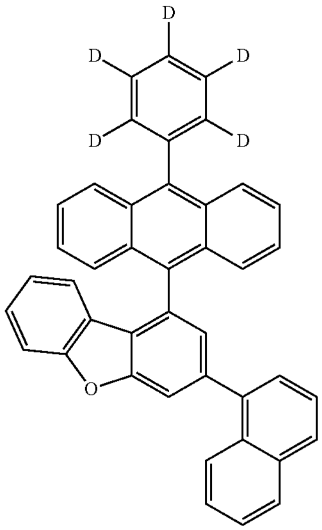
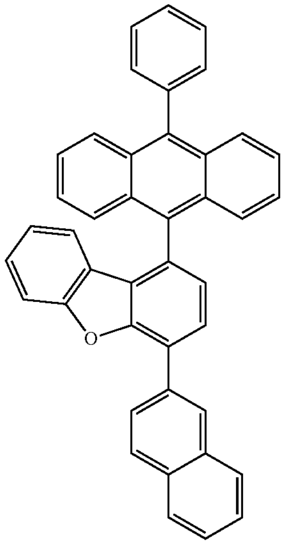
-continued
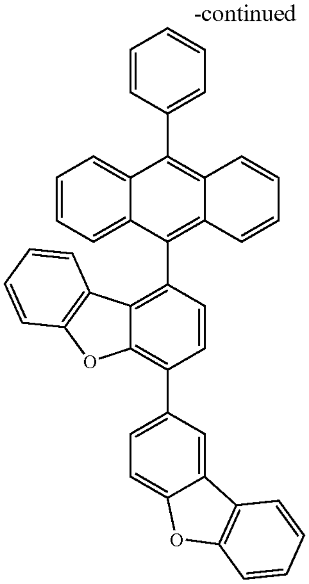
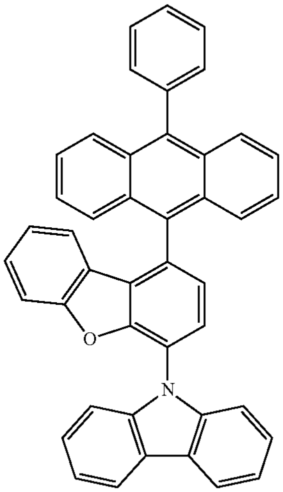
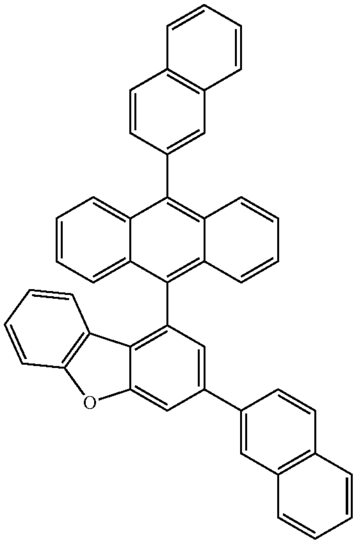

-continued
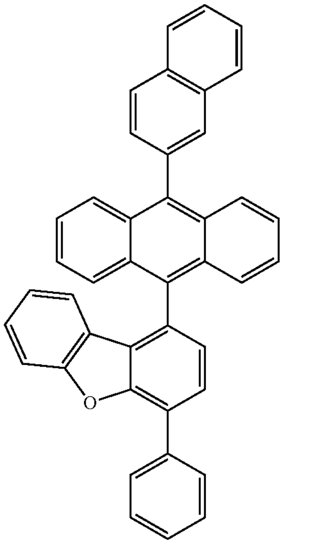
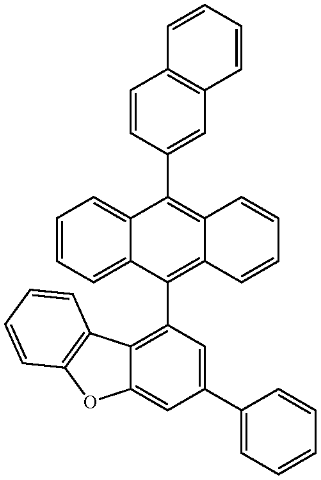
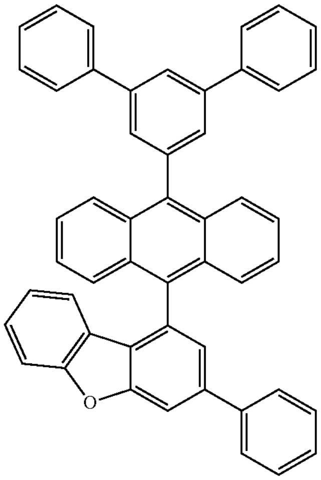
-continued
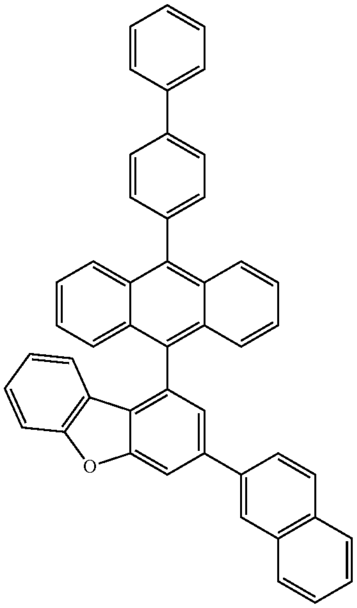
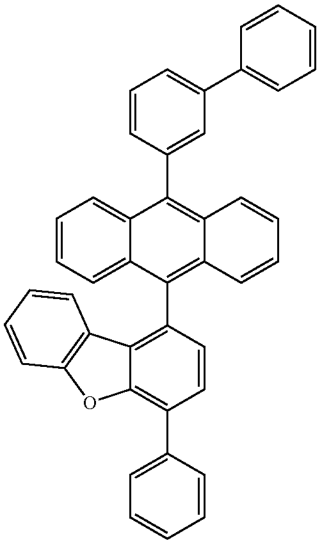
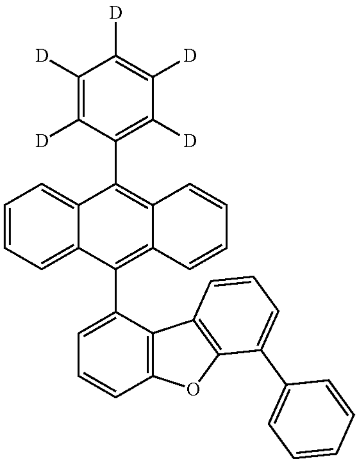

-continued
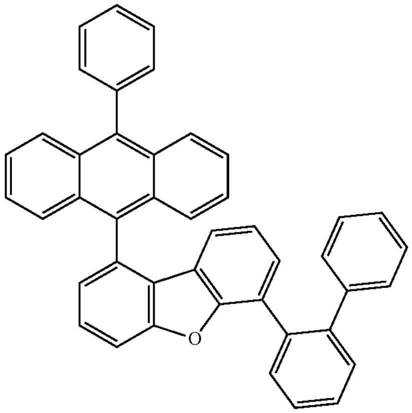
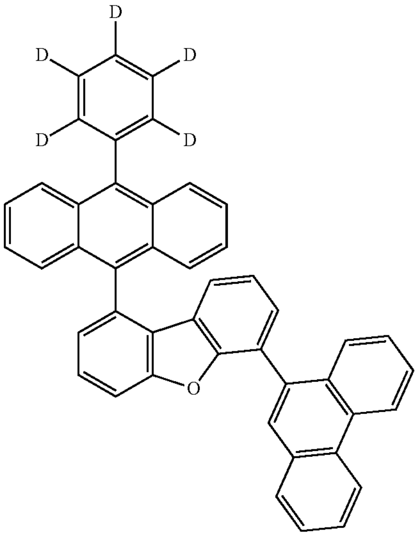
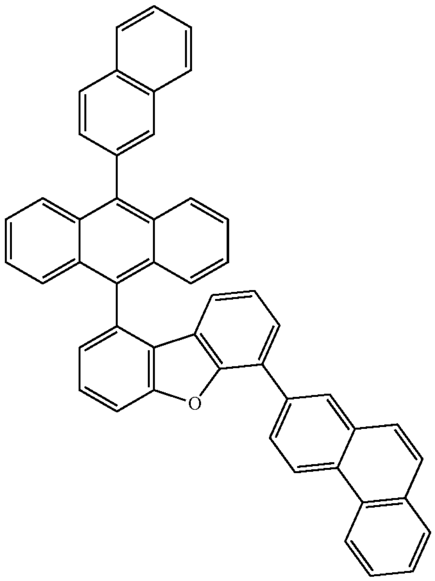
-continued
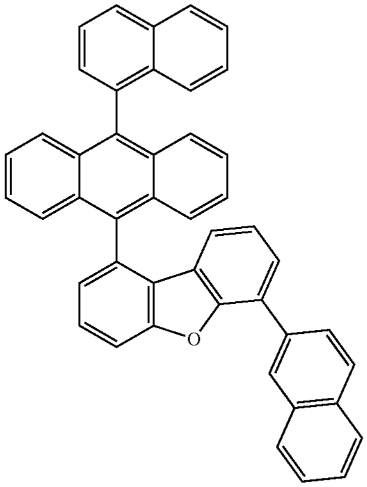
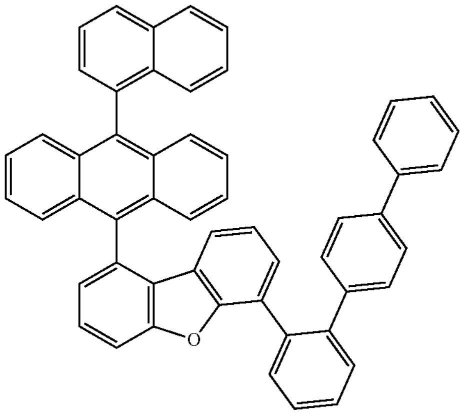
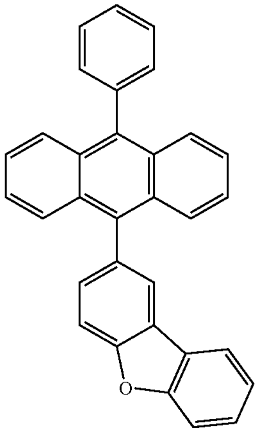

-continued
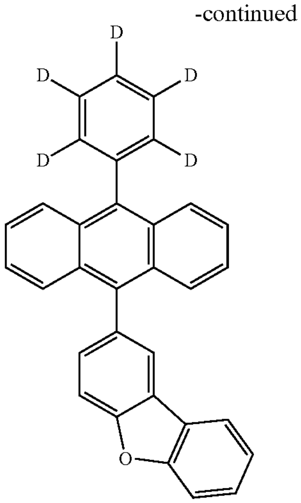
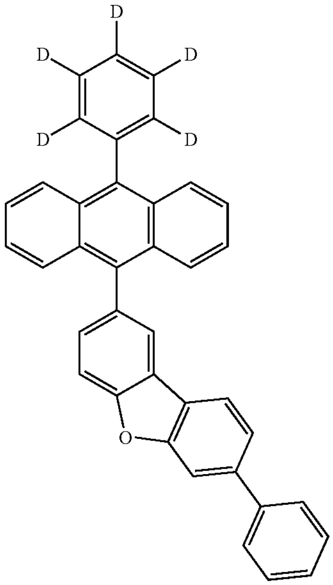
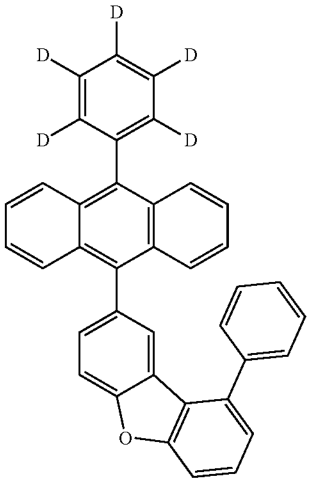
-continued
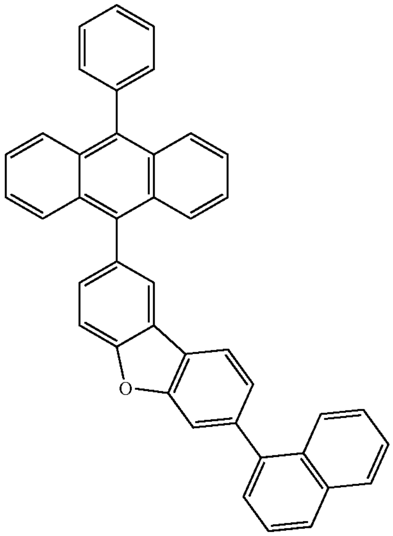
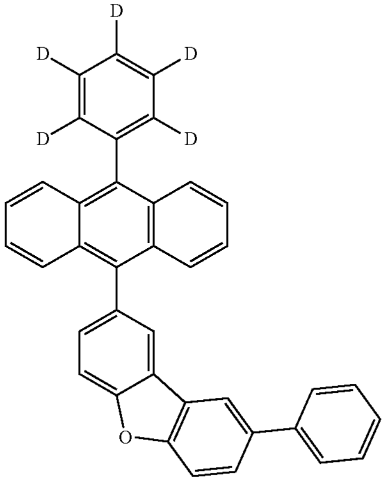
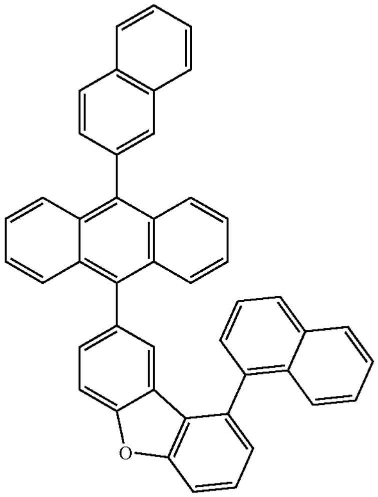

-continued
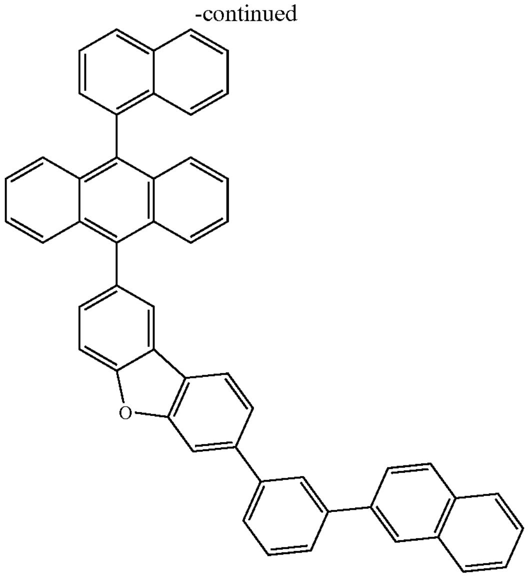
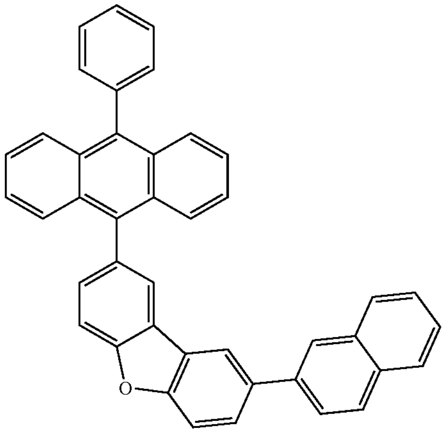
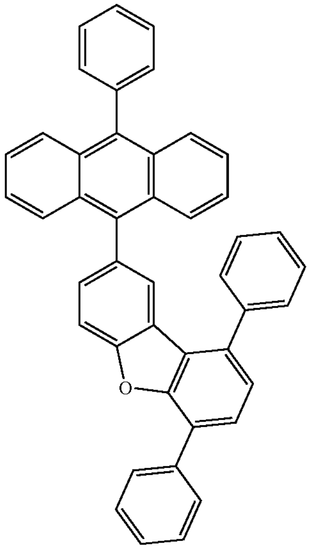
-continued
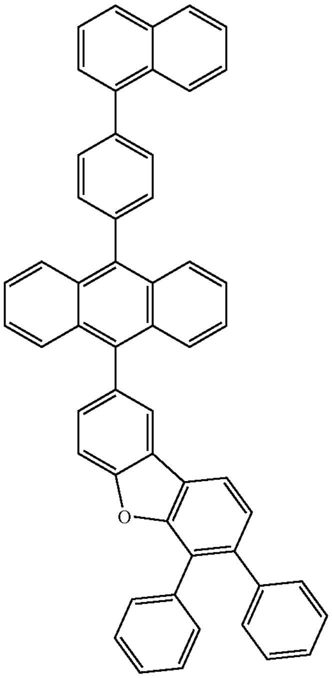
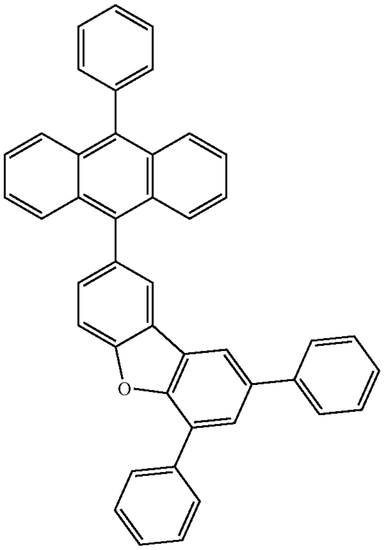

-continued
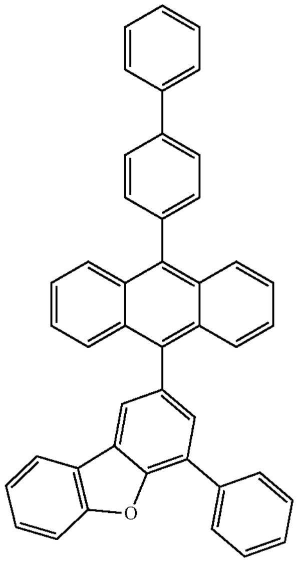
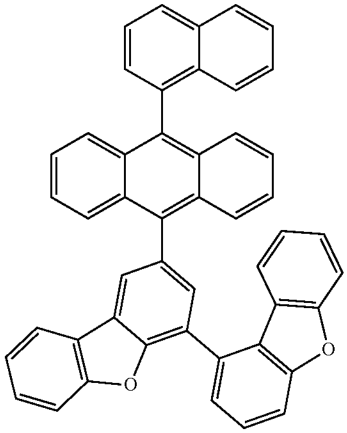
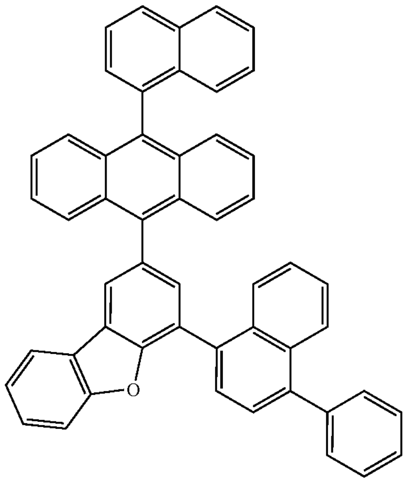
-continued
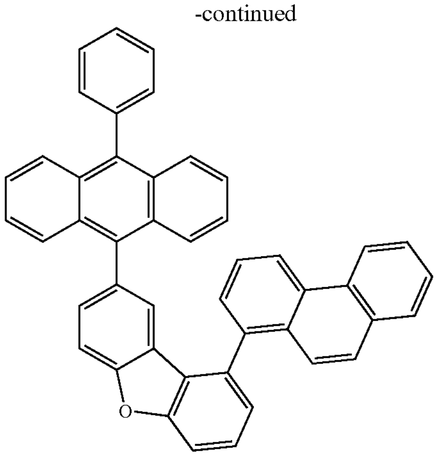
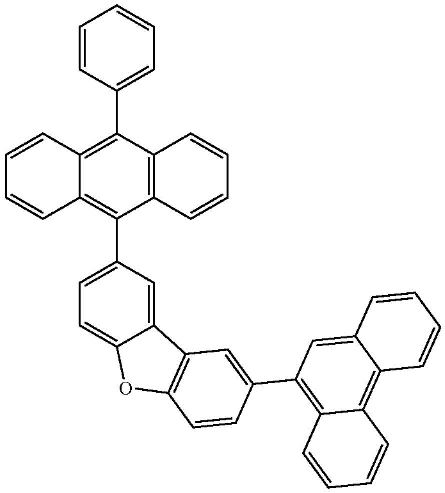
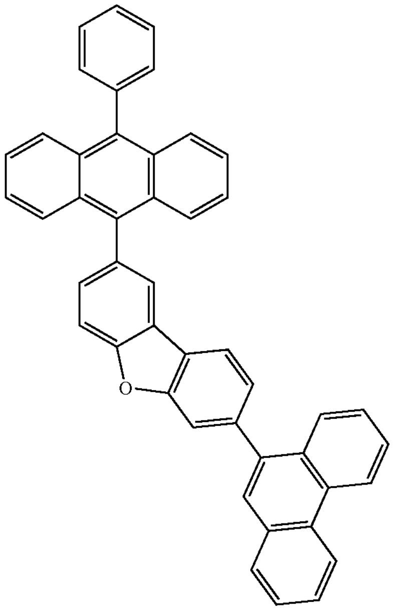

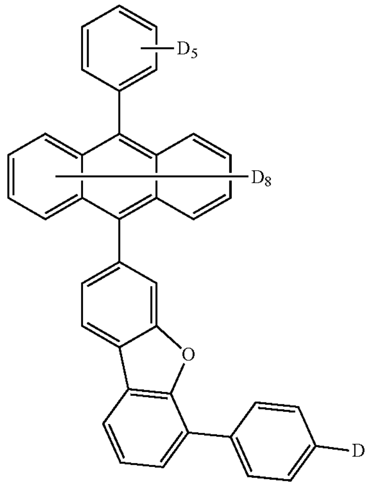
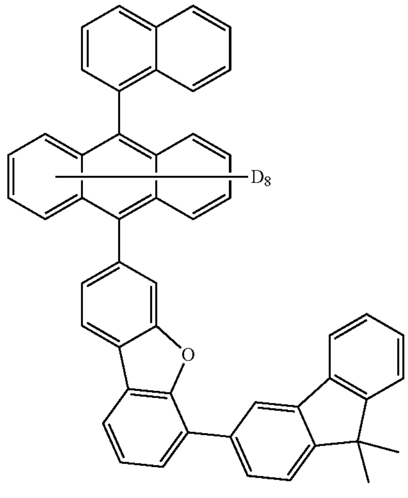
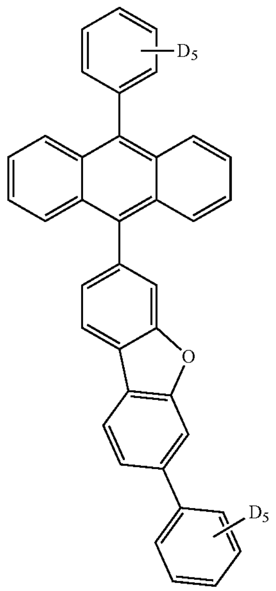
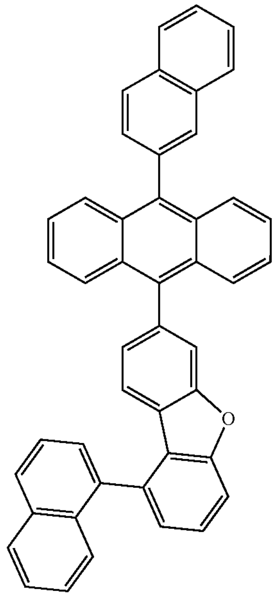
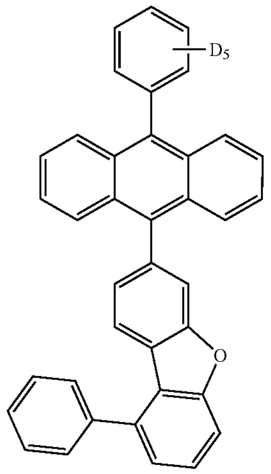
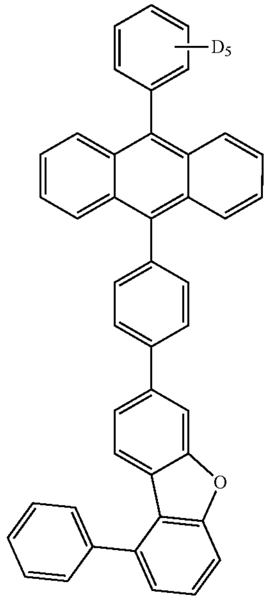

-continued
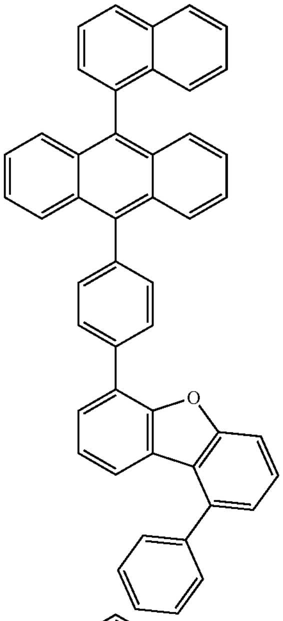
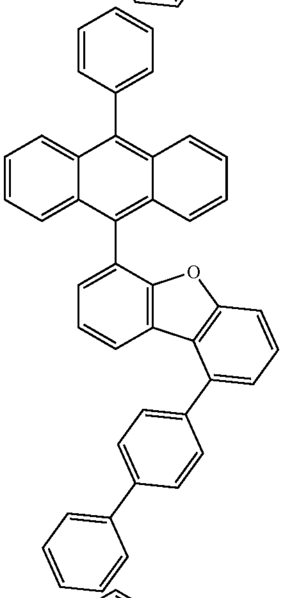
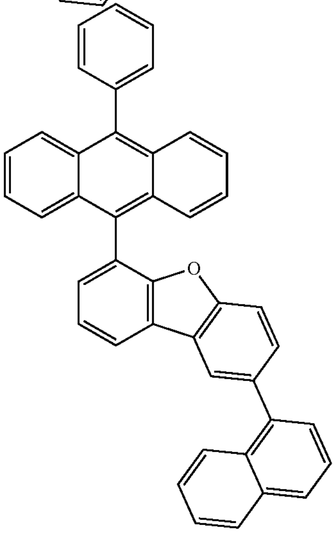
-continued
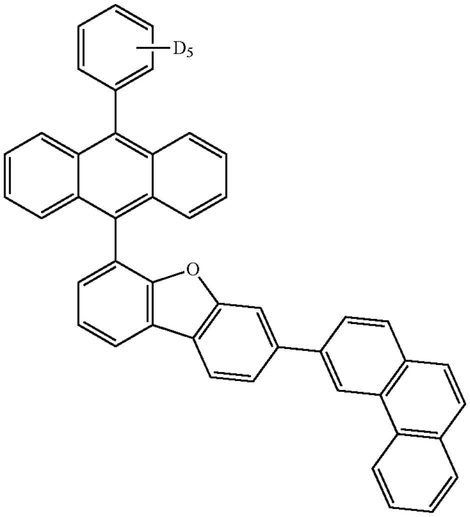
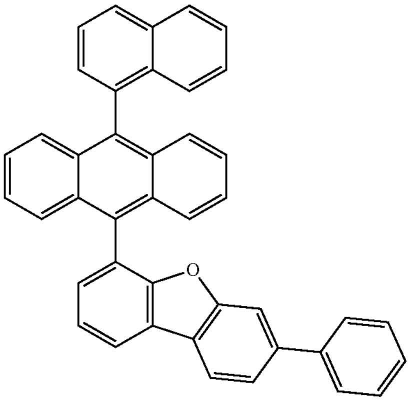
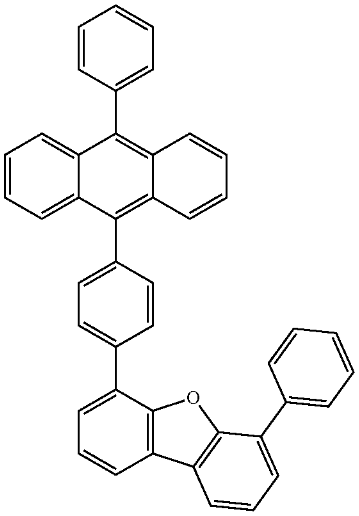

-continued
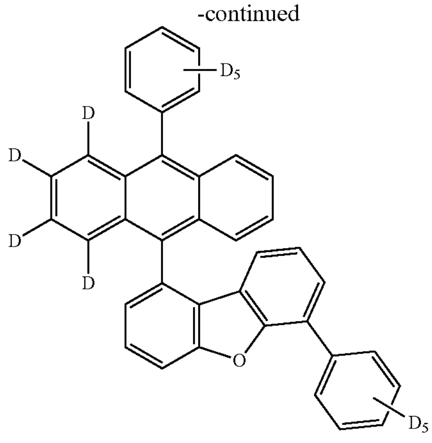
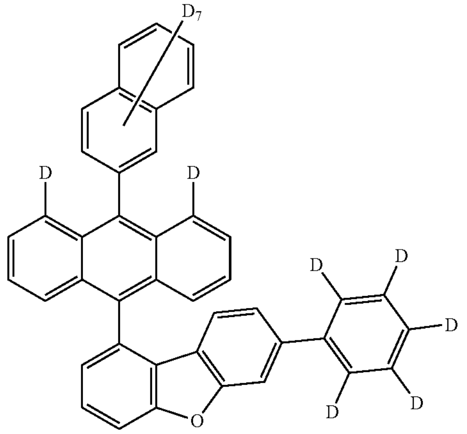
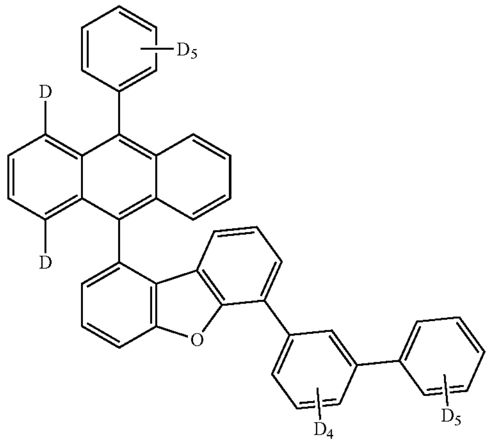
-continued
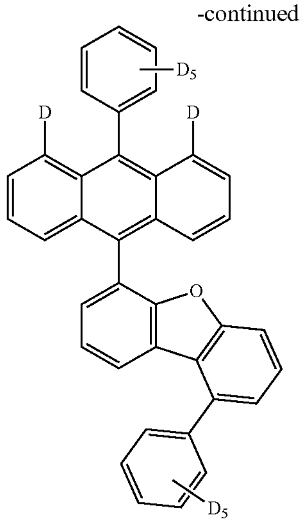
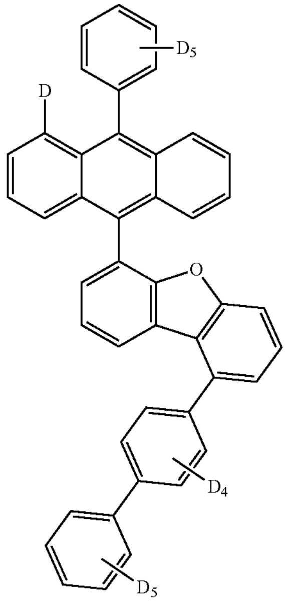
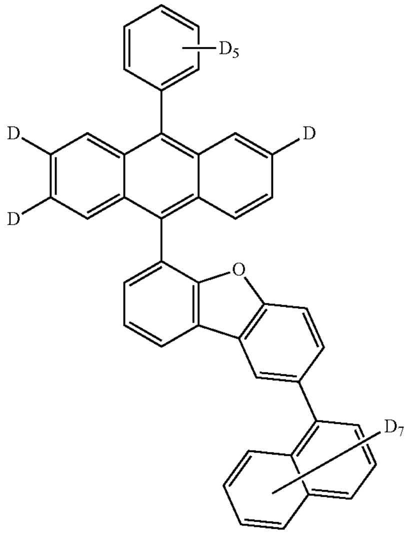

-continued
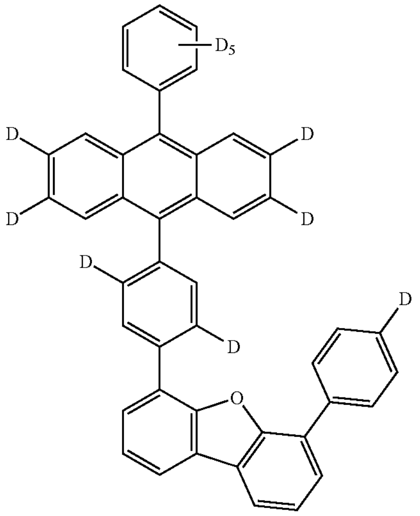
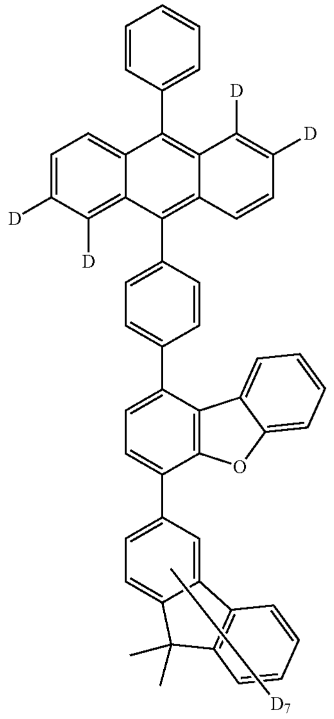
-continued
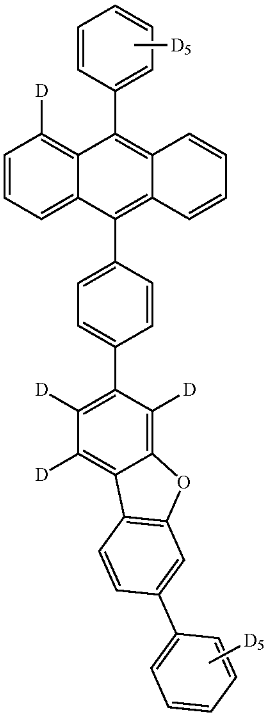
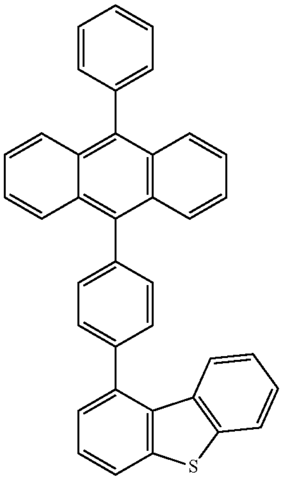
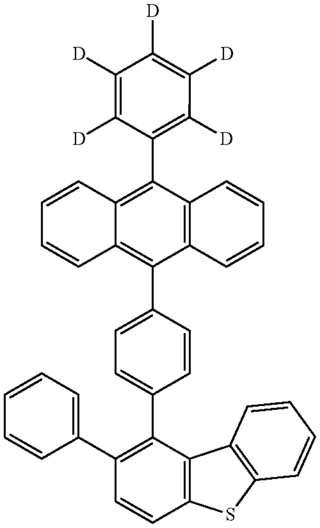

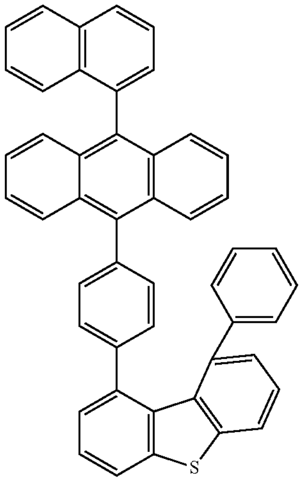
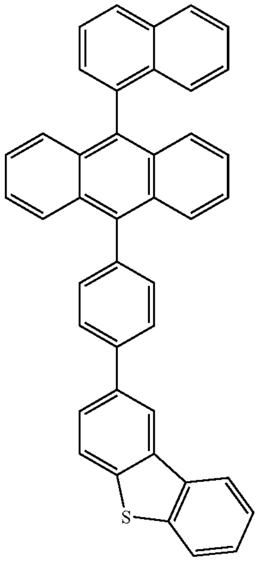
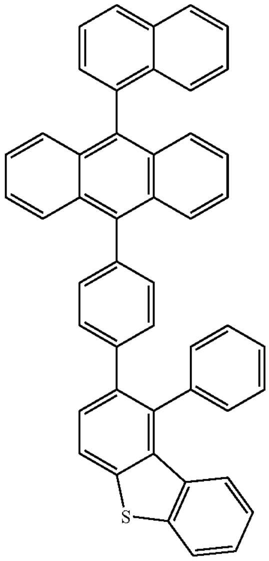
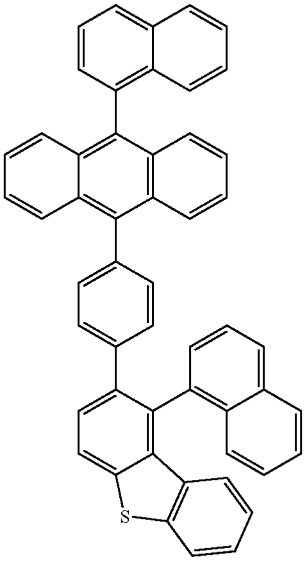
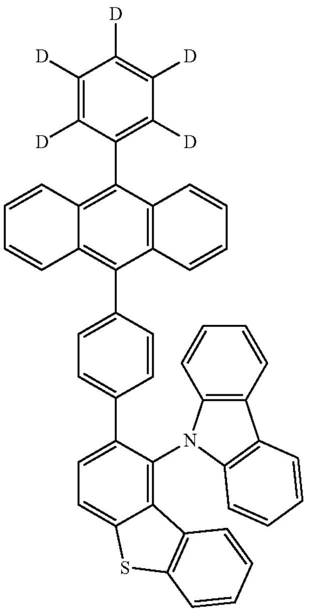

-continued
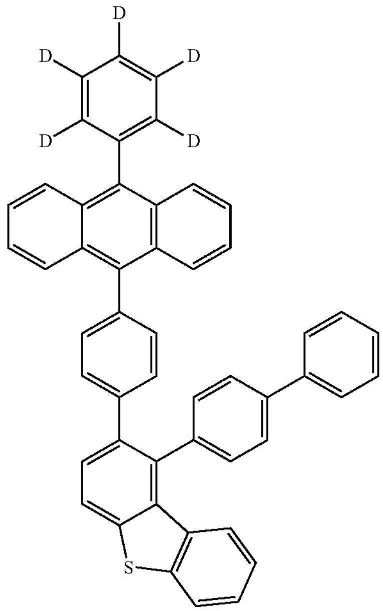
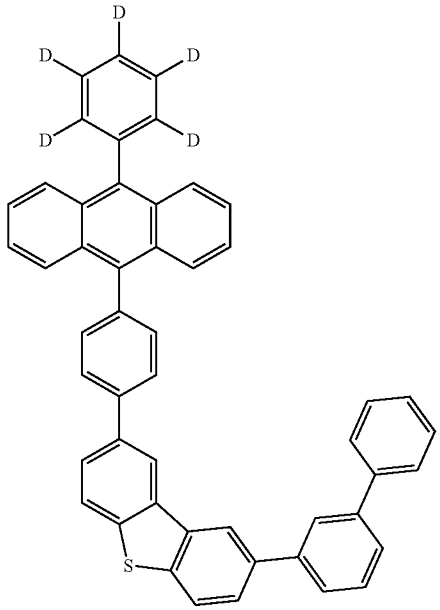
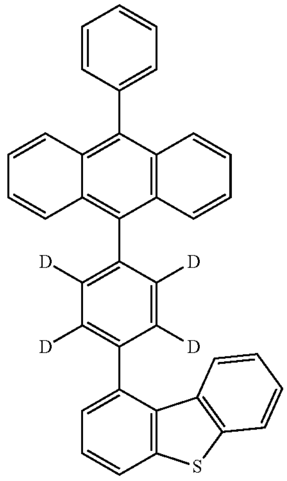
-continued
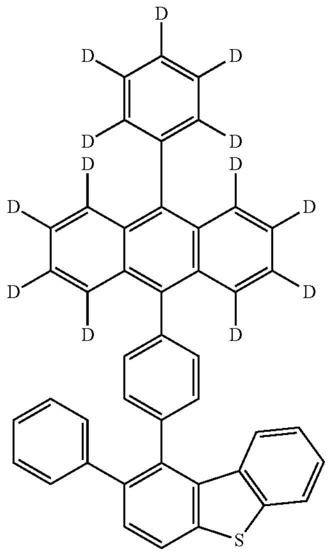
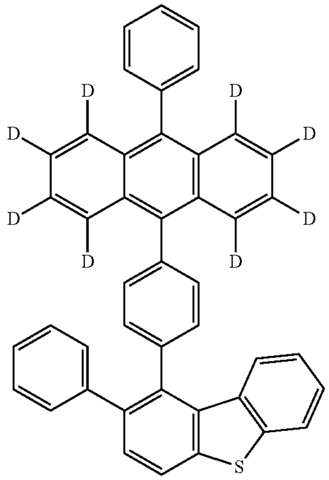
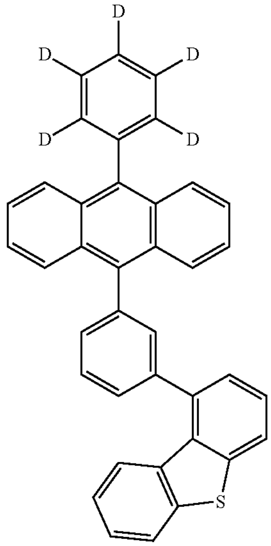

-continued
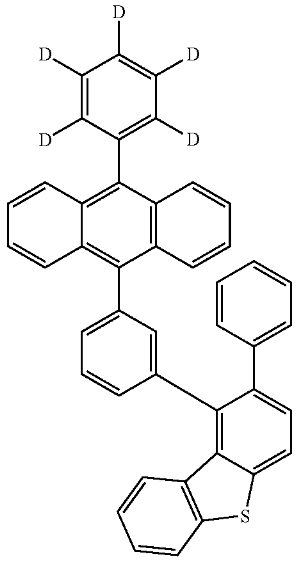
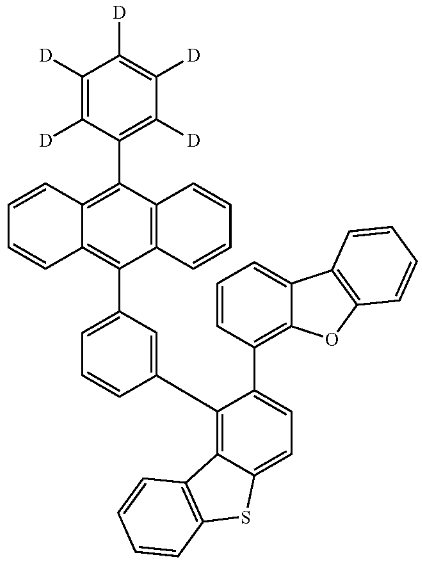
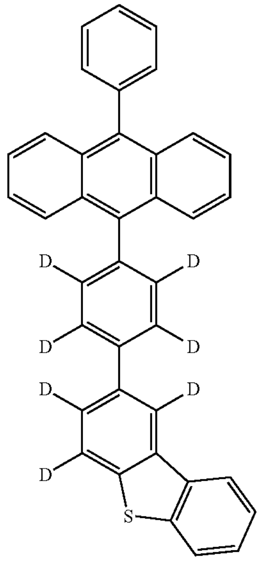
-continued
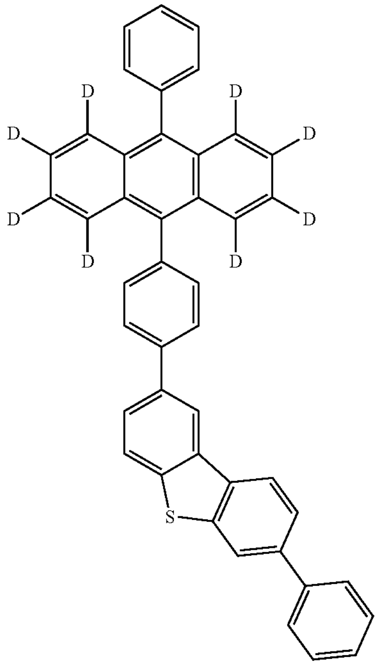
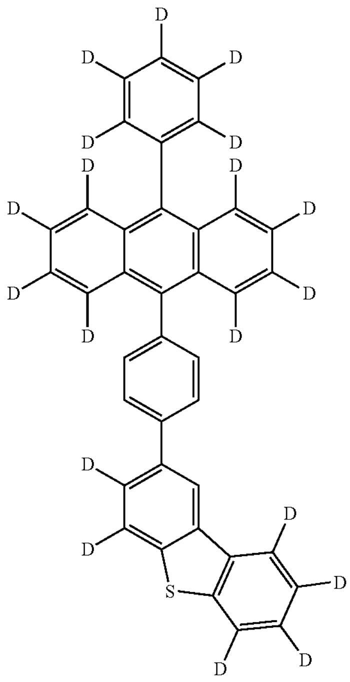
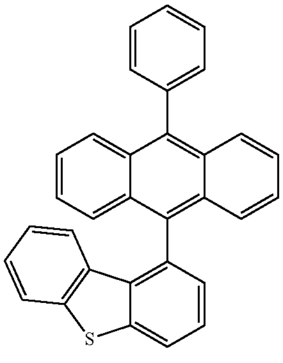

-continued
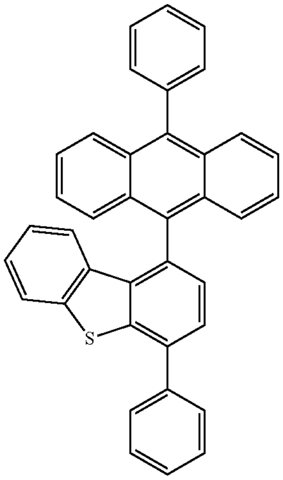
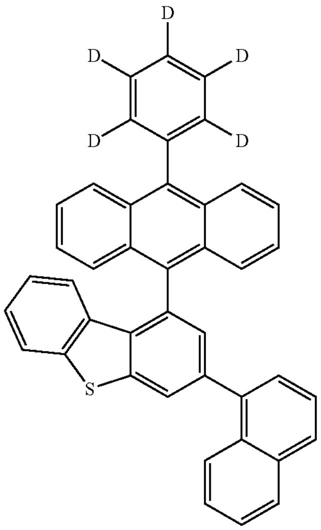
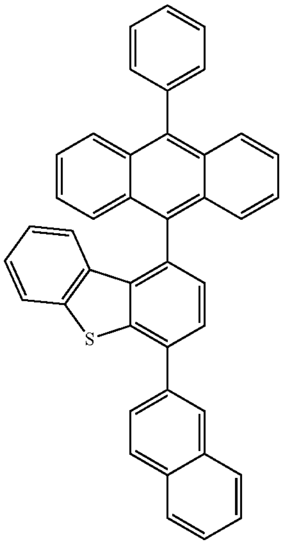
-continued
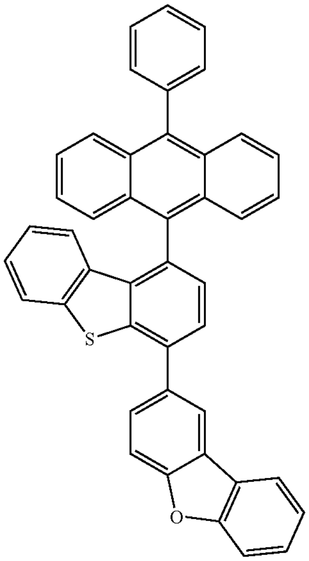
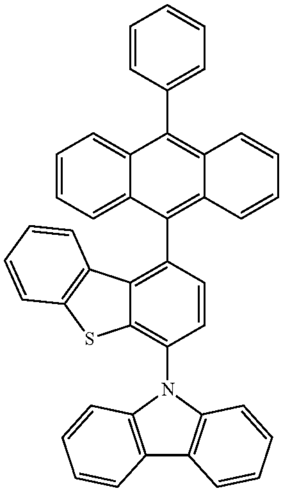
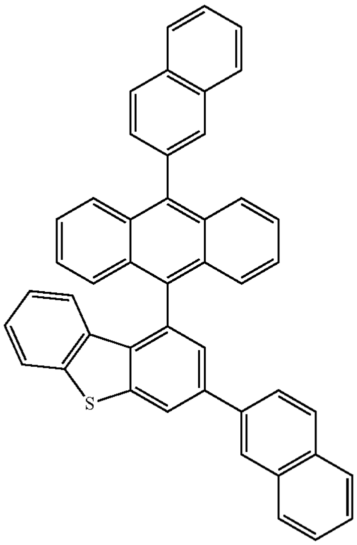

-continued
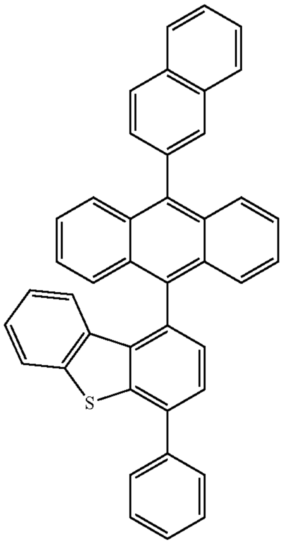
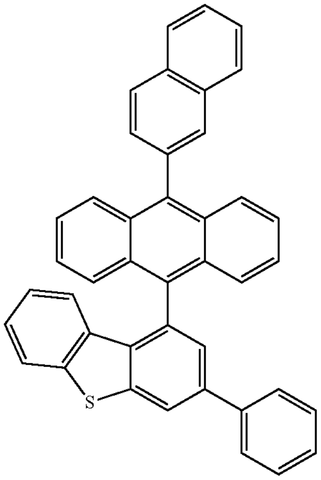
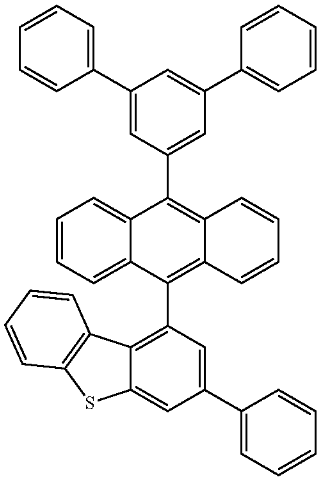
-continued
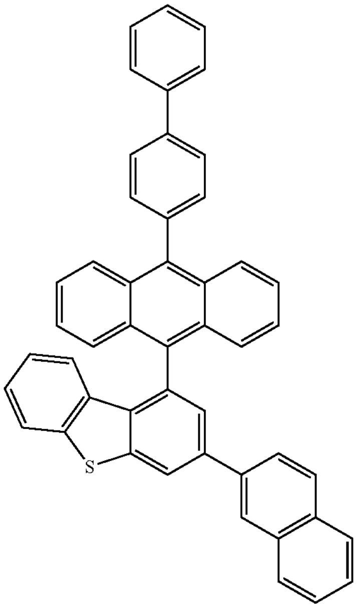
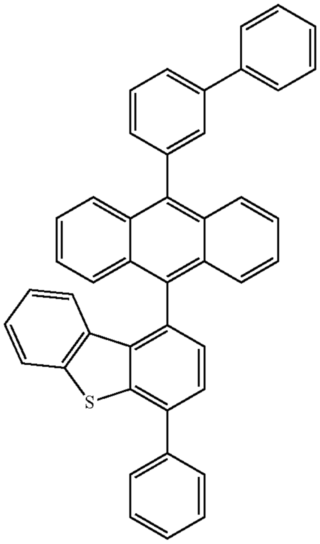
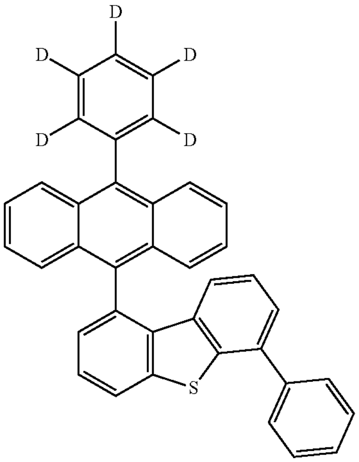

-continued
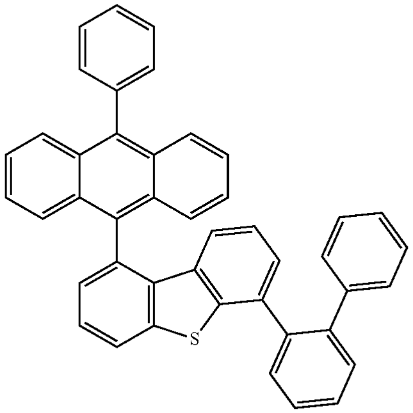
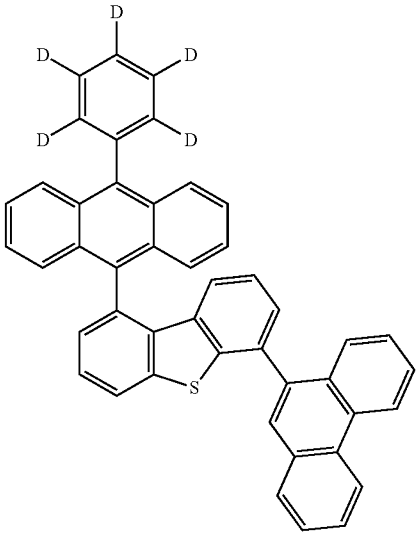
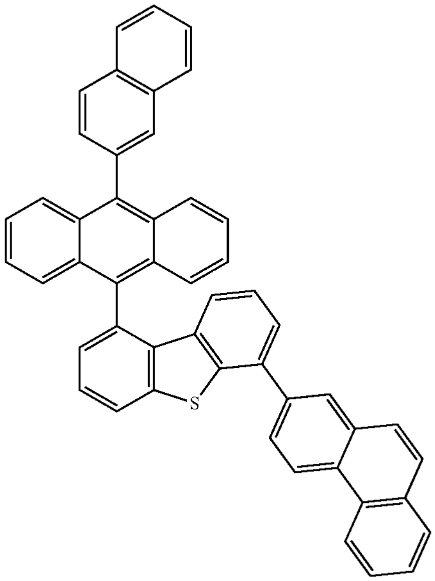
-continued
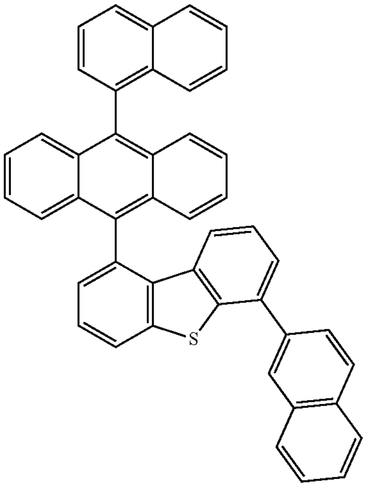
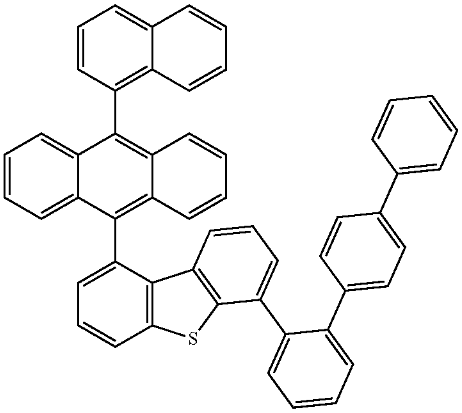
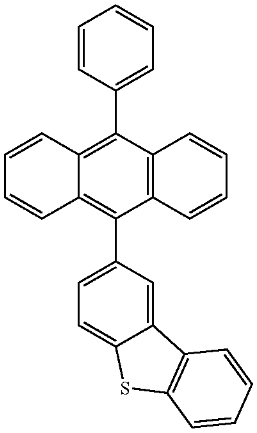

-continued
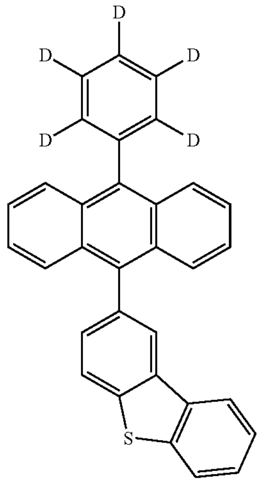
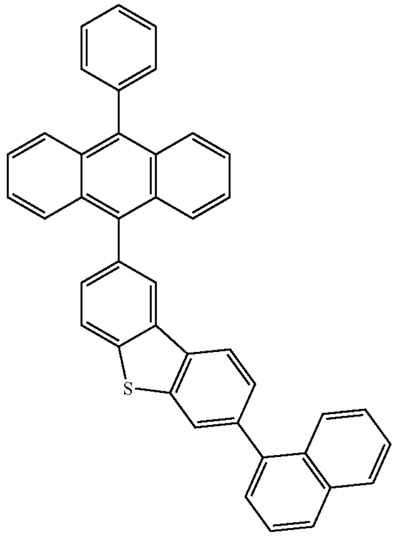
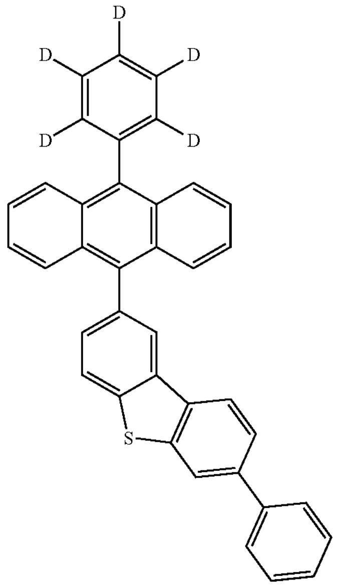
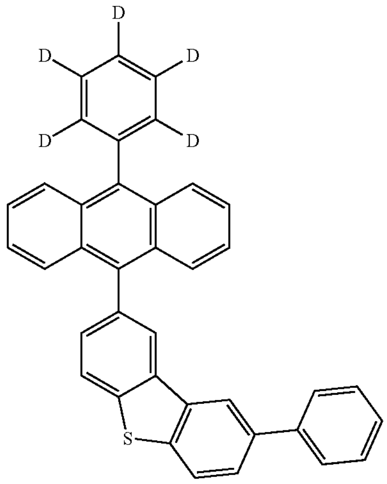
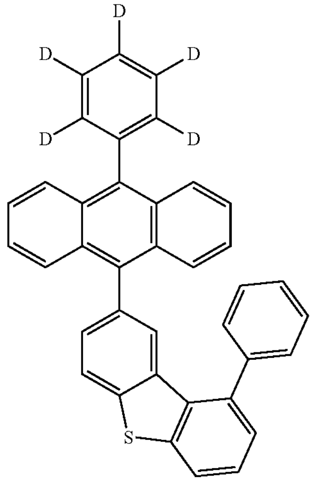
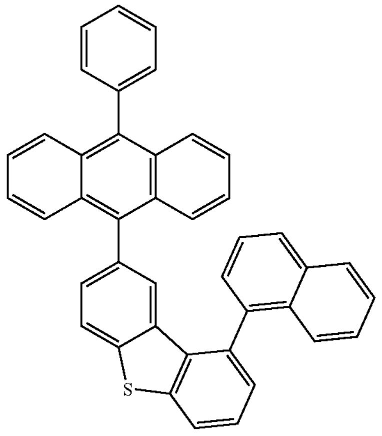
-continued -continued
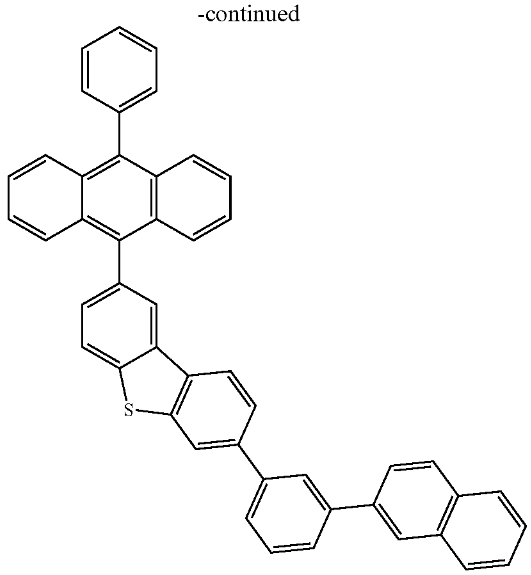
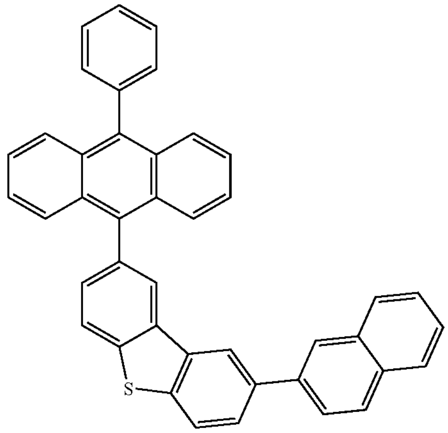
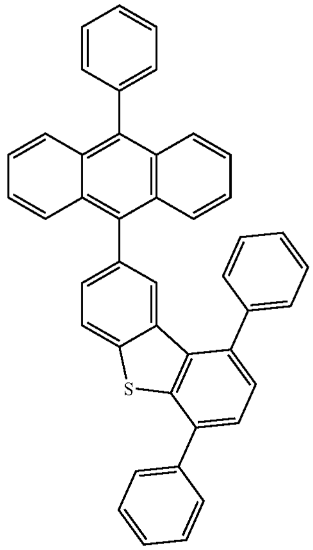
-continued
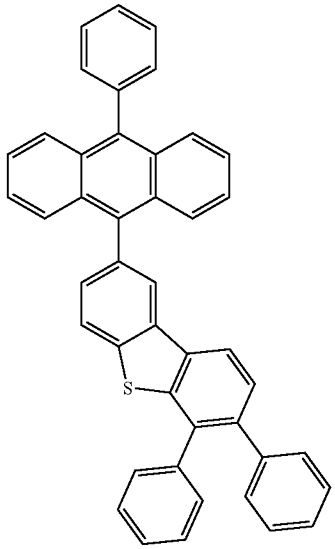
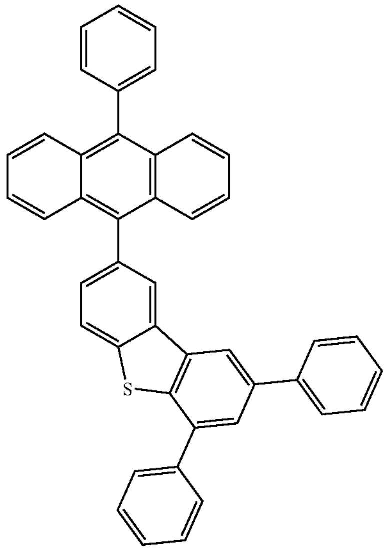
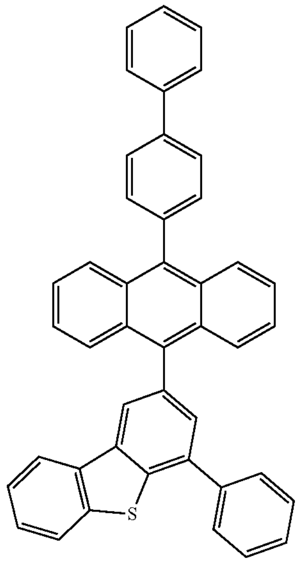

-continued
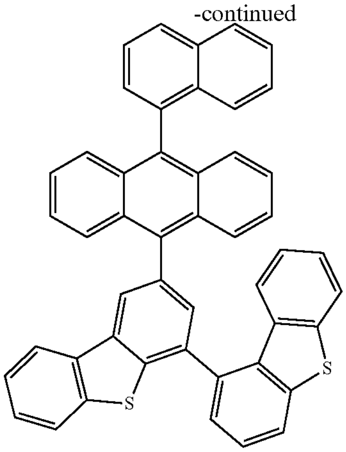
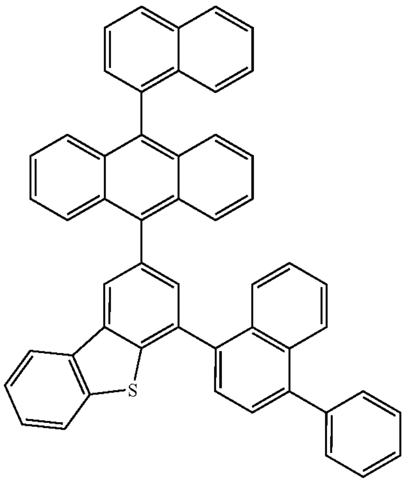
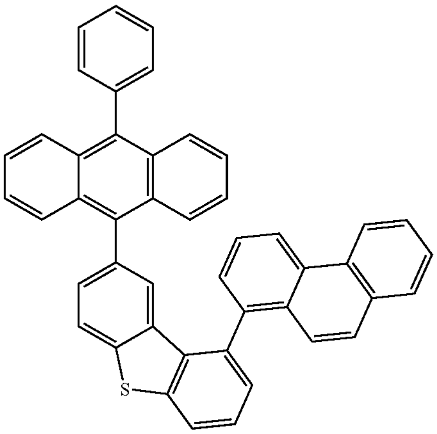
-continued
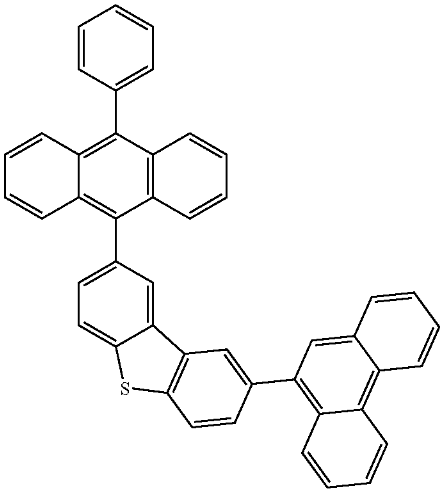
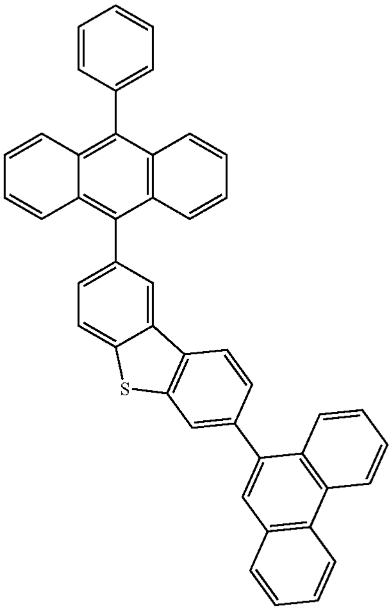
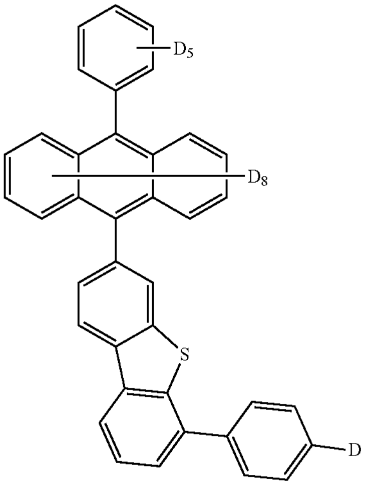

-continued
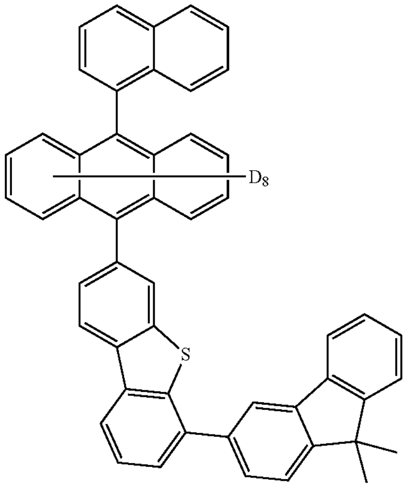
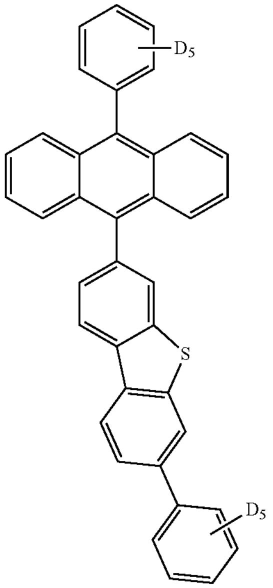
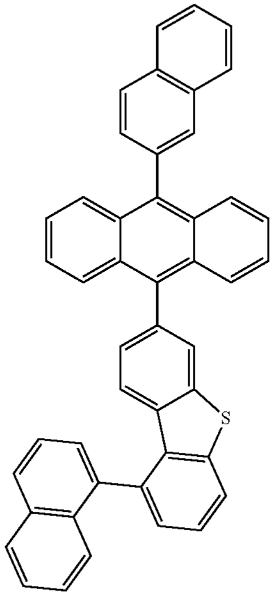
-continued
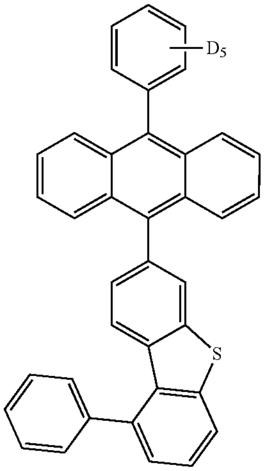
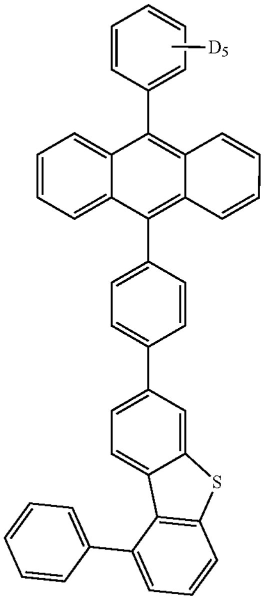
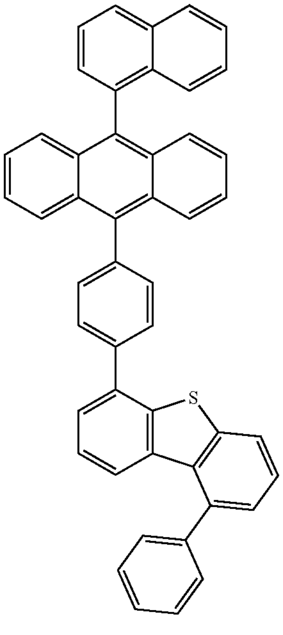

-continued
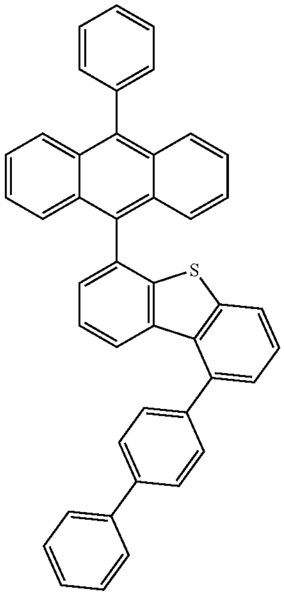
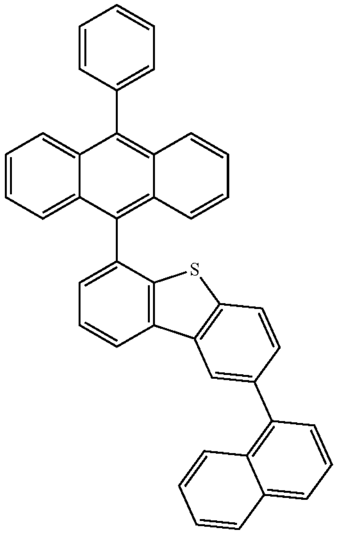
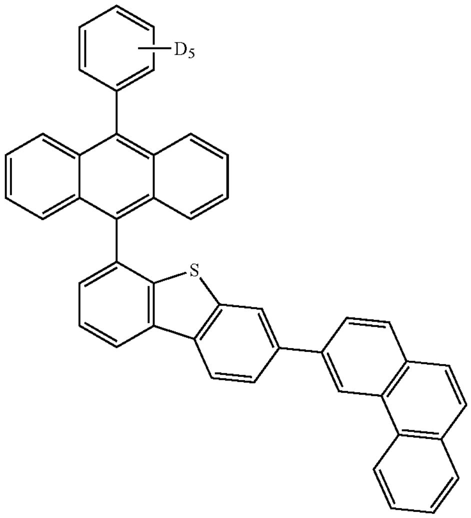
-continued
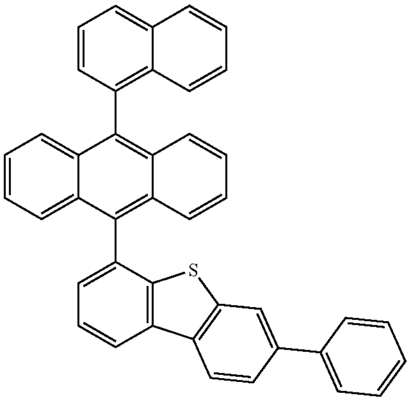
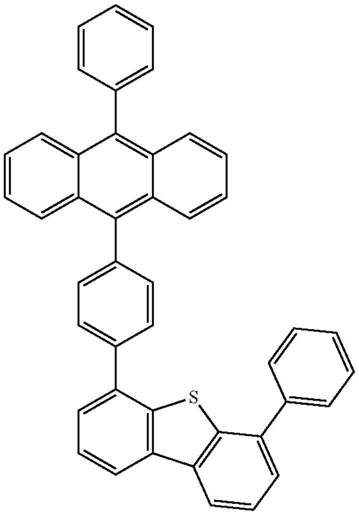
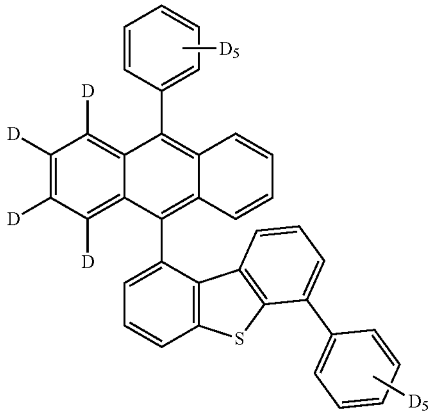

-continued
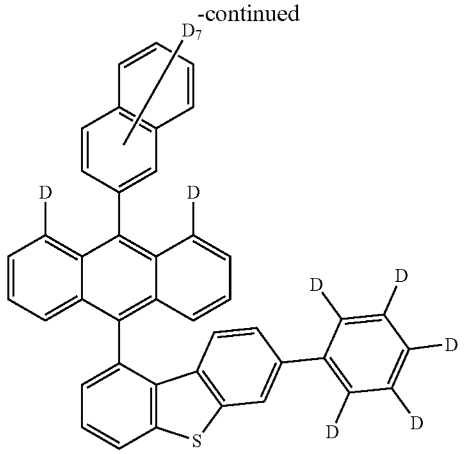
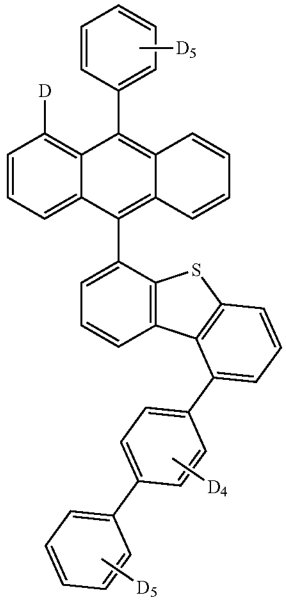
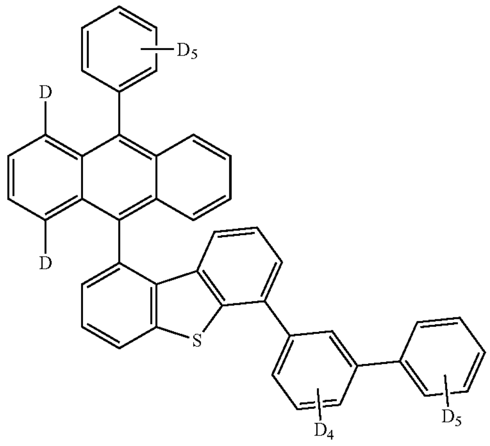
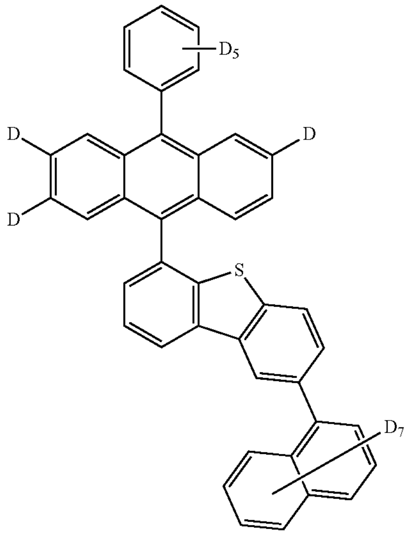
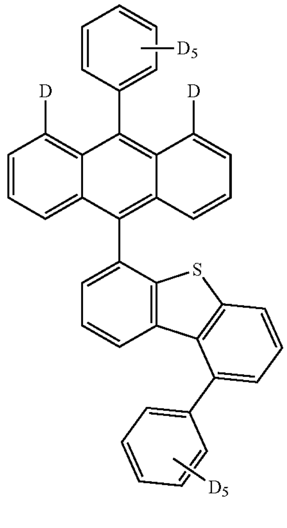
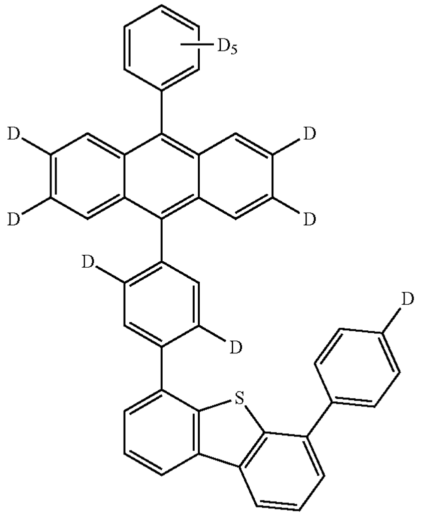

-continued

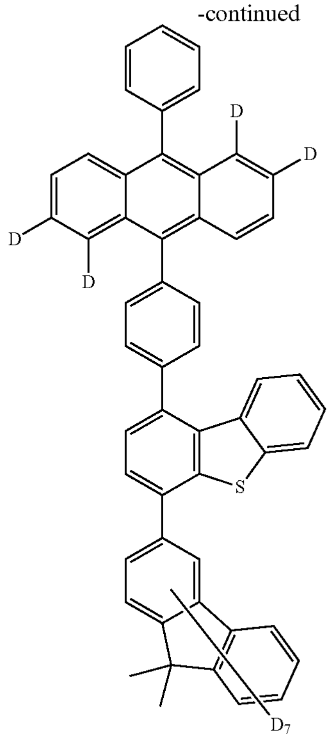

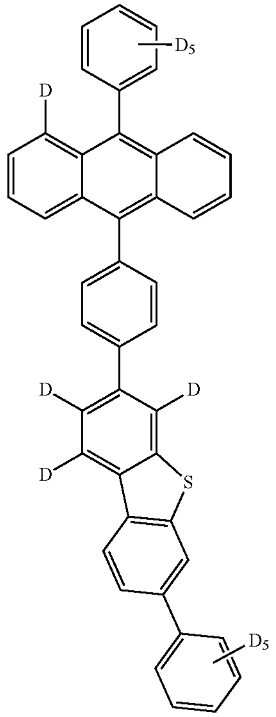

The organic material layer structure of the preferred organic light-emitting device according to the present invention will be described in more detail in the following Examples.

Meanwhile, a detailed structure of the organic light-emitting device according to an embodiment of the present invention, a method of manufacturing the same, and materials for the organic layers will be described as follows.

First, a substrate is coated with a material for an anode to form the anode. The substrate used herein is a substrate generally used for organic light-emitting devices and is preferably an organic substrate or a transparent plastic substrate that has excellent transparency, surface evenness, handleability and waterproofness. In addition, a material for the anode is indium tin oxide (ITO), indium zinc oxide (IZO), tin oxide ($SnO_2$), zinc oxide (ZnO), or the like, which is transparent and has excellent conductivity.

A hole injection layer is formed on the anode by vacuum thermal evaporation or spin coating using a material for the hole injection layer, and then a hole transport layer is formed on the hole injection layer by vacuum thermal evaporation or spin coating using a material for the hole transport layer.

The material for the hole injection layer may be used without particular limitation as long as it is commonly used in the art and specific examples thereof include 2-TNATA [4,4',4"-tris(2-naphthylphenyl-phenylamino)-triphenylamine], NPD [N,N'-di(1-naphthyl)-N,N'-diphenylbenzidine)], TPD [N,N'-diphenyl-N,N'-bis(3-methylphenyl)-1,1'-biphenyl-4,4'-diamine], DNTPD [N,N'-diphenyl-N,N'-bis-[4-(phenyl-m-tolyl-amino)-phenyl]-biphenyl-4,4'-diamine], and the like.

In addition, the material for the hole transport layer is also used without particular limitation as long as it is commonly used in the art and is, for example, N,N'-bis(3-methylphenyl)-N,N'-diphenyl-[1,1-biphenyl]-4,4'-diamine (TPD) or N,N'-di(naphthalen-1-yl)-N,N'-diphenylbenzidine (α-NPD).

Subsequently, a hole auxiliary layer and a light-emitting layer are sequentially stacked on the hole transport layer, and a hole blocking layer is selectively deposited on the light-emitting layer by vacuum deposition or spin coating to form a thin film. Because the lifetime and efficiency of the device are reduced when holes are introduced into the cathode through the organic light-emitting layer, the hole blocking layer is formed using a material having a very low HOMO (highest occupied molecular orbital) level so as to prevent this problem. The hole blocking material used herein is not particularly limited and is typically BAlq, BCP or TPBI that has an electron transport ability and has an ionization potential higher than that of a light-emitting compound.

The material used for the hole blocking layer may be BAlq, BCP, Bphen, TPBI, NTAZ, $BeBq_2$, OXD-7, Liq, or the like, but is not limited thereto.

An electron transport layer is deposited on the hole blocking layer through vacuum deposition or spin coating and a metal for forming a cathode is formed on the electron injection layer through vacuum thermal evaporation to form a cathode. As a result, an organic light-emitting device according to an embodiment is completed.

Here, the metal for forming the cathode may be lithium (Li), magnesium (Mg), aluminum (Al), aluminum-lithium (Al—Li), calcium (Ca), magnesium-indium (Mg—In), magnesium-silver (Mg—Ag) or the like. A transmissive cathode using ITO or IZO may be used in order to obtain a top-emission type light-emitting device.

The material for the electron transport layer functions to stably transport electrons injected from the cathode and may be a well-known electron transport material. Examples of the well-known electron transport material include quinoline derivatives, especially, tris(8-quinolinolate)aluminum (Alq3), TAZ, BAlq, beryllium bis(benzoquinolin-10-olate: Bebq2) and oxadiazole derivatives (PBD, BMD, BND, etc.).

In addition, each of the organic layers may be formed by a monomolecular deposition or solution process. The deposition is a method of forming a thin film by evaporating a material for forming each layer through heating in the presence of a vacuum or low pressure and the solution process is a method of forming a thin film by mixing a material for forming each layer with a solvent and forming the thin film from the mixture through a method such as inkjet printing, roll-to-roll coating, screen printing, spray coating, dip coating, or spin coating.

In addition, the organic light-emitting device according to the present invention may further include a light-emitting layer of a blue light-emitting material, a green light-emitting material, or a red light-emitting material that emits light in a wavelength range of 380 nm to 800 nm. That is, the light-emitting layer of the present invention includes a plurality of light-emitting layers, and a blue light-emitting material, a green light-emitting material, or a red light-emitting material in the additionally formed light-emitting layer may be a fluorescent material or a phosphorescent material.

In addition, the organic light-emitting device is used for a display or lighting system selected from flat panel displays, flexible displays, monochromatic or white flat panel lighting systems, monochromatic or white flexible lighting systems, vehicle displays, and displays for virtual or augmented reality.

MODE FOR INVENTION

Hereinafter, the present invention will be described in more detail with reference to preferred examples. However, it will be obvious to those skilled in the art that these examples are merely provided for illustration of the present invention, and should not be construed as limiting the scope of the present invention.

[Formula B] or [Formula C] Synthesis Example

Synthesis Example 1. Synthesis of Compound 1

Synthesis Example 1-1. Synthesis of <Intermediate 1-a>

[Reaction Scheme 1]

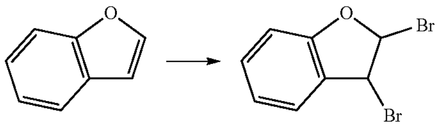

<Intermediate 1-a>

50 g (423 mmol) of benzofuran and 500 mL of dichloromethane are added to a 1 L reactor, followed by stirring. The reaction product was cooled to −10° C., and a dilution of 67.7 g (423 mmol) of bromine in 100 mL of dichloromethane was added dropwise to the reaction product, followed by stirring at 0° C. for 2 hours. After completion of the reaction, an aqueous sodium thiosulfate solution was added thereto, followed by stirring and extraction with ethyl acetate and $H_2O$. The organic layer was concentrated under reduced pressure and recrystallized with ethanol to obtain 100 g of <Intermediate 1-a>. (yield 93%)

Synthesis Example 1-2. Synthesis of <Intermediate 1-b>

<Intermediate 1-b> was synthesized by the following [Reaction Scheme 2].

[Reaction Scheme 2]

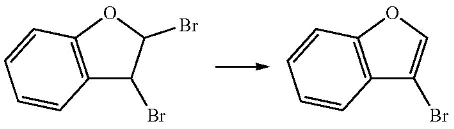

<Intermediate 1-b>

48.6 g (866 mmol) of potassium hydroxide was dissolved in 400 mL of ethanol in a 1 L reactor. A solution of 120 g (433 mmol) of <Intermediate 1-A> in ethanol was added dropwise thereto at 0° C., followed by stirring under reflux for 2 hours. After completion of the reaction, the ethanol organic layer was concentrated under reduced pressure and extracted with ethyl acetate and water. The result was separated by column chromatography to obtain 42 g of <intermediate 1-b>. (yield 50%)

Synthesis Example 1-3. Synthesis of <Intermediate 1-c>

<Intermediate 1-c> was synthesized by the following [Reaction Scheme 3].

[Reaction Scheme 3]

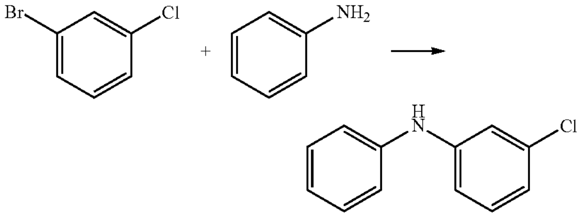

<Intermediate 1-c>

4.5 g (16 mmol) of 1-bromo-3-iodobenzene, 5.8 g (16 mmol) of aniline, 0.1 g (1 mmol) of palladium acetate, 3 g (32 mmol) of sodium tert-butoxide, 0.2 g (1 mmol) of bis(diphenylphosphino)-1,1'-binaphthyl and 45 mL of toluene were added to a 100 mL reactor, followed by stirring under reflux for 24 hours. After completion of the reaction, the product was filtered and the filtrate was concentrated and separated by column chromatography to obtain 5.2 g of <Intermediate 1-c>. (yield 82%)

Synthesis Example 1-4. Synthesis of <Intermediate 1-d>

<Intermediate 1-d> was synthesized by the following [Reaction Scheme 4].

[Reaction Scheme 4]

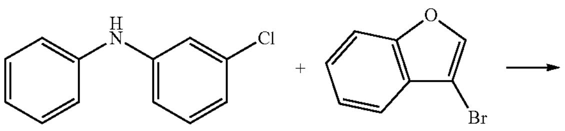

-continued

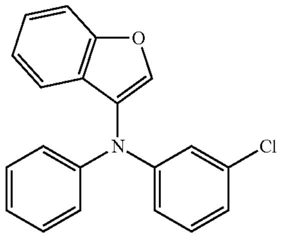

<Intermediate 1-d>

20 g (98 mmol) of <Intermediate 1-c>, 18.4 g (98 mmol) of <Intermediate 1-b>, 0.5 g (2 mmol) of palladium acetate, 18.9 g (196 mmol) of sodium tert-butoxide, 0.8 g (4 mmol) of tri-tert-butylphosphine, and 200 mL of toluene were added to a 250 mL reactor, followed by stirring under reflux for 5 hours. After completion of the reaction, the product was filtered and the filtrate was concentrated and separated by column chromatography to obtain 22 g of <Intermediate 1-d>. (yield 75%)

Synthesis Example 1-5. Synthesis of <Intermediate 1-e>

<Intermediate 1-e> was synthesized by the following [Reaction Scheme 5].

[Reaction Scheme 5]

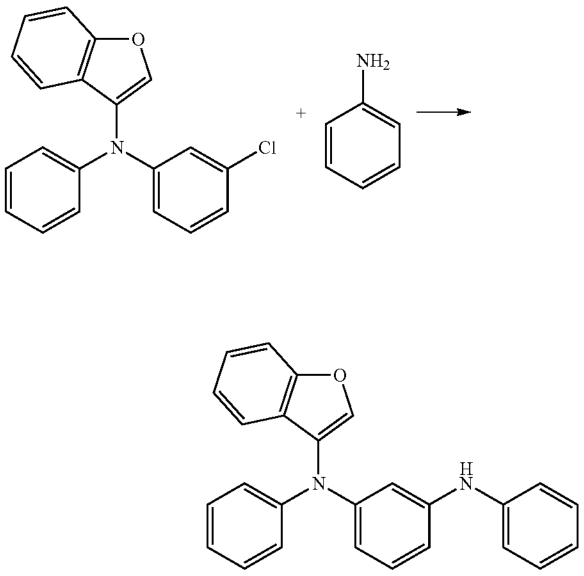

<Intermediate 1-e>

18.5 g of <Intermediate 1-e> was obtained in the same manner as in Synthesis Example 1-3, except that <Intermediate 1-d> was used instead of 1-bromo-4-iodobenzene. (yield 74.1%)

Synthesis Example 1-6. Synthesis of <Intermediate 1-f>

<Intermediate 1-f> was synthesized by the following [Reaction Scheme 6].

[Reaction Scheme 6]

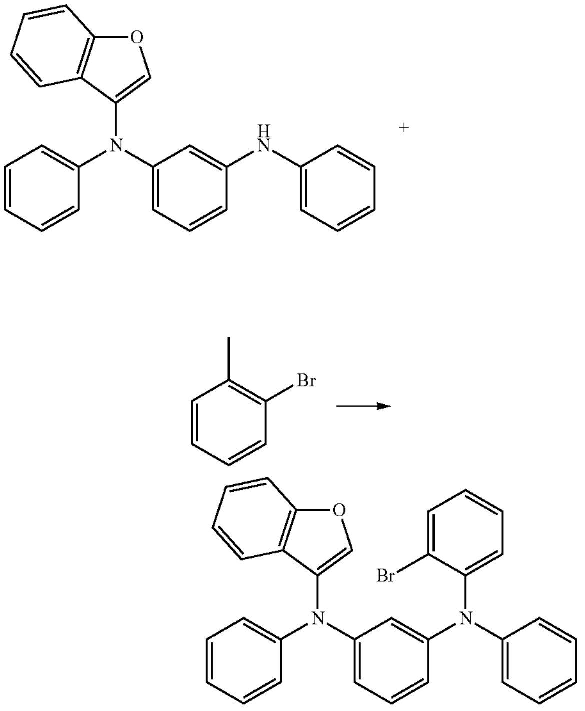

<Intermediate 1-f>

12 g of <Intermediate 1-f> was obtained in the same manner as in Synthesis Example 1-4, except that <Intermediate 1-e> and 1-bromo-2-iodobenzene were used instead of <Intermediate 1-c> and <Intermediate 1-b>. (yield 84.1%)

Synthesis Example 1-7. Synthesis of <Compound 1>

<Compound 1> was synthesized by the following [Reaction Scheme 7].

[Reaction Scheme 7]

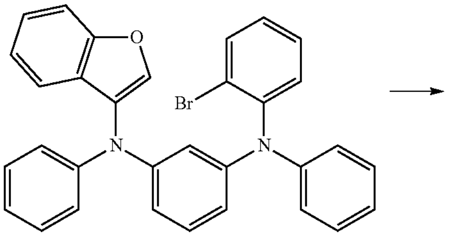

-continued

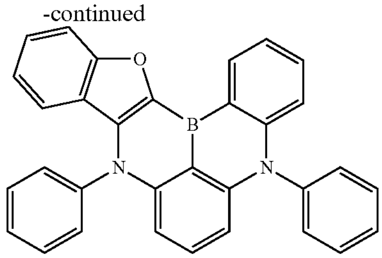

<Compound 1>

12 g (23 mmol) of <Intermediate 1-f> and 120 mL of tert-butylbenzene were added to a 300 mL reactor. 42.5 mL (68 mmol) of n-butyllithium was added dropwise thereto at −78° C. Then, the mixture was stirred at 60° C. for 3 hours. Then, the heptane was removed by purging with nitrogen at 60° C. 11.3 g (45 mmol) of boron tribromide was added dropwise at −78° C. Then, the mixture was stirred at room temperature for 1 hour, and 5.9 g (45 mmol) of N,N-diisopropylethylamine was added dropwise at 0° C. Then, the mixture was stirred at 120° C. for 2 hours. After completion of the reaction, a sodium acetate solution was added thereto at room temperature, followed by stirring. The result was extracted with ethyl acetate, and the organic layer was concentrated and separated by column chromatography to obtain 0.8 g of <Compound 1>. (yield 13%)

MS (MALDI-TOF): m/z 460.17 [$M^+$]

Synthesis Example 2. Synthesis of Compound 2

Synthesis Example 2-1. Synthesis of <Intermediate 2-a>

<Intermediate 2-a> was synthesized by the following [Reaction Scheme 8].

[Reaction Scheme 8]

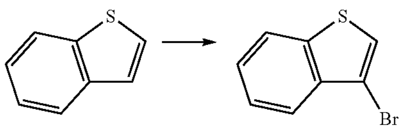

<Intermediate 2-a>

50 g (373 mmol) of benzothiophene and 500 mL of dichloromethane are added to a 1 L reactor, followed by stirring. The reaction product was cooled to −0° C., and a dilution of 59.5 g (373 mmol) of bromine in 100 mL of chloroform was added dropwise to the reaction product, followed by stirring at room temperature for 4 hours. After completion of the reaction, an aqueous sodium thiosulfate solution was added thereto, followed by stirring and extraction with ethyl acetate and $H_2O$. The organic layer was concentrated under reduced pressure and separated by column chromatography to obtain 70 g of <Intermediate 2-a>. (yield 91%)

Synthesis Example 2-2. Synthesis of <Intermediate 2-b>

<Intermediate 2-b> Was synthesized by the following [Reaction Scheme 9].

[Reaction Scheme 9]

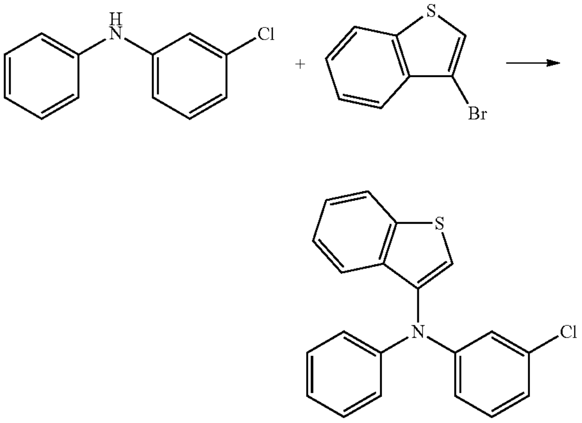

<Intermediate 2-b>

32 g of <Intermediate 2-b> was obtained in the same manner as in Synthesis Example 1-4, except that <Intermediate 2-a> was used instead of <Intermediate 1-b>. (yield 75.4%)

Synthesis Example 2-3. Synthesis of <Intermediate 2-c>

<Intermediate 2-c> was synthesized by the following [Reaction Scheme 10].

[Reaction Scheme 10]

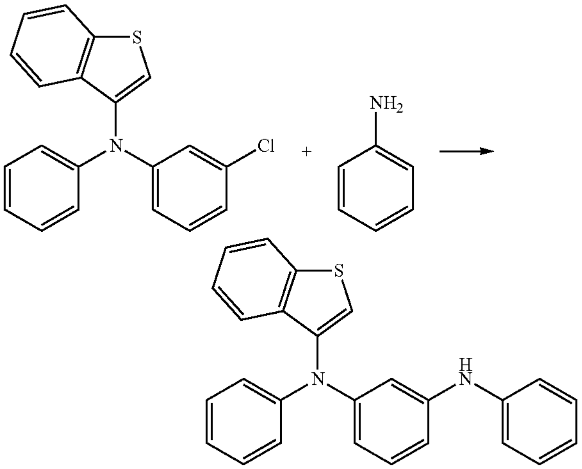

<Intermediate 2-c>

24.5 g of <Intermediate 2-c> was obtained in the same manner as in Synthesis Example 1-3, except that <Intermediate 2-b> was used instead of 1-bromo-4-iodobenzene. (yield 73.1%)

Synthesis Example 2-4. Synthesis of <Intermediate 2-d>

<Intermediate 2-d> was synthesized by the following [Reaction Scheme 11].

[Reaction Scheme 11]

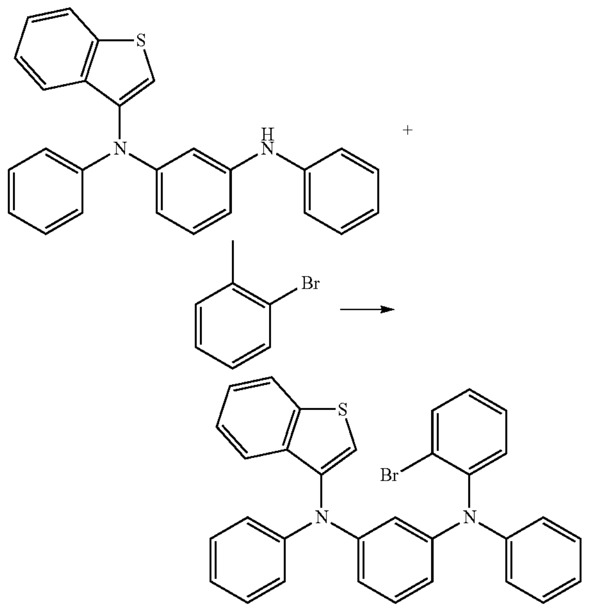

<Intermediate 2-d>

21 g of <Intermediate 2-d> was obtained in the same manner as in Synthesis Example 1-4, except that <Intermediate 2-c> and 1-bromo-2-iodobenzene were used instead of <Intermediate 1-c> and <Intermediate 1-b>. (yield 77.5%)

Synthesis Example 2-5. Synthesis of <Compound 2>

<Compound 2> was synthesized by the following [Reaction Scheme 12].

[Reaction Scheme 12]

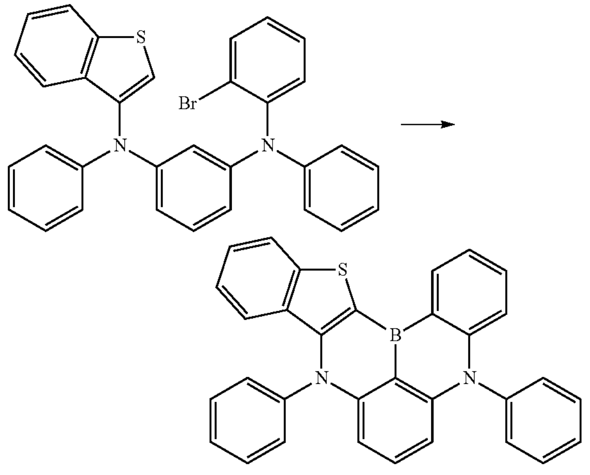

<Compound 2>

1.5 g of <Compound 2> was obtained in the same manner as in Synthesis Example 1-7, except that <Intermediate 2-d> was used instead of <Intermediate 1-f>. (yield 10.1%)

MS (MALDI-TOF): m/z 467.15 [$M^+$]

Synthesis Example 3. Synthesis of Compound 13

Synthesis Example 3-1. Synthesis of <Intermediate 3-a>

<Intermediate 3-a> was synthesized by the following [Reaction Scheme 13].

[Reaction Scheme 13]

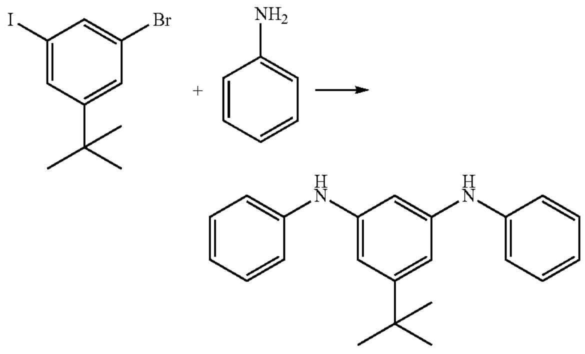

<Intermediate 3-a>

50 g (177 mmol) of 1-bromo-3(tert-butyl)-5-iodobenzene, 36.2 g (389 mmol) of aniline, 1.6 g (7 mmol) of palladium acetate, 51 g (530 mmol) of sodium tert-butoxide, 4.4 g (7 mmol) of bis(diphenylphosphino)-1,1'-binaphthyl, and 500 mL of toluene were added to a 1 L reactor, followed by stirring under reflux for 24 hours. After completion of the reaction, the reaction product was filtered. The filtrate was concentrated and separated by column chromatography to obtain 42.5 g of <Intermediate 3-a>. (yield 50%)

Synthesis Example 3-2. Synthesis of <Intermediate 3-b>

<Intermediate 3-b> was synthesized by the following [Reaction Scheme 14].

[Reaction Scheme 14]

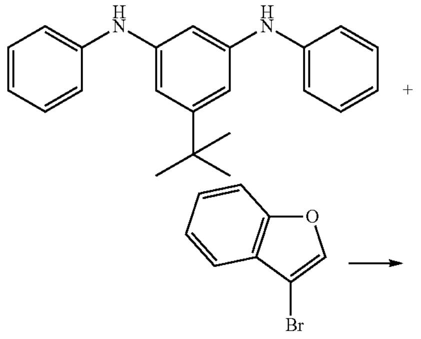

-continued

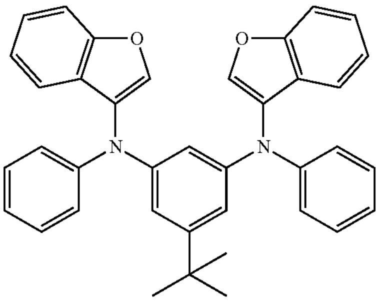

<Intermediate 3-b>

11 g (42 mmol) of <Intermediate 3-a>, 20 g (101 mmol) of <Intermediate 1-b>, 1 g (2 mmol) of palladium acetate, 12.2 g (127 mmol) of sodium tert-butoxide, 0.7 g (3 mmol) of tri-tert-butylphosphine and 150 mL of toluene were added to a 250 mL reactor, followed by stirring under reflux for 5 hours. After completion of the reaction, the reaction product was filtered and the filtrate was concentrated and then separated by column chromatography to obtain 11 g of <Intermediate 3-b>. (yield 65%)

Synthesis Example 3-3. Synthesis of <Compound 13>

<Compound 13> was synthesized by the following [Reaction Scheme 15].

[Reaction Scheme 15]

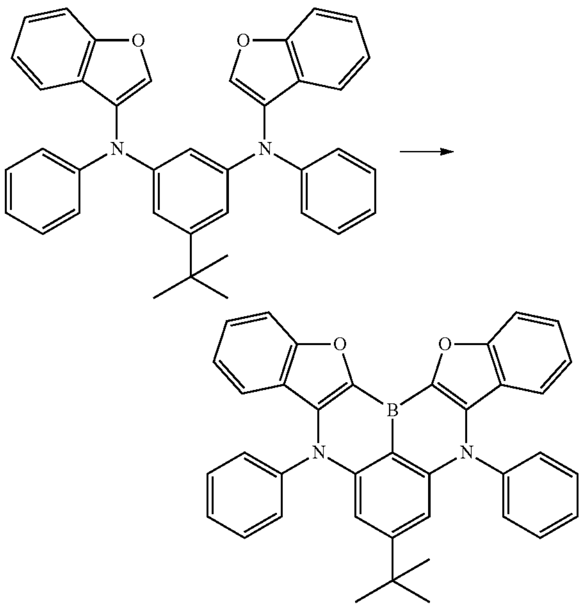

<Compound 13>

0.5 g of <Compound 13> was obtained in the same manner as in Synthesis Example 1-7, except that <Intermediate 3-b> was used instead of <Intermediate 1-f>. (yield 8%)

MS (MALDI-TOF): m/z 556.23 [$M^+$]

Synthesis Example 4. Synthesis of Compound 65

Synthesis Example 4-1. Synthesis of <Intermediate 4-a>

<Intermediate 4-a> was synthesized by the following [Reaction Scheme 16].

[Reaction Scheme 16]

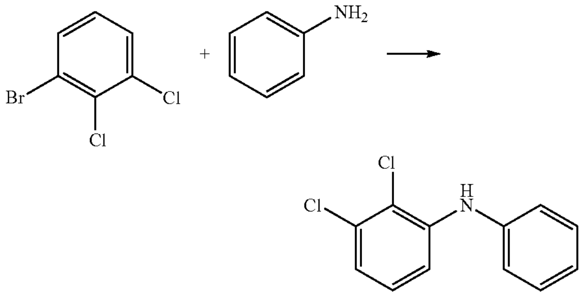

<Intermediate 4-a>

35.6 g of <Intermediate 4-a> was obtained in the same manner as in Synthesis Example 1-3, except that 1-bromo-2,3-dichlorobenzene was used instead of 1-bromo-4-iodobenzene. (yield 71.2%)

Synthesis Example 4-2. Synthesis of <Intermediate 4-b>

<Intermediate 4-b> was synthesized by the following [Reaction Scheme 17].

[Reaction Scheme 17]

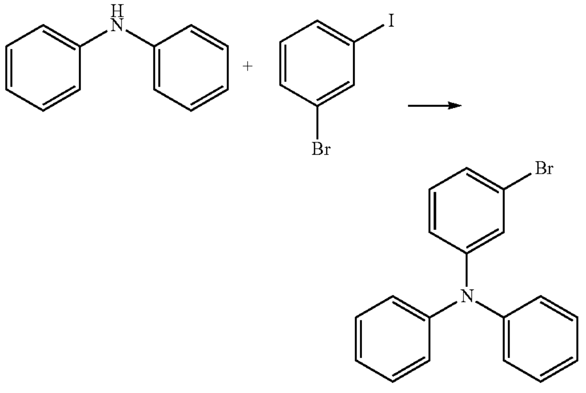

<Intermediate 4-b>

60.0 g (355 mmol) of diphenylamine, 100.3 g (355 mmol) of 1-bromo-3-iodobenzene, 0.8 g (4 mmol) of palladium acetate, 2 g (4 mmol) of xantphos, 68.2 g (709 mmol) of sodium tertiary butoxide, and 700 mL of toluene were added to a 2 L reactor, followed by stirring under reflux for 2 hours. After completion of the reaction, the resulting product was filtered at room temperature, concentrated under reduced pressure, and separated by column chromatography to obtain 97 g of <Intermediate 4-b>. (yield 91.2%)

Synthesis Example 4-3. Synthesis of <Intermediate 4-c>

<Intermediate 4-c> was synthesized by the following [Reaction Scheme 18].

[Reaction Scheme 18]

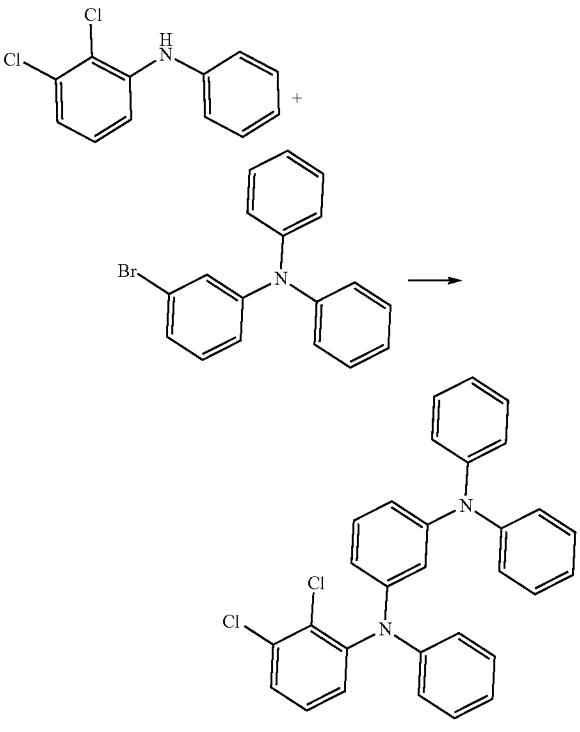

<Intermediate 4-c>

31 g of <Intermediate 4-c> was obtained in the same manner as in Synthesis Example 1-4, except that <Intermediate 4-a> and <Intermediate 4-b> were used instead of <Intermediate 1-c> and <Intermediate 1-b>. (yield 77.7%)

Synthesis Example 4-4. Synthesis of <Intermediate 4-d>

<Intermediate 4-d> was synthesized by the following [Reaction Scheme 19].

[Reaction Scheme 19]

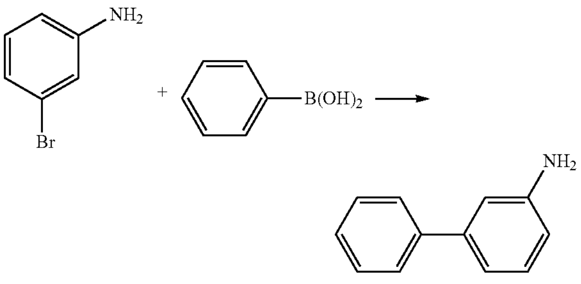

<Intermediate 4-d>

30 g (174 mmol) of 3-bromoaniline, 25.5 g (209 mmol) of phenylboronic acid, 4 g (3 mmol) of tetrakis(triphenylphosphine)palladium, 48.2 g (349 mmol) of potassium carbonate, 150 mL of 1,4-dioxane, 150 mL of toluene, and 90 mL of distilled water were added to a 1 L reactor, followed by stirring under reflux for 4 hours. After completion of the reaction, the layers were separated at room temperature, and the organic layer was concentrated under reduced pressure and separated by column chromatography to obtain 24 g of <Intermediate 4-d>. (yield 80%)

Synthesis Example 4-5. Synthesis of <Intermediate 4-e>

<Intermediate 4-e> was synthesized by the following [Reaction Scheme 20].

[Reaction Scheme 20]

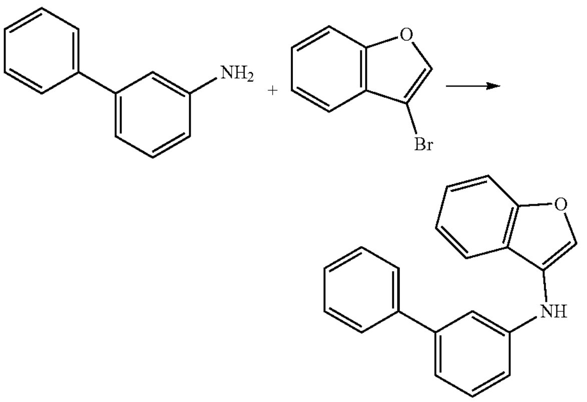

<Intermediate 4-e>

31.6 g of <Intermediate 4-e> was obtained in the same manner as in Synthesis Example 1-3, except that <Intermediate 4-d> and <Intermediate 1-b> were used instead of 1-bromo-4-iodobenzene and aniline. (yield 68.2%)

Synthesis Example 4-6. Synthesis of <Intermediate 4-f>

<Intermediate 4-f> was synthesized by the following [Reaction Scheme 21].

[Reaction Scheme 21]

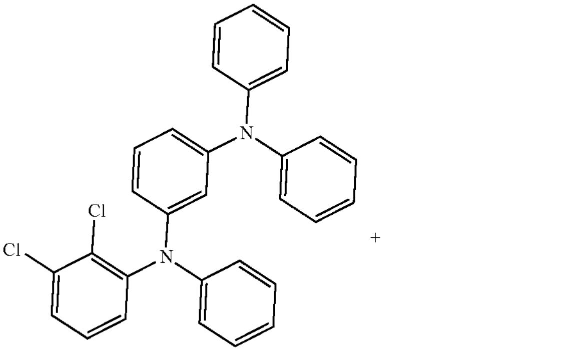

-continued

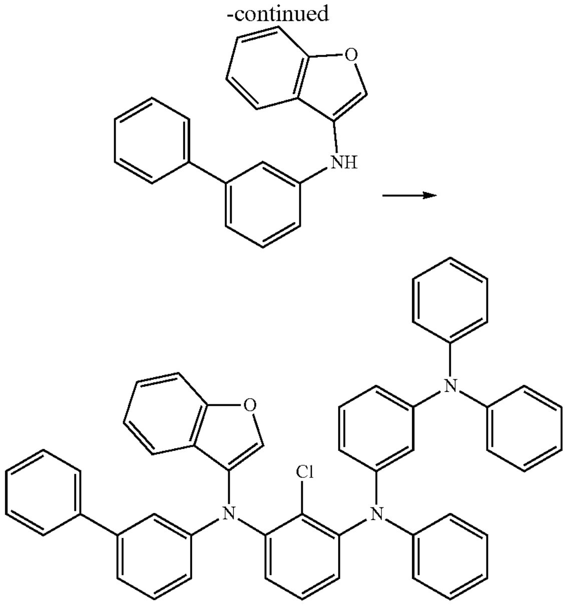

<Intermediate 4-f>

21 g of <Intermediate 4-f> was obtained in the same manner as in Synthesis Example 1-4, except that <Intermediate 4-c> and <Intermediate 4-e> were used instead of <Intermediate 1-c> and <Intermediate 1-b>. (yield 67.7%)

Synthesis Example 4-7. Synthesis of <Compound 65>

<Compound 65> was synthesized by the following [Reaction Scheme 22].

[Reaction Scheme 22]

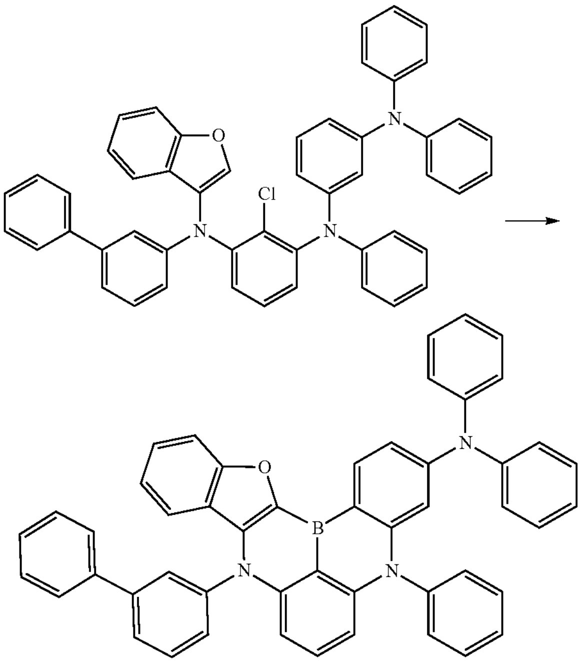

<Compound 65>

21 g (37 mmol) of <Intermediate 4-f> and tert-butylbenzene were added to a 250 mL reactor. 42.4 mL (74 mmol) of n-butyllithium was added dropwise thereto at −78° C. Then, the mixture was stirred at 60° C. for 3 hours. Then, the pentane was removed at 60° C. by nitrogen purging. 7.1 mL (74 mmol) of boron tribromide was added dropwise at −78° C. Then, the mixture was stirred at room temperature for 1 hour, and 6 g (74 mmol) of N,N-diisopropylethylamine was added dropwise at 0° C. Then, the mixture was stirred at 120° C. for 2 hours. After completion of the reaction, a sodium acetate solution was added thereto at room temperature, followed by stirring. The result was extracted with ethyl acetate, and the organic layer was concentrated and separated by column chromatography to obtain 2.0 g of <Compound 65>. (yield 17.4%)

MS (MALDI-TOF): m/z 703.28 [$M^+$]

Synthesis Example 5. Synthesis of Compound 73

Synthesis Example 5-1. Synthesis of <Intermediate 5-a>

<Intermediate 5-a> was synthesized by the following [Reaction Scheme 23].

[Reaction Scheme 23]

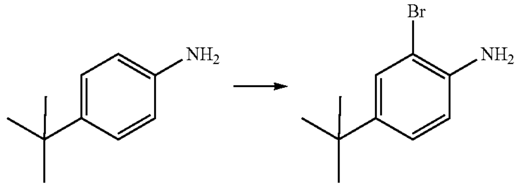

<Intermediate 5-a>

40 g (236 mmol) of 4-tert-butylaniline was dissolved in 400 mL of methylene chloride in a 1 L reactor, followed by stirring at 0° C. Then, 42 g (236 mmol) of N-bromosuccinimide was slowly added to the reactor. The reaction product was warmed to room temperature and was stirred for 4 hours. After completion of the reaction, $H_2O$ was added dropwise thereto at room temperature and extracted with methylene chloride. The organic layer was concentrated and separated by column chromatography to obtain 48 g of <Intermediate 5-a> (yield 80%).

Synthesis Example 5-2. Synthesis of <Intermediate 5-b>

<Intermediate 5-b> was synthesized by the following [Reaction Scheme 24].

[Reaction Scheme 24]

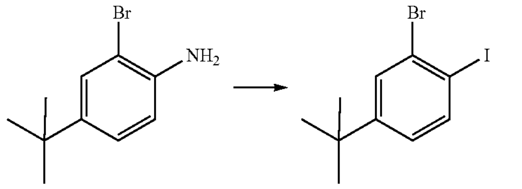

<Intermediate 5-b>

80 g (351 mmol) of <Intermediate 5-a> and 450 mL of water are added to a 2 L reactor, followed by stirring. 104 mL of sulfuric acid was further added thereto. A solution of 31.5 g (456 mmol) of sodium nitrite in 240 mL of water was added dropwise thereto at 0° C. Then, the mixture was stirred at 0° C. for 2 hours. A solution of 116.4 g (701 mmol) of potassium iodide in 450 mL of water was added dropwise at 0° C. Then, the mixture was stirred at room temperature for 6 hours. After completion of the reaction, an aqueous sodium thiosulfate solution was added thereto at room temperature, followed by stirring. The reaction product was extracted with ethyl acetate and the organic layer was concentrated and separated by column chromatography to obtain 58 g of <Intermediate 5-b>. (yield 51%)

Synthesis Example 5-3. Synthesis of <Intermediate 5-c>

<Intermediate 5-c> was synthesized by the following [Reaction Scheme 25].

[Reaction Scheme 25]

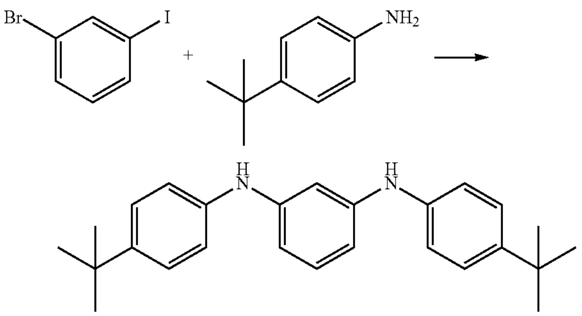

<Intermediate 5-c>

95 g of <Intermediate 4-c> was obtained in the same manner as in Synthesis Example 3-1, except that 4-tert-butylaniline was used instead of aniline. (yield 80.4%)

Synthesis Example 5-4. Synthesis of <Intermediate 5-d>

<Intermediate 5-d> was synthesized by the following [Reaction Scheme 26].

[Reaction Scheme 26]

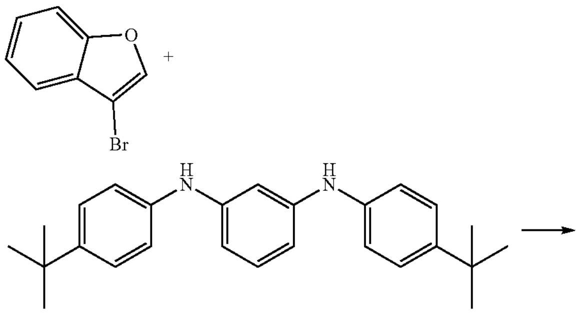

-continued

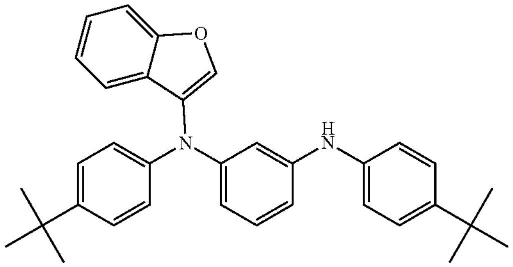

<Intermediate 5-d>

31 g of <Intermediate 5-d> was obtained in the same manner as in Synthesis Example 1-4, except that <Intermediate 5-c> was used instead of <Intermediate 1-c>. (yield 71.5%)

Synthesis Example 5-5. Synthesis of <Intermediate 5-e>

<Intermediate 5-e> was synthesized by the following [Reaction Scheme 27].

[Reaction Scheme 27]

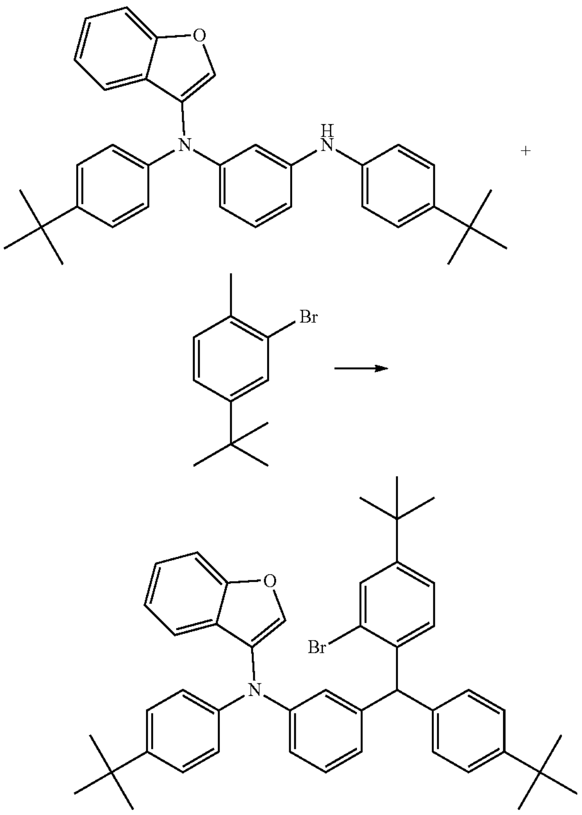

<Intermediate 5-e>

24 g of <Intermediate 5-e> was obtained in the same manner as in Synthesis Example 1-4, except that <Intermediate 5-d> and <Intermediate 5-b> were used instead of <Intermediate 1-c> and <Intermediate 1-b> (yield 67.1%)

Synthesis Example 5-6. Synthesis of <Compound 73>

<Compound 73> was synthesized by the following [Reaction Scheme 28].

[Reaction Scheme 28]

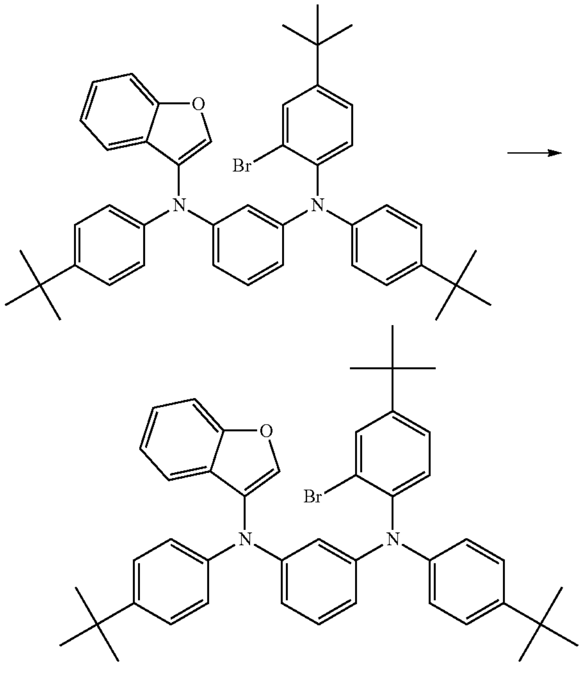

<Compound 73>

2.4 g of <Compound 73> was obtained in the same manner as in Synthesis Example 1-7, except that <Intermediate 5-e> was used instead of <Intermediate 1-f>. (yield 15%)

MS (MALDI-TOF): m/z 628.36 [$M^+$]

Synthesis Example 6. Synthesis of Compound 109

Synthesis Example 6-1. Synthesis of <Intermediate 6-a>

<Intermediate 6-a> was synthesized by the following [Reaction Scheme 29].

[Reaction Scheme 29]

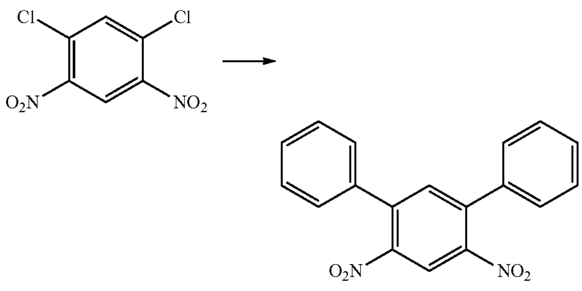

<Intermediate 6-a>

40.0 g (123 mmol) of 1,5-dichloro-2,4-dinitrobenzene, 44.9 g (368 mmol) of phenylboronic acid, 2.8 g (2.5 mmol) of tetrakis(triphenylphosphine) palladium, 50.9 g (368 mmol) of potassium carbonate, 120 mL of 1,4-dioxane, 200 mL of toluene and 120 mL of water were added to a 1 L reactor, followed by stirring under reflux. After completion of the reaction, the reaction product was extracted with water and ethyl acetate and the organic layer was concentrated and separated by column chromatography to obtain 27.5 g of <Intermediate 6-a>. (yield Synthesis Example 6-2: Synthesis of <Intermediate 6-b>

<Intermediate 6-b> was synthesized by the following [Reaction Scheme 30].

[Reaction Scheme 30]

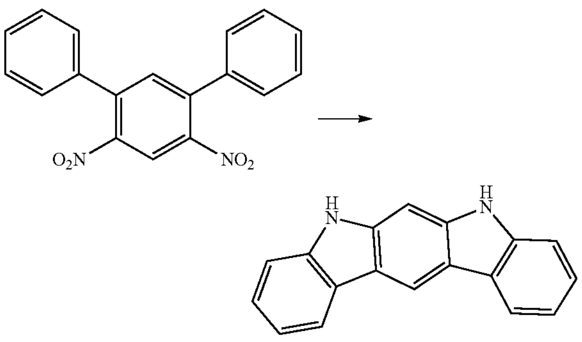

<Intermediate 6-b>

27.5 g (86 mmol) of <Intermediate 6-a>, 57.8 g (348 mmol) of triphenylphosphine, and 300 mL of dichlorobenzene were added to a 1 L reactor, followed by stirring under reflux for 3 days. After completion of the reaction, the dichlorobenzene was removed and the residue was separated by column chromatography to obtain 10.8 g of <Intermediate 6-b>. (yield 49.0%)

Synthesis Example 6-3. Synthesis of <Intermediate 6-c>

<Intermediate 6-c> was synthesized by the following [Reaction Scheme 31].

[Reaction Scheme 31]

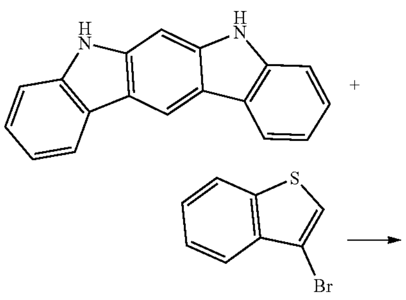

-continued

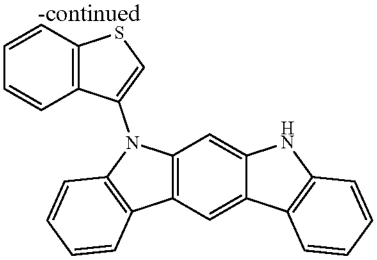

<Intermediate 6-c>

10.8 g (42 mmol) of <Intermediate 6-b>, 11.0 g (10.8 mmol) of <Intermediate 2-a>, 10.7 g (1 mmol) of a copper powder, 4.5 g (17 mmol) of 18-crown-6-ether, 34.9 g (253 mmol) of potassium carbonate, and 110 mL of dichlorobenzene were added to a 250 mL reactor, followed by stirring under reflux at 180° C. for 24 hours. After completion of the reaction, the dichlorobenzene was removed and the residue was separated by column chromatography to obtain 9.5 g of <Intermediate 6-c>. (yield 52%)

Synthesis Example 6-4. Synthesis of <Intermediate 6-d>

<Intermediate 6-d> was synthesized by the following [Reaction Scheme 32].

[Reaction Scheme 32]

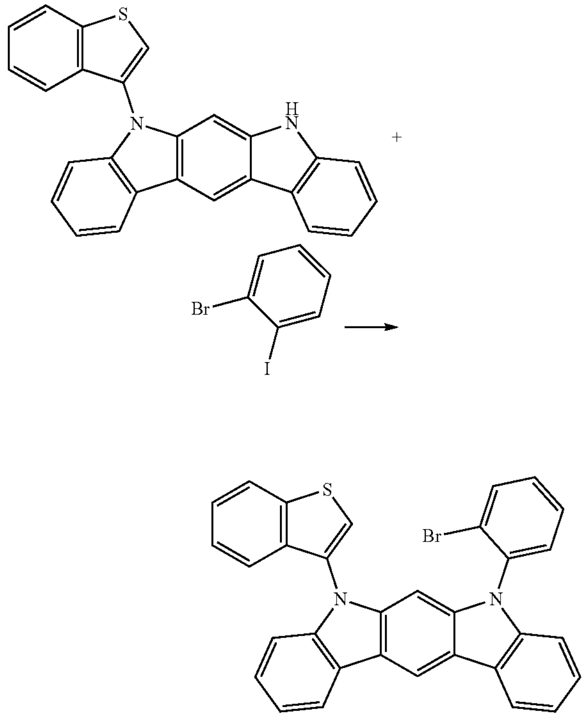

<Intermediate 6-d>

14 g of <Intermediate 6-d> was obtained in the same manner as in Synthesis Example 6-3, except that <Intermediate 6-c> and 1-bromo-2-iodobenzene were used instead of <Intermediate 1-c> and <Intermediate 2-a> (yield 67.1%)

Synthesis Example 6-5. Synthesis of <Compound 109>

<Compound 109> was synthesized by the following [Reaction Scheme 33].

[Reaction Scheme 33]

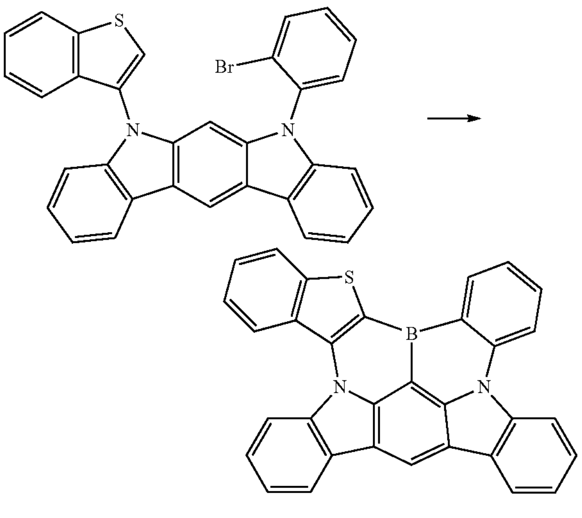

<Compound 109>

2.1 g of <Compound 109> was obtained in the same manner as in Synthesis Example 1-7, except that <Intermediate 6-d> was used instead of <Intermediate 1-f> (yield 14%)

MS (MALDI-TOF): m/z 472.12 [M$^+$]

Synthesis Example 7. Synthesis of Compound 126

Synthesis Example 7-1. Synthesis of <Intermediate 7-a>

<Intermediate 7-a> was synthesized by the following [Reaction Scheme 34].

[Reaction Scheme 34]

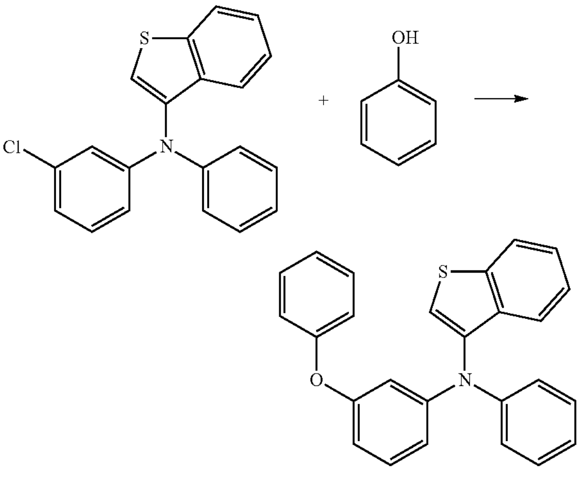

<Intermediate 7-a>

30.0 g (150 mmol) of <Intermediate 2-b>, 31.2 g (160 mmol) of phenol, 45.7 g (300 mmol) of potassium carbonate and 250 mL of NMP were added to a 500 mL reactor, followed by stirring under reflux at 160° C. for 12 hours. After completion of the reaction, the reaction product was cooled to room temperature, the NMP was distilled off under reduced pressure and the residue was extracted with water and ethyl acetate. The solvent was concentrated under reduced pressure and separated by column chromatography to obtain 22 g of <Intermediate 7-a>. (yield 68%)

Synthesis Example 7-2. Synthesis of <Compound 126>

<Compound 126> was synthesized by the following [Reaction Scheme 35].

[Reaction Scheme 35]

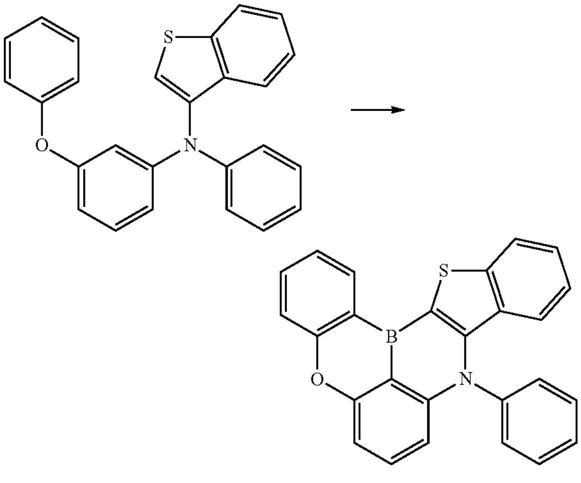

<Compound 126>

1.2 g of <Compound 126> was obtained in the same manner as in Synthesis Example 1-7, except that <Intermediate 7-a> was used instead of <Intermediate 1-f> (yield 13.4%)

MS (MALDI-TOF): m/z 401.10 [$M^+$]

Synthesis Example 8. Synthesis of Compound 145

Synthesis Example 8-1. Synthesis of <Intermediate 8-a>

<Intermediate 8-a> was synthesized by the following [Reaction Scheme 36].

[Reaction Schdeme 36]

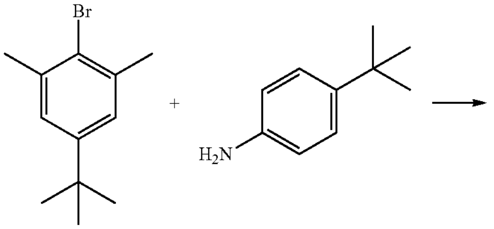

-continued

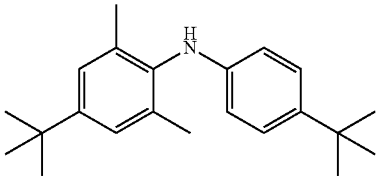

<Intermediate 8-a>

41.6 g of <Intermediate 8-a> was obtained in the same manner as in Synthesis Example 1-3, except that 2-bromo tert-butyl-1,3-dimethylbenzene and 4-tert-butylaniline were used instead of 1-bromo-3-iodobenzene and aniline (yield 88.2%)

Synthesis Example 8-2. Synthesis of <Intermediate 8-b>

<Intermediate 8-b> was synthesized by the following [Reaction Scheme 37].

[Reaction Scheme 37]

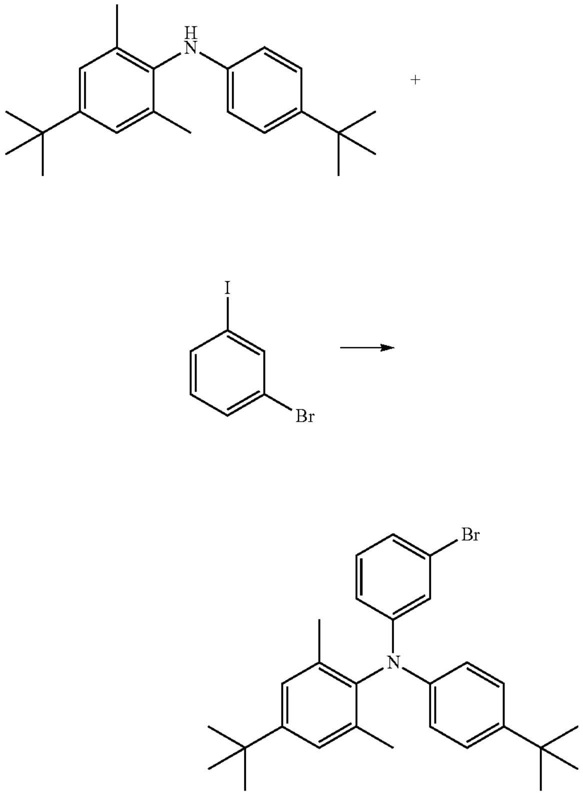

<Intermediate 8-b>

37.6 g of <Intermediate 8-b> was obtained in the same manner as in Synthesis Example 4-2, except that <Intermediate 8-a> was used instead of diphenylamine. (yield 78.4%)

Synthesis Example 8-3. Synthesis of <Intermediate 8-c>

<Intermediate 8-c> was synthesized by the following [Reaction Scheme 38].

[Reaction Scheme 38]

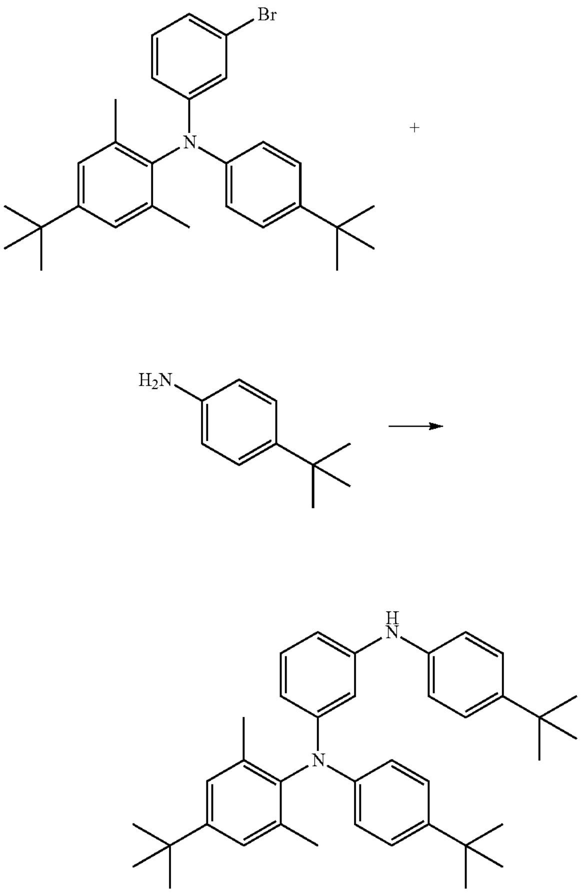

<Intermediate 8-c>

31.2 g of <Intermediate 8-c> was obtained in the same manner as in Synthesis Example 1-3, except that <Intermediate 8-b> and 4-tert-butylaniline were used instead of 1-bromo-3-iodobenzene and aniline. (yield 74.2%)

Synthesis Example 8-4. Synthesis of <Intermediate 8-d>

<Intermediate 8-d> was synthesized by the following [Reaction Scheme 39].

[Reaction Scheme 39]

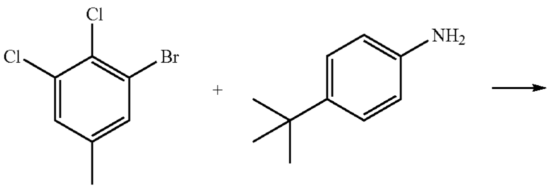

-continued

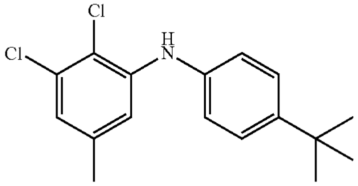

<Intermediate 8-d>

30.3 g of <Intermediate 8-d> was obtained in the same manner as in Synthesis Example 1-3, except that 1-bromo-2,3-dichloro-5-ethylbenzene and 4-tert-butylaniline were used instead of 1-bromo-3-iodobenzene and aniline. (yield 89.8%)

Synthesis Example 8-5. Synthesis of <Intermediate 8-e>

<Intermediate 8-e> was synthesized by the following [Reaction Scheme 40].

[Reaction Scheme 40]

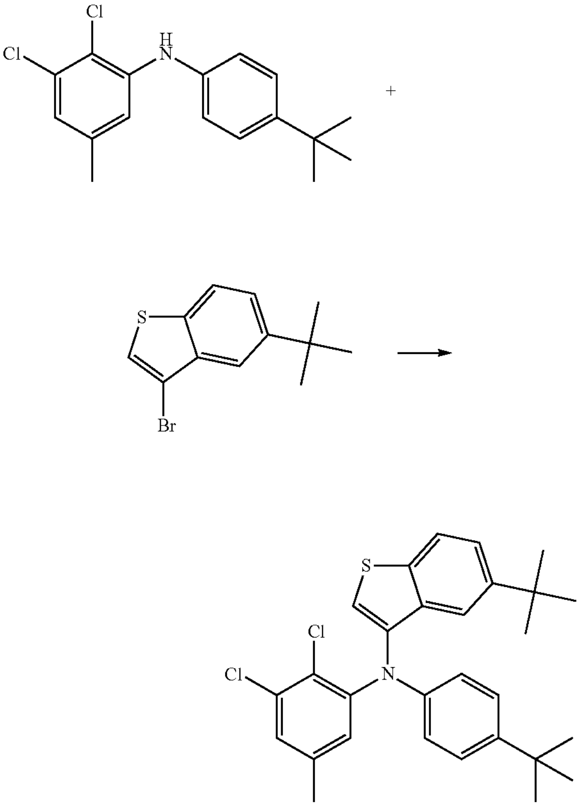

<Intermediate 8-e>

27.4 g of <Intermediate 8-e> was obtained in the same manner as in Synthesis Example 1-4, except that <Intermediate 8-d> and 3-bromo-5-(tert-butyl)benzothiophene were used instead of <Intermediate 1-c> and <Intermediate 1-b>. (yield 77.1%)

Synthesis Example 8-6. Synthesis of <Intermediate 8-f>

<Intermediate 8-f> was synthesized by the following [Reaction Scheme 41].

[Reaction Scheme 41]

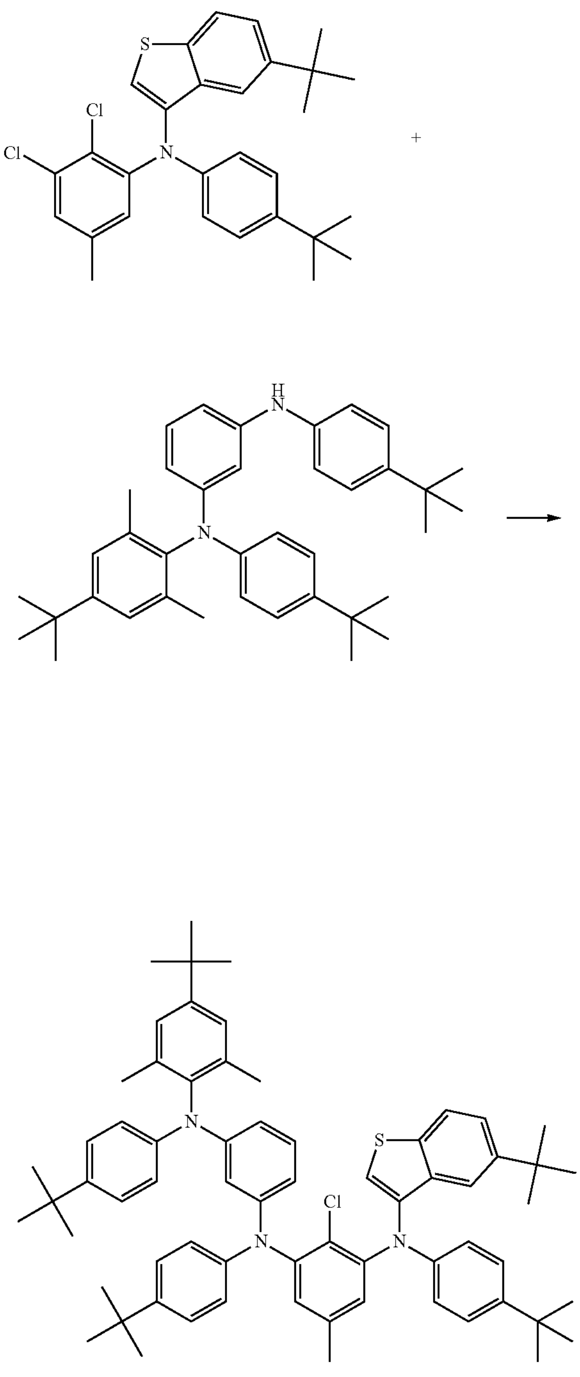

<Intermediate 8-f>

21 g of <Intermediate 8-f> was obtained in the same manner as in Synthesis Example 1-4, except that <Intermediate 8-e> and <Intermediate 8-c> were used instead of <Intermediate 1-c> and <Intermediate 1-b>. (yield 74.1%)

Synthesis Example 8-7. Synthesis of <Compound 145>

<Compound 145> was synthesized by the following [Reaction Scheme 42].

[Reaction Scheme 42]

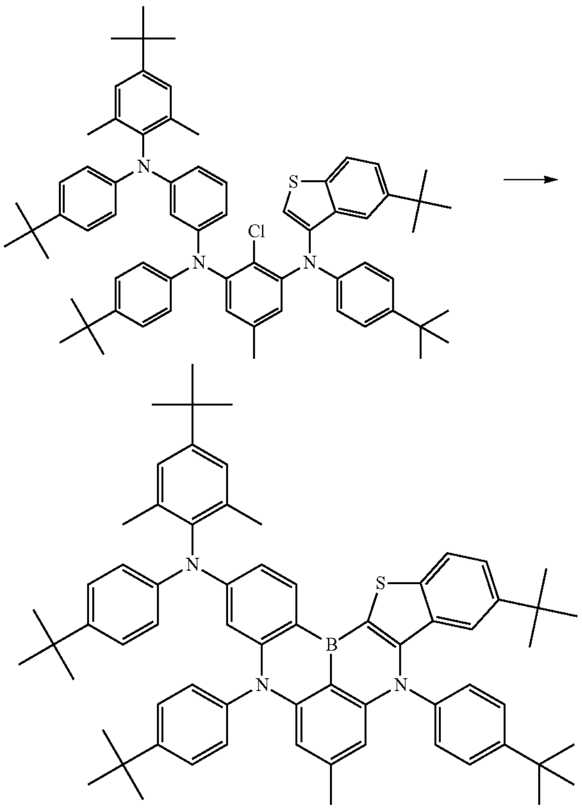

<Compound 145>

3.4 g of <Compound 145> was obtained in the same manner as in Synthesis Example 1-7, except that <Intermediate 8-f> was used instead of <Intermediate 1-f>. (yield 19.4%)

MS $[M]^+$ 979.60

Synthesis Example 9. Synthesis of Compound 150

Synthesis Example 9-1. Synthesis of <Intermediate 9-a>

<Intermediate 9-a> was synthesized by the following [Reaction Scheme 43].

[Reaction Scheme 43]

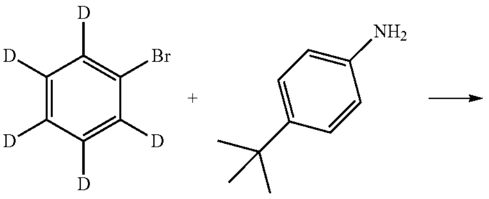

-continued

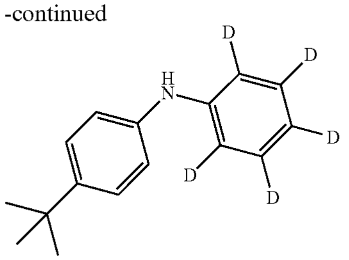

<Intermediate 9-a>

32.7 g of <Intermediate 9-a> was obtained in the same manner as in Synthesis Example 1-3, except that bromobenzene-d5 and 4-tert-butylaniline were used instead of 1-bromo iodobenzene and aniline. (yield 78.2%)

Synthesis Example 9-2. Synthesis of <Intermediate 9-b>

<Intermediate 9-b> was synthesized by the following [Reaction Scheme 44].

[Reaction Scheme 44]

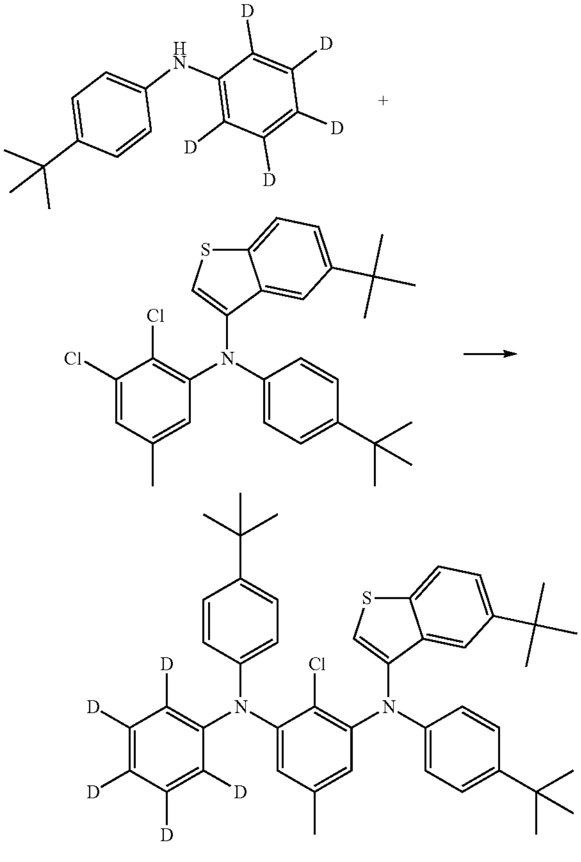

<Intermediate 9-b>

34.2 g of <Intermediate 9-b> was obtained in the same manner as in Synthesis Example 1-4, except that <Intermediate 8-e> and <Intermediate 9-a> were used instead of <Intermediate 1-c> and <Intermediate 1-b>. (yield 84.1%)

Synthesis Example 9-3. Synthesis of <Compound 150>

<Compound 150> was synthesized by the following [Reaction Scheme 45].

[Reaction Scheme 45]

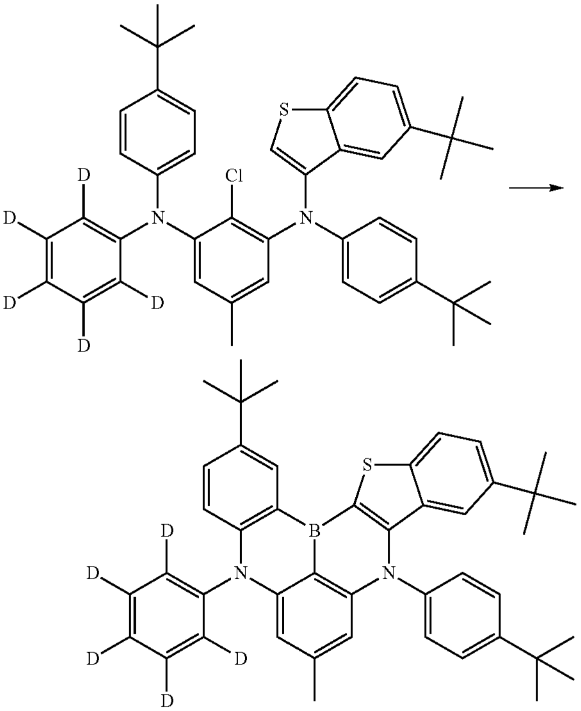

<Compound 150>

2.7 g of <Compound 150> was obtained in the same manner as in Synthesis Example 1-7, except that <Intermediate 9-b> was used instead of <Intermediate 1-f>. (yield 11.4%)

MS $[M]^+$ 663.39

Synthesis Example 10. Synthesis of Compound 153

Synthesis Example 10-1. Synthesis of <Intermediate 10-a>

<Intermediate 10-a> was synthesized by the following [Reaction Scheme 46].

[Reaction Scheme 46]

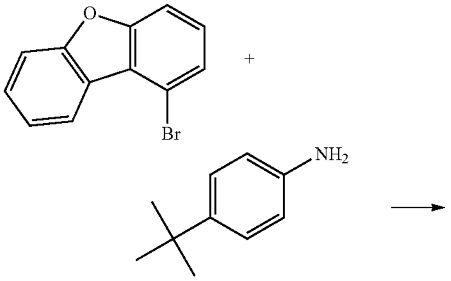

-continued

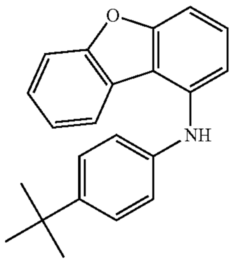

<Intermediate 10-a>

25.6 g of <Intermediate 10-a> was obtained in the same manner as in Synthesis Example 1-3, except that 1-bromodibenzofuran and 4-tert-butylaniline were used instead of 1-bromo-3-iodobenzene and aniline. (yield 79.2%)

Synthesis Example 10-2. Synthesis of <Intermediate 10-b>

<Intermediate 10-b> was synthesized by the following [Reaction Scheme 47].

[Reaction Scheme 47]

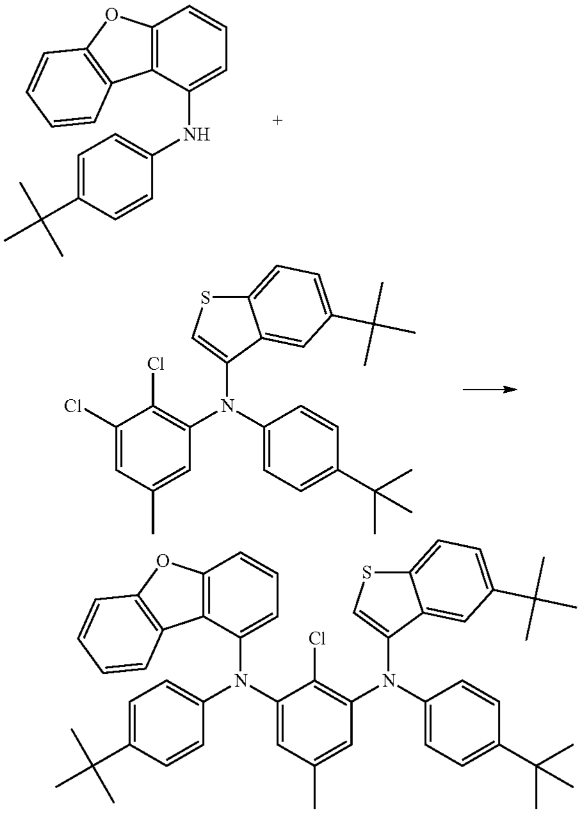

<Intermediate 10-b>

18.6 g of <Intermediate 10-b> was obtained in the same manner as in Synthesis Example 1-4, except that <Intermediate 8-e> and <Intermediate 10-a> were used instead of <Intermediate 1-c> and <Intermediate 1-b>. (yield 74.1%)

Synthesis Example 10-3. Synthesis of <Compound 153>

<Compound 153> was synthesized by the following [Reaction Scheme 48].

[Reaction Scheme 48]

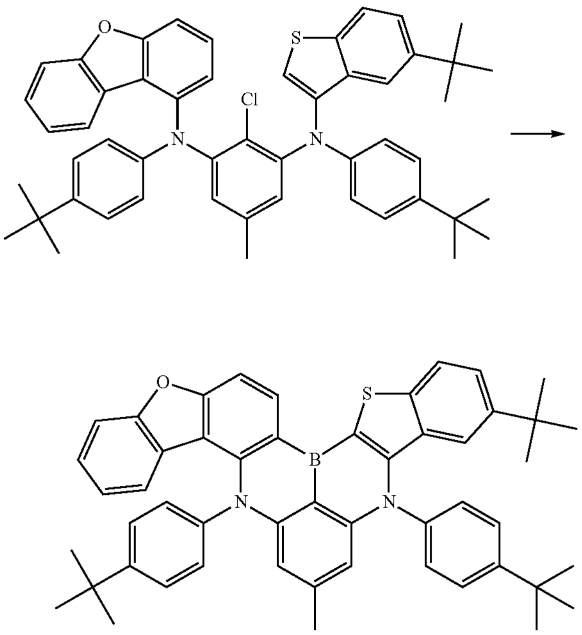

<Compound 153>

3.4 g of <Compound 153> was obtained in the same manner as in Synthesis Example 1-7, except that <Intermediate 10-b> was used instead of <Intermediate 1-f>. (yield 15.4%)

MS $[M]^+$ 748.37

[FORMULA A] SYNTHESIS EXAMPLE

Synthesis Example 11. Synthesis of Compound 12

Synthesis Example 11-1. Synthesis of <Intermediate 11-a>

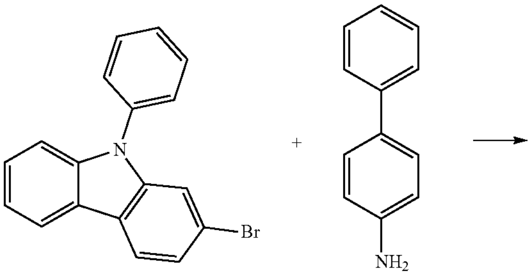

-continued

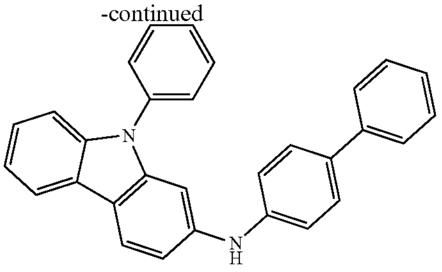

<Intermediate 11-a>

3-bromo-9-phenyl-9H-carbazole (11.3 g, 0.035 mol), 4-aminobiphenyl (6.6 g, 0.039 mol), tris(dibenzylideneacetone)dipalladium (0) (0.65 g, 0.0007 mol), sodium tert-butoxide (6.79 g, 0.0706 mol), 2,2'-bis(diphenylphosphino)-1,1'-binaphthalene (0.44 g, 0.0007 mol) and 100 mL of toluene were added to a round-bottom flask, followed by stirring under reflux for 3 hours. After completion of the reaction, the mixture was cooled to room temperature and extracted with ethyl acetate and water. The organic layer was separated, dehydrated with magnesium sulfate, and then concentrated under reduced pressure. The result was separated by column chromatography to obtain 12.2 g of <Intermediate 11-a>. (yield 85%)

Synthesis Example 11-2. Synthesis of <Compound 12>

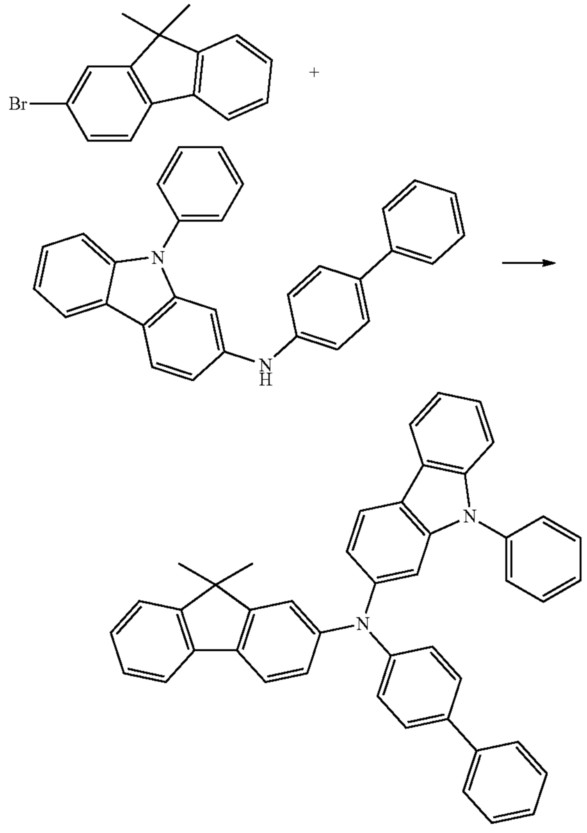

<Compound 12>

3-bromo-9,9-dimethylfluorene (2.4 g, 0.009 mol), <Intermediate 11-a> (5.3 g, 0.013 mol), palladium (II) acetate (0.08 g, 0.4 mmol), sodium tert-butoxide (3.4 g, 0.035 mol), tritert-butylphosphine (0.07 g, 0.4 mmol), and 60 mL of toluene were added to a round-bottom flask, followed by stirring under reflux for 2 hours. After completion of the reaction, the reaction solution was cooled to room temperature and extracted with ethyl acetate and water. The organic layer was separated, dehydrated with magnesium sulfate, and then concentrated under reduced pressure. The result was separated and purified by column chromatography and recrystallized with dichloromethane and acetone to obtain 2.6 g of <Compound 12>. (yield 48%)

MS (MALDI-TOF): m/z 602.27 [$M^+$]

Synthesis Example 12. Synthesis of Compound 30

Synthesis Example 12-(1): Synthesis of Compound 30

<Compound 30> was synthesized in the same manner as in Synthesis Example 5 except that 1-naphthylamine was used instead of 4-aminobiphenyl used in Synthesis Example 5-(1), and 3-bromo-9,9-dimethylfluorene was used instead of 2-bromo-9,9-dimethylfluorene used in Synthesis Example 5-(2) (yield 45%).

MS (MALDI-TOF): m/z 830.29 [$M^+$]

Synthesis Example 13. Synthesis of Compound 44

Synthesis Example 13-(1): Synthesis of Compound 44

<Compound 44> was synthesized in the same manner as in Synthesis Example 5 except that aniline-2,3,4,5,6-d5 was used instead of 4-aminobiphenyl used in Synthesis Example 5-(1), and 2-bromo-9,9'-dimethylfluorene was used instead of 2-bromo-9,9-dimethylfluorene used in Synthesis Example 5-(2) (yield 46%).

MS (MALDI-TOF): m/z 653.29 [$M^+$]

Synthesis Example 14. Synthesis of Compound 78

Synthesis Example 14-(1): Synthesis of Compound 78

<Compound 78> was synthesized in the same manner as in Synthesis Example 5 except that 2-bromo-9,9-diphenylfluorene was used instead of 2-bromo-9,9-dimethylfluorene used in Synthesis Example 5-(2) (yield 46%).

MS (MALDI-TOF): m/z 726.30 [$M^+$]

Synthesis Example 15. Synthesis of Compound 102

Synthesis Example 15-(1): Synthesis of Compound 102

<Compound 102> was synthesized in the same manner as in Synthesis Example 5, except that 2-naphthylamine was used instead of 4-aminobiphenyl used in Synthesis Example 5-(1) and 2-(4-bromophenyl)-9,9-diphenyl-9H-fluorene was used instead of 2-bromo-9,9-dimethylfluorene used in Synthesis Example 5-(2) (yield 45%).

MS (MALDI-TOF): m/z 776.32 [$M^+$]

Synthesis Example 16. Synthesis of Compound 174

Synthesis Example 16-(1): Synthesis of Compound 174

<Compound 174> was synthesized in the same manner as in Synthesis Example 5, except that 3-bromo-9-phenyl-9H- carbazole was used instead of 2-bromo-9-phenyl-9H-carbazole used in Synthesis Example 5-(1), and 4-(1-naphthyl) aniline was used instead of 4-aminobiphenyl (yield 47%).

MS (MALDI-TOF): m/z 652.29 [$M^{+}$]

Synthesis Example 17. Synthesis of Compound 195

Synthesis Example 17-(1): Synthesis of Compound 195

<Compound 195> was synthesized in the same manner as in Synthesis Example 5, except that 3-bromo-9-phenyl-9H-carbazole was used instead of 2-bromo-9-phenyl-9H-carbazole used in Synthesis Example 5-(1), 3-aminobiphenyl was used instead of 4-aminobiphenyl, and 1-(4-bromophenyl)-9,9-dimethyl-9H-fluorene was used instead of 2-bromo-9,9-dimethylfluorene used in Synthesis Example 5-(2). (yield 45%)

MS (MALDI-TOF): m/z 678.30 [$M^+$]

Examples 1 to 21: Fabrication of Organic Light-Emitting Devices

ITO glass was patterned such that a light-emitting area of the ITO glass was adjusted to 2 mm×2 mm and was then washed. The ITO glass was mounted in a vacuum chamber, a base pressure was set to $1\times10^{-7}$ torr, and 2-TNATA (400 Å) and a material for a hole transport layer shown in [Table 1] (200 Å) were sequentially deposited on the ITO glass. Then, a mixture of [BH] as a host and the compound shown in the following Table 1 as a dopant (3 wt %) was deposited to a thickness of 250 Å to form a light-emitting layer. Then, a compound of [Formula E-1] was deposited thereon to a thickness of 300 Å to form an electron transport layer, Liq was deposited thereon to a thickness of 10 Å to form an electron injection layer, and Al was deposited thereon to a thickness of 1,000 Å to form a cathode. As a result, an organic light-emitting device was fabricated. The properties of the organic light-emitting device were measured at 10 mA/cm$^2$.

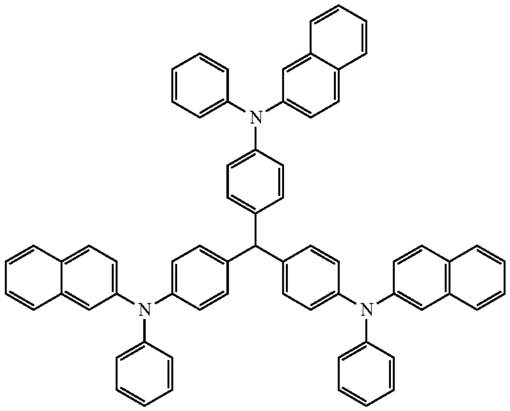

[2-TNATA]

-continued

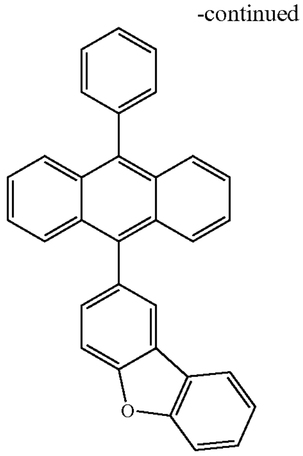

[BH]

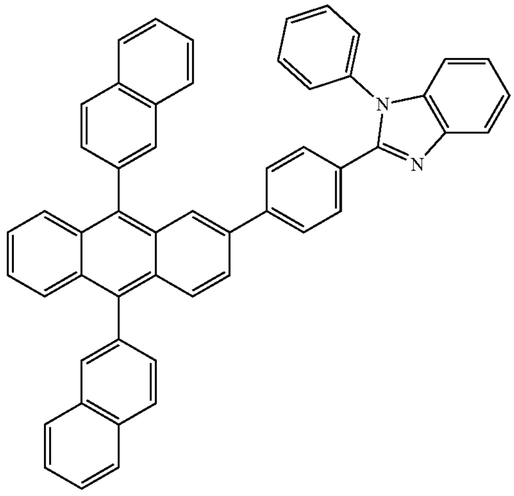

[Formula E-1]

Comparative Examples 1 to 6

Organic light-emitting devices were fabricated in the same manner as in Examples above, except that [HT], and [BD1] and [BD2] were used instead of the compound used as the hole transport layer material and dopant compounds, respectively, in Examples 1 to 16. The properties of the organic light-emitting devices were measured at 10 mA/cm$^2$. The structures of [HT], [BD1] and [BD2] are as follows.

TABLE 1
[HT]
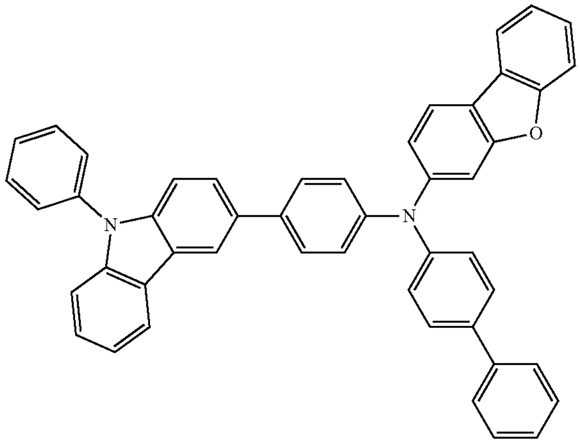 [SMILES: c1ccc(-c2ccc(N(c3ccc(-c4ccc5c(c4)c4ccccc4n5-c4ccccc4)cc3)c3ccc4c(c3)oc3ccccc34)cc2)cc1]
[BD1]
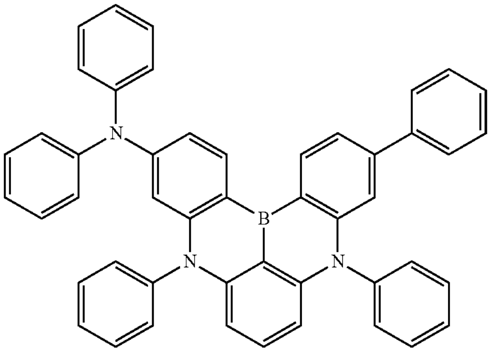 [SMILES: c1ccc(-c2ccc3c(c2)N(c2ccccc2)c2cccc4c2B3c2ccc(N(c3ccccc3)c3ccccc3)cc2N4c2ccccc2)cc1]
[BD2]
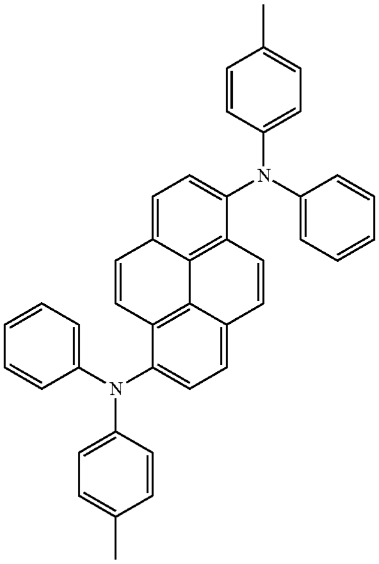 [SMILES: Cc1ccc(N(c2ccccc2)c2ccc3ccc4c(N(c5ccccc5)c5ccc(C)cc5)ccc5ccc2c3c54)cc1]
| Item | Hole transport layer [Formula A] | Light-emitting layer (dopant) [Formula B/C] | Voltage (V) | External quantum efficiency (%) |
|---|---|---|---|---|
| Example 1 | 12 | 1 | 3.6 | 11.1 |
| Example 2 | 44 | 1 | 3.5 | 11.5 |
| Example 3 | 102 | 1 | 3.6 | 11.2 |
| Example 4 | 174 | 1 | 3.6 | 10.9 |
| Example 5 | 30 | 2 | 3.6 | 10.8 |
| Example 6 | 44 | 2 | 3.5 | 11.5 |

TABLE 1-continued

| | | | | |
|---|---|---|---|---|
| Example 7 | 78 | 2 | 3.5 | 11.7 |
| Example 8 | 195 | 2 | 3.6 | 11.2 |
| Example 9 | 30 | 13 | 3.6 | 11.4 |
| Example 10 | 44 | 13 | 3.5 | 11.5 |
| Example 11 | 102 | 13 | 3.6 | 10.9 |
| Example 12 | 195 | 13 | 3.6 | 11.0 |
| Example 13 | 12 | 65 | 3.6 | 11.3 |
| Example 14 | 44 | 65 | 3.5 | 11.5 |
| Example 15 | 78 | 65 | 3.5 | 11.6 |
| Example 16 | 174 | 65 | 3.6 | 11.0 |
| Comparative Example 1 | HT | 1 | 3.7 | 8.9 |
| Comparative Example 2 | HT | 2 | 3.7 | 8.6 |
| Comparative Example 3 | 12 | BD 1 | 3.8 | 7.9 |
| Comparative Example 4 | 12 | BD 2 | 3.7 | 7.5 |
| Comparative Example 5 | 174 | BD 1 | 3.8 | 7.7 |
| Comparative Example 6 | 174 | BD 2 | 3.7 | 7.2 |

As can be seen from [Table 1] above, the organic light-emitting device according to the present invention using the hole transport material (Formula A) in the hole transport layer, and using the dopant material according to the present invention in the light-emitting layer can be operated at a lower voltage and exhibit improved luminous efficacy based on remarkably improved external quantum efficiency compared to the organic light-emitting device using the conventional compound represented by HT, the organic light-emitting device using the conventional compound represented by BD1 and BD2, and the organic light-emitting device without using the combination of materials according to the present invention.

INDUSTRIAL APPLICABILITY

The organic light-emitting device according to the present invention can be operated at a lower driving voltage and exhibits excellent external quantum efficiency and thus high luminous efficacy by utilizing the compounds having characteristic structures as a hole transport material and a dopant material, respectively, in the hole injection layer or the hole transport layer, and the light-emitting layer, and thus is industrially applicable to flat panel displays, flexible displays, monochromatic or white flat panel lighting systems, monochromatic or white flexible lighting systems, vehicle displays, displays for virtual or augmented reality and the like.

The invention claimed is:

1. An organic light-emitting device comprising:

a first electrode;

a second electrode facing the first electrode; and a hole injection layer or a hole transport layer and a light-emitting layer interposed between the first electrode and the second electrode, wherein (i) the hole injection layer or the hole transport layer comprises at least one compound represented by the following [Formula A], and (ii) the light-emitting layer comprises a compound represented by the following [Formula B] or [Formula C]:

[Formula A]

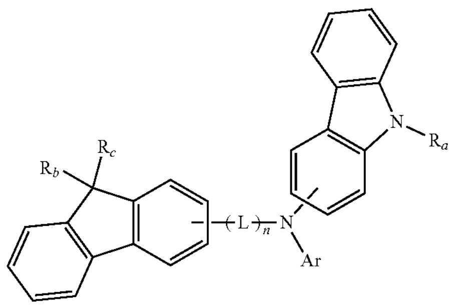

wherein

L is a single bond, a substituted or unsubstituted aromatic C6-C50 hydrocarbon ring, or a substituted or unsubstituted C2-C50 aromatic heterocyclic ring;

n is an integer of 1 to 3, with the proviso that when n is 2 or more, L's are identical to or different from each other;

Ar is selected from a substituted or unsubstituted C5-C50 aryl group and a substituted or unsubstituted C2-C50 heteroaryl group;

$R_a$ to $R_c$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group, with the proviso that $R_b$ and $R_c$ are bonded to each other to further form an alicyclic or aromatic monocyclic or polycyclic ring,

[Formula B]

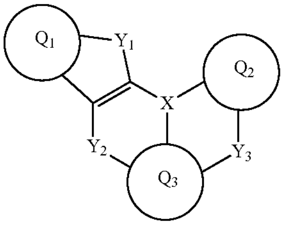

[Formula C]

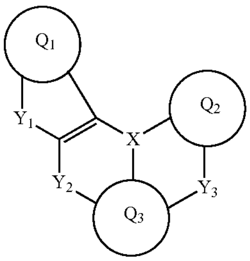

wherein $Q_1$ to $Q_3$ are identical to or different from each other, and are each independently a substituted or unsubstituted aromatic C6-C50 hydrocarbon ring, or a substituted or unsubstituted C2-C50 aromatic heterocyclic group;

$Y_1$ is selected from N—$R_1$, $CR_2R_3$, O, S, Se, and $SiR_4R_5$;

$Y_2$ and $Y_3$ are identical to or different from each other and are each independently selected from N—$R_1$, $CR_2R_3$, O, S, Se, and $SiR_4R_5$, where at least one of $Y_2$ and $Y_3$ are selected from $CR_2R_3$, O, S, Se, and $SiR_4R_5$;

X is selected from B, P and P═O; and $R_1$ to $R_5$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group, with the proviso that each of $R_1$ to $R_5$ is bonded to the ring $Q_1$ to $Q_3$ to further form an alicyclic or aromatic monocyclic or polycyclic ring, and $R_2$ and $R_3$, and $R_4$ and $R_5$ are bonded to each other to further form an alicyclic or aromatic monocyclic or polycyclic ring.

2. The organic light-emitting device according to claim 1, wherein [Formula B] or [Formula C] is represented by the following [Formula B-1] or [Formula C-1]:

[Formula B-1]

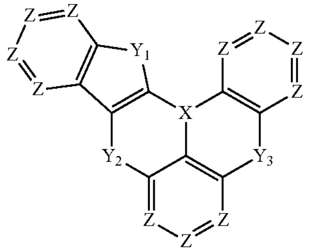

[Formula C-1]

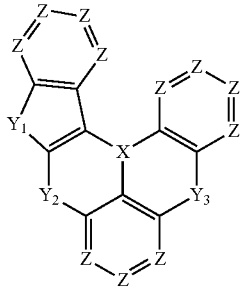

wherein

Z is CR or N, with the proviso that Z's and are identical to or different from each other and R's are identical to or different from each other, wherein R's are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, a halogen group and —N($R_6$) ($R_7$), and R's are bonded to each other or each thereof is bonded to an adjacent substituent to form at least one alicyclic or aromatic monocyclic or polycyclic ring, and the carbon atom of the formed alicyclic, aromatic monocyclic or polycyclic ring is substituted with at least one heteroatom selected from (N), a sulfur atom (S), and an oxygen atom (O), $R_6$ and $R_7$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, and a substituted or unsubstituted C2-C50 heteroaryl group, with the proviso that Re and Ry are bonded to each other to form an alicyclic or aromatic monocyclic or polycyclic ring, and X and $Y_1$ to $Y_3$ are as defined in [Formula B] and [Formula C] above.

3. The organic light-emitting device according to claim 1, wherein [Formula B] or [Formula C] is represented by any one of the following [Formula B-2], [Formula C-2] and [Formula D-2]:

[Formula B-2]

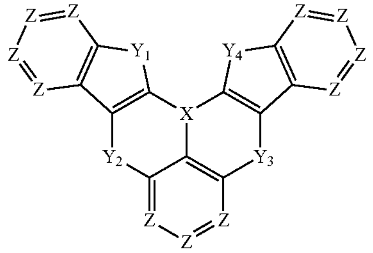

[Formula C-2]

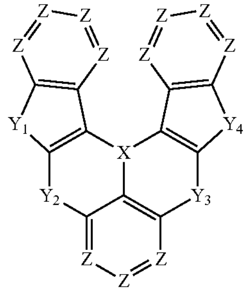

[Formula D-2]

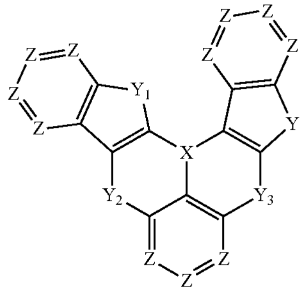

wherein

Z is CR or N, with the proviso that Z's are identical to or different from each other and R's are identical to or different from each other, wherein R's are identical to or different from each other and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, a halogen group and —N($R_6$)($R_7$), and R's are bonded to each other or each thereof is bonded to an adjacent substituent to form at least one alicyclic or aromatic monocyclic or polycyclic ring, and the carbon atom of the formed alicyclic, aromatic monocyclic or polycyclic ring is substituted with at least one heteroatom selected from (N), a sulfur atom (S), and an oxygen atom (O), $R_6$ and $R_7$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, and a substituted or unsubstituted C2-C50 heteroaryl group, with the proviso that $R_6$ and $R_7$ are bonded to each other to form an alicyclic or aromatic monocyclic or polycyclic ring, and X and $Y_1$ to $Y_3$ are as defined in [Formula B] and [Formula C] above.

4. The organic light-emitting device according to claim 2, wherein at least one of R's is —N($R_6$)($R_7$).

5. The organic light-emitting device according to claim 3, wherein at least one of R's is —N($R_6$)($R_7$).

6. The organic light-emitting device according to claim 1, wherein L in [Formula A] is a single bond, or a substituted or unsubstituted aromatic C6-C50 hydrocarbon ring.

7. The organic light-emitting device according to claim 6, wherein L in [Formula A] is a substituted or unsubstituted phenyl group, a substituted or unsubstituted biphenyl group, a substituted or unsubstituted naphthyl group, a substituted or unsubstituted phenanthryl group, or a substituted or unsubstituted fluorenyl group.

8. The organic light-emitting device according to claim 1, wherein the compound represented by [Formula A] is selected from the compounds represented by the following formula:

1

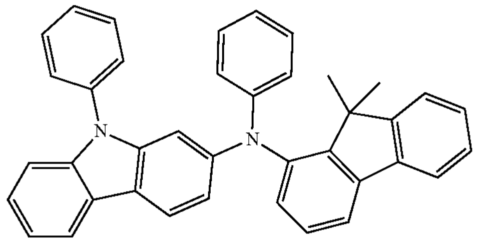

2

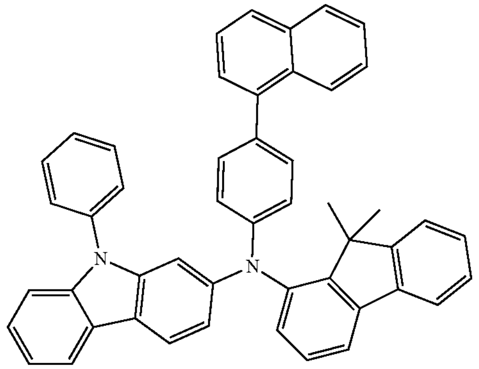

3

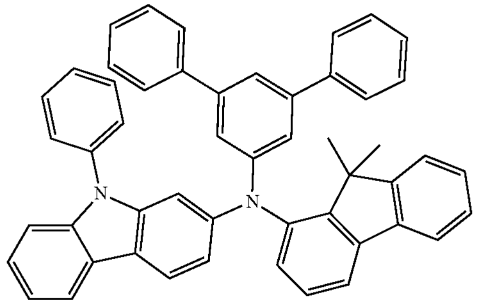

-continued
4
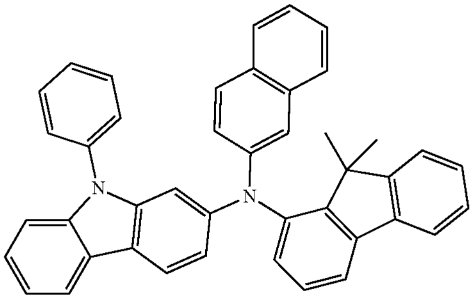
5
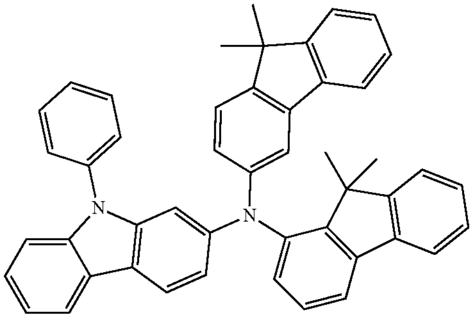
6
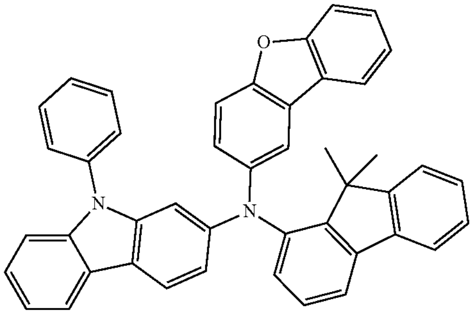
7
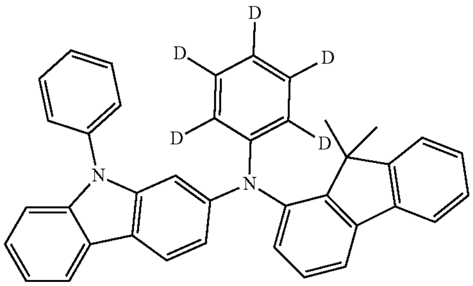
8
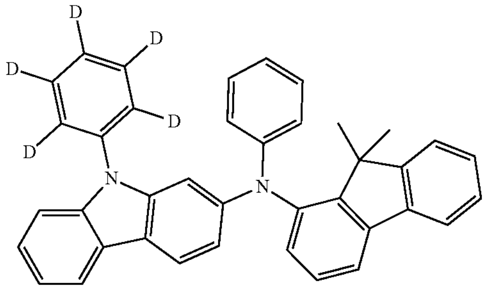
-continued
9
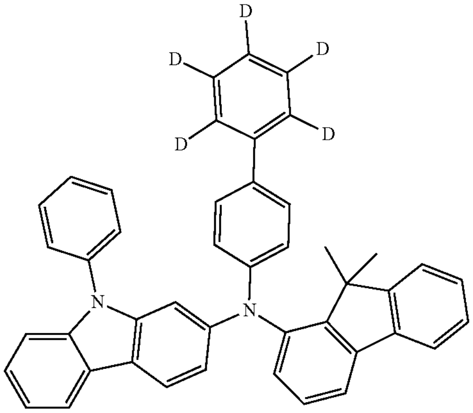
10
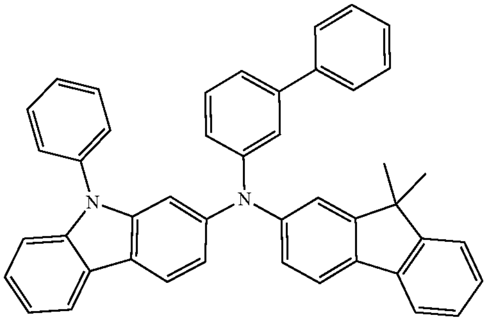
11
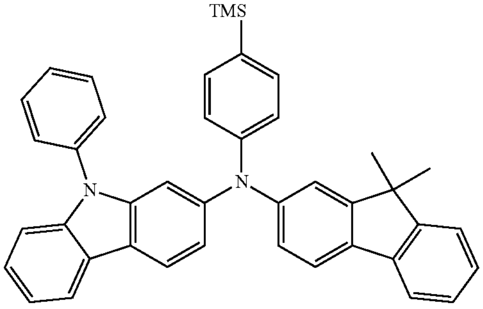
12
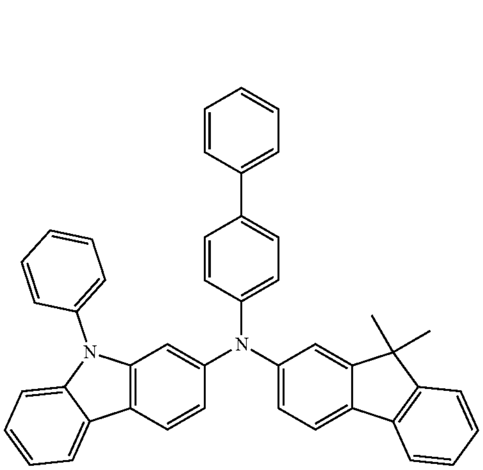

-continued
13
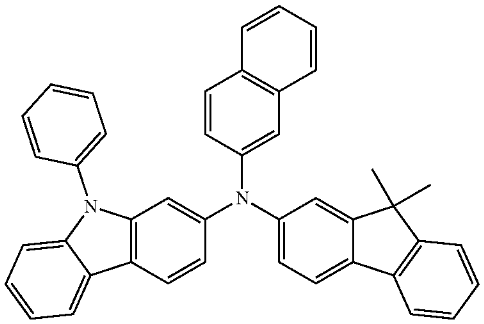
14
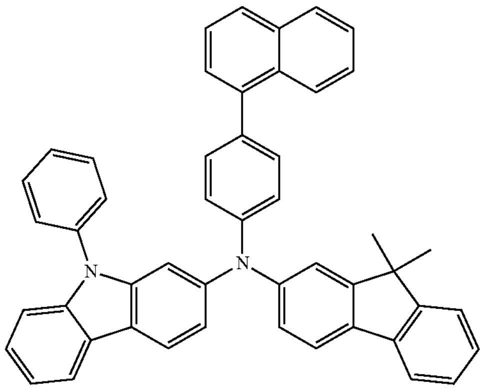
15
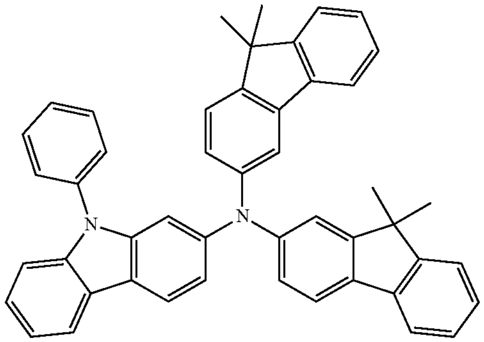
16
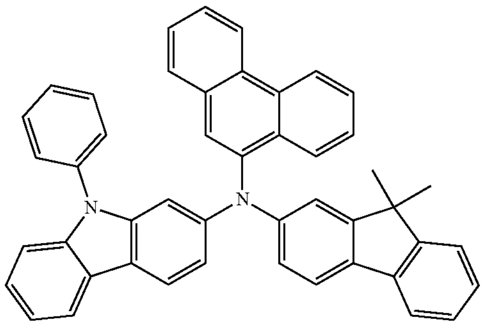
-continued
17
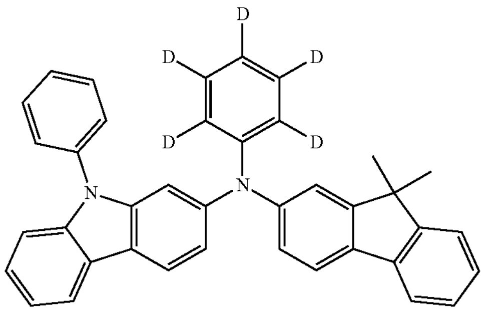
18
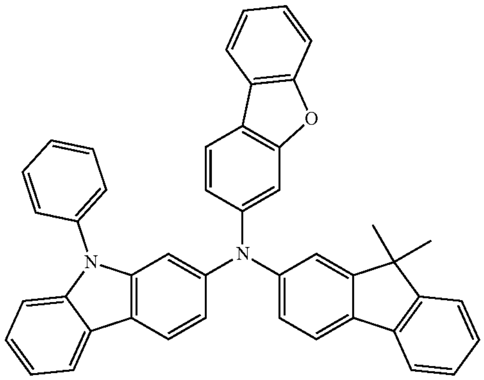
19
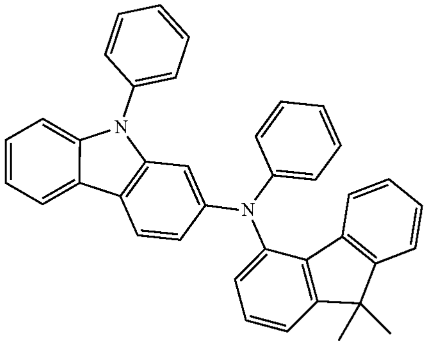
20
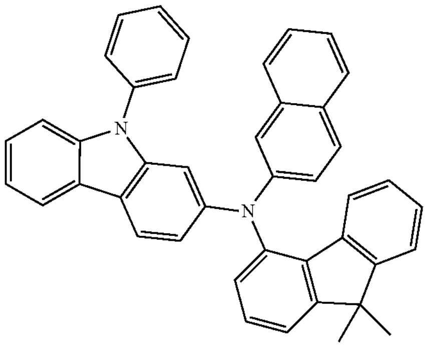

-continued
21
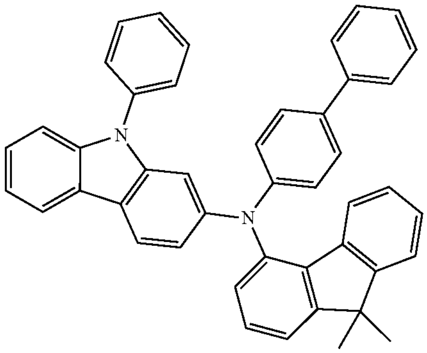
22
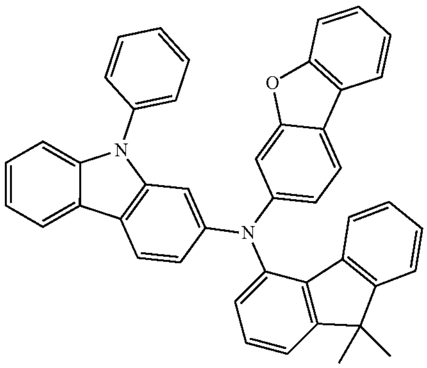
23
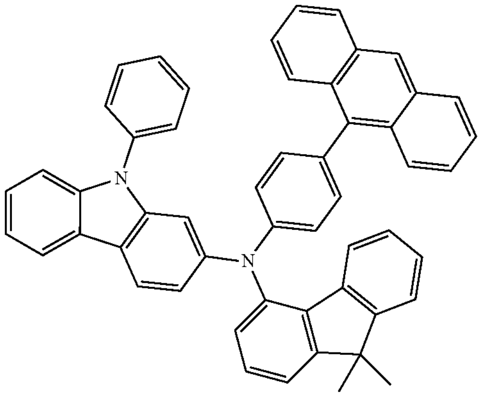
24
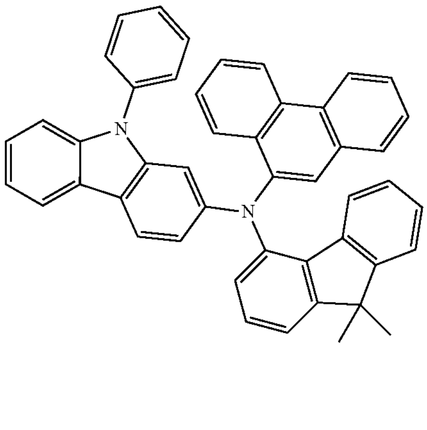
-continued
25
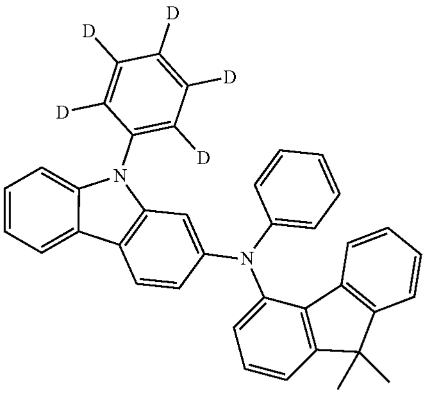
26
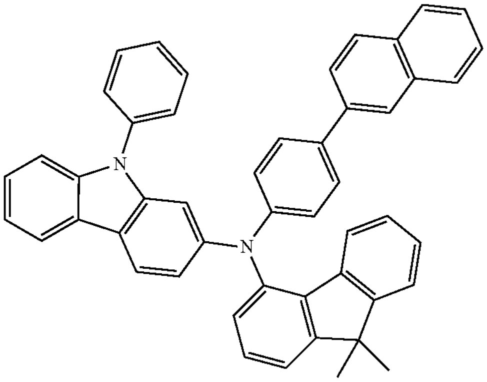
27
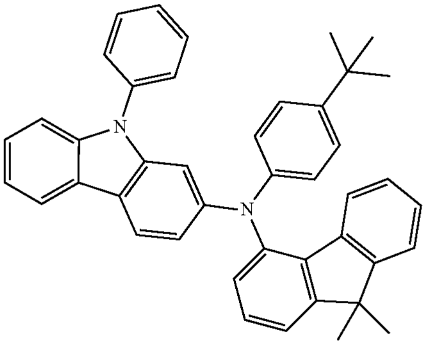
28
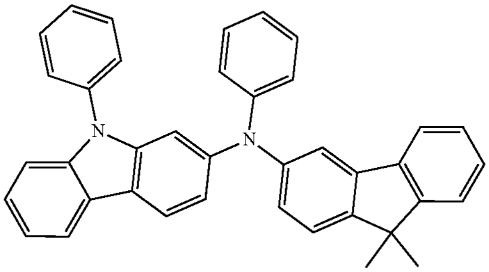

-continued
29
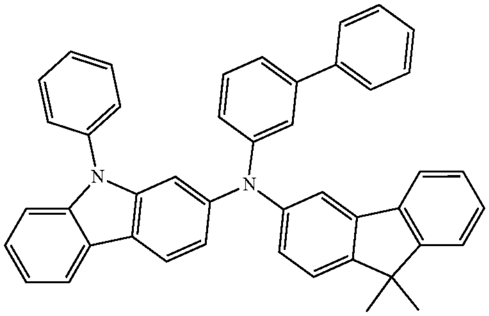
30
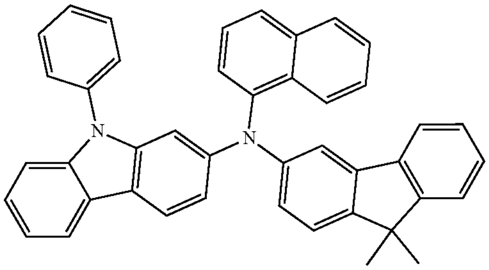
31
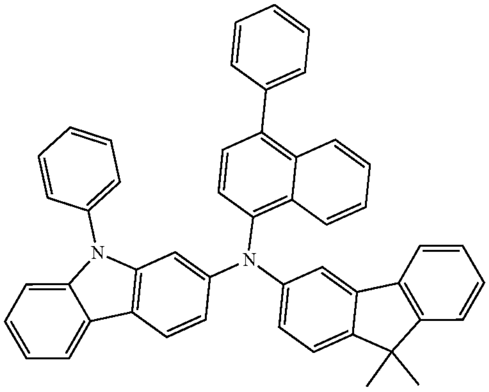
32
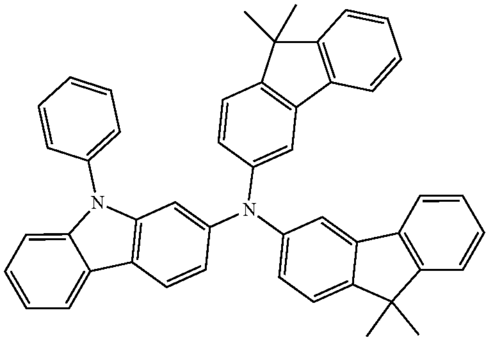
-continued
33
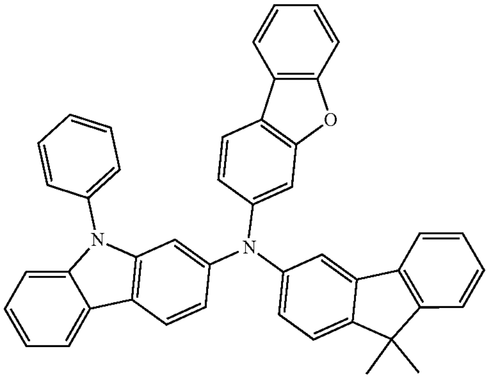
34
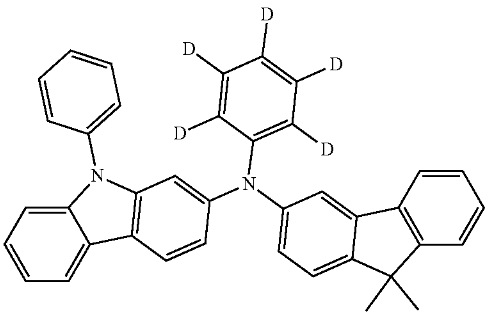
35
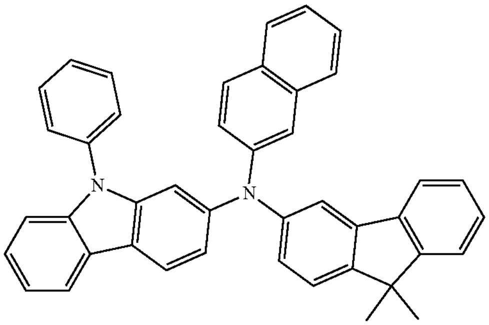
36
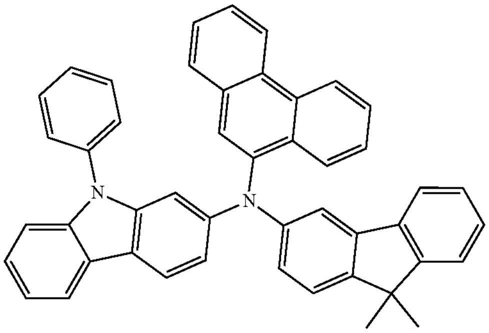

-continued
37
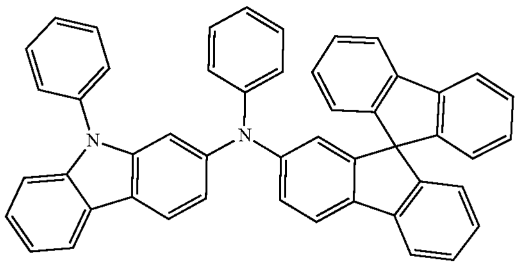
38
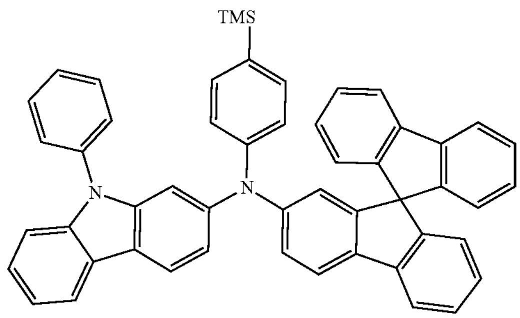
39
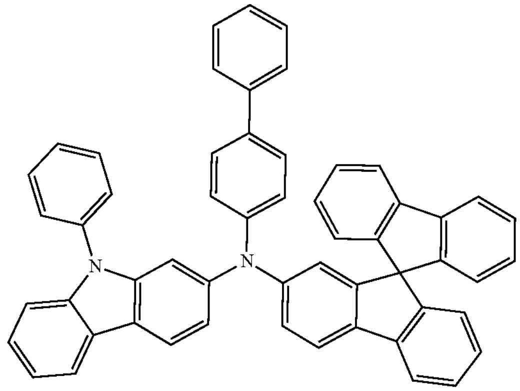
40
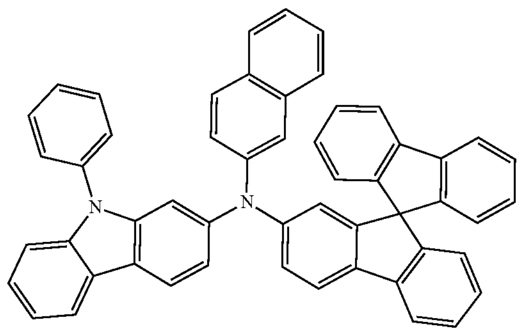
-continued
41
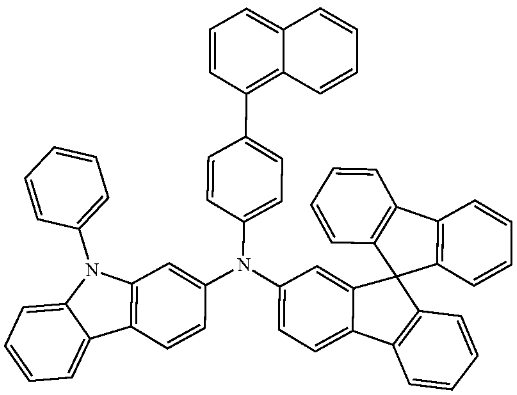
42
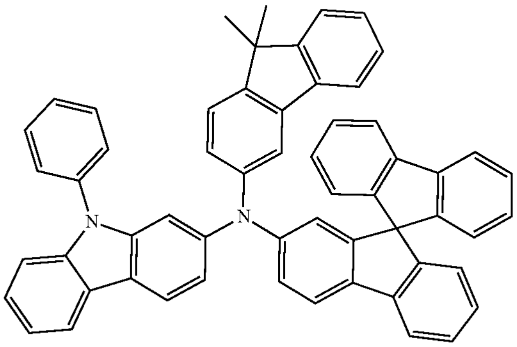
43
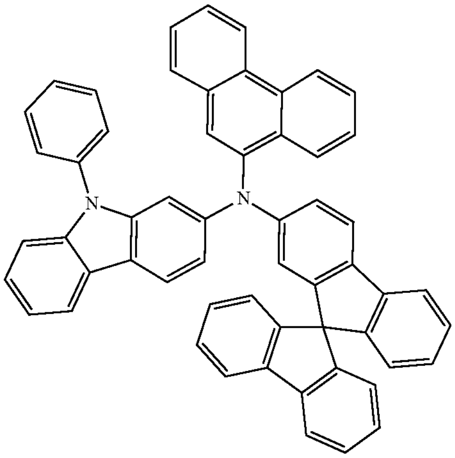

-continued
44
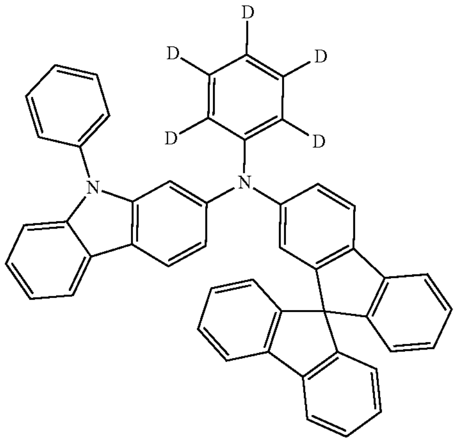
45
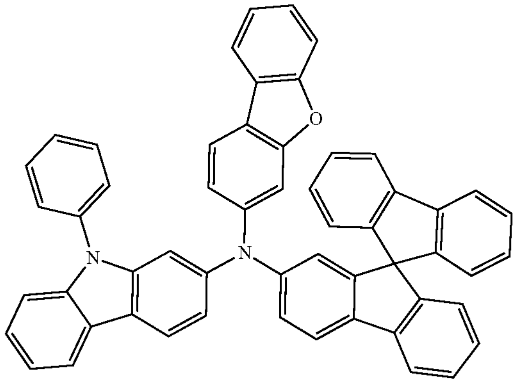
46
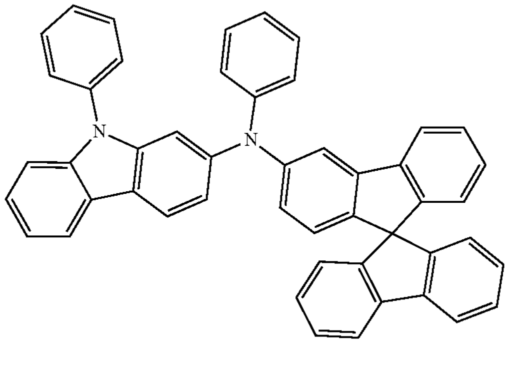
47
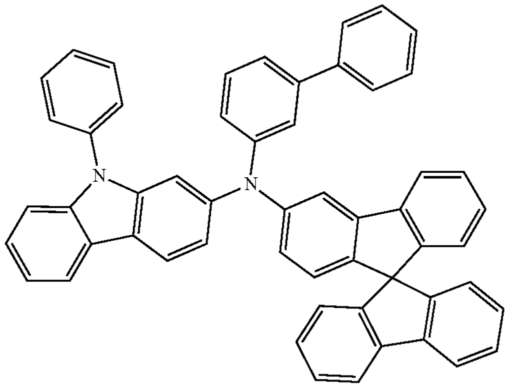
-continued
48
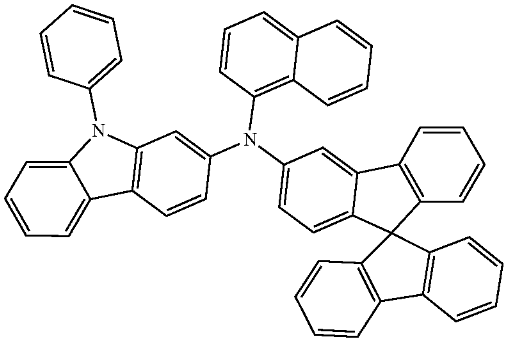
49
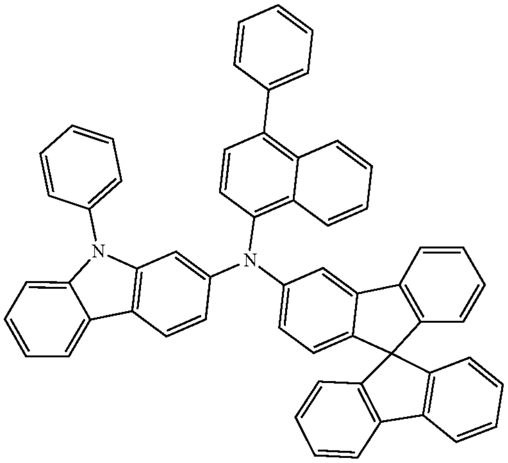
50
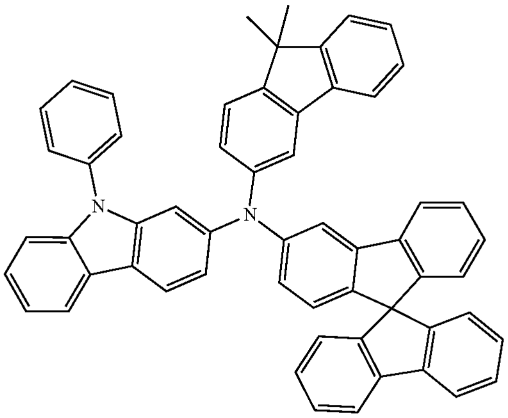

-continued
51
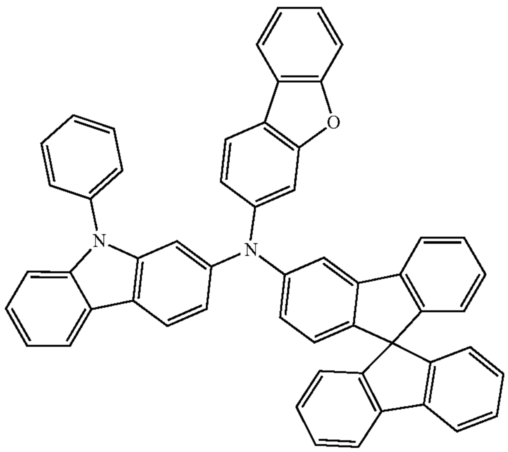
52
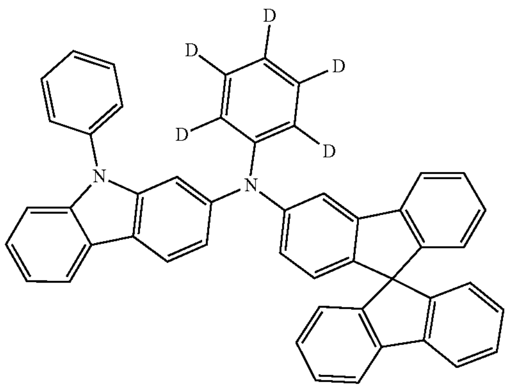
53
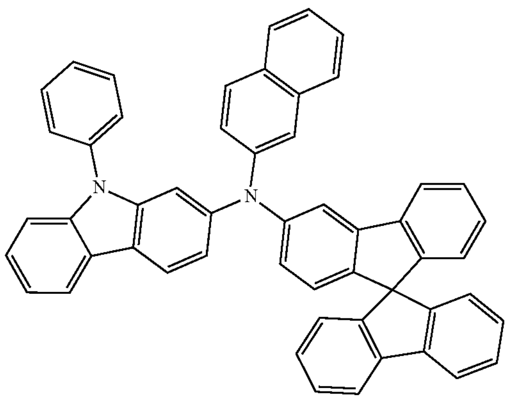
-continued
54
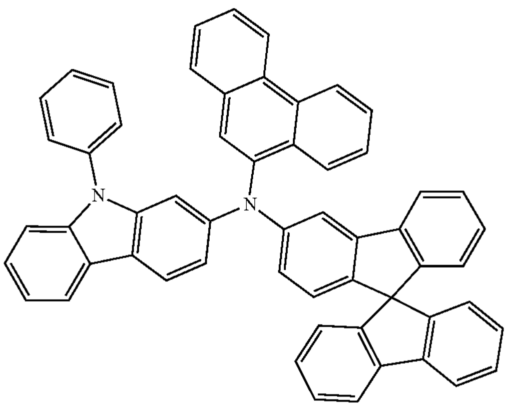
55
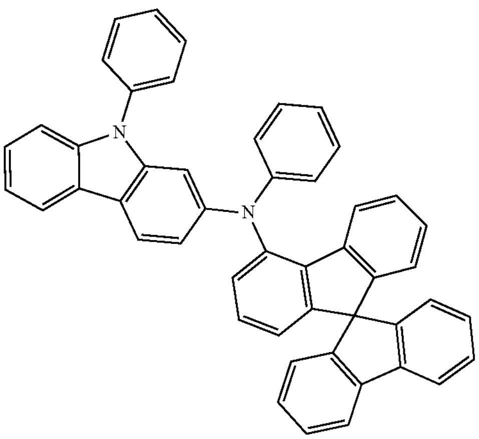
56
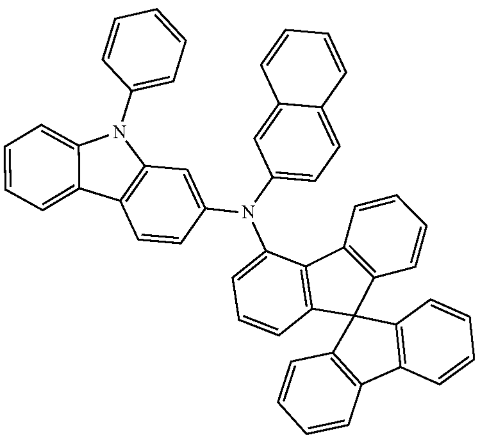

-continued
57
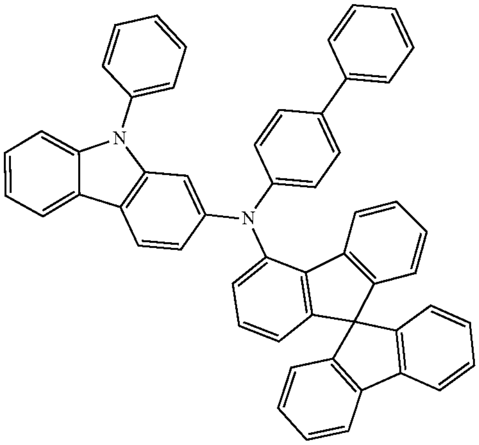
60
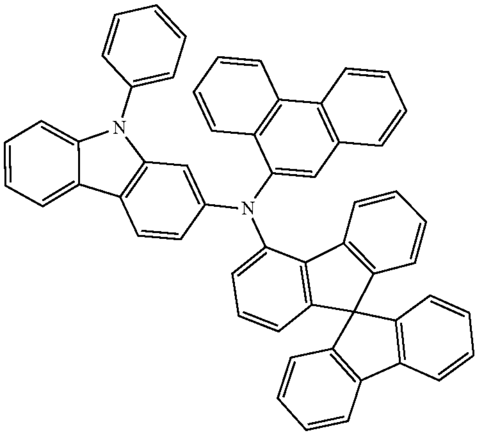
58
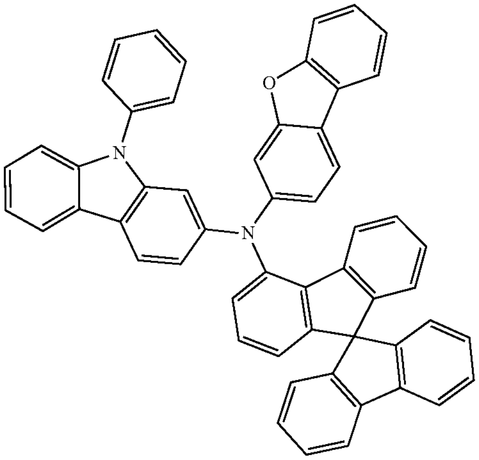
61
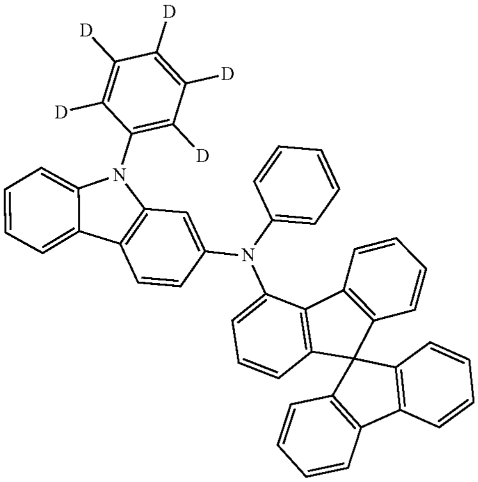
59
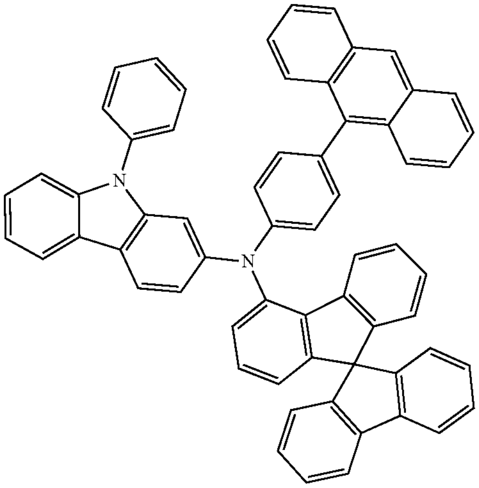
62
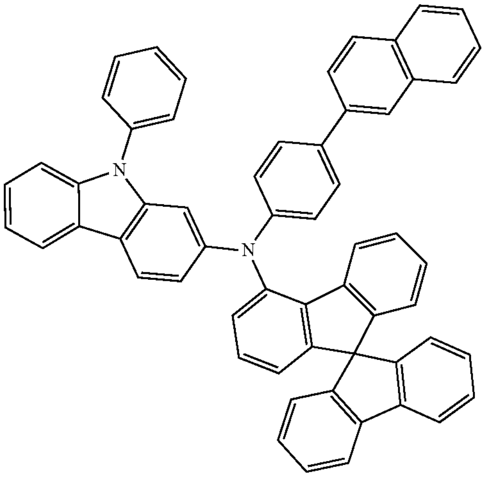

-continued
63
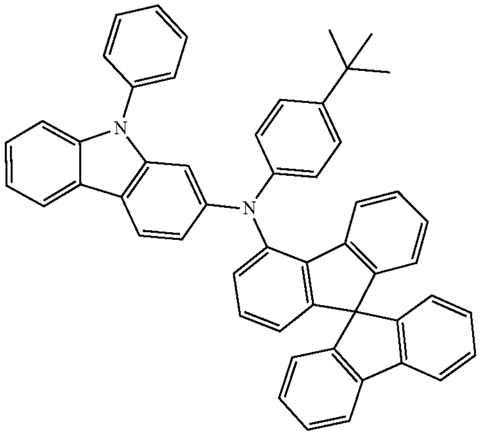
64
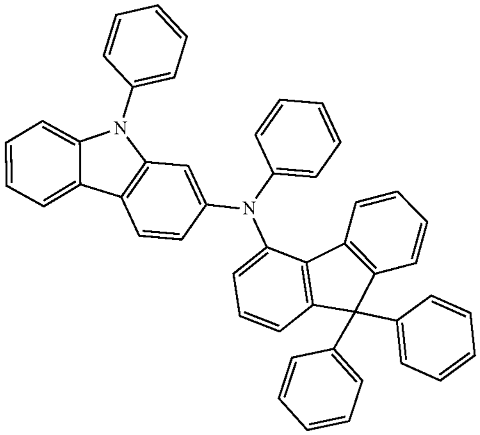
65
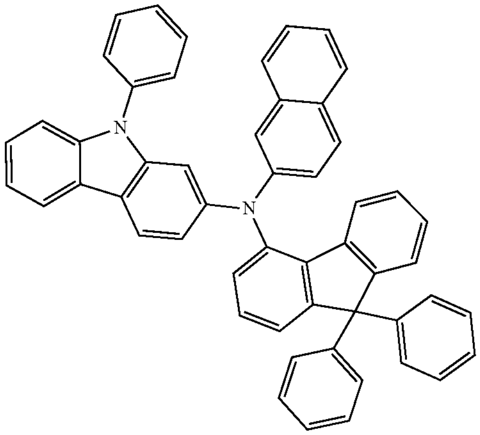
-continued
66
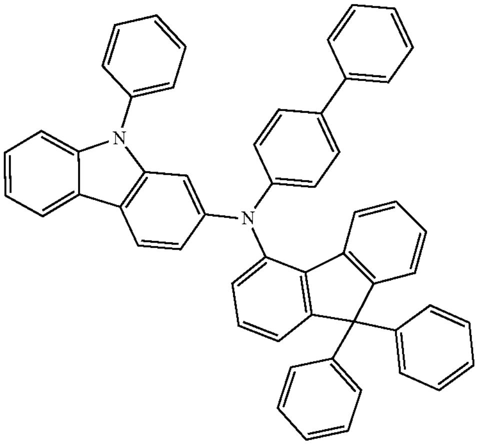
67
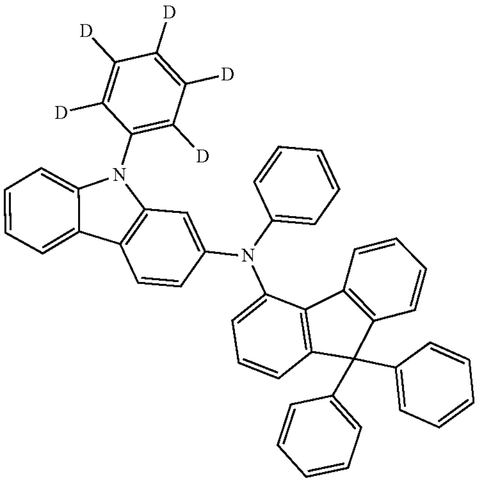
68
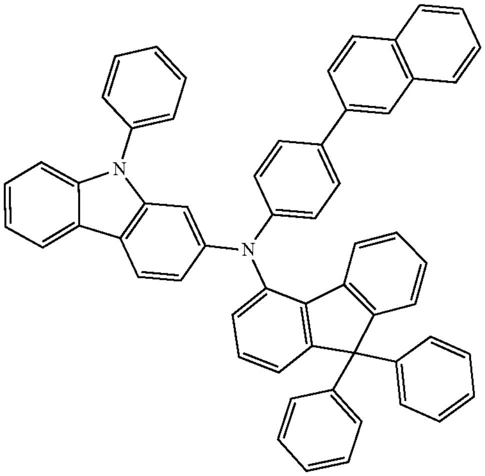

69
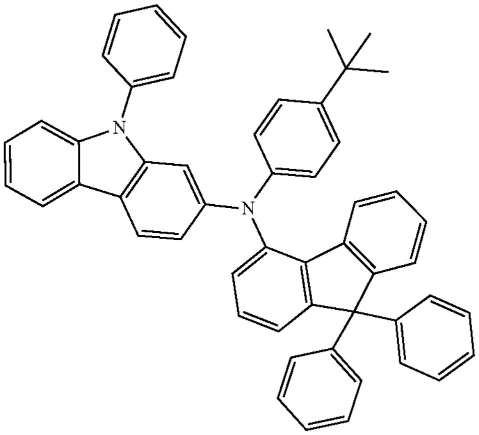
70
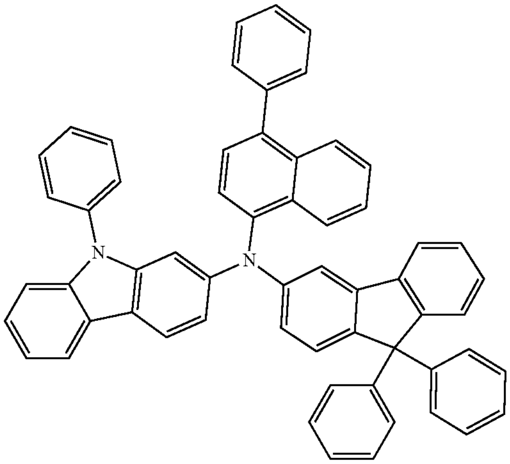
71
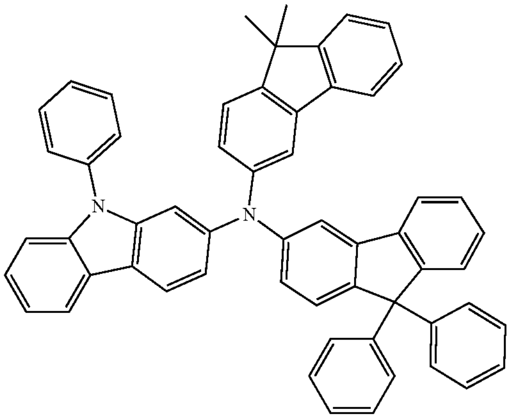
72
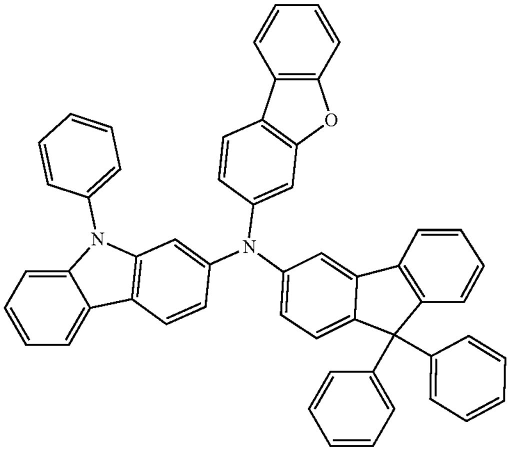
73
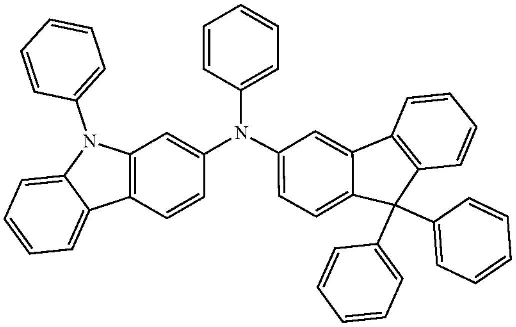
74
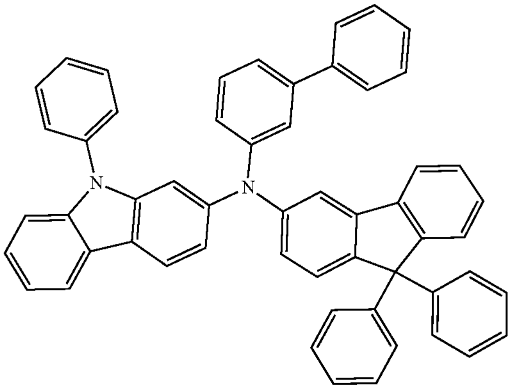
75
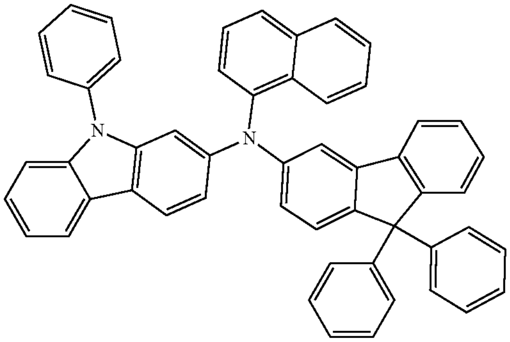

-continued
76
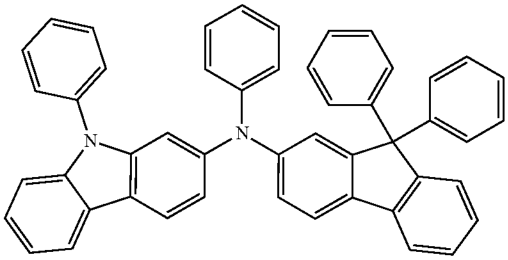
77
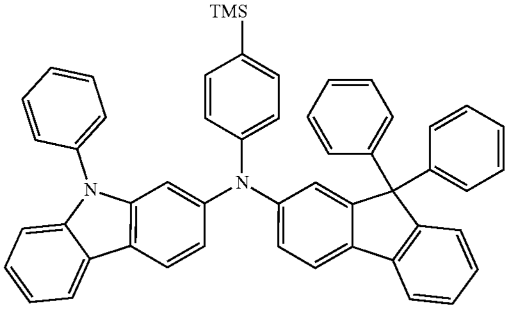
78
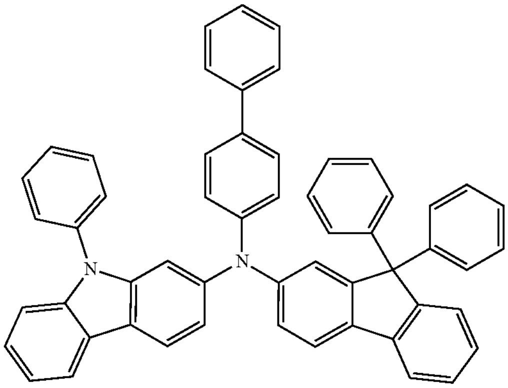
79
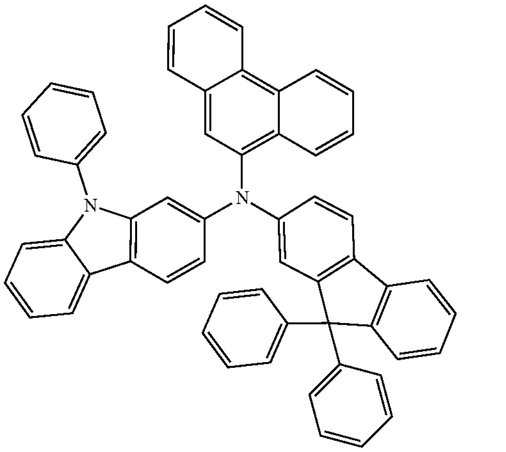
-continued
80
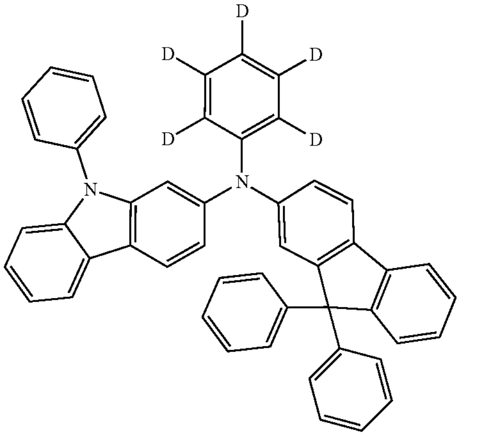
81
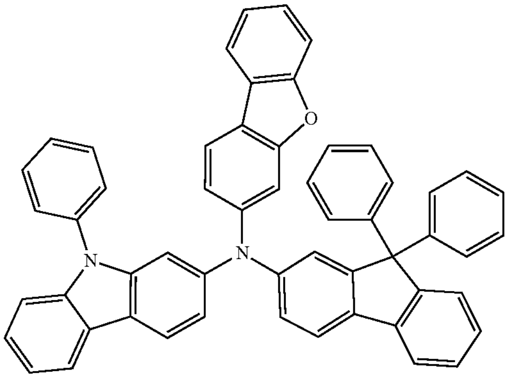
82
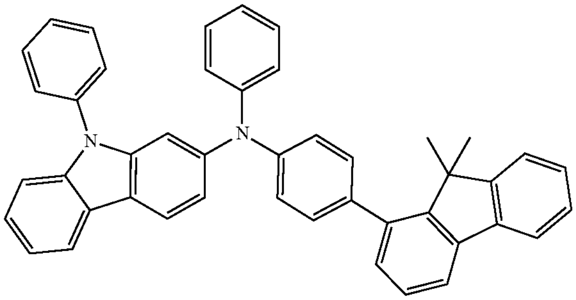
83
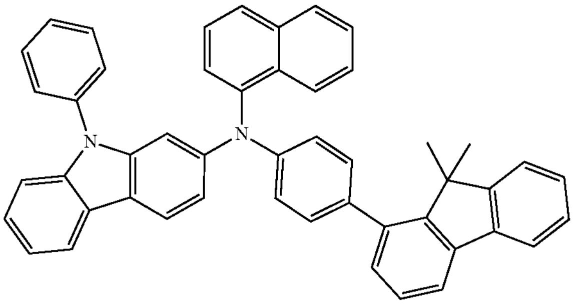

-continued
84
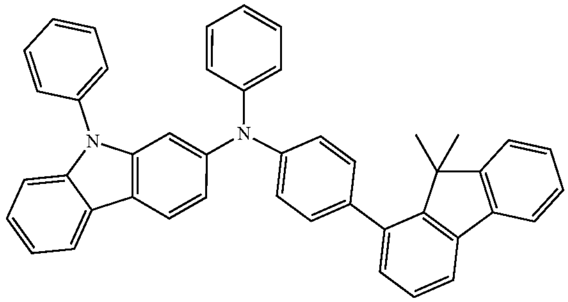
85
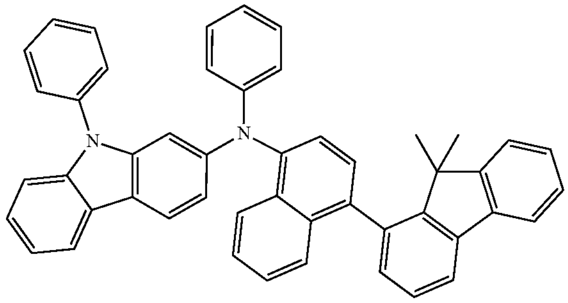
86
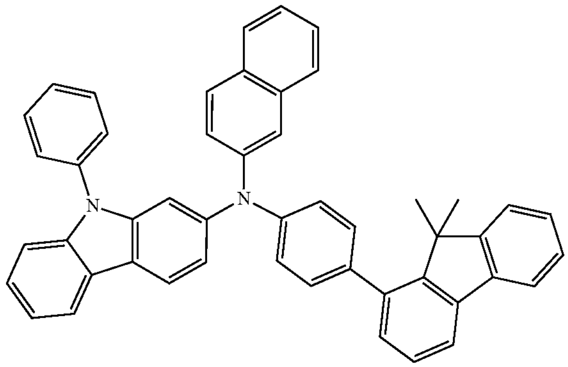
87
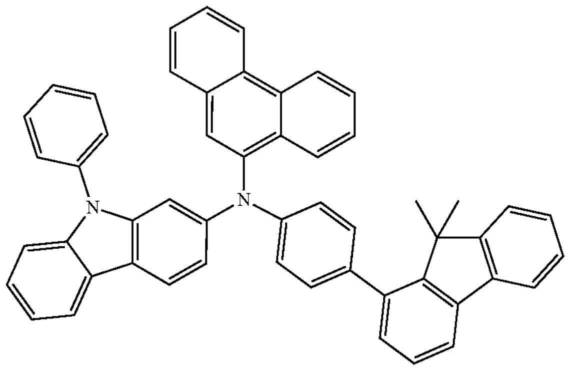
-continued
88
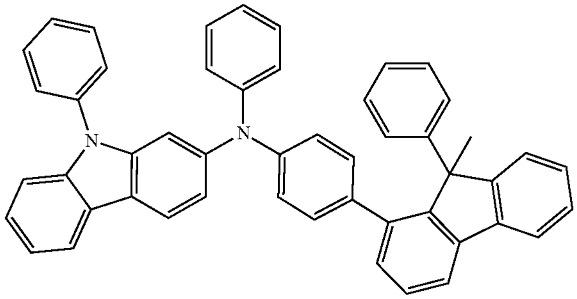
89
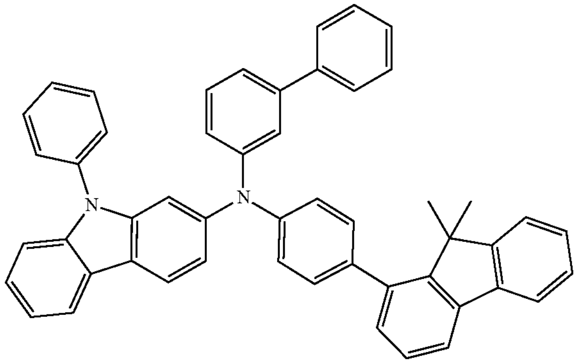
90
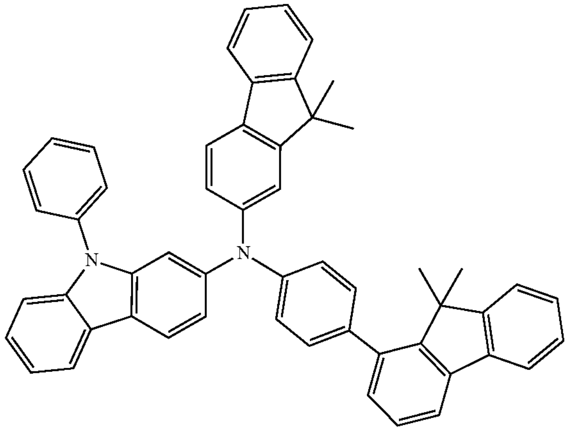
91
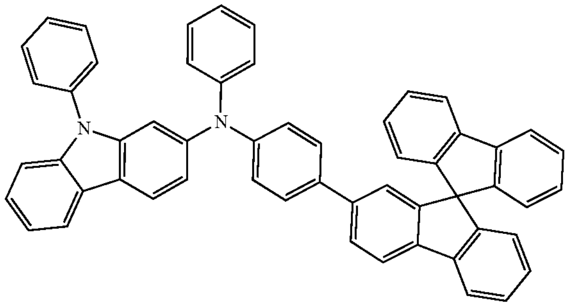

-continued
92
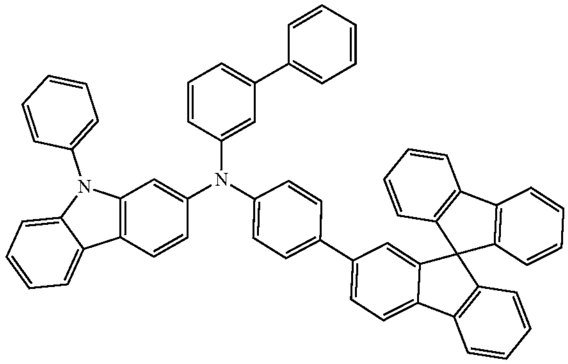
93
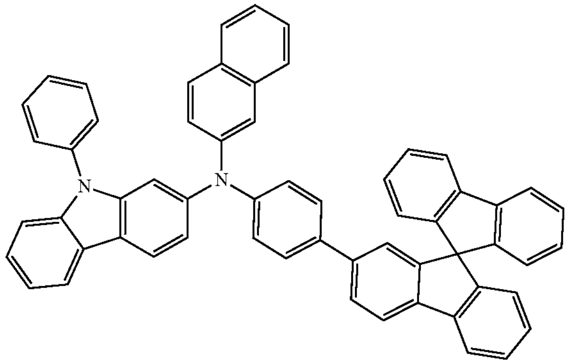
94
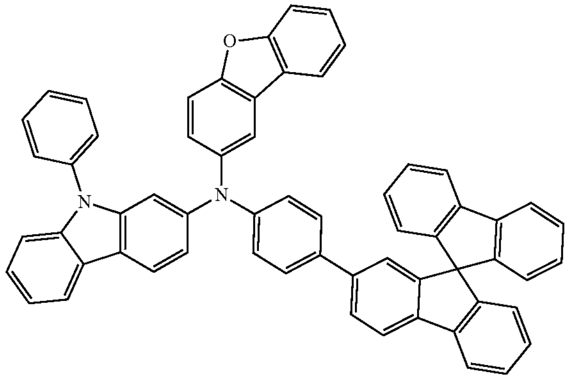
95
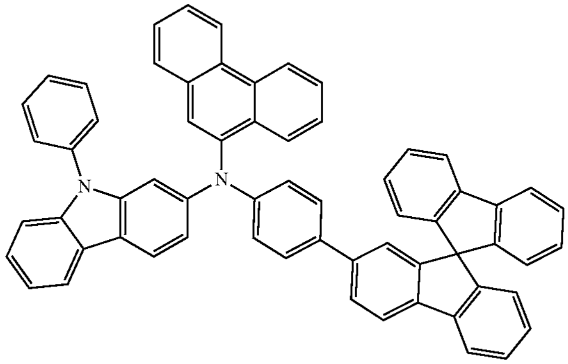
-continued
96
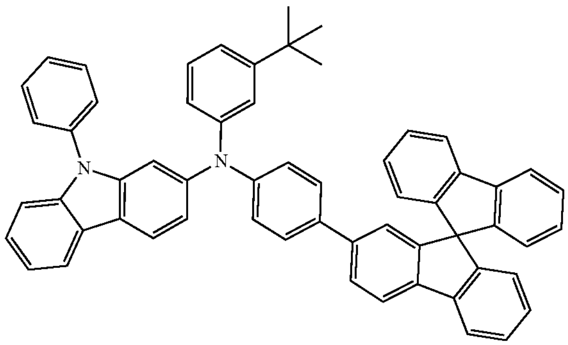
97
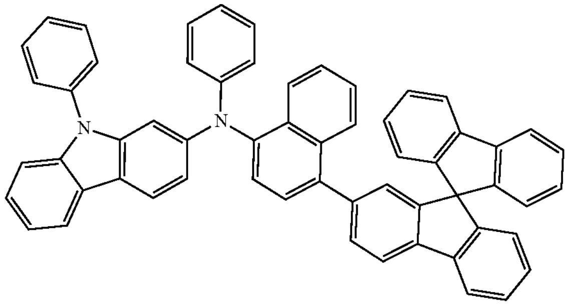
98
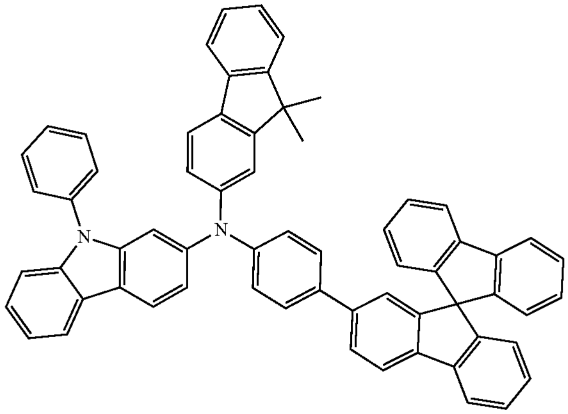
99
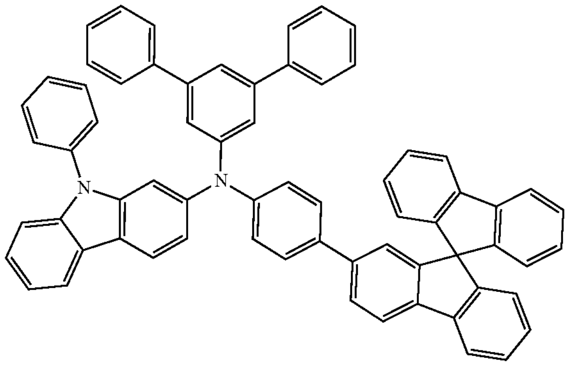

-continued
100
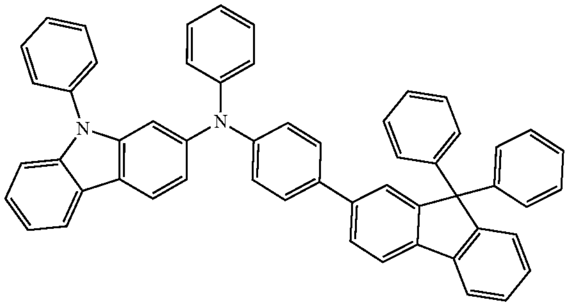
101
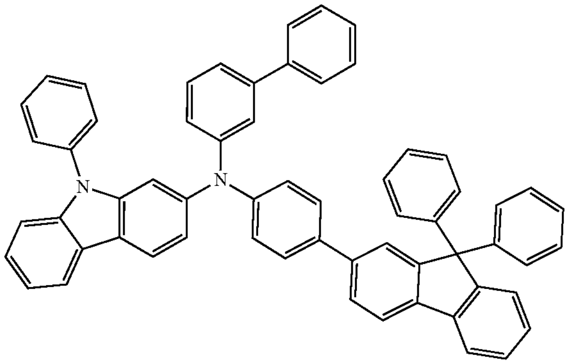
102
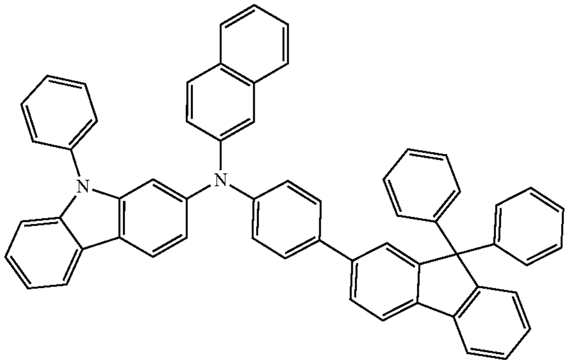
103
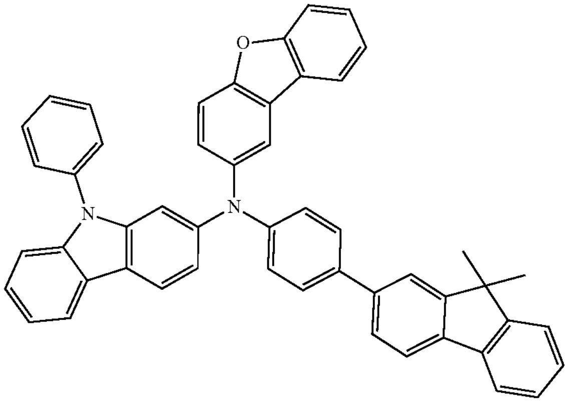
-continued
104
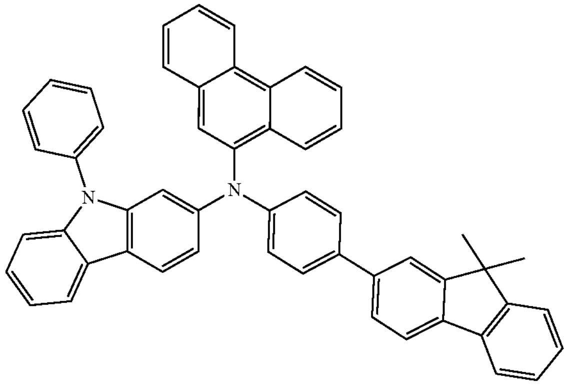
105
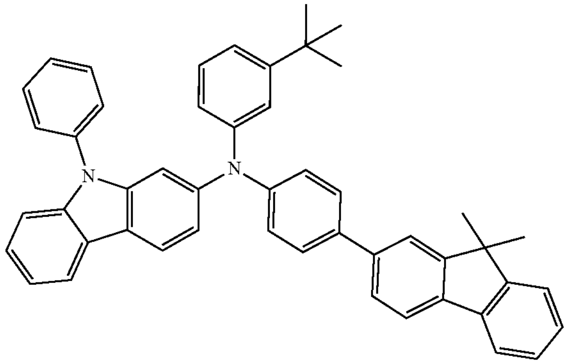
106
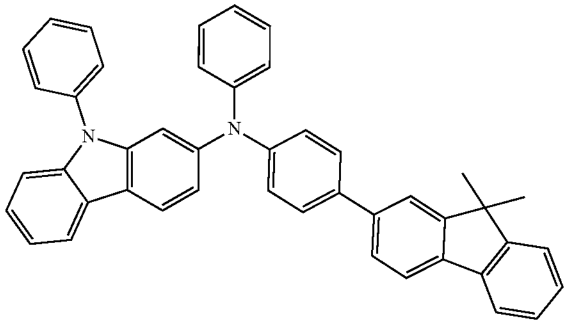
107
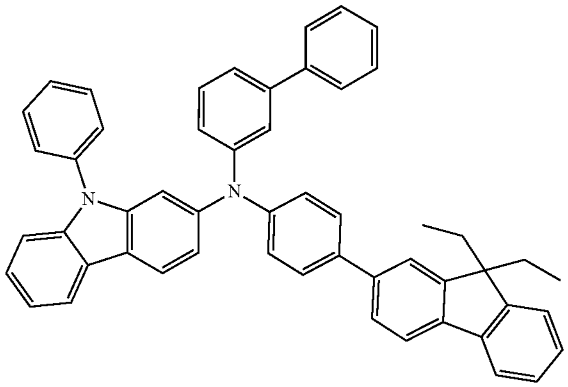

-continued
108
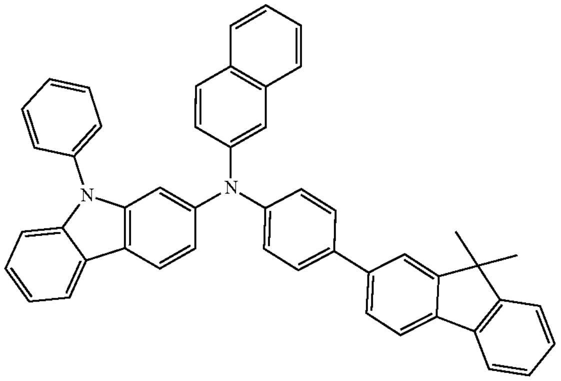
109
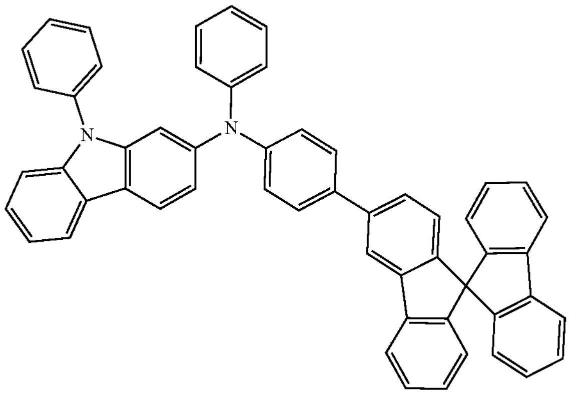
110
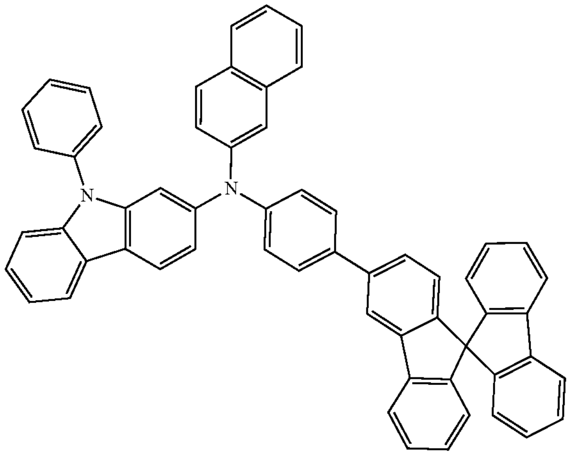
-continued
111
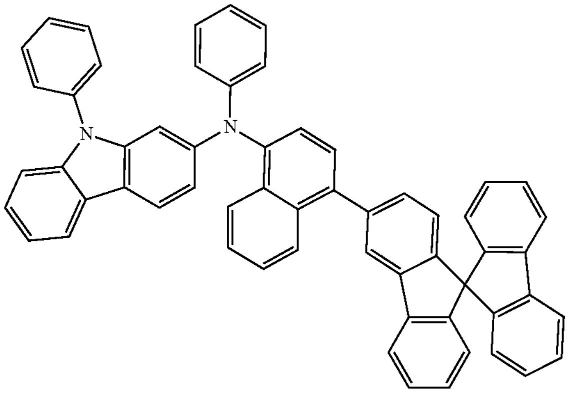
112
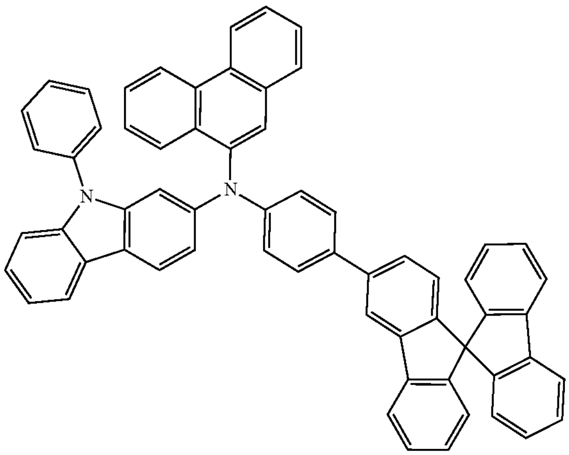
113
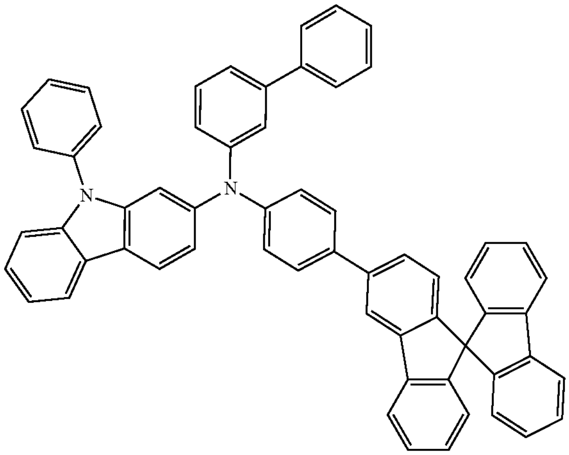

-continued
114
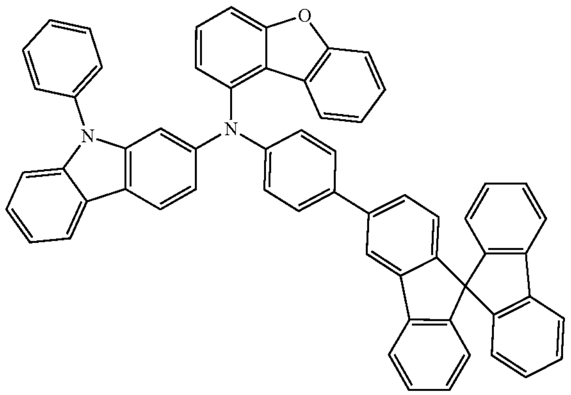
115
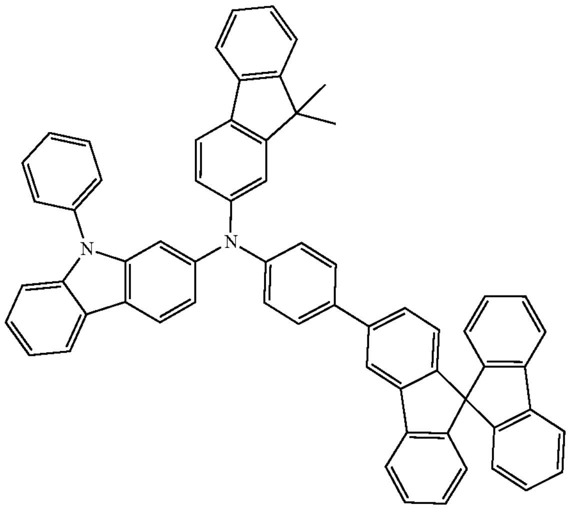
116
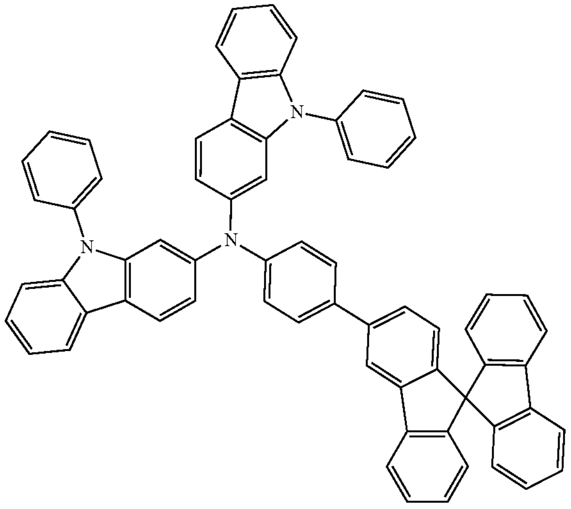
-continued
117
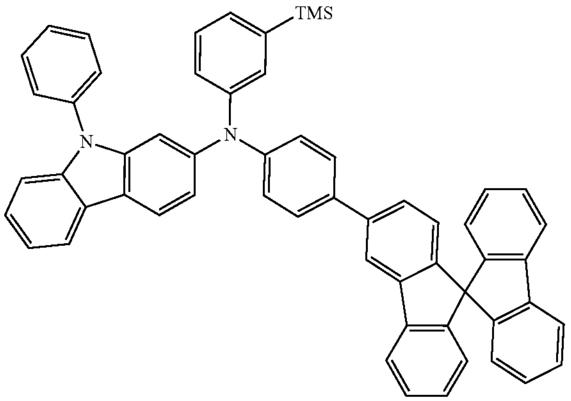
118
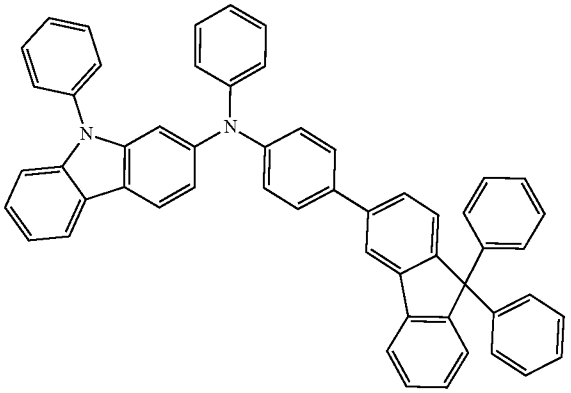
119
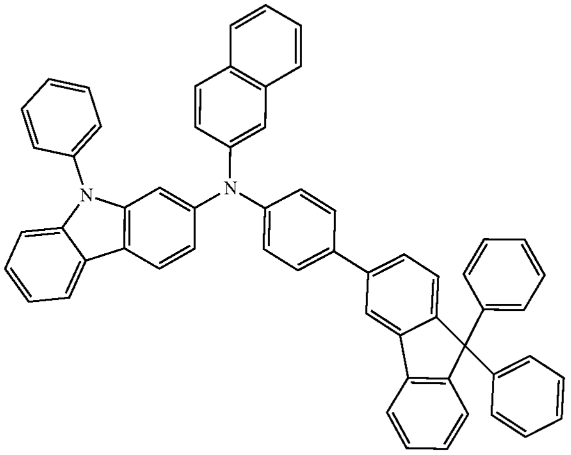

-continued
120
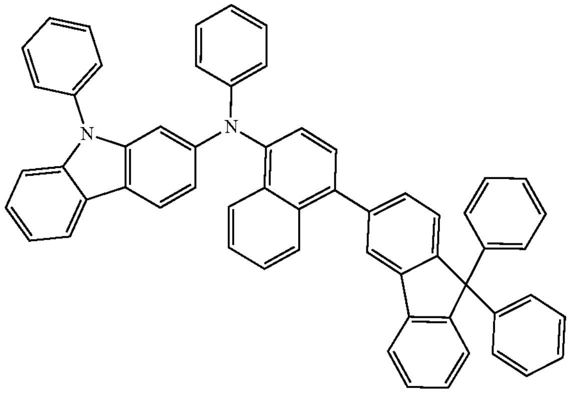
121
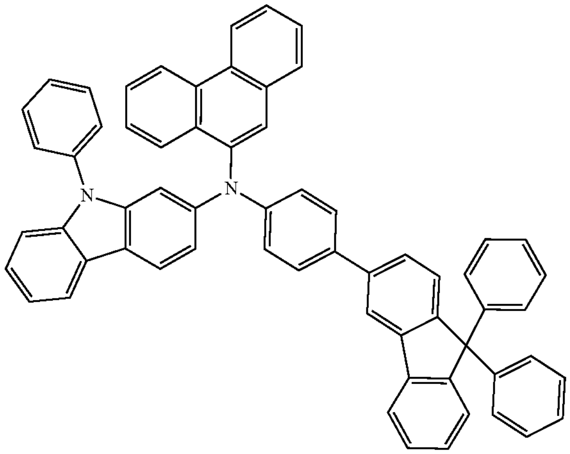
122
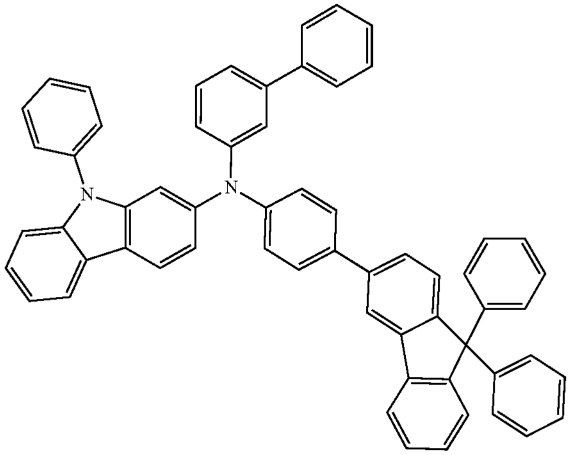
-continued
123
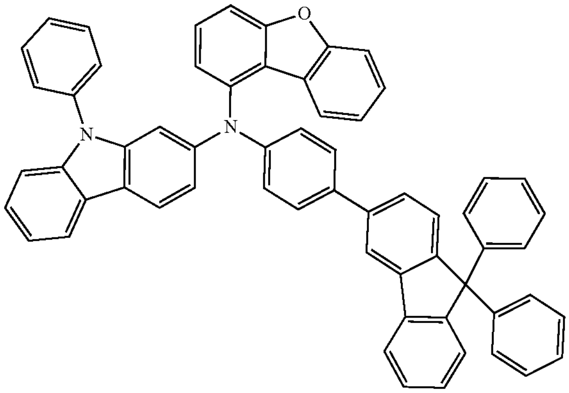
124
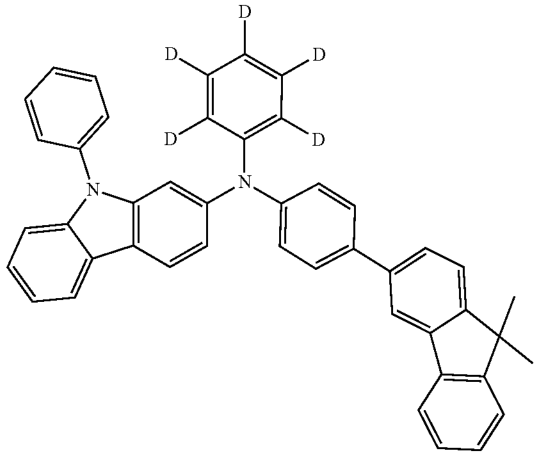
125
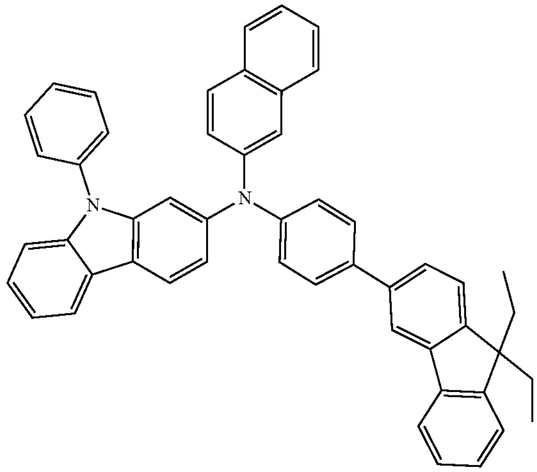

-continued
126
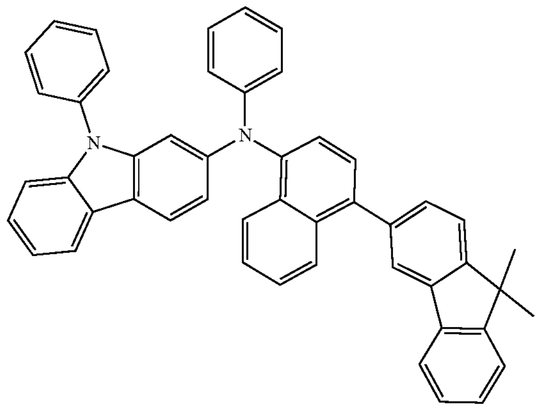
127
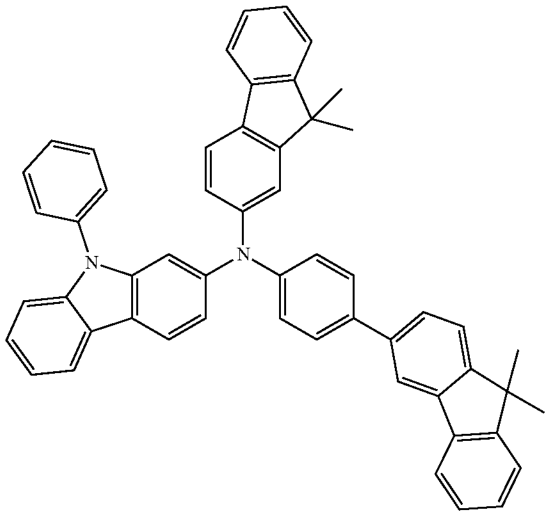
128
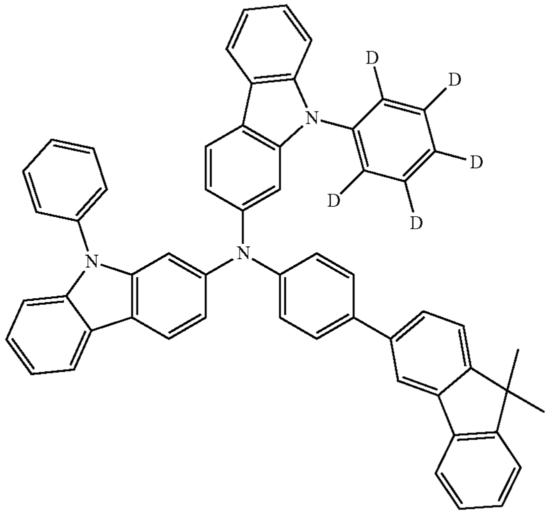
-continued
129
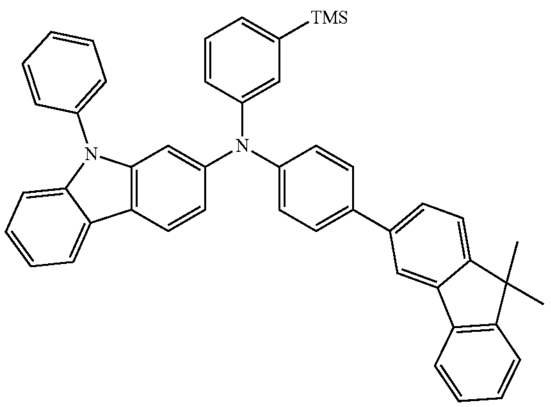
130
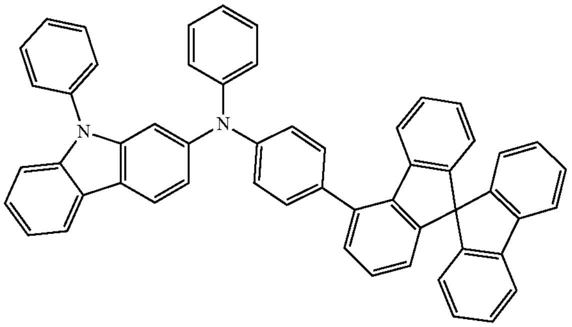
131
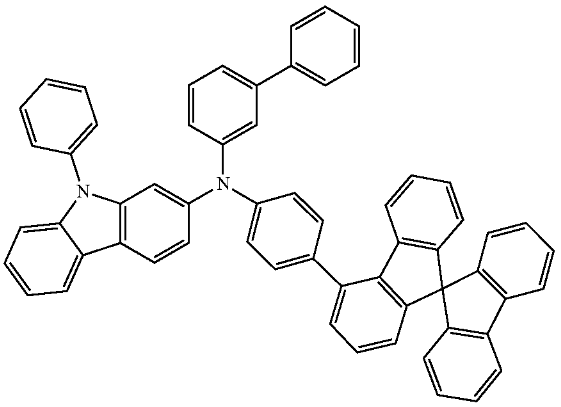
132
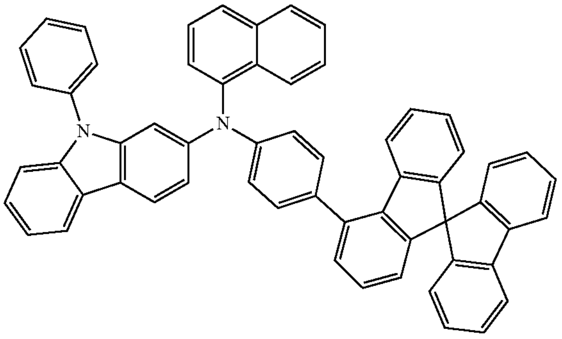

-continued
133
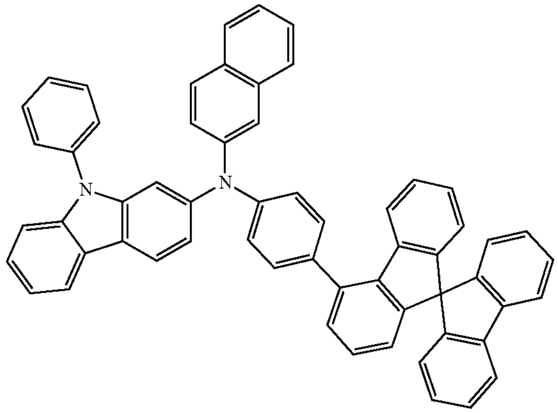
134
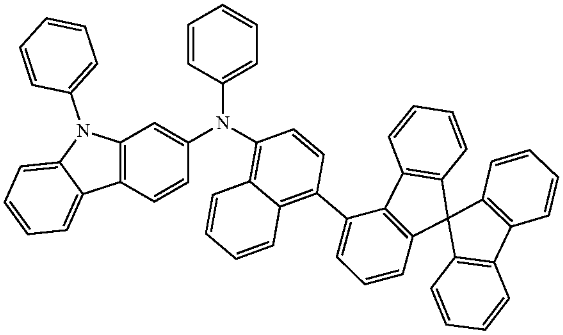
135
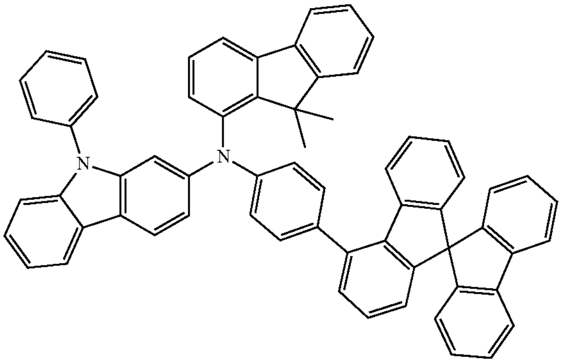
136
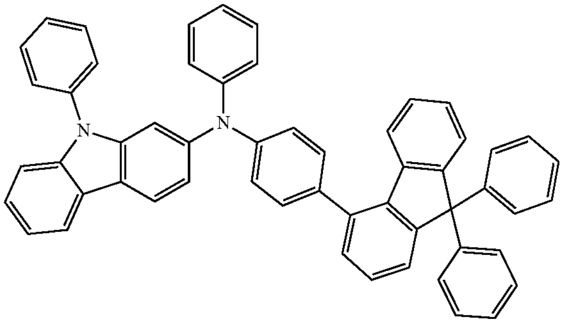
-continued
137
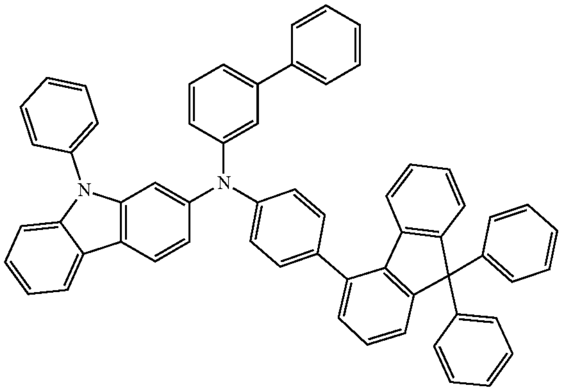
138
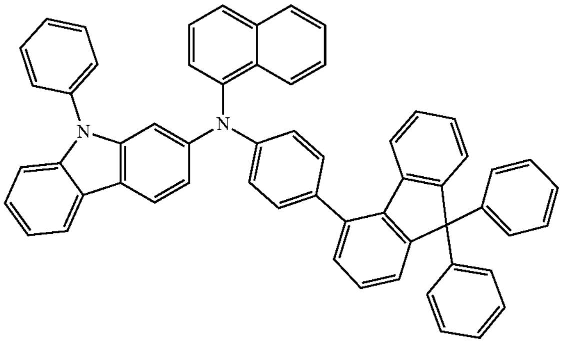
139
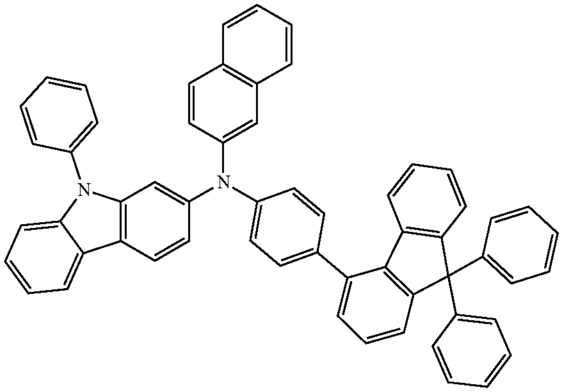
140
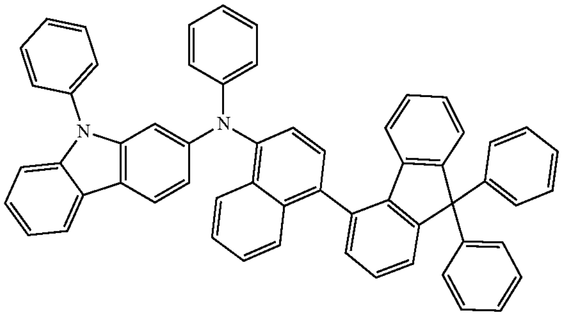

-continued
141
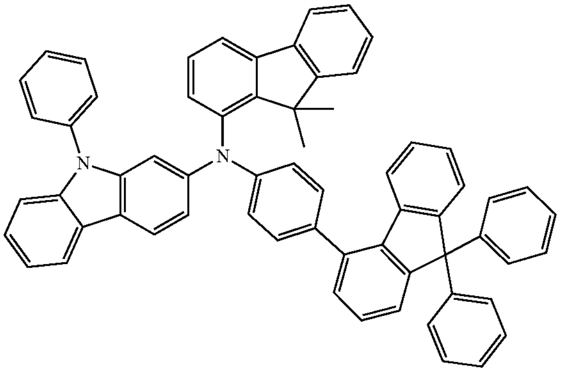
142
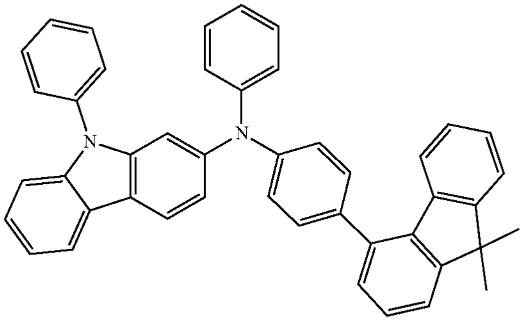
143
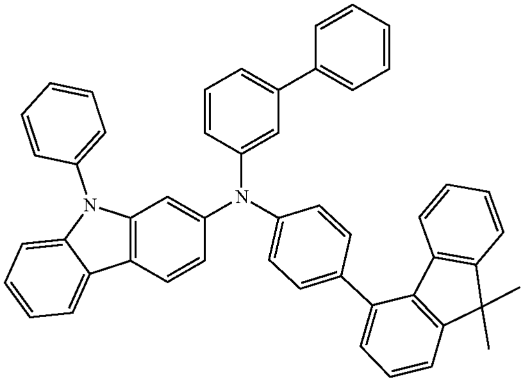
144
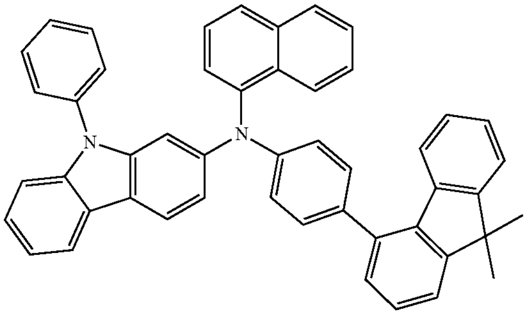
-continued
145
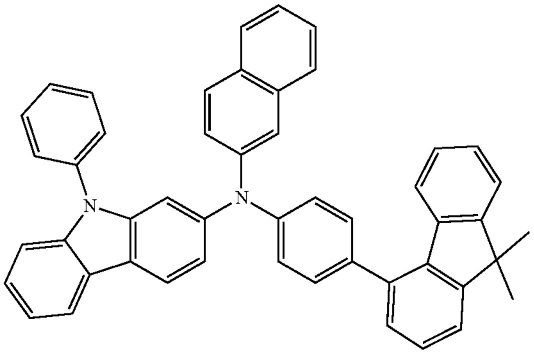
146
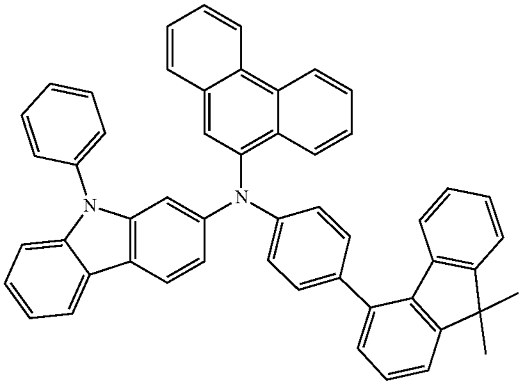
147
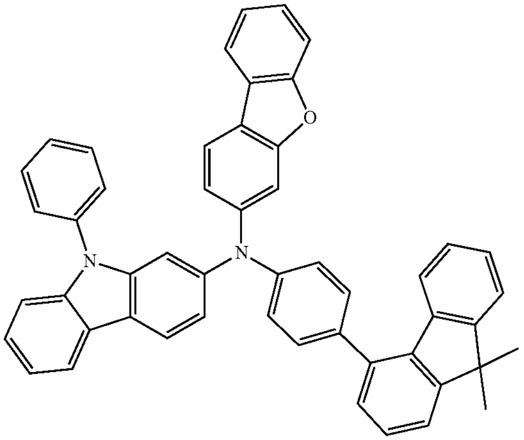
148
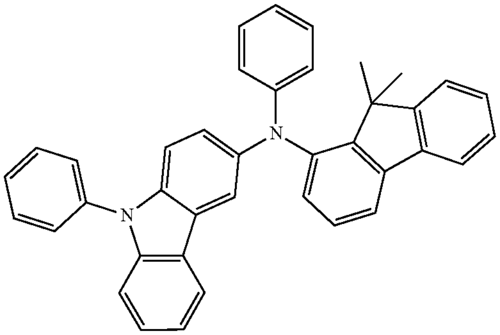

149
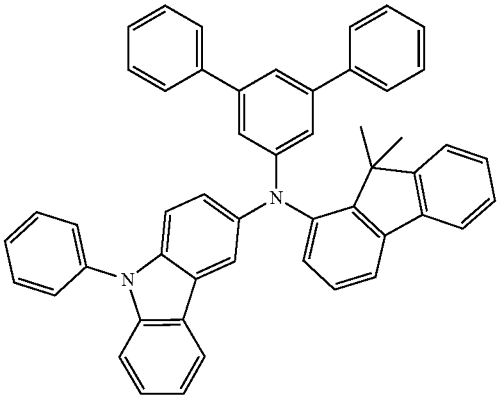
150
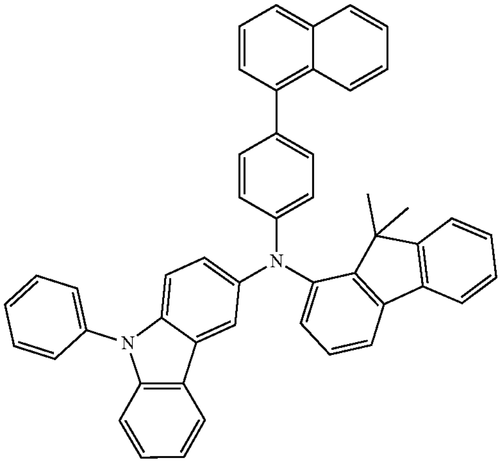
151
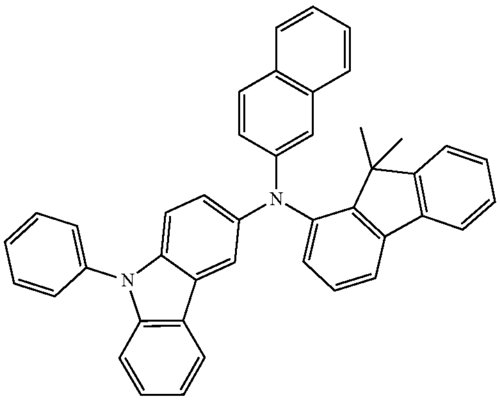
152
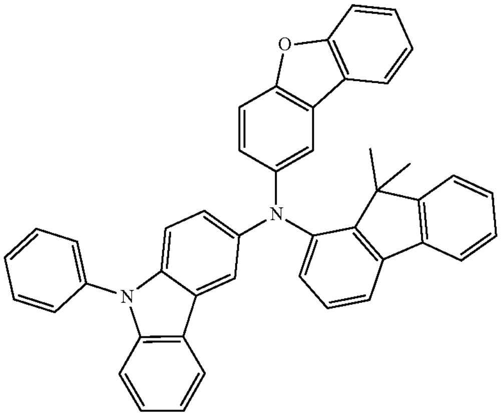
153
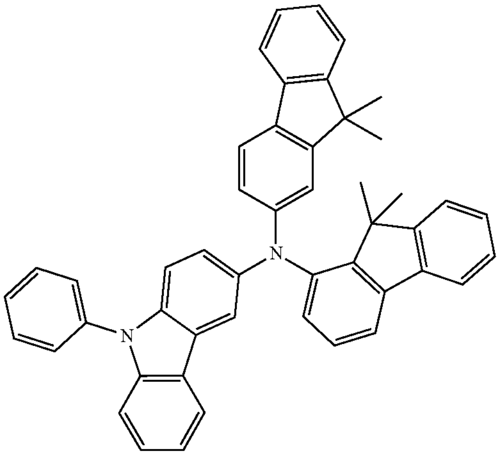
154
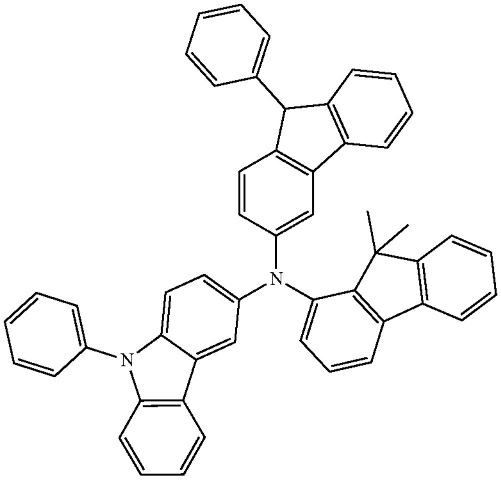

-continued
155
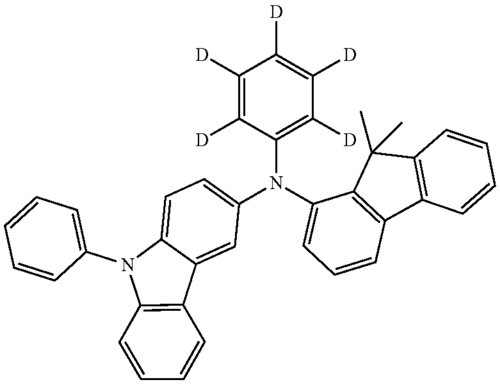
156
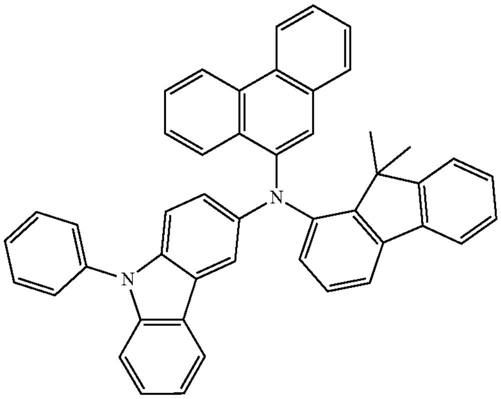
157
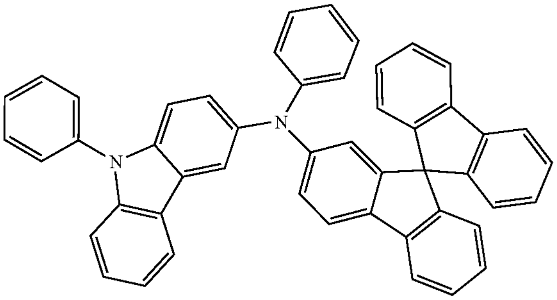
158
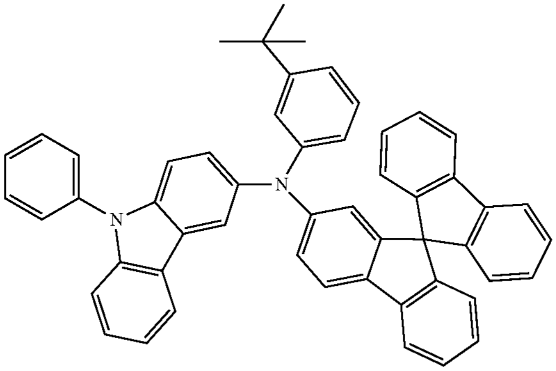
-continued
159
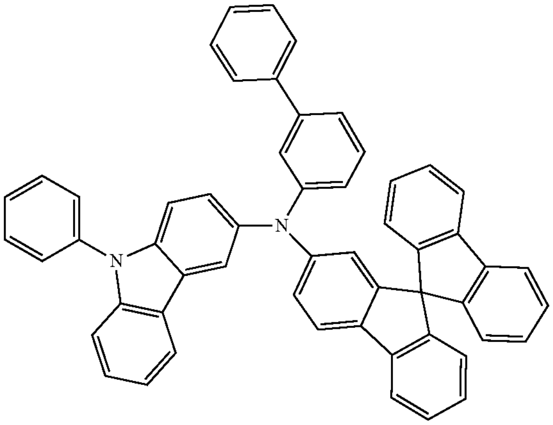
160
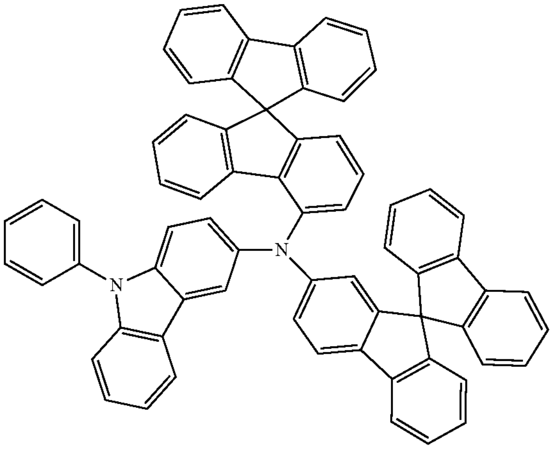
161
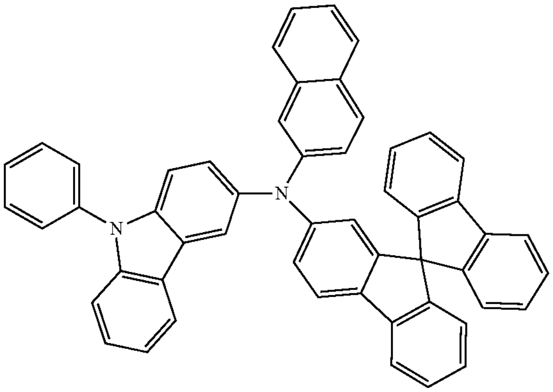

-continued
162
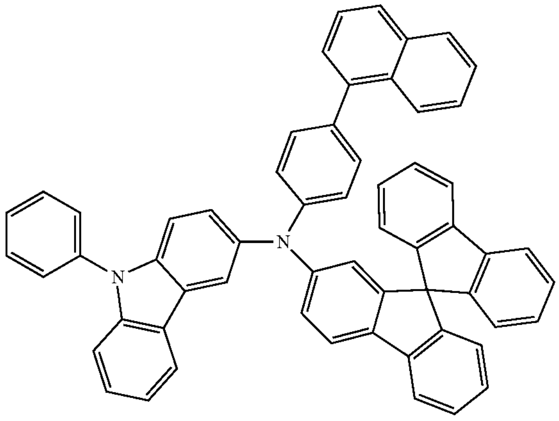
163
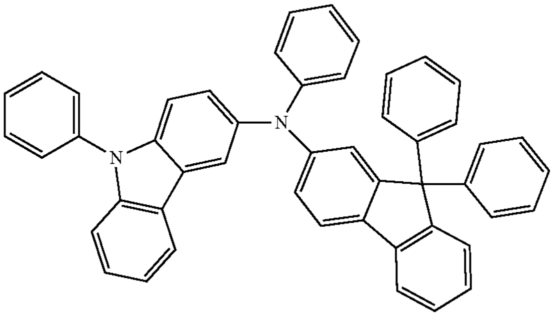
164
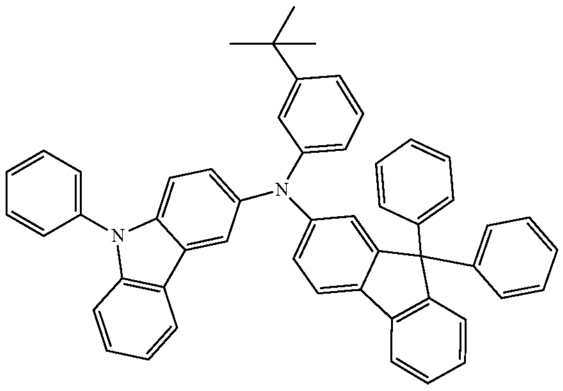
165
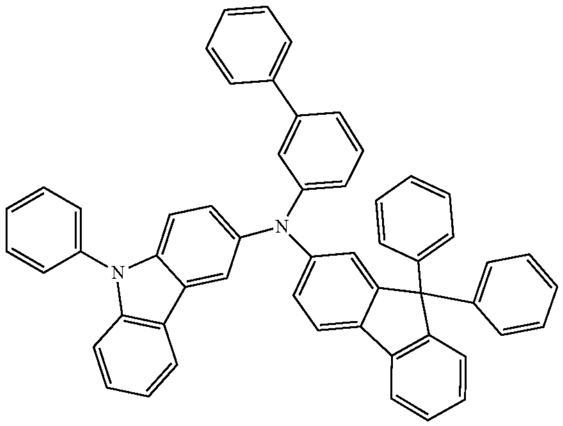
-continued
166
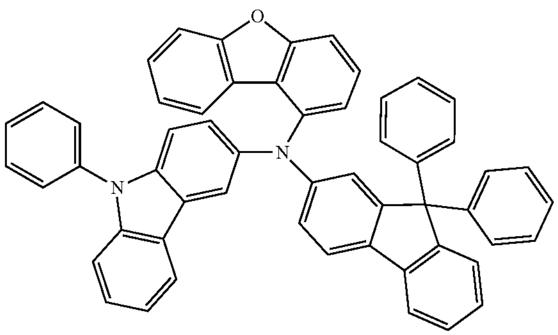
167
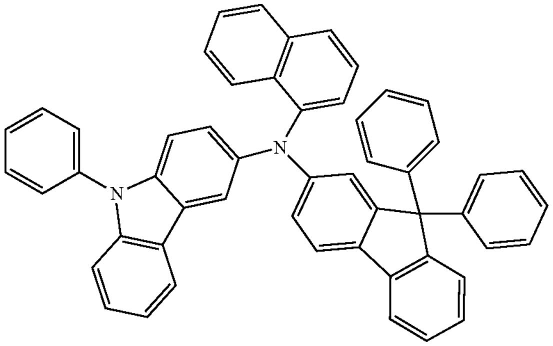
168
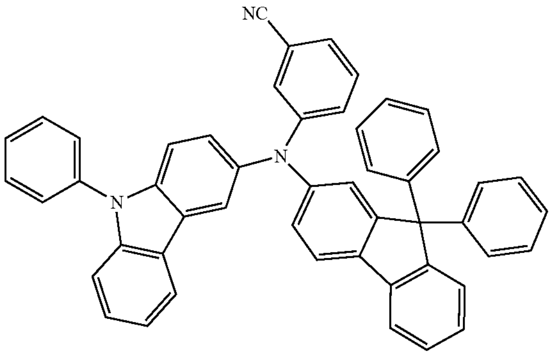
169
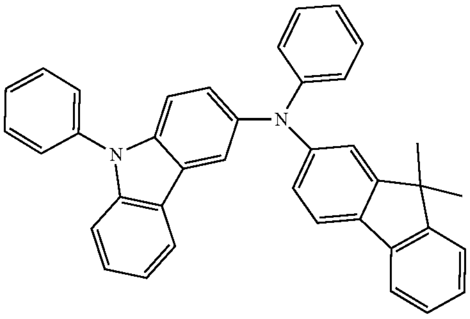

-continued
170
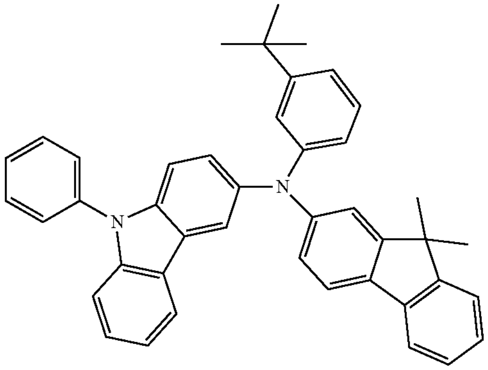
171
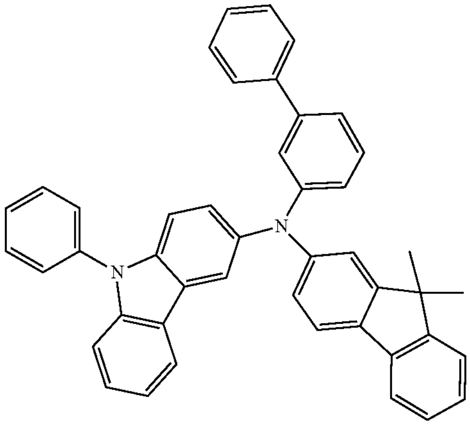
172
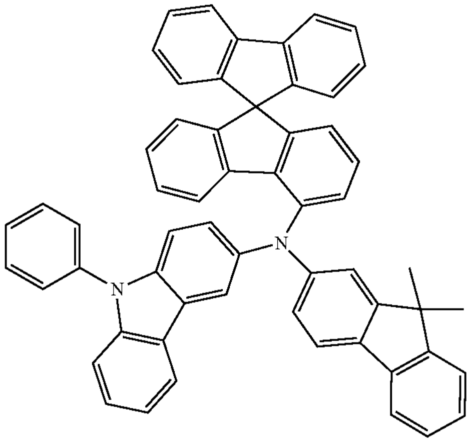
173
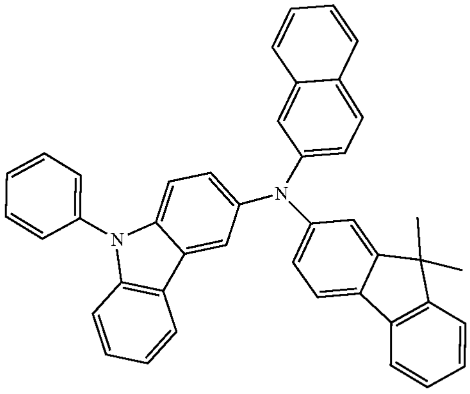
-continued
174
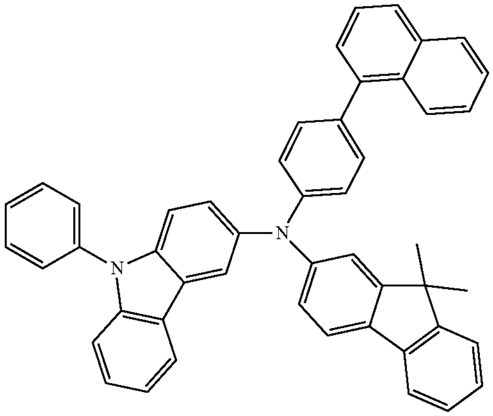
175
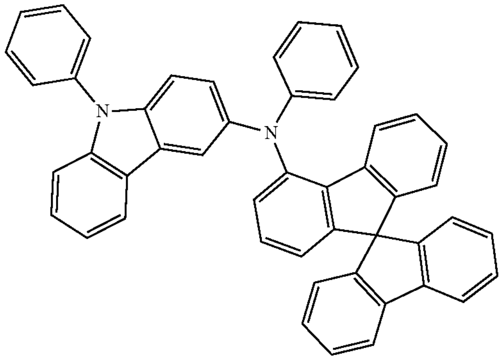
176
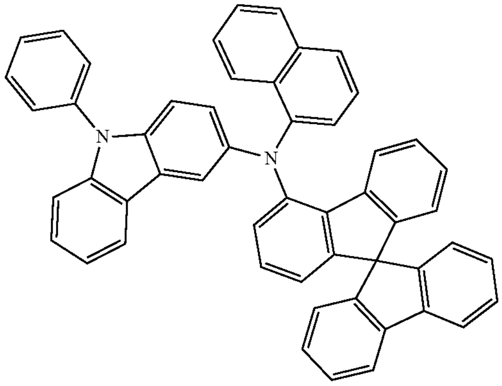
177
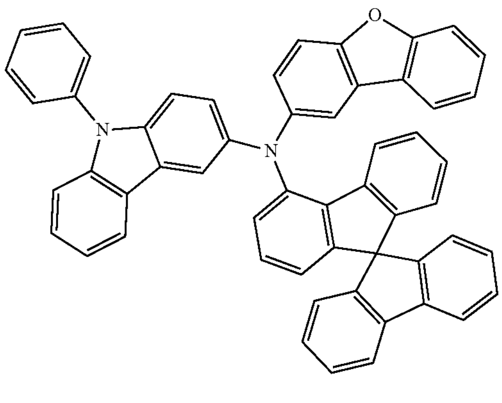

-continued
178
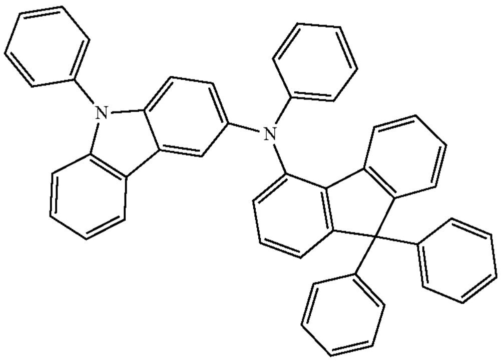
179
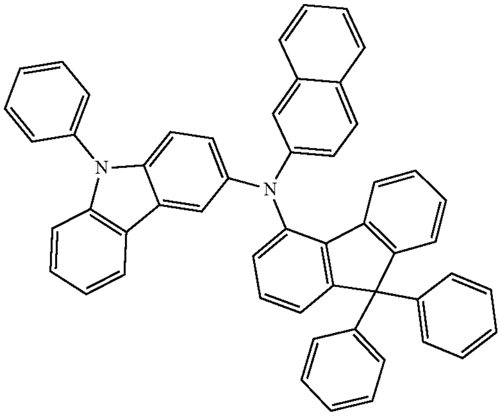
180
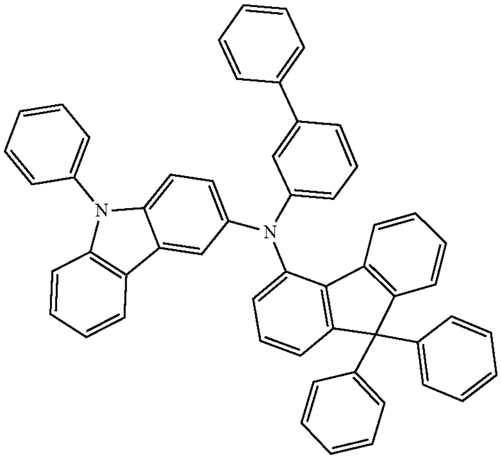
-continued
181
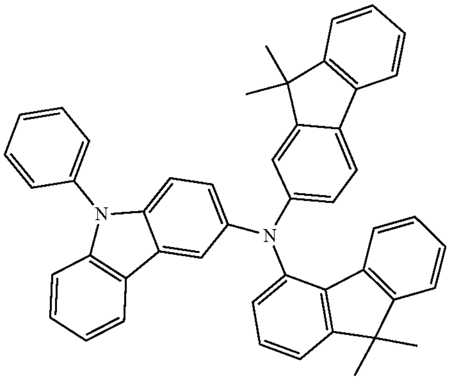
182
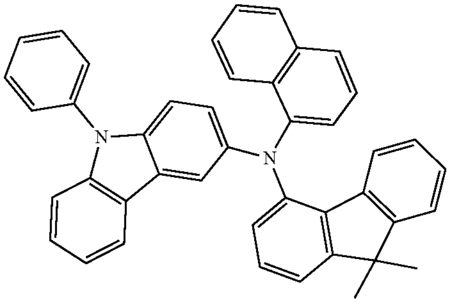
183
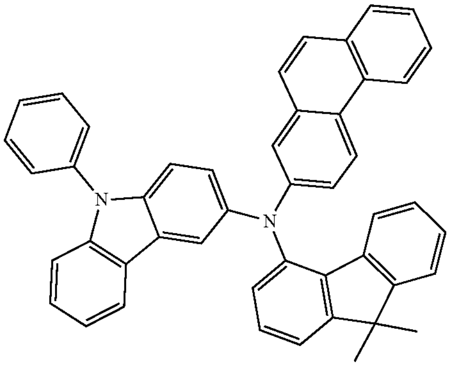
184
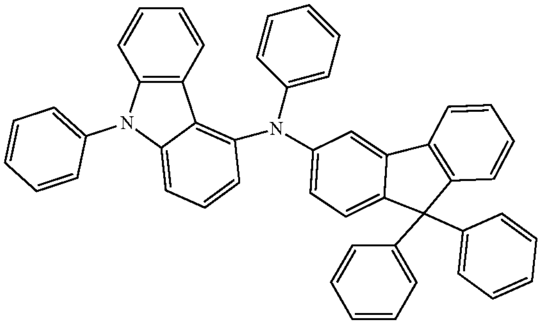

-continued
185
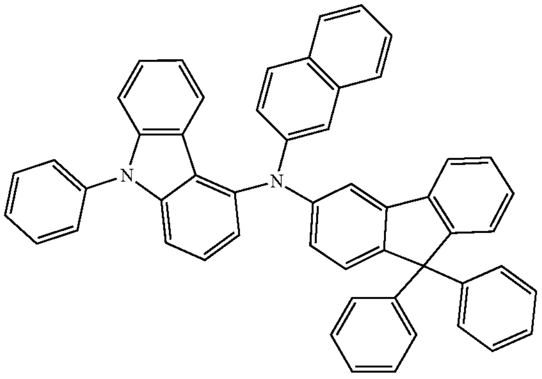
186
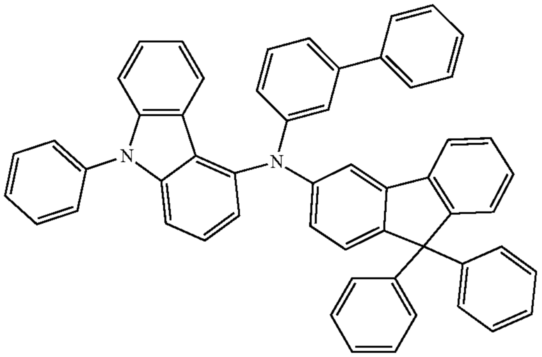
187
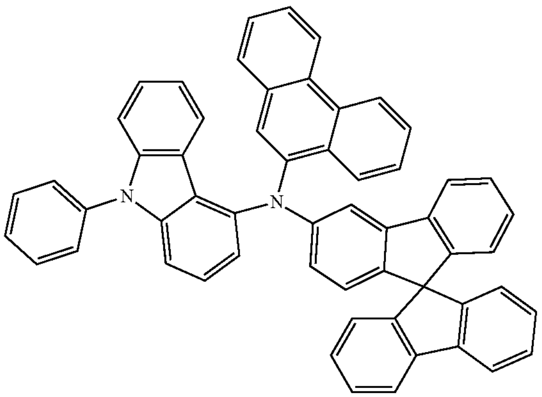
188
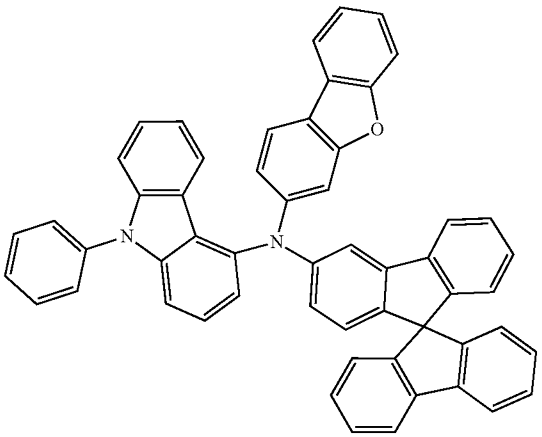
-continued
189
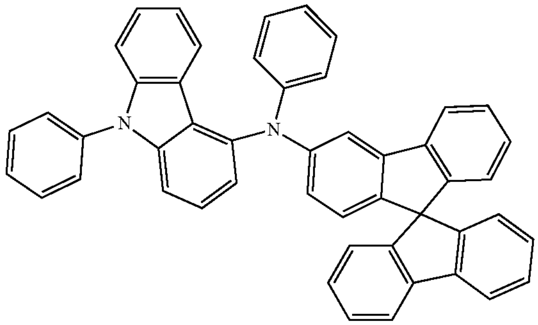
190
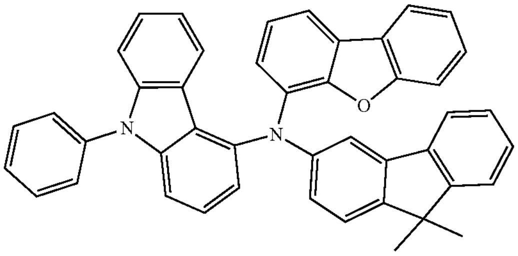
191
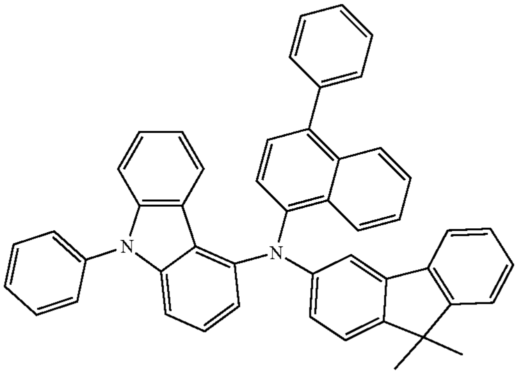
192
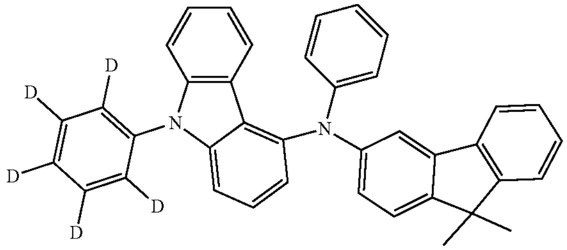
193
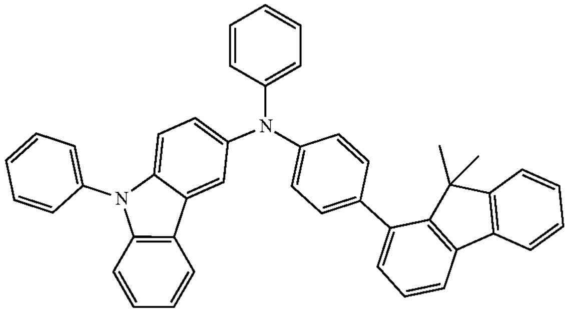

-continued
194
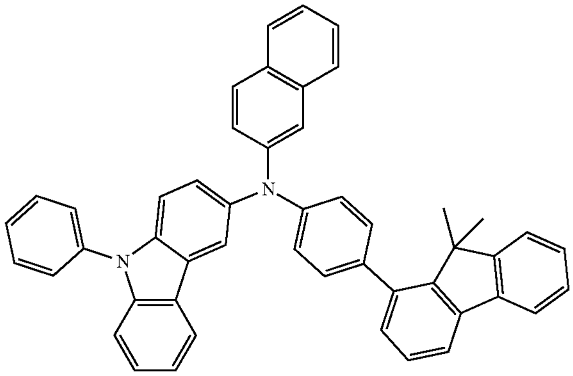
195
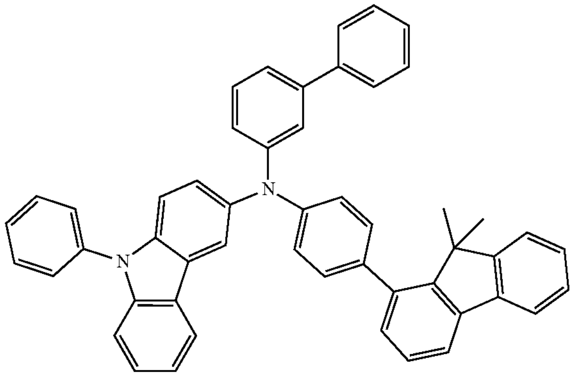
196
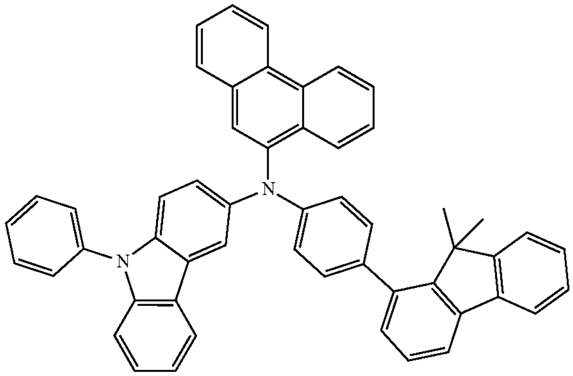
197
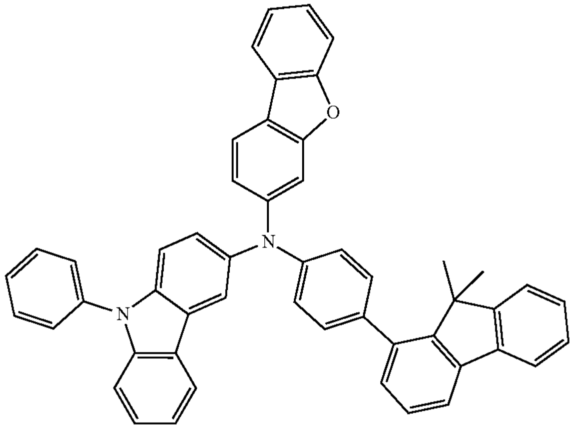
-continued
198
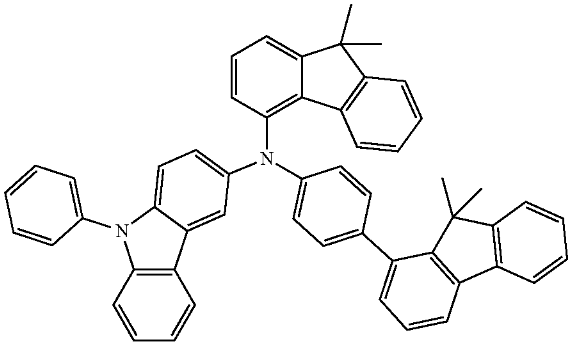
199
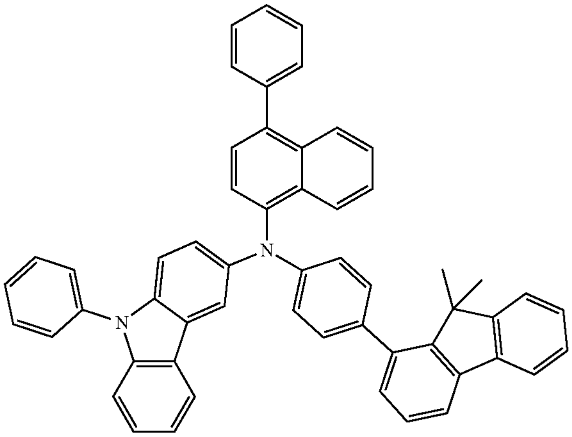
200
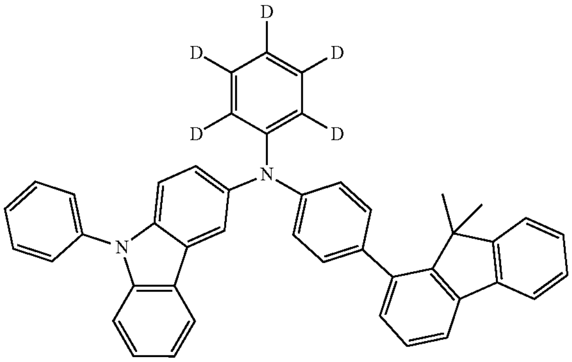
201
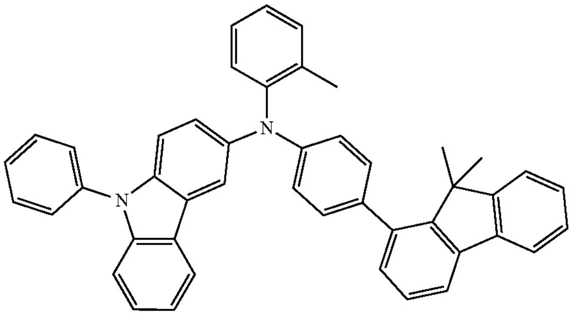

-continued
202
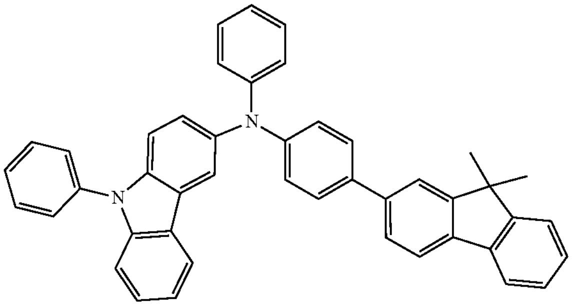
203
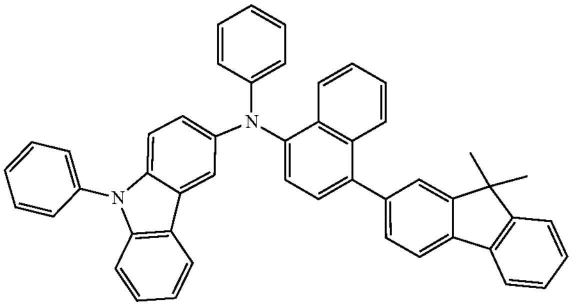
204
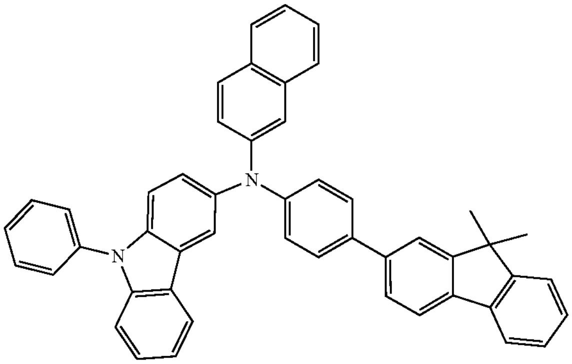
205
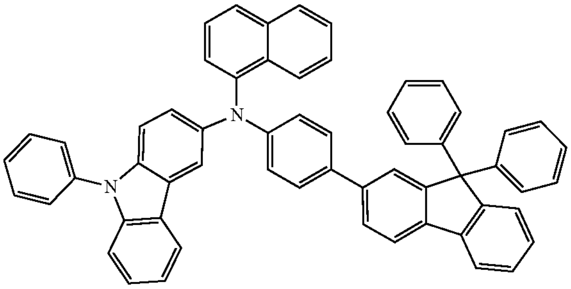
-continued
206
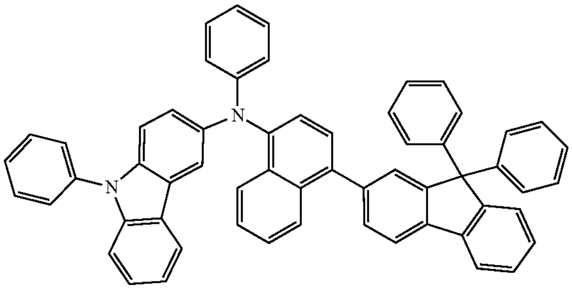
207
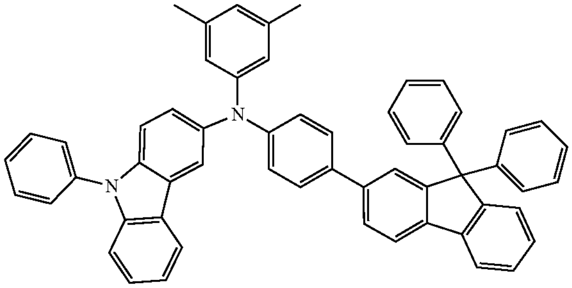
208
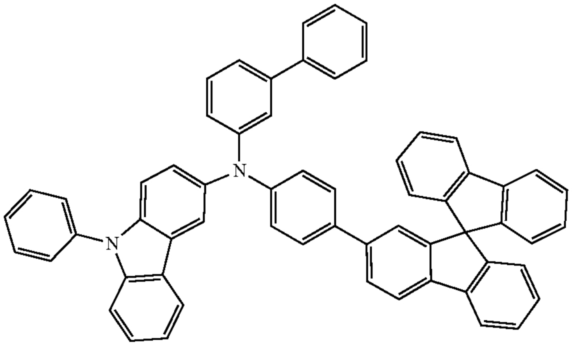
209
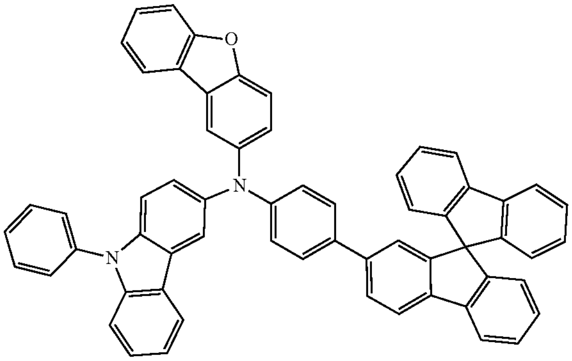

-continued
210
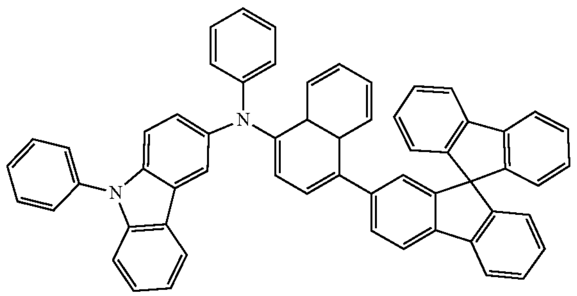
211
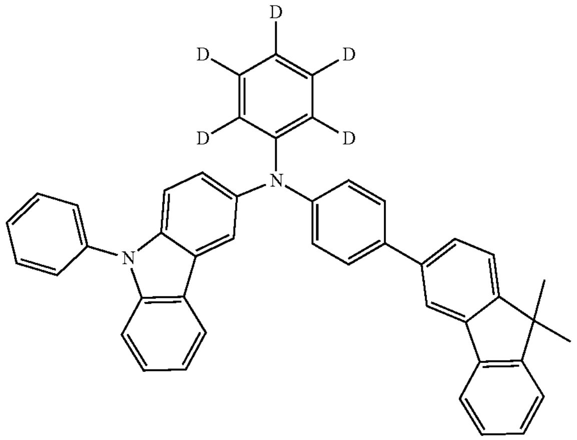
212
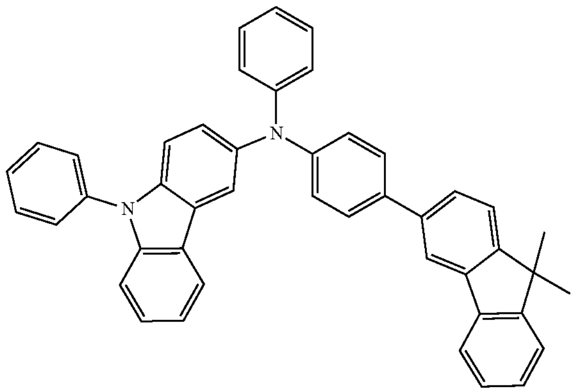
213
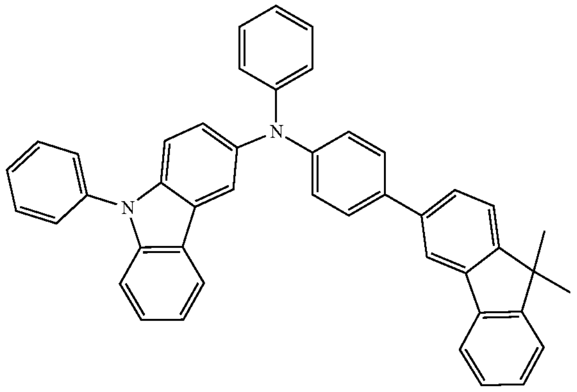
-continued
214
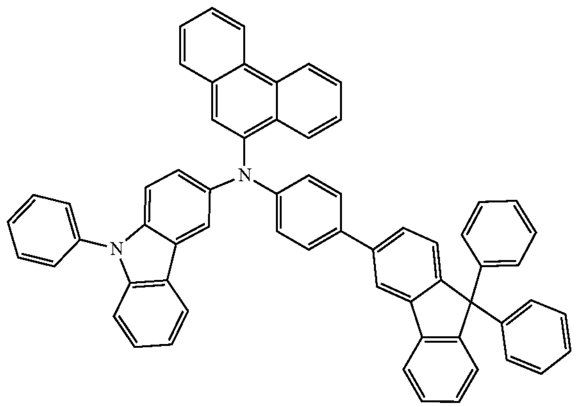
215
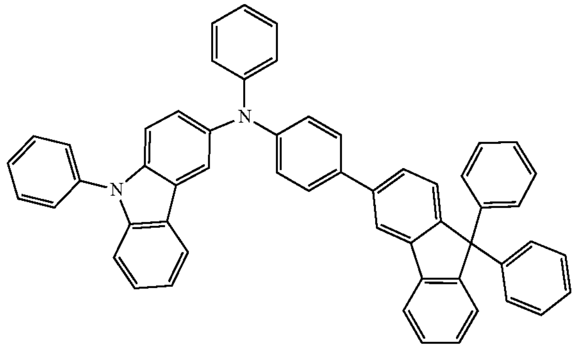
216
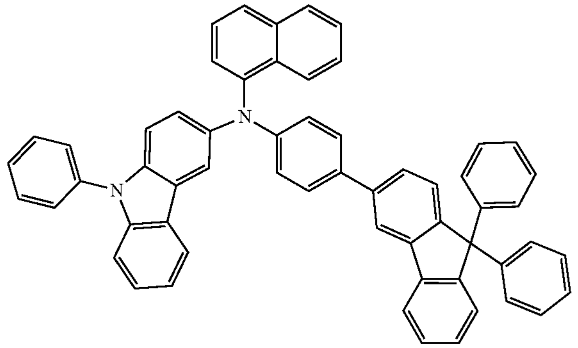
217
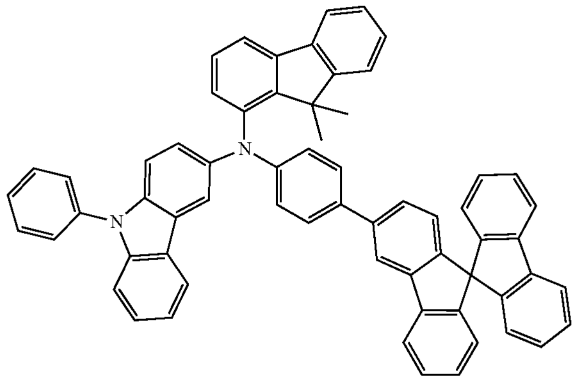

-continued
218
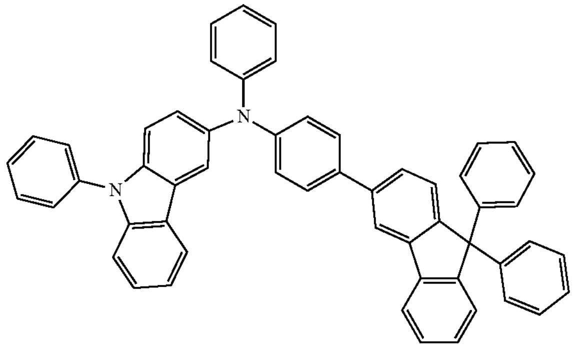
219
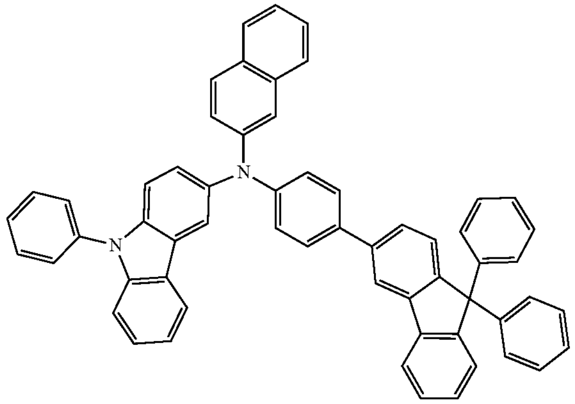
220
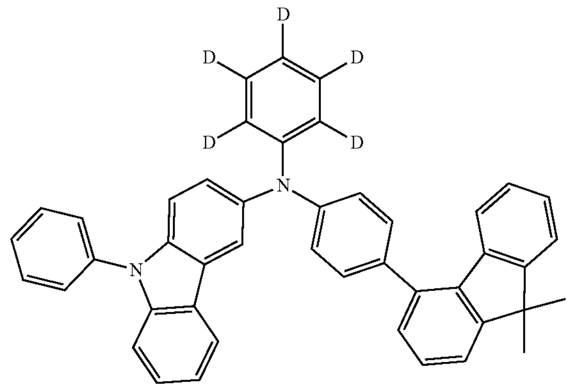
221
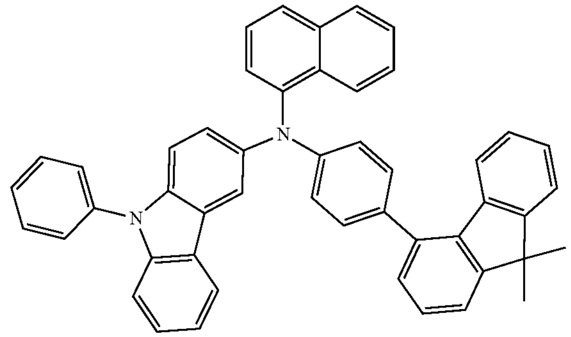
-continued
222
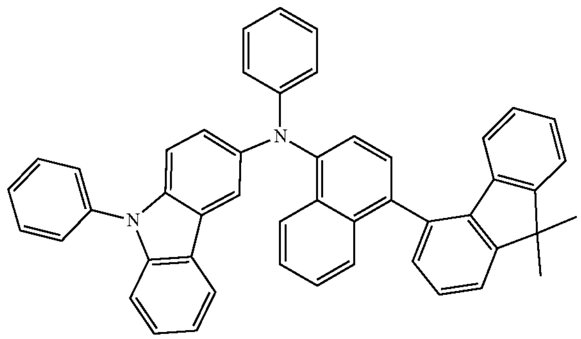
223
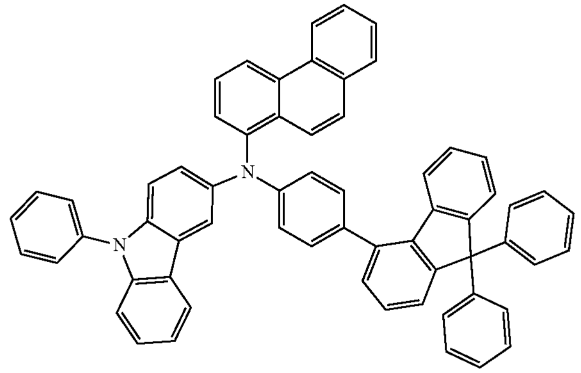
224
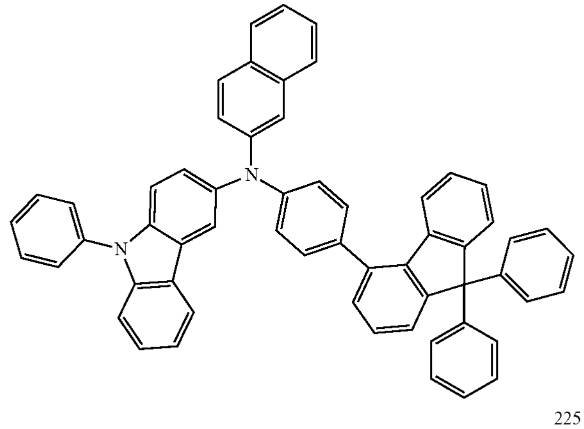
225
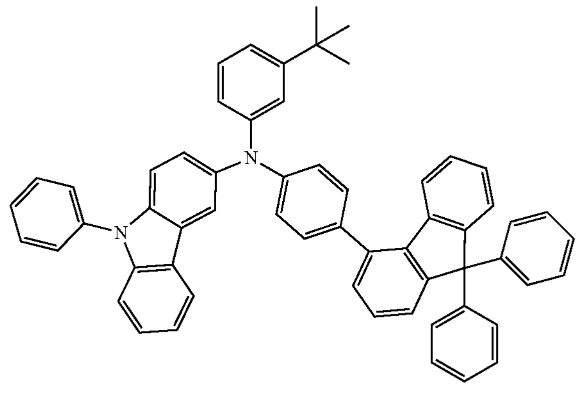

-continued
226
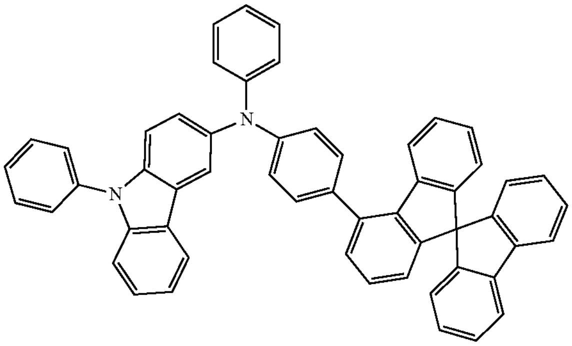
227
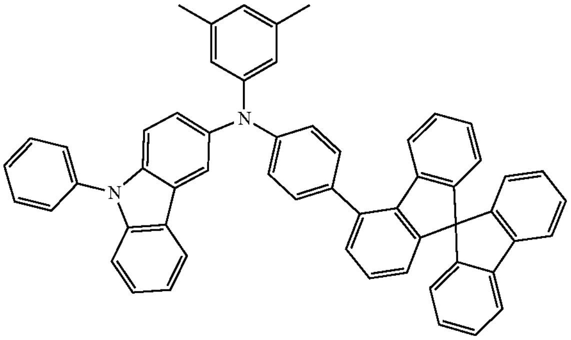
228
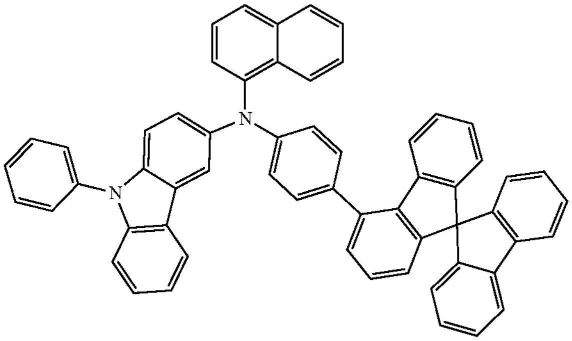
229
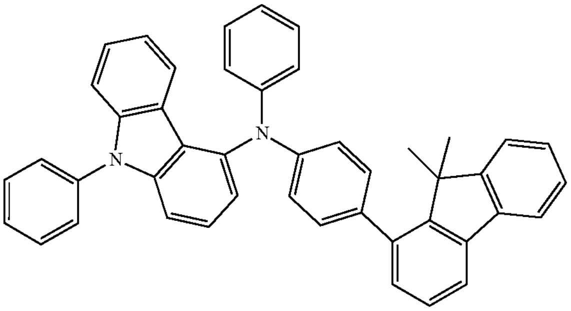
-continued
230
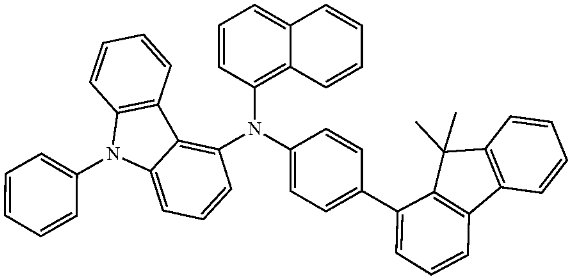
231
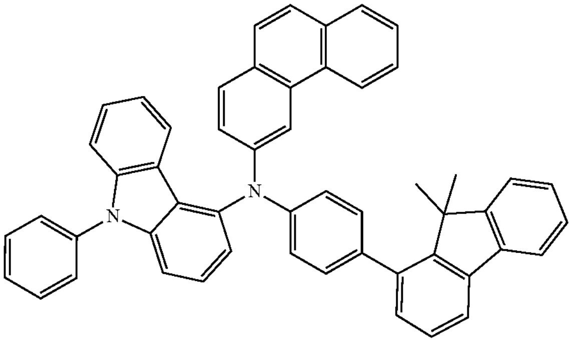
232
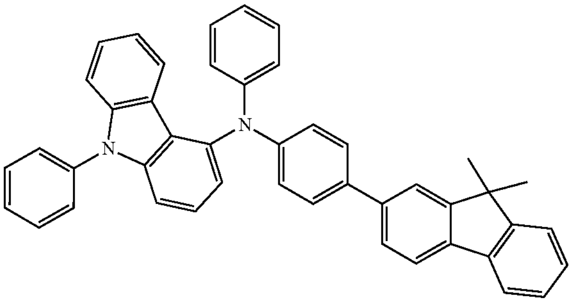
233
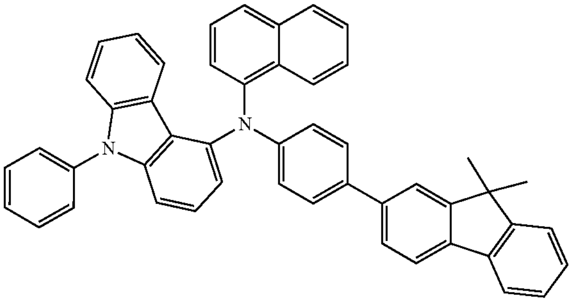

-continued
234
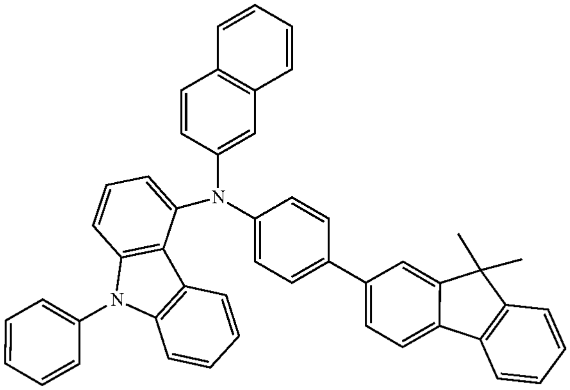
235
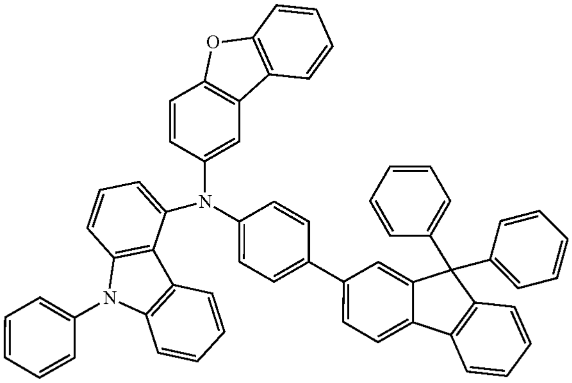
236
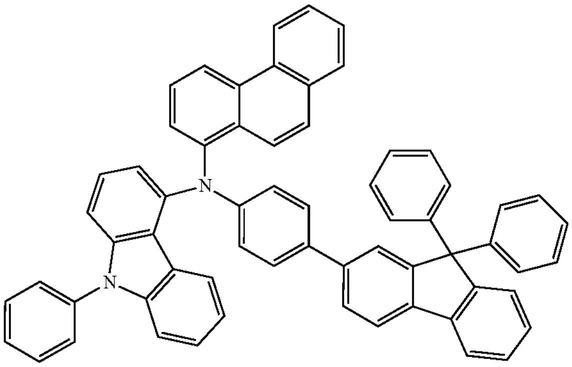
237
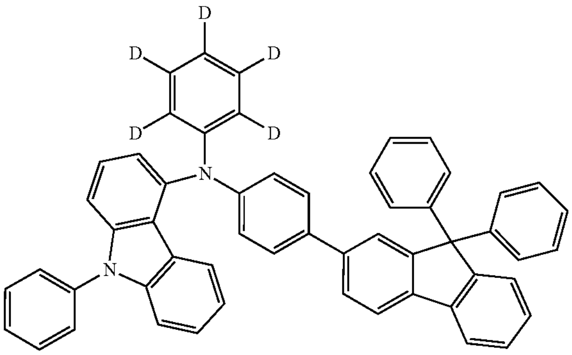
-continued
238
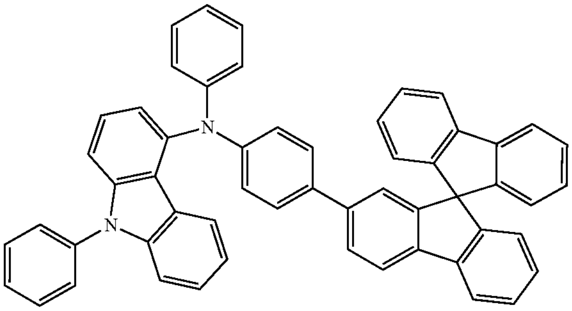
239
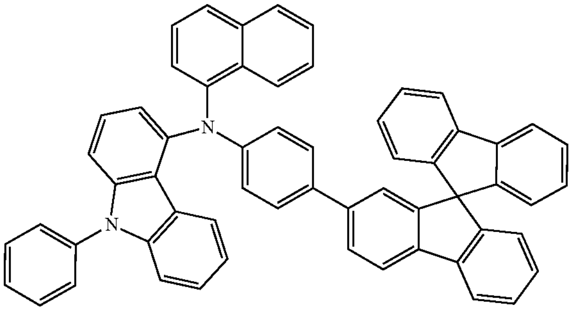
240
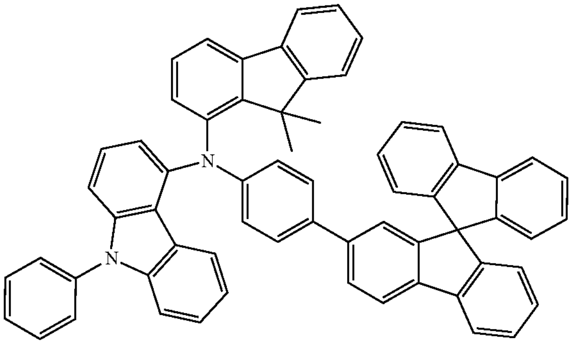
241
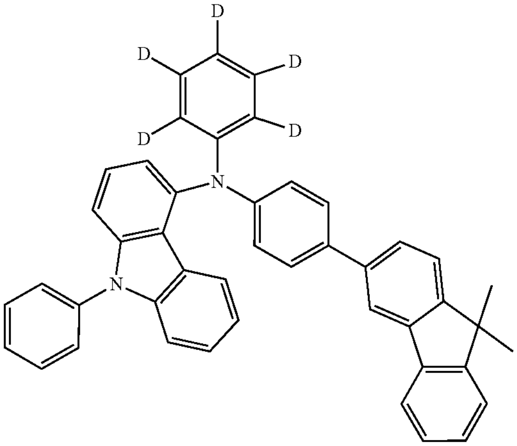

-continued
242
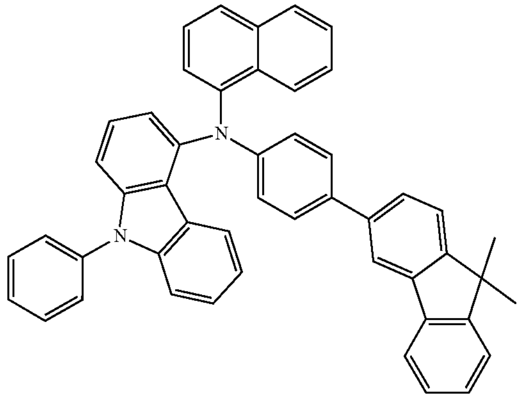
243
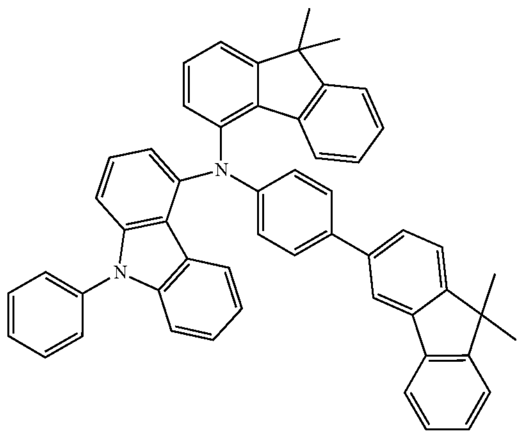
244
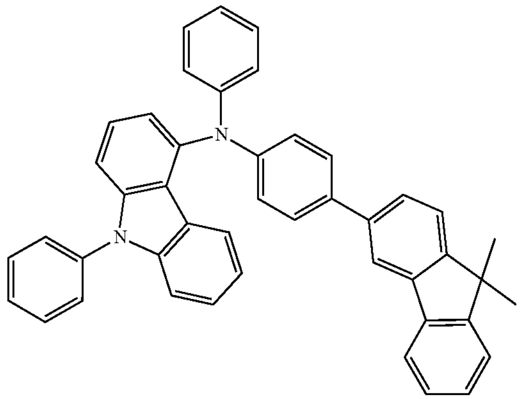
-continued
245
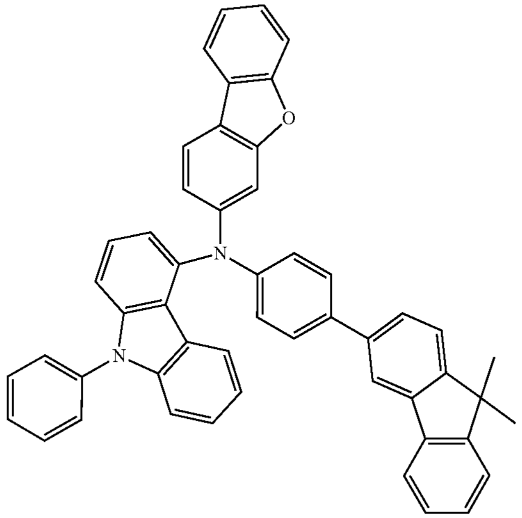
246
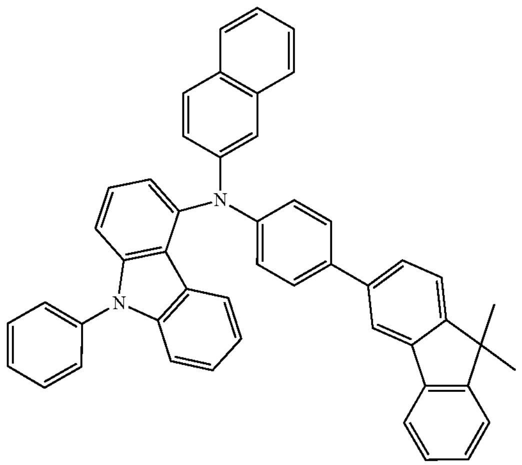
247
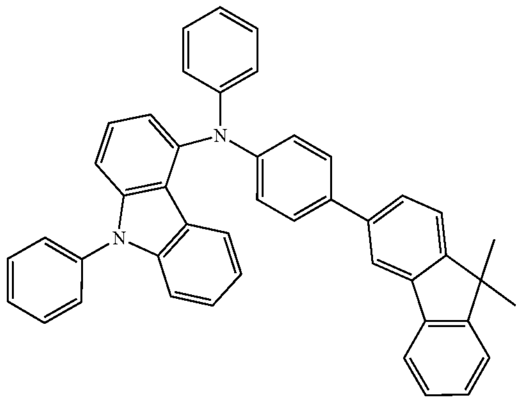

248
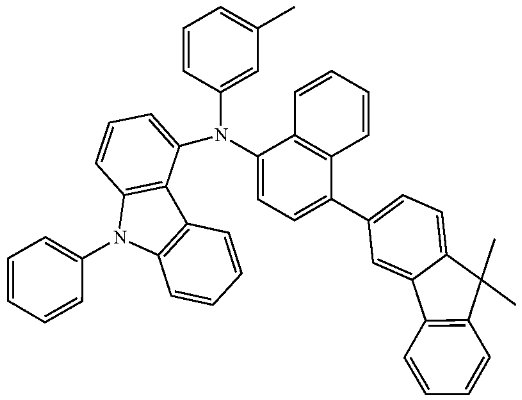
249
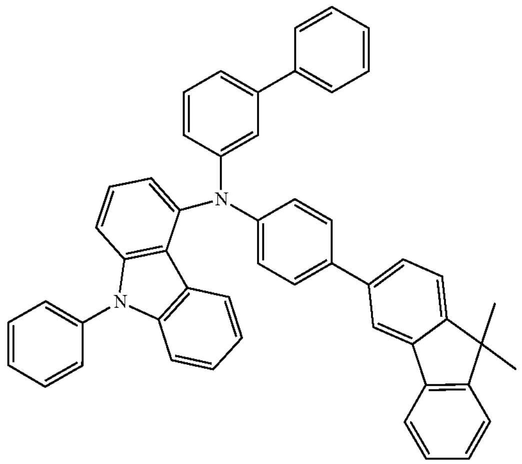
250
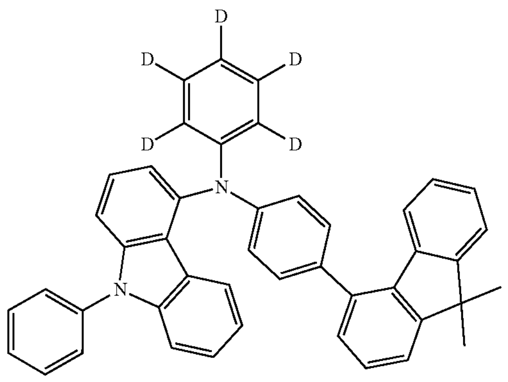
251
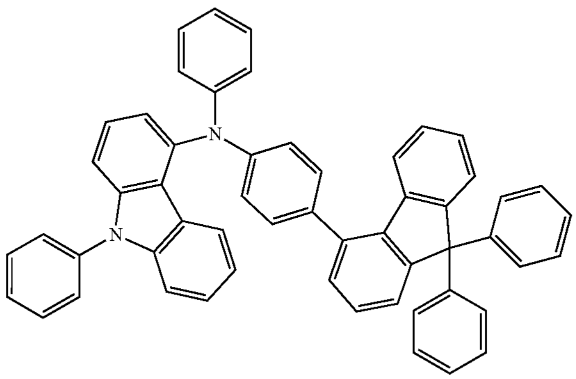
252
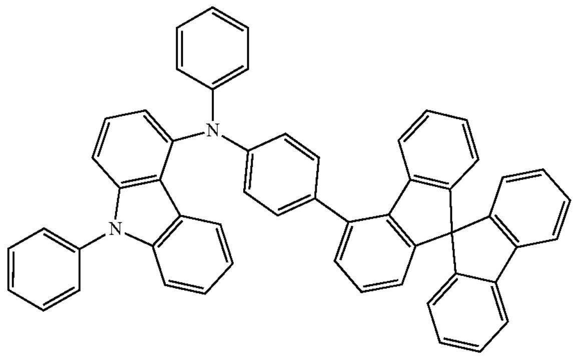
253
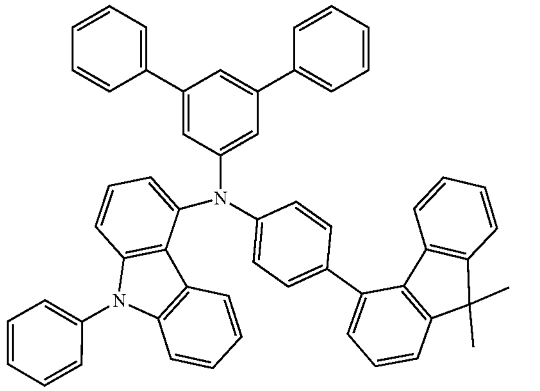
254
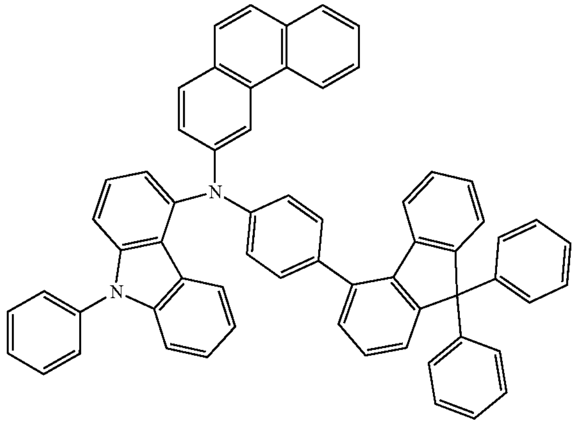

-continued

255

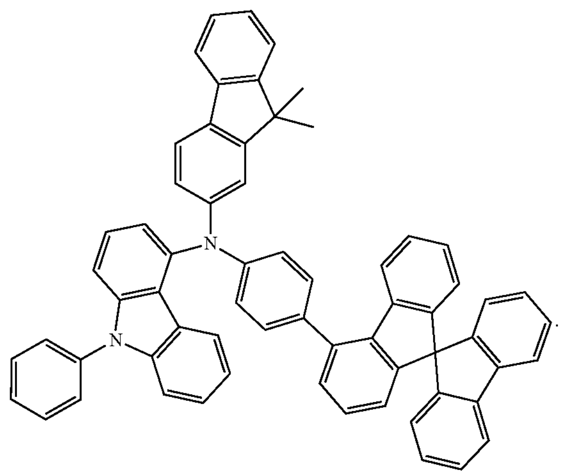

9. The organic light-emitting device according to claim 1, further comprising at least one of a functional layer capable of injecting and/or transporting holes, an electron transport layer, an electron injection layer, a functional layer capable of transporting and injecting electrons, an electron blocking layer, a hole blocking layer and a hole auxiliary layer, in addition to the light-emitting layer, the hole injection layer and the hole transport layer.

10. The organic light-emitting device according to claim 9, wherein at least one selected from the layers is formed by a deposition process or a solution process.

11. The organic light-emitting device according to claim 1, wherein the organic light-emitting device is used for a display or lighting system selected from flat panel displays, flexible displays, monochromatic or white flat panel lighting systems, monochromatic or white flexible lighting systems, vehicle displays, and displays for virtual or augmented reality.

12. An organic light-emitting device comprising:

a first electrode;

a second electrode facing the first electrode; and a hole injection layer or a hole transport layer and a light-emitting layer interposed between the first electrode and the second electrode, wherein (i) the hole injection layer or the hole transport layer comprises at least one compound represented by the following [Formula A], and (ii) the light-emitting layer comprises a compound represented by the following [Formula B] or [Formula C]:

[Formula A]

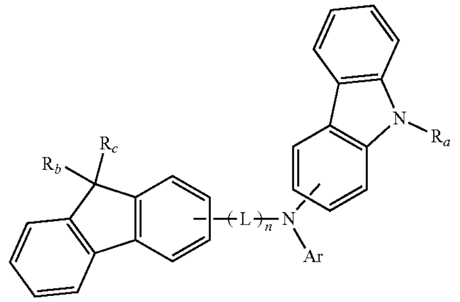

wherein

L is a single bond, a substituted or unsubstituted aromatic C6-C50 hydrocarbon ring, or a substituted or unsubstituted C2-C50 aromatic heterocyclic ring;

n is an integer of 1 to 3, with the proviso that when n is 2 or more, L's are identical to or different from each other;

Ar is selected from a substituted or unsubstituted C5-C50 aryl group and a substituted or unsubstituted C2-C50 heteroaryl group;

$R_a$ to $R_c$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group, with the proviso that $R_b$ and $R_c$ are bonded to each other to further form an alicyclic or aromatic monocyclic or polycyclic ring, wherein at least one of Ar, $R_a$, $R_b$, and $R_c$ comprises deuterium,

[Formula B]

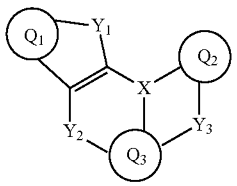

[Formula C]

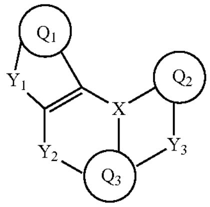

wherein $Q_1$ to $Q_3$ are identical to or different from each other, and are each independently a substituted or unsubstituted aromatic C6-C50 hydrocarbon ring, or a substituted or unsubstituted C2-C50 aromatic heterocyclic group;

$Y_1$ to $Y_3$ are identical to or different from each other, and are each independently selected from N—$R_1$, $CR_2R_3$, O, S, Se, and $SiR_4R_5$;

X is selected from B, P and P═O; and $R_1$ to $R_5$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group, with the proviso that each of $R_1$ to $R_5$ is bonded to the ring $Q_1$ to $Q_3$ to further form an alicyclic or aromatic monocyclic or polycyclic ring, and $R_2$ and $R_3$, and $R_4$ and $R_5$ are bonded to each other to further form an alicyclic or aromatic monocyclic or polycyclic ring.

13. The organic light-emitting device according to claim 12, wherein [Formula B] or [Formula C] is represented by the following [Formula B-1] or [Formula C-1]:

[Formula B-1]

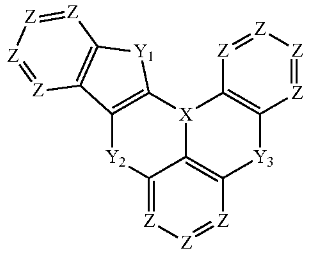

[Formula C-1]

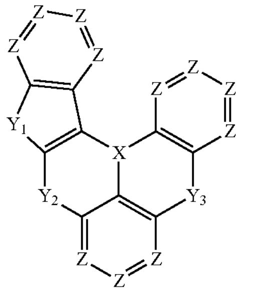

wherein

Z is CR or N, with the proviso that Z's and are identical to or different from each other and R's are identical to or different from each other, wherein R's are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, a halogen group and —$N(R_6)(R_7)$, and R's are bonded to each other or each thereof is bonded to an adjacent substituent to form at least one alicyclic or aromatic monocyclic or polycyclic ring, and the carbon atom of the formed alicyclic, aromatic monocyclic or polycyclic ring is substituted with at least one heteroatom selected from (N), a sulfur atom (S), and an oxygen atom (O), $R_6$ and $R_7$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, and a substituted or unsubstituted C2-C50 heteroaryl group, with the proviso that $R_6$ and $R_7$ are bonded to each other to form an alicyclic or aromatic monocyclic or polycyclic ring, and X and $Y_1$ to $Y_3$ are as defined in [Formula B] and [Formula C] above.

14. The organic light-emitting device according to claim 12, wherein [Formula B] or [Formula C] is represented by any one of the following [Formula B-2], [Formula C-2] and [Formula D-2]:

[Formula B-2]

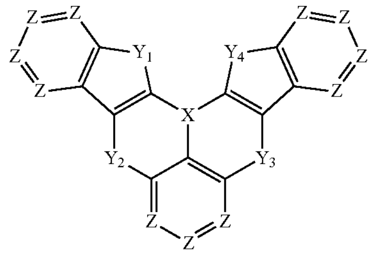

[Formula C-2]

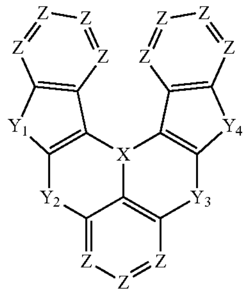

[Formula D-2]

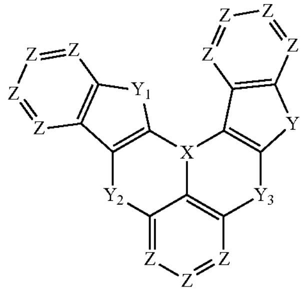

wherein

Z is CR or N, with the proviso that Z's are identical to or different from each other and R's are identical to or different from each other, wherein R's are identical to or different from each other and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, a halogen group and —$N(R_6)(R_7)$, and R's are bonded to each other or each thereof is bonded to an adjacent substituent to form at least one alicyclic or aromatic monocyclic or polycyclic ring, and the carbon atom of the formed alicyclic, aromatic monocyclic or polycyclic ring is substituted with at least one heteroatom selected from (N), a sulfur atom (S), and an oxygen atom (O), $R_6$ and $R_7$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, and a substituted or unsubstituted C2-C50 heteroaryl group, with the proviso that $R_6$ and $R_7$ are bonded to each other to form an alicyclic or aromatic monocyclic or polycyclic ring, and X and $Y_1$ to $Y_3$ are as defined in [Formula B] and [Formula C] above.

15. The organic light-emitting device according to claim 13, wherein at least one of R's is —$N(R_6)(R_7)$.

16. The organic light-emitting device according to claim 14, wherein at least one of R's is —$N(R_6)(R_7)$.

17. The organic light-emitting device according to claim 12, wherein L in [Formula A] is a single bond, or a substituted or unsubstituted aromatic C6-C50 hydrocarbon ring.

18. The organic light-emitting device according to claim 17, wherein L in [Formula A] is a substituted or unsubstituted phenyl group, a substituted or unsubstituted biphenyl group, a substituted or unsubstituted naphthyl group, a substituted or unsubstituted phenanthryl group, or a substituted or unsubstituted fluorenyl group.

19. The organic light-emitting device according to claim 12, wherein the compound represented by [Formula B] or [Formula C] is selected from the compounds represented by the following formulas:

1

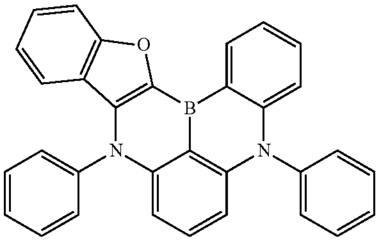

2

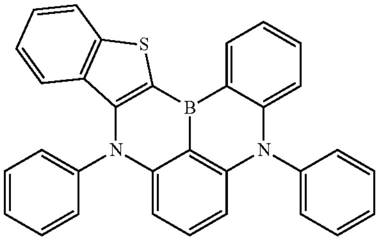

-continued

3

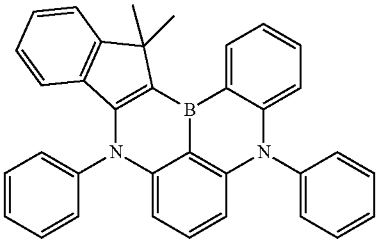

4

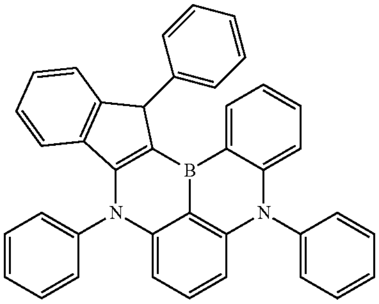

5

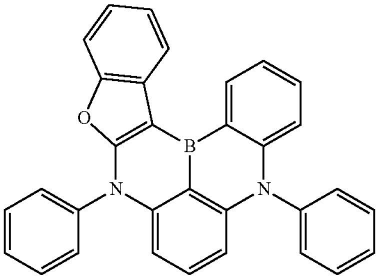

6

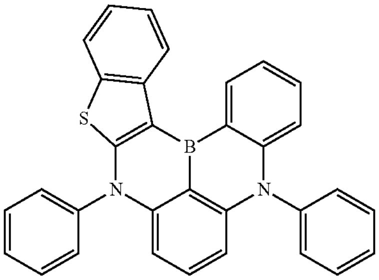

7

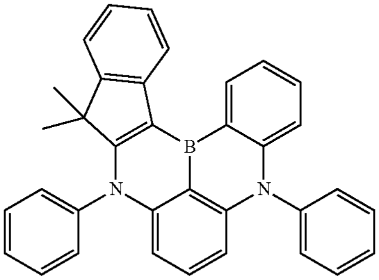

-continued
8
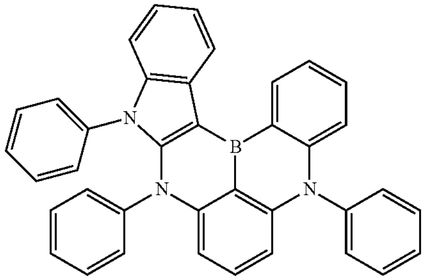
9
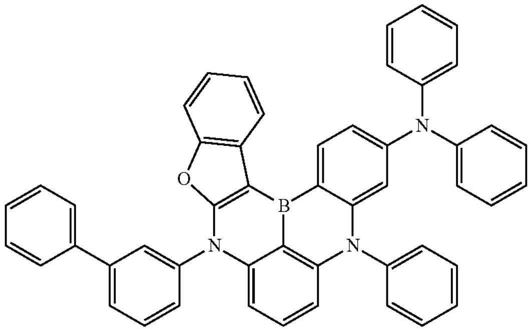
10
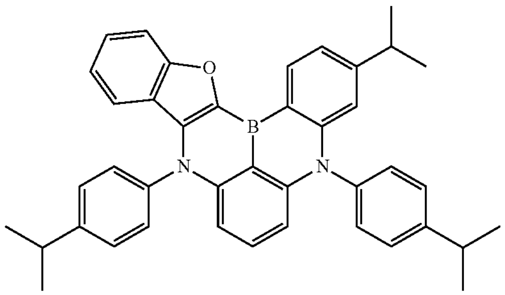
11
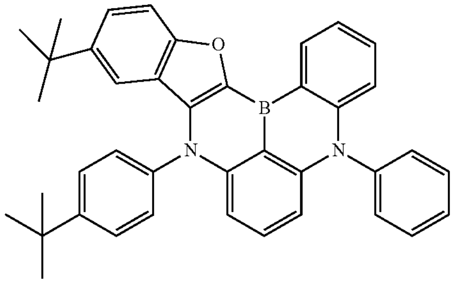
12
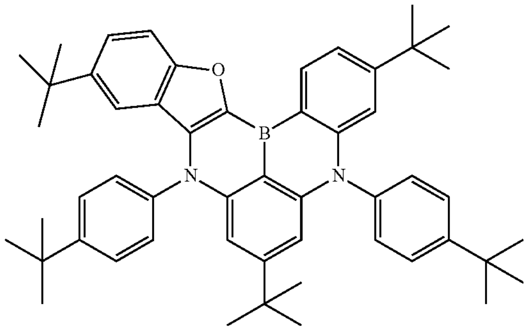
-continued
13
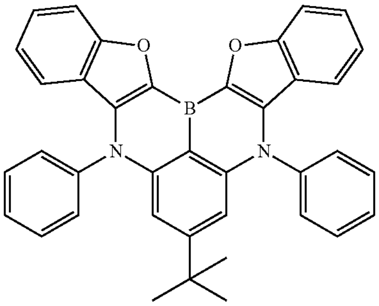
14
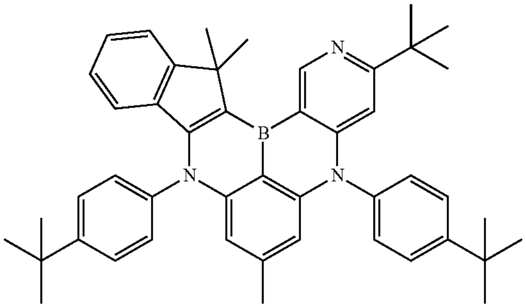
15
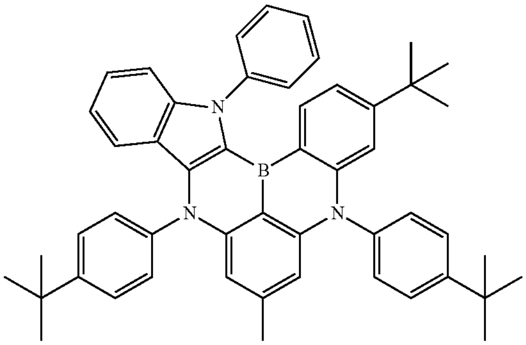
16
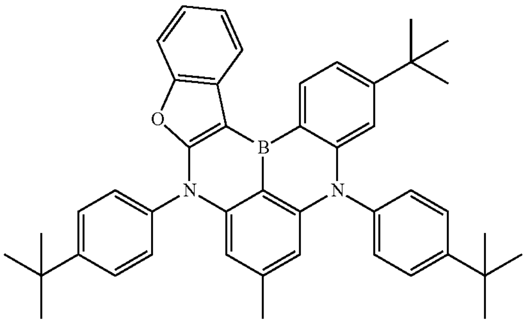
17
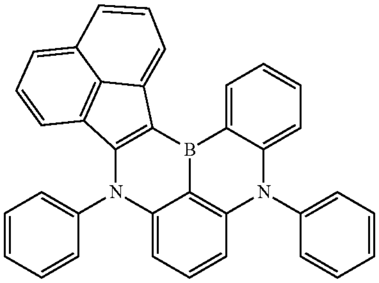

-continued
18
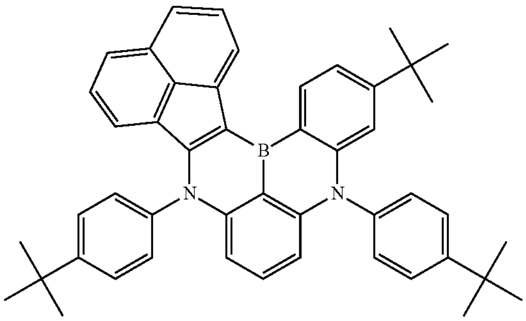
19
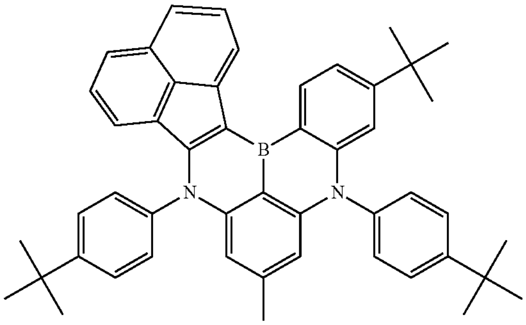
20
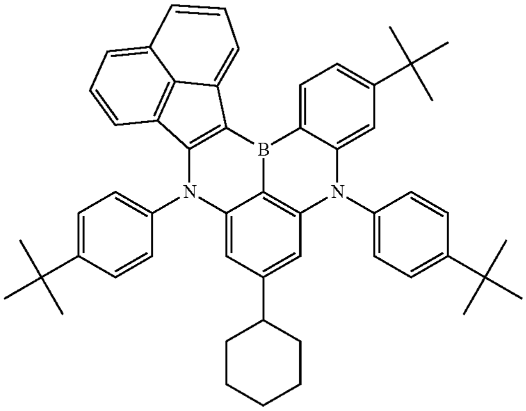
21
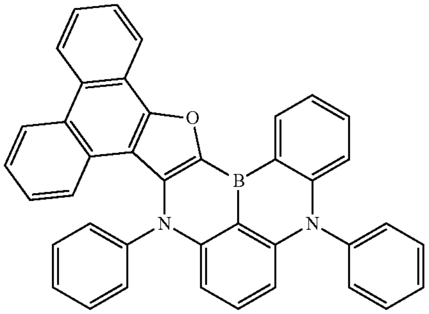
-continued
22
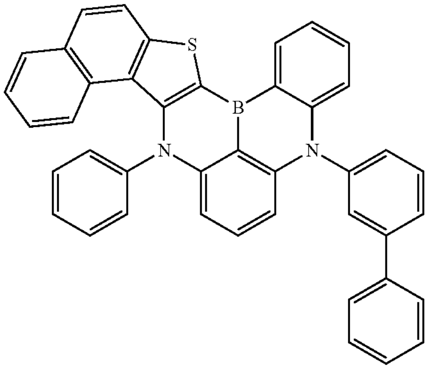
23
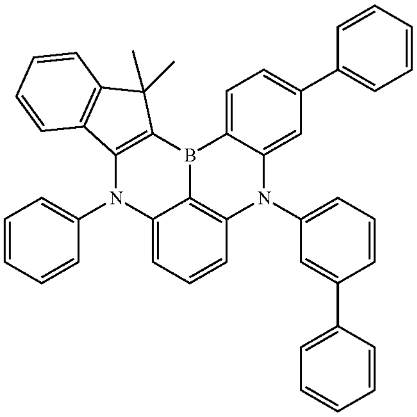
24
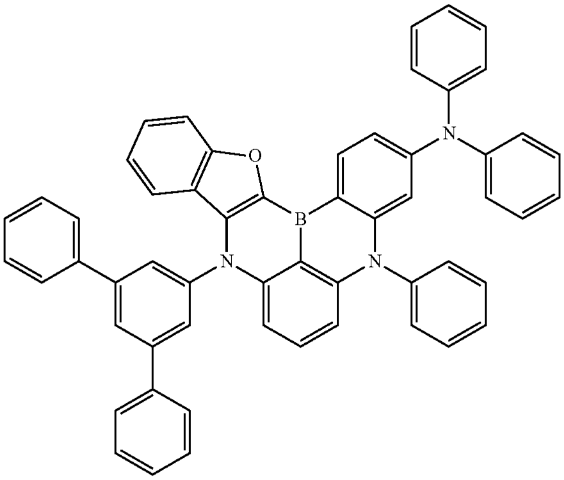

-continued
25
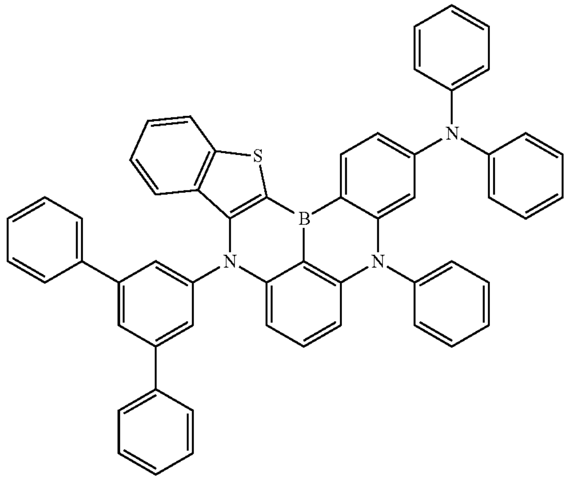
26
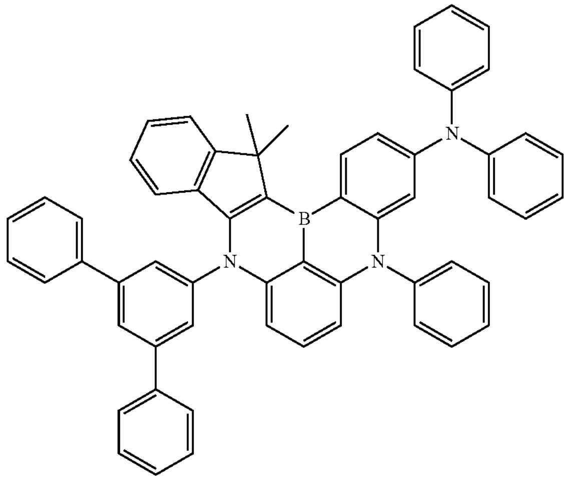
27
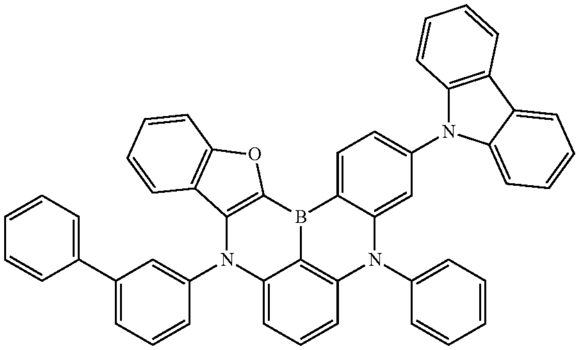
-continued
28
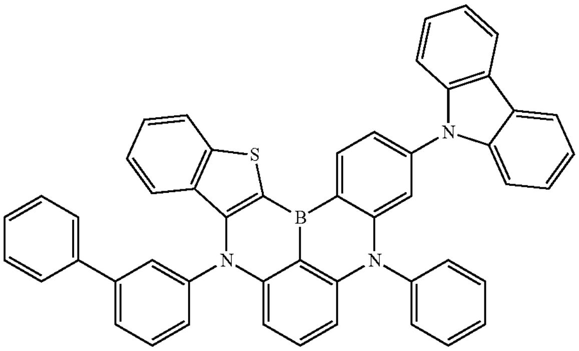
29
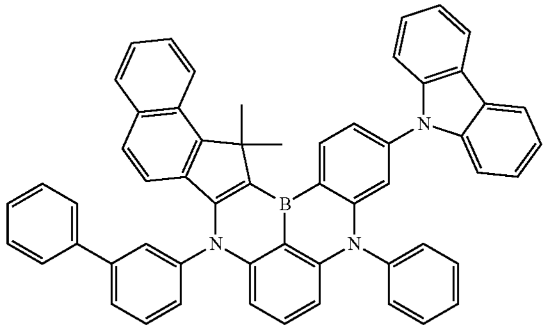
30
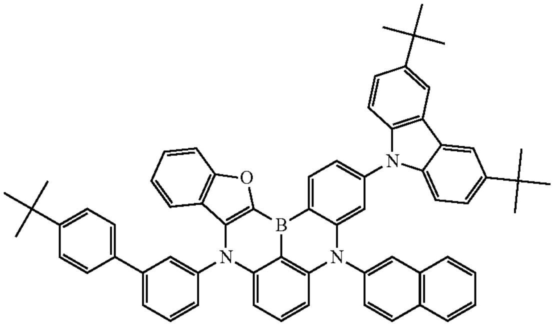
31
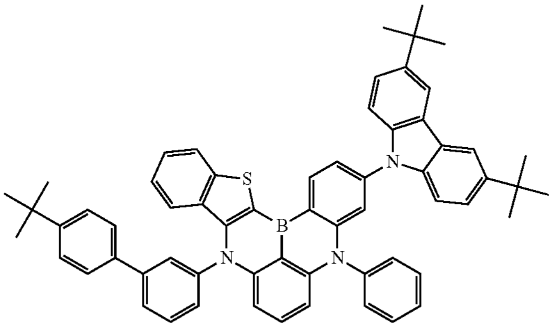

-continued
32
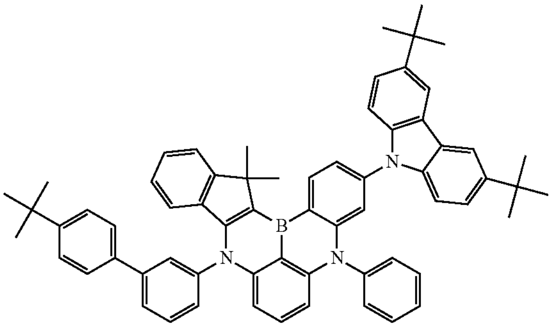
33
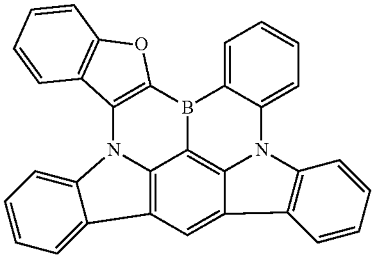
34
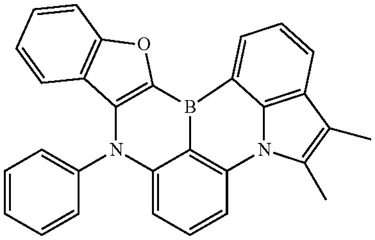
35
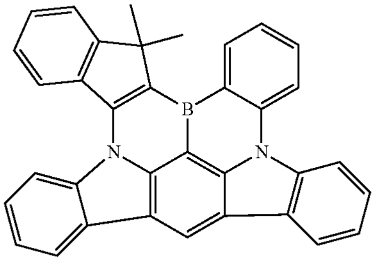
36
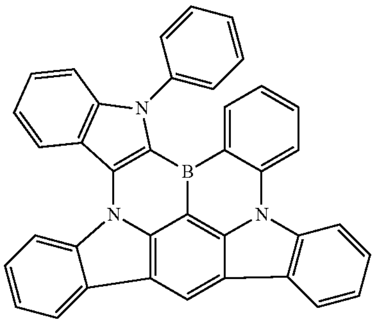
-continued
37
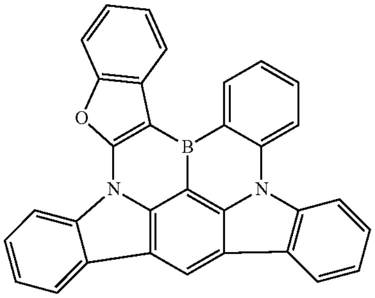
38
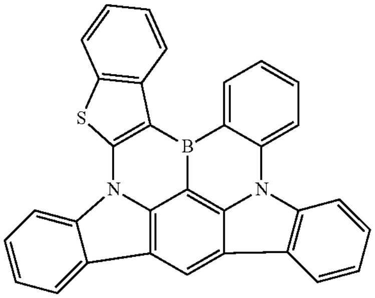
39
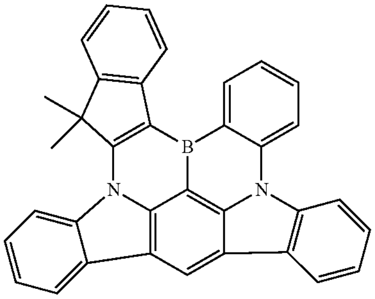
40
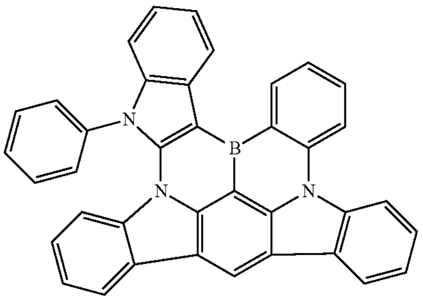
41
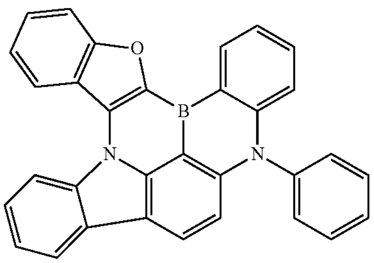

-continued
42
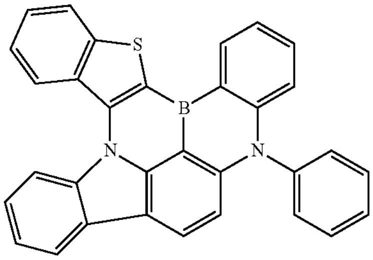
43
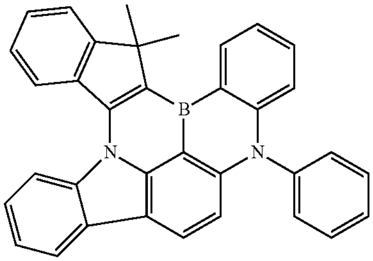
44
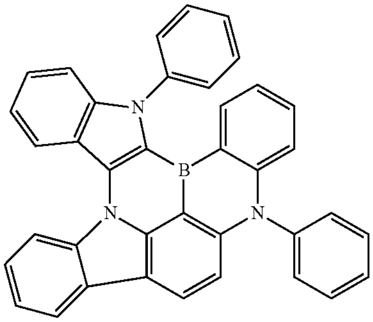
45
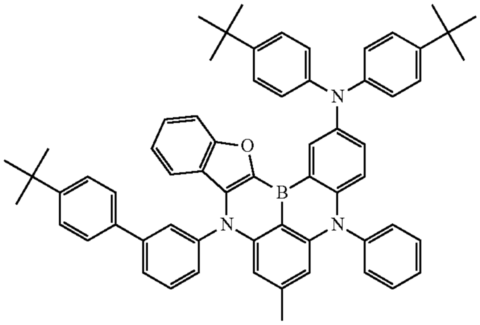
46
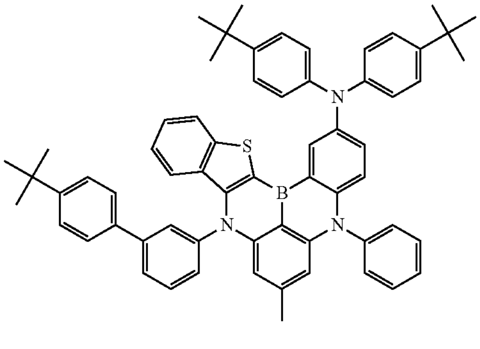
-continued
47
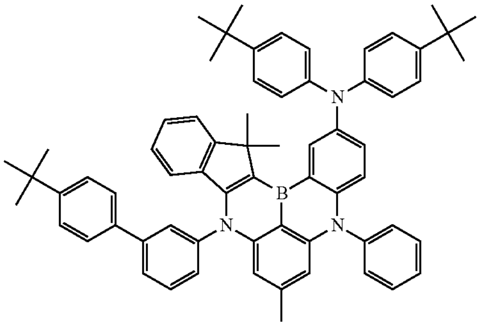
48
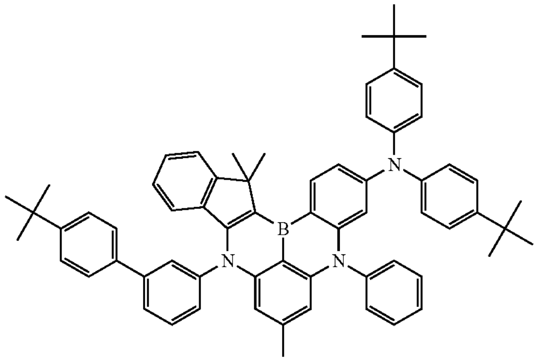
49
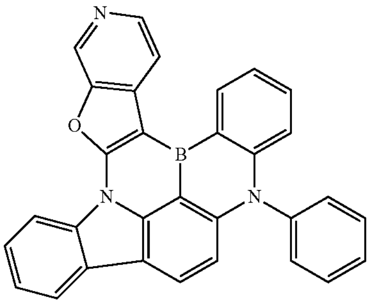
50
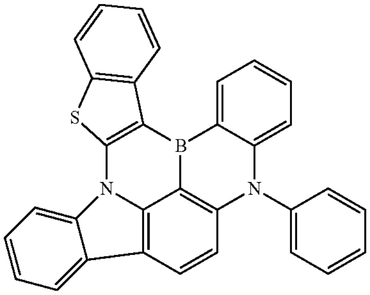
51
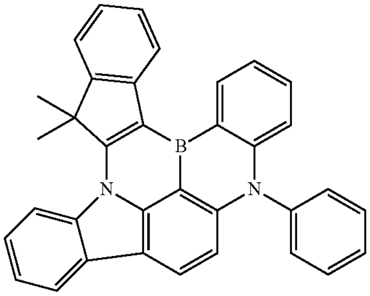

-continued
52
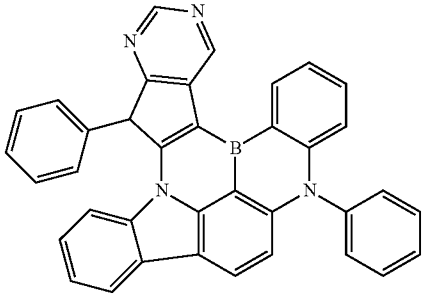
53
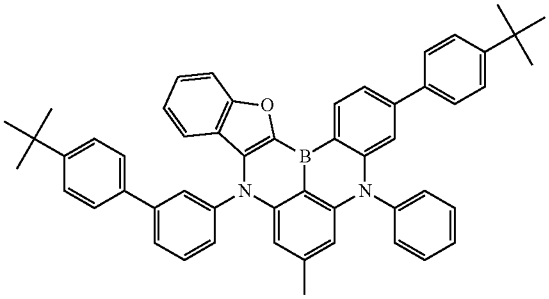
54
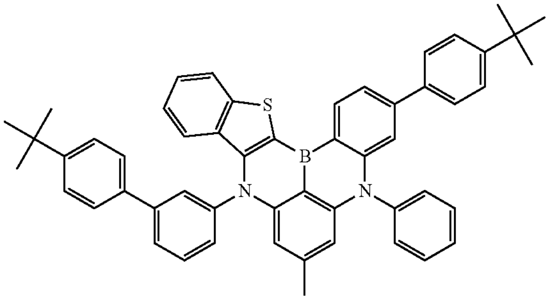
55
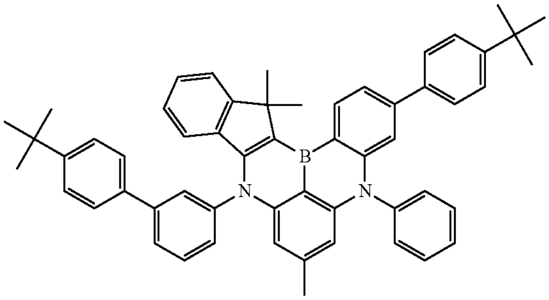
56
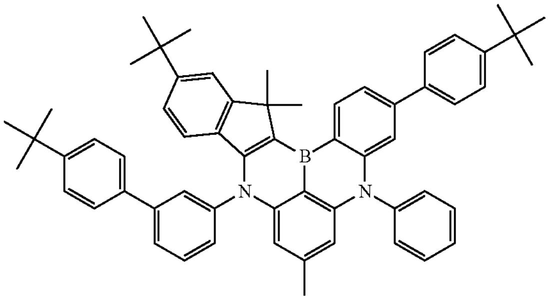
-continued
57
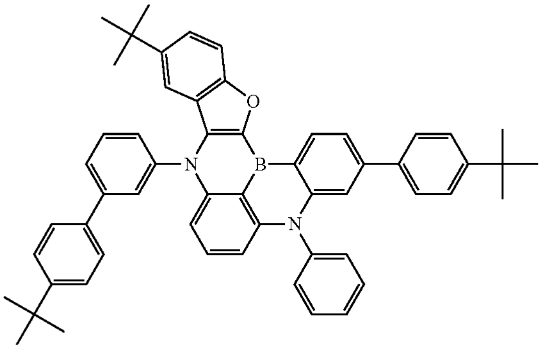
58
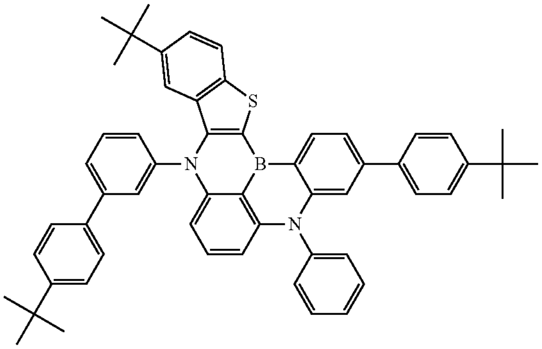
59
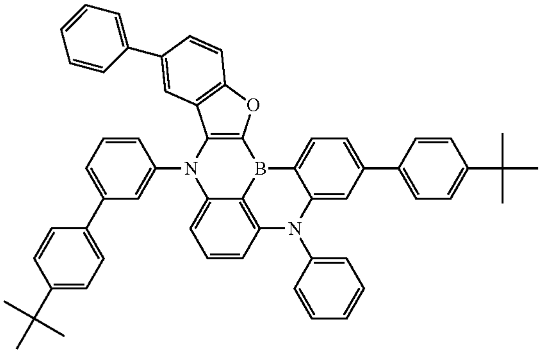
60
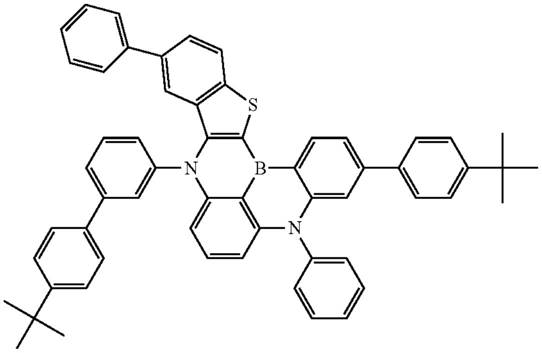

-continued
61
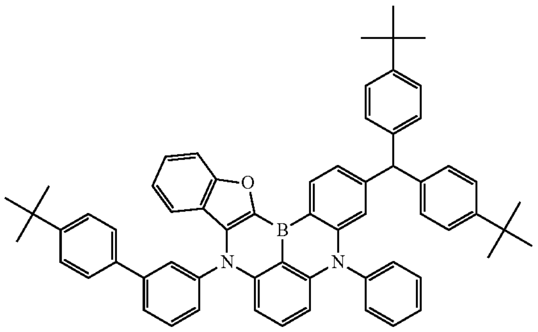
62
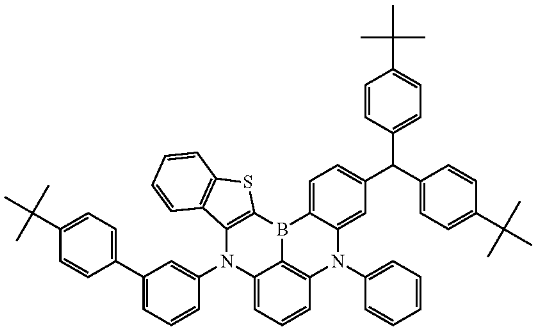
63
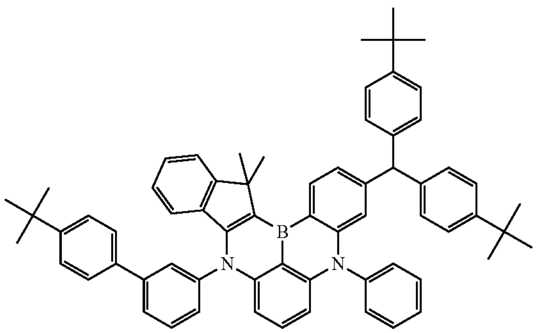
64
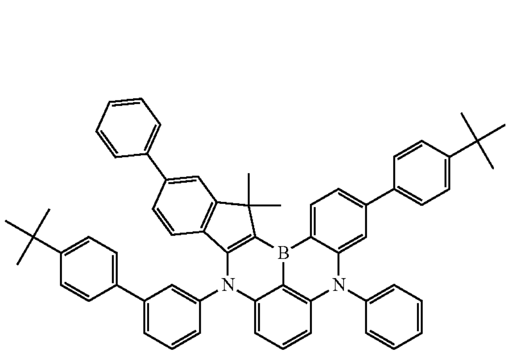
-continued
65
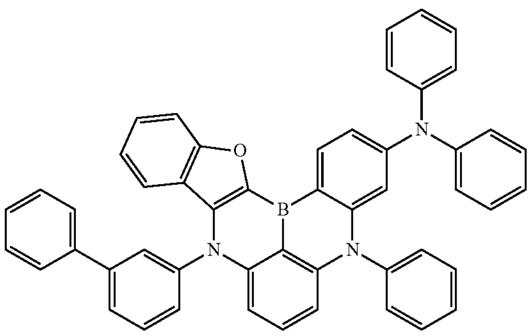
66
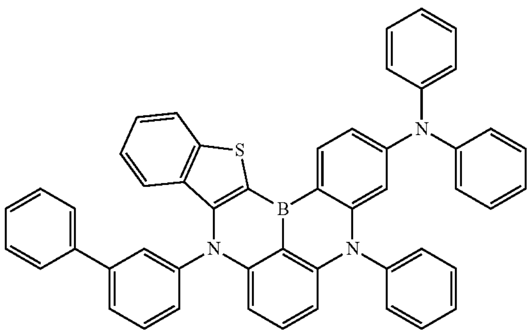
67
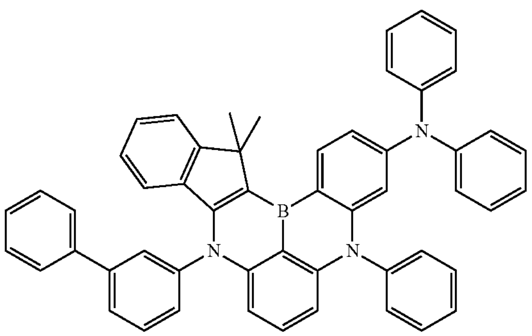
68
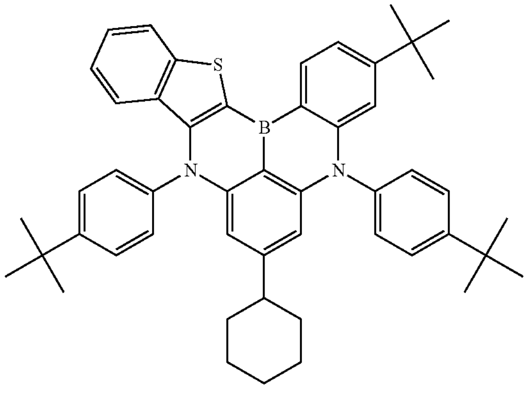

-continued
69
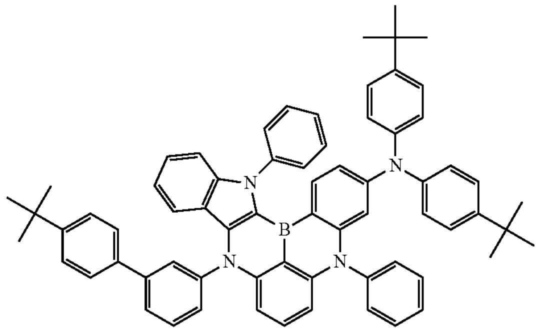
70
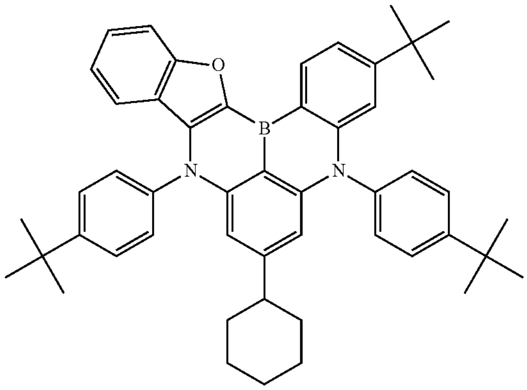
71
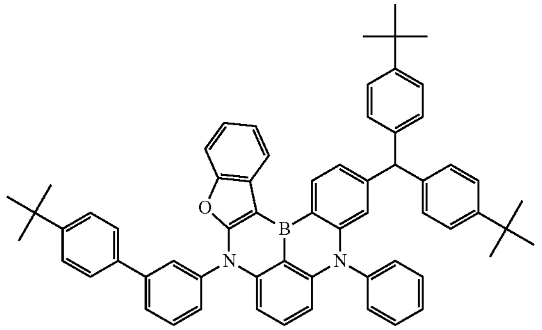
72
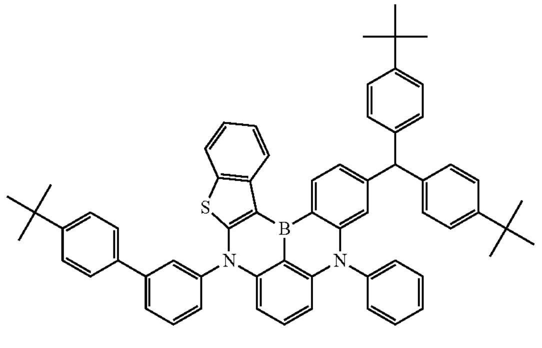
-continued
73
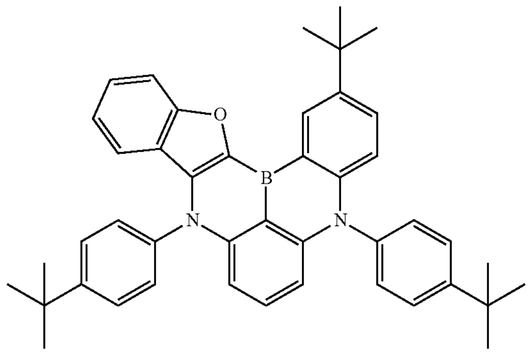
74
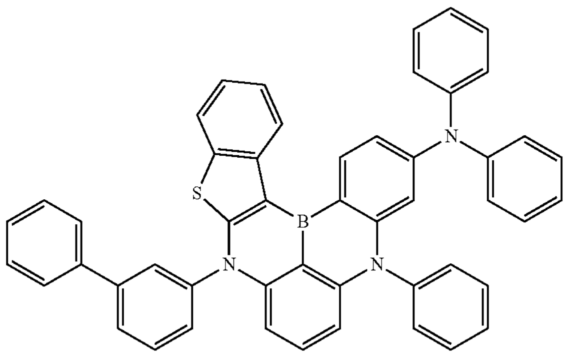
75
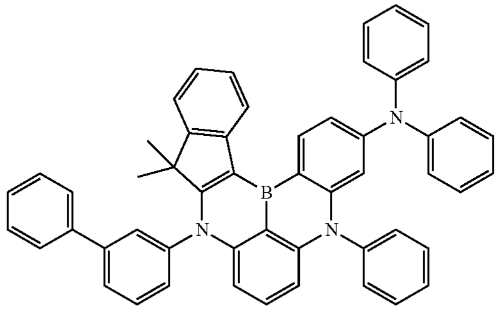
76
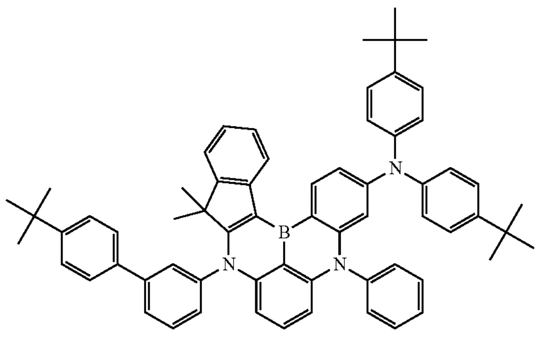

-continued
77
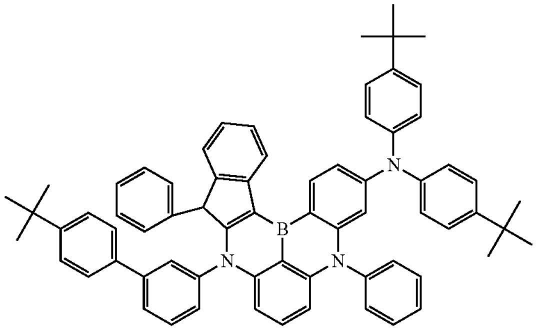
78
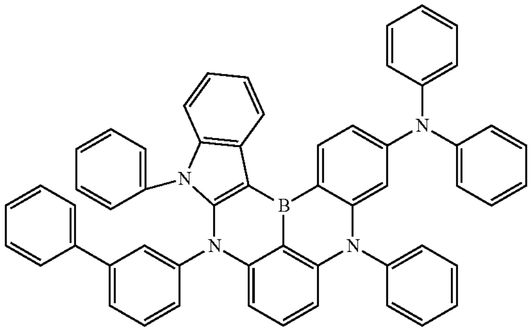
79
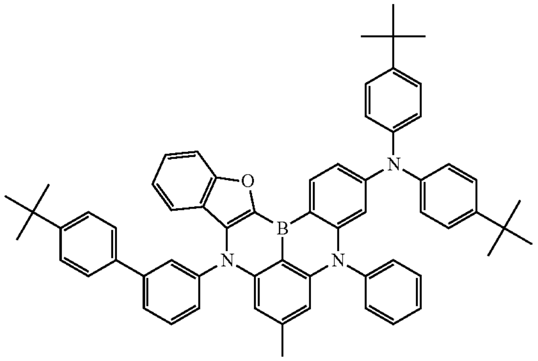
80
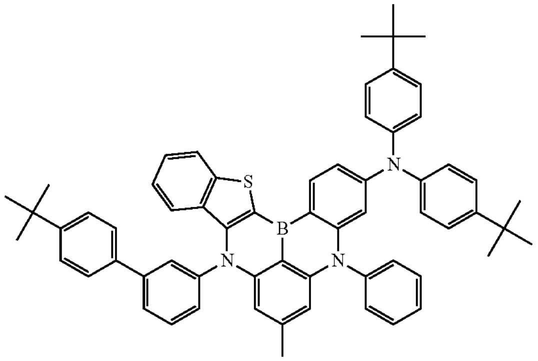
-continued
81
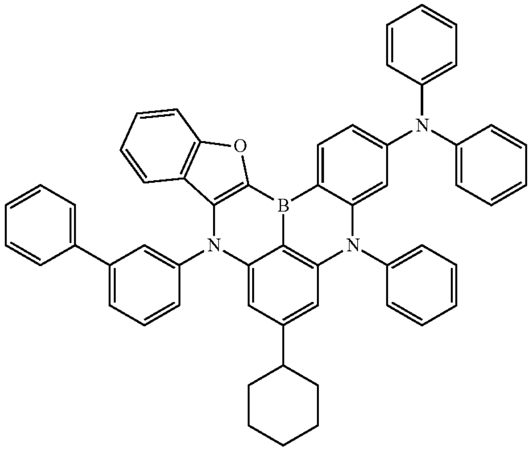
82
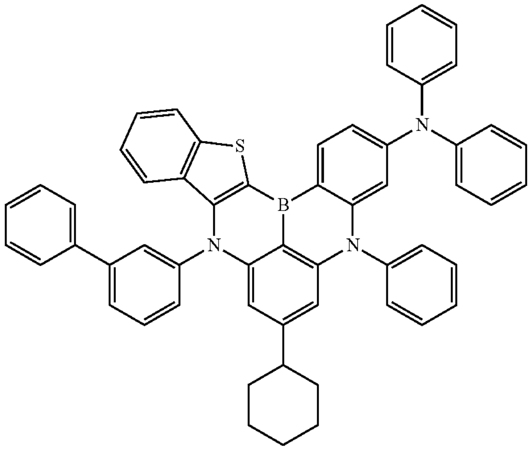
83
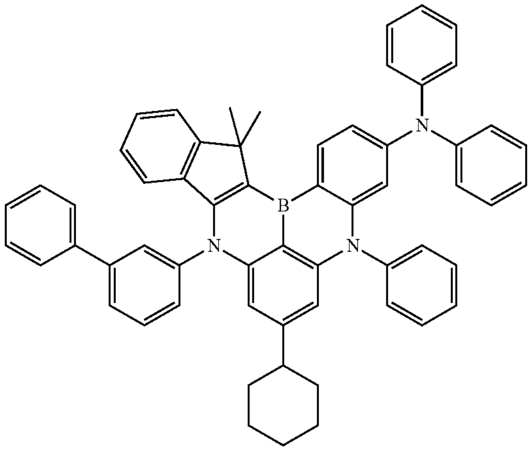

-continued
84
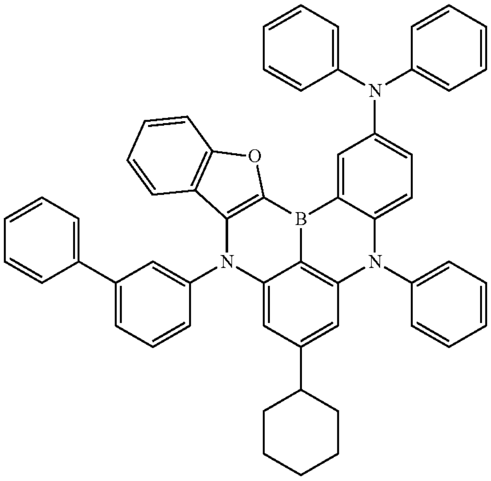
85
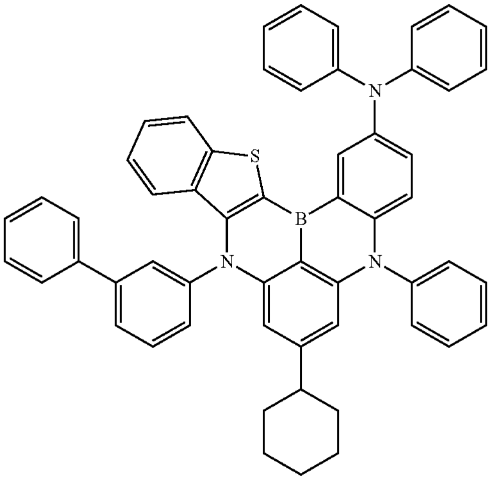
86
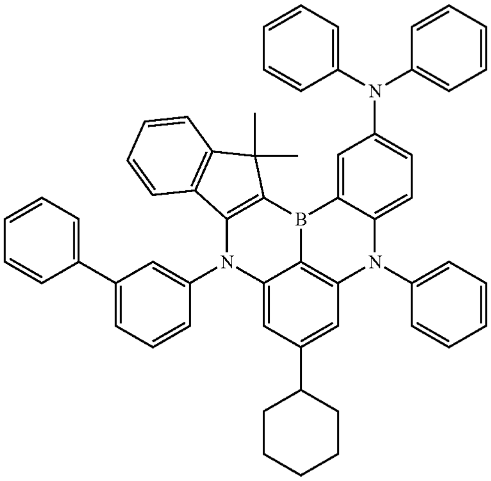
-continued
87
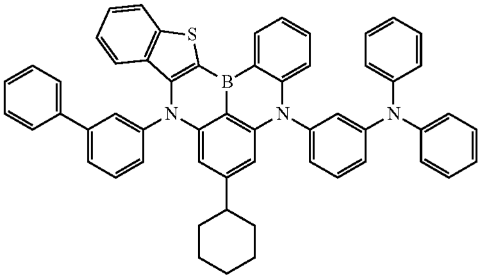
88
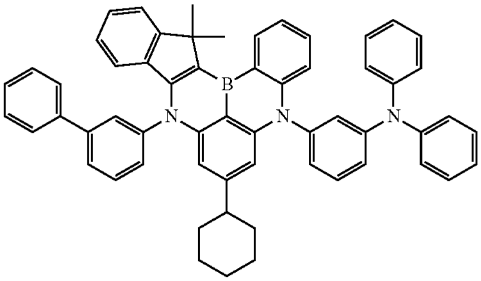
89
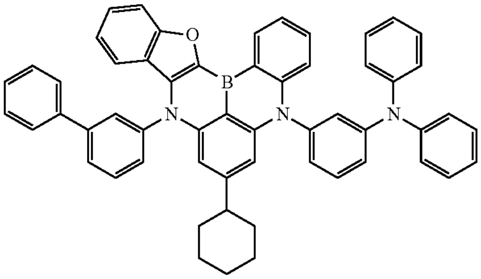
90
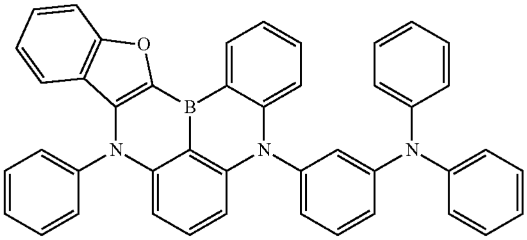
91
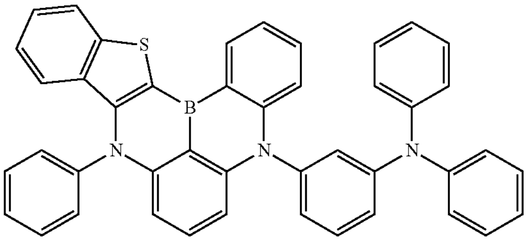

-continued
92
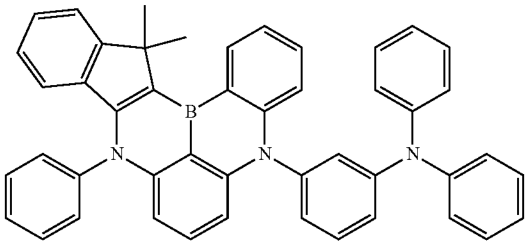
93
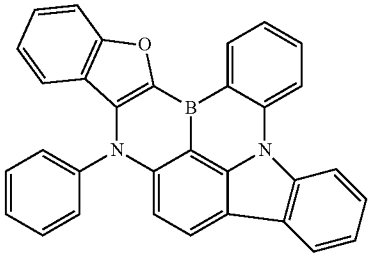
94
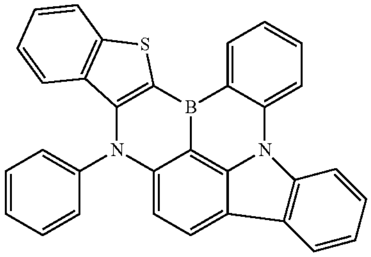
95
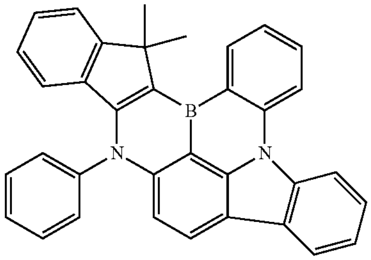
96
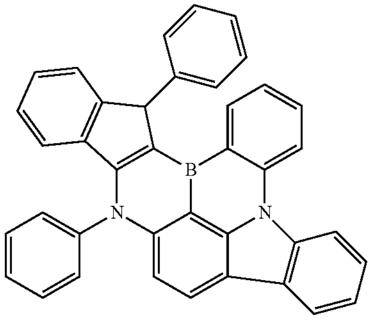
-continued
97
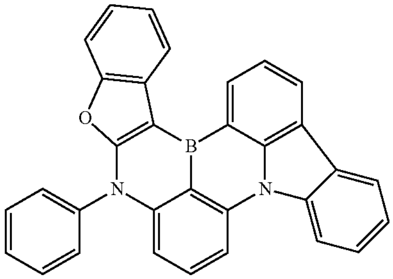
98
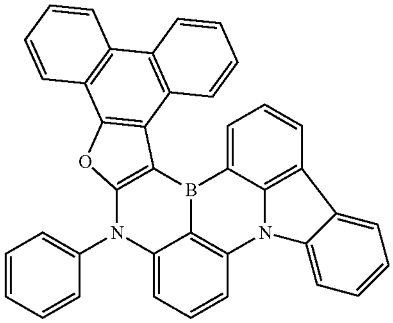
99
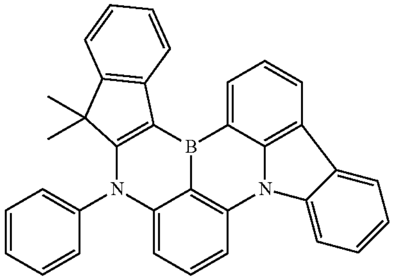
100
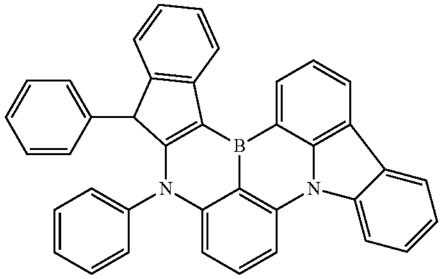
101
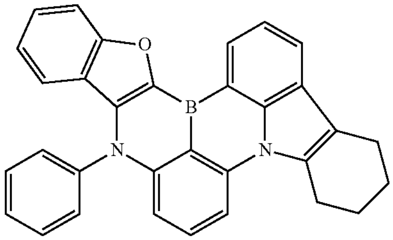

-continued
102
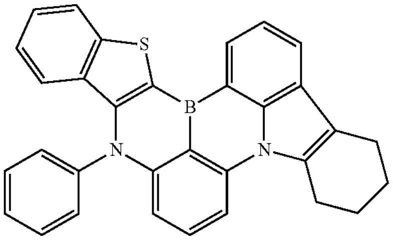
103
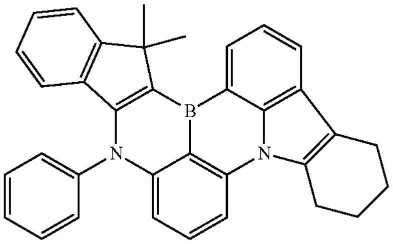
104
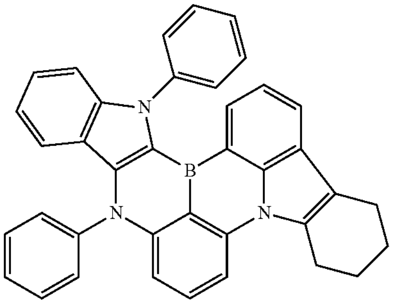
105
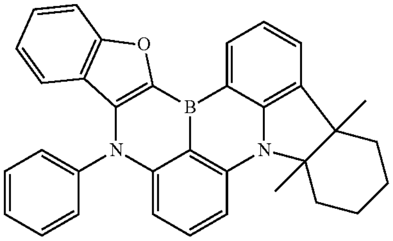
106
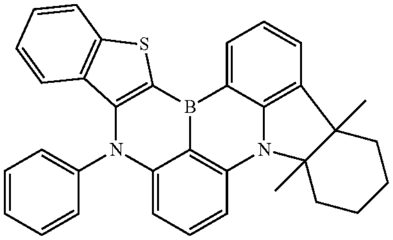
107
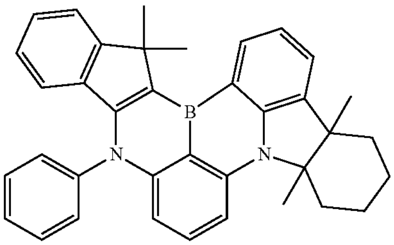
-continued
108
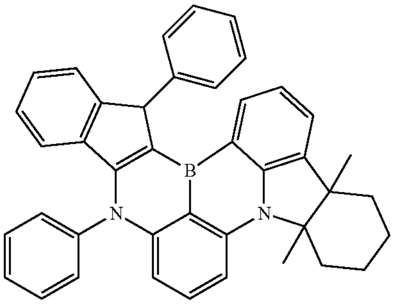
109
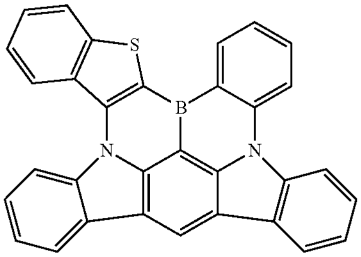
110
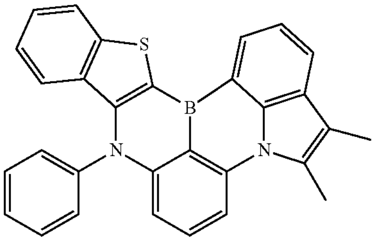
111
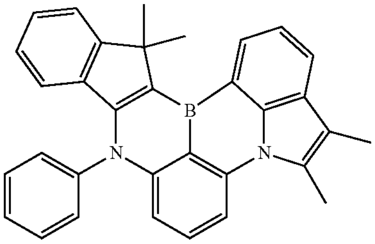
112
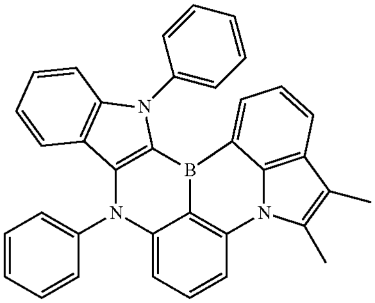

-continued
113
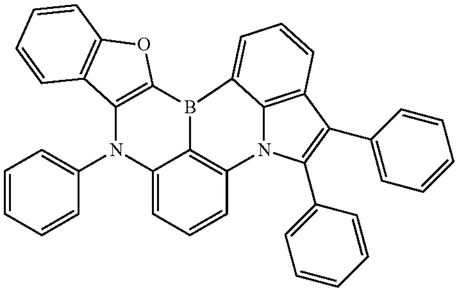
114
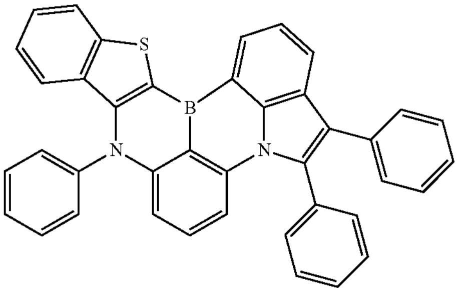
115
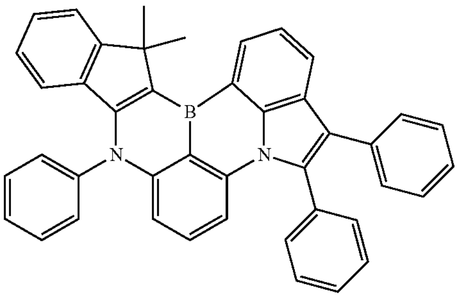
116
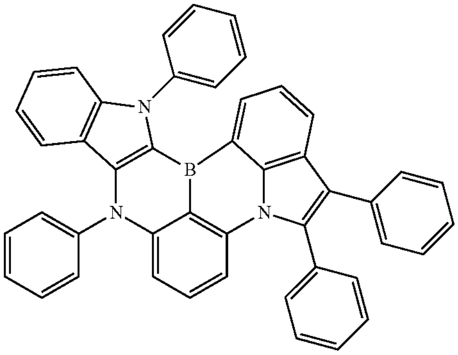
117
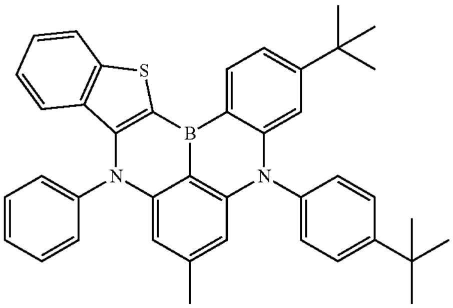
-continued
118
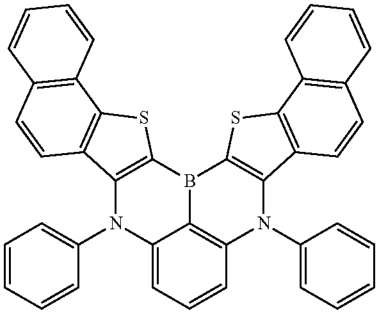
119
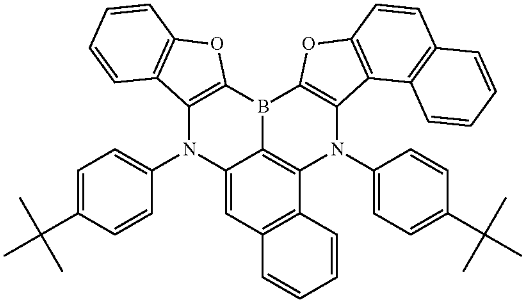
120
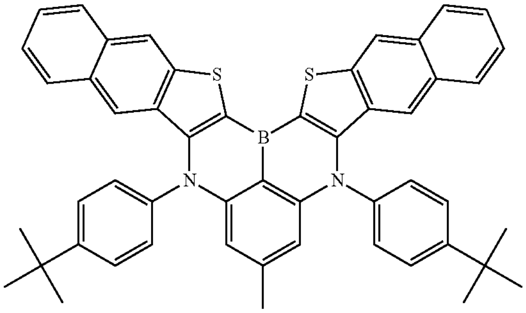
121
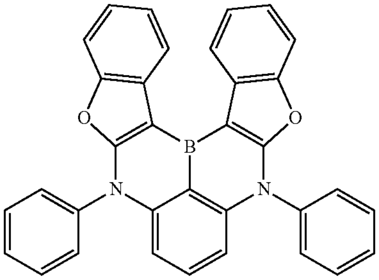
122
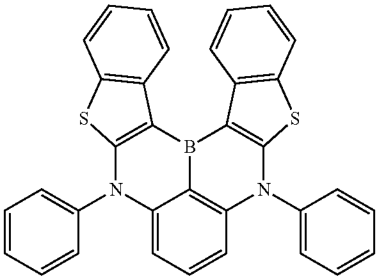

-continued
123
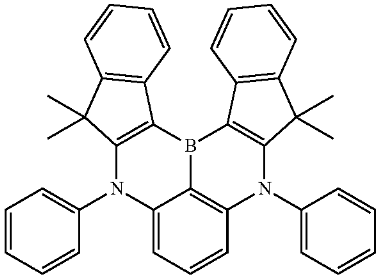
124
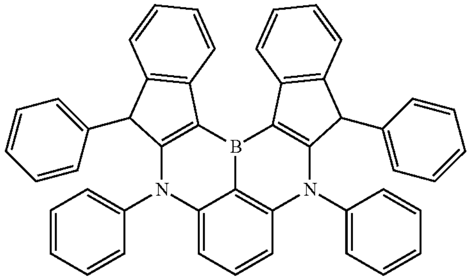
125
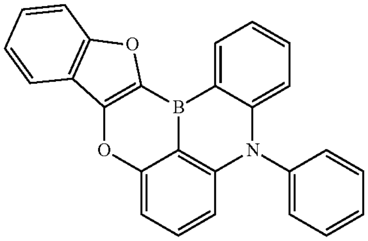
126
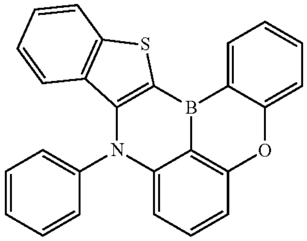
127
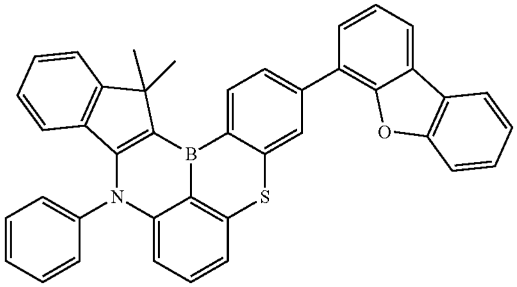
-continued
128
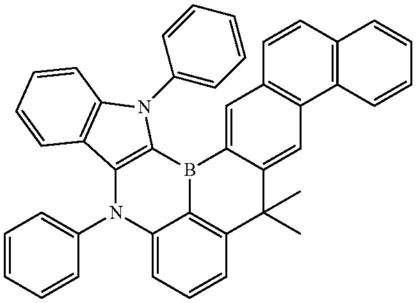
129
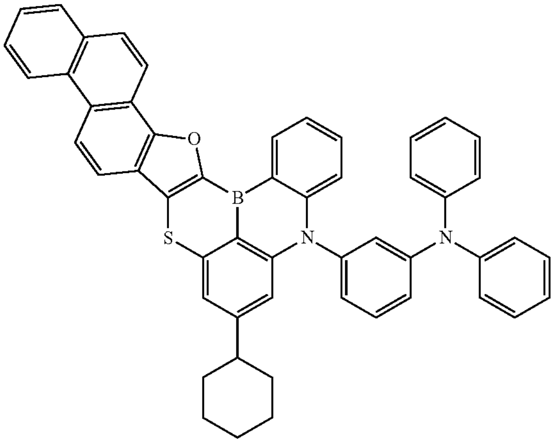
130
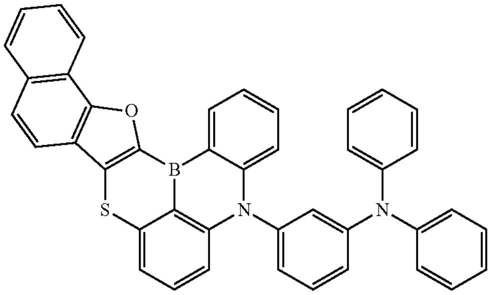
131
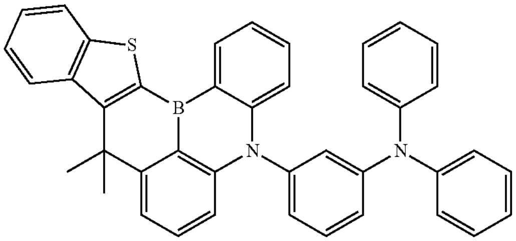

132
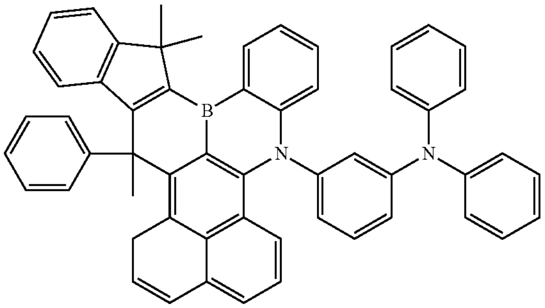
133
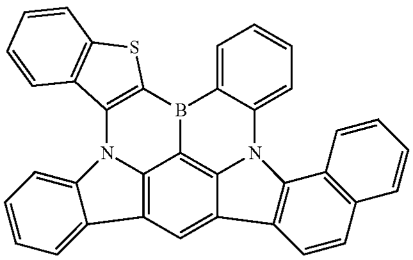
134
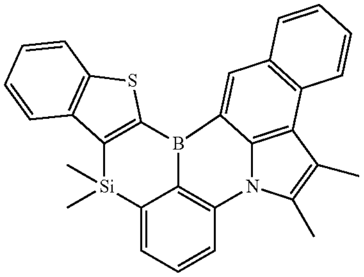
135
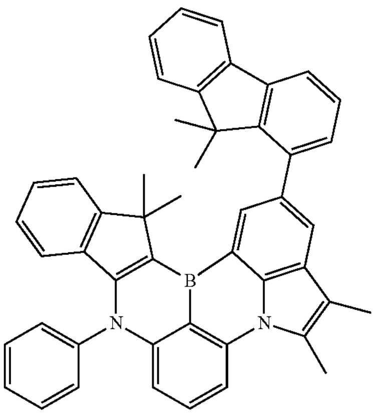
136
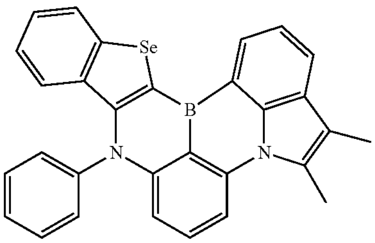
137
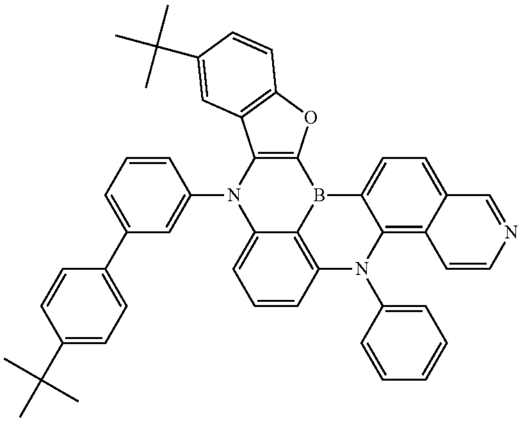
138
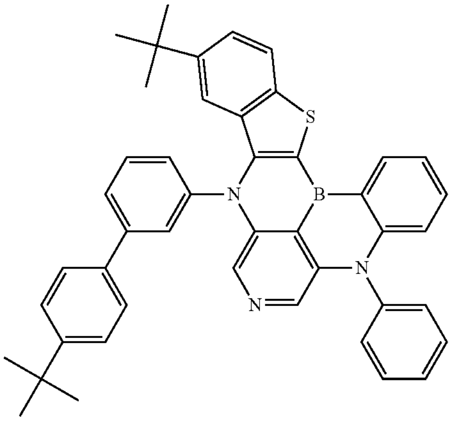
139
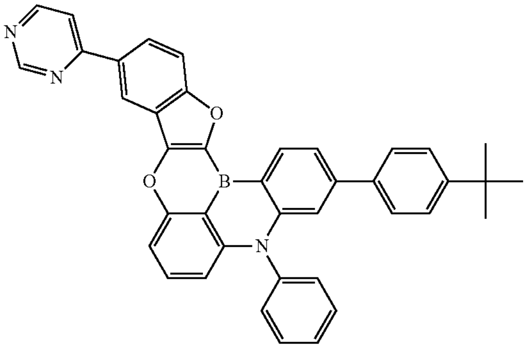
140
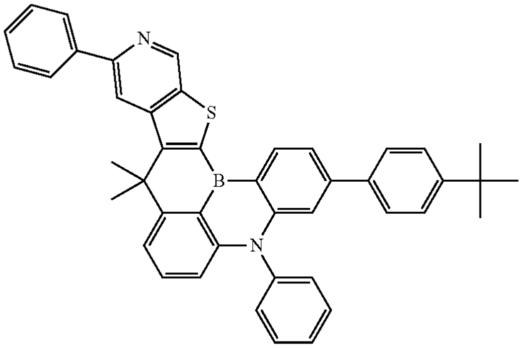

-continued
141
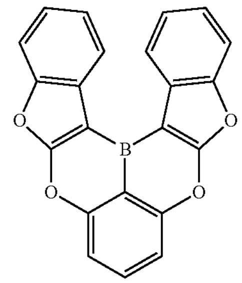
142
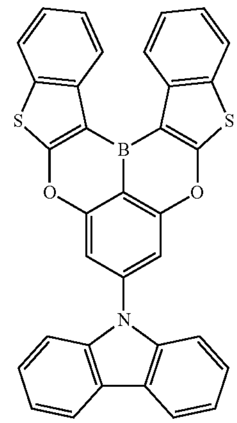
143
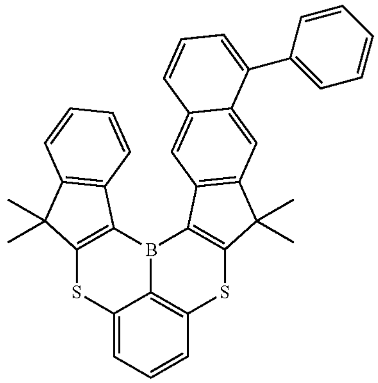
144
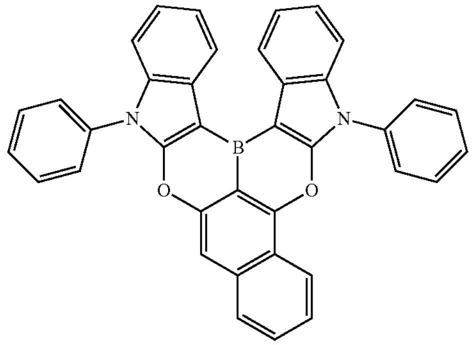
-continued
145
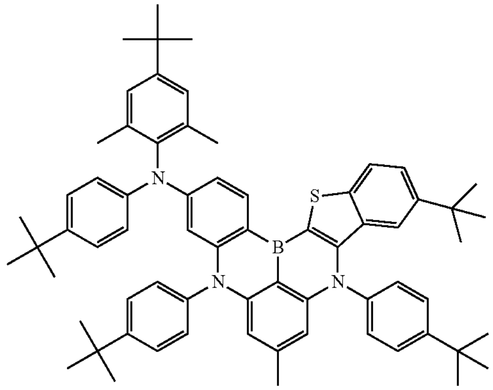
146
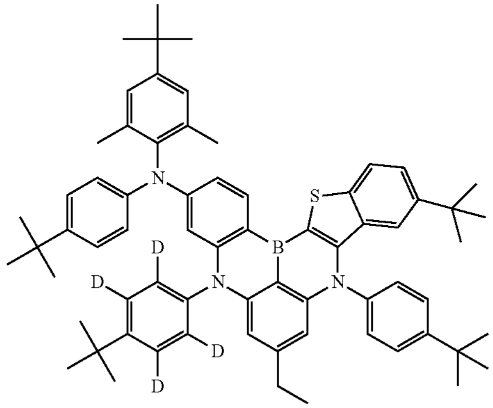
147
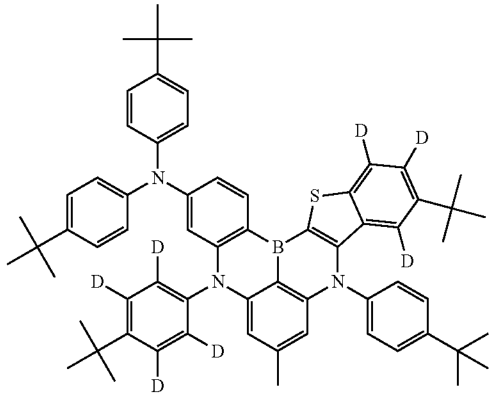

148
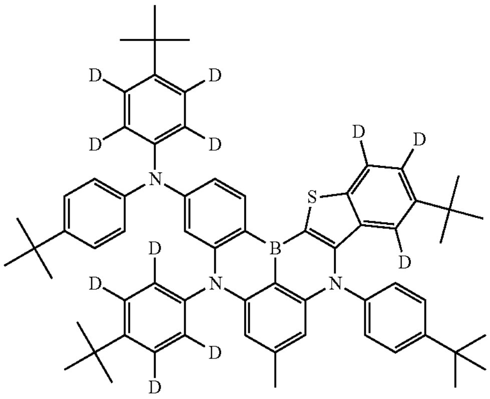
149
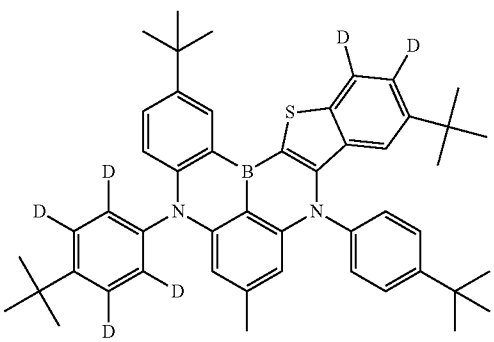
150
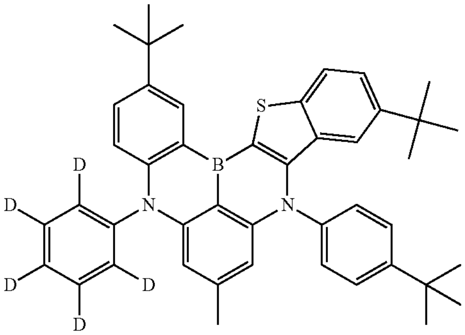
151
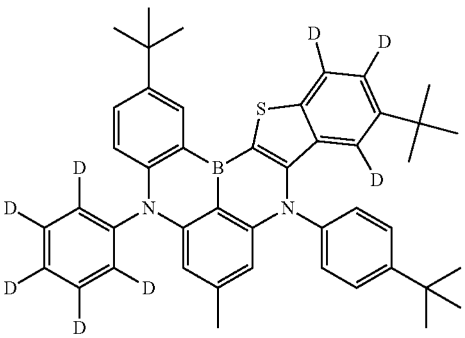
152
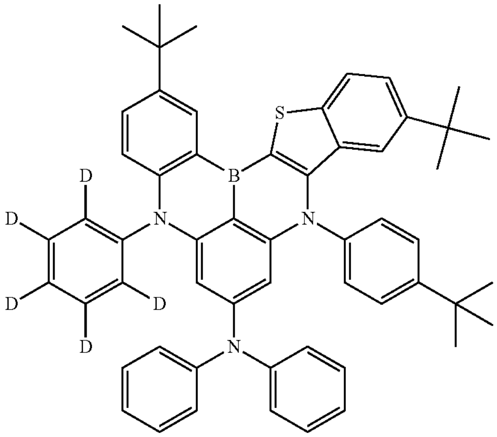
153
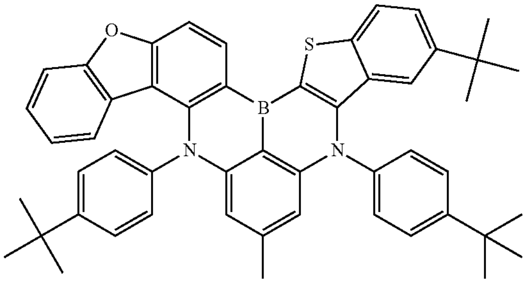
154
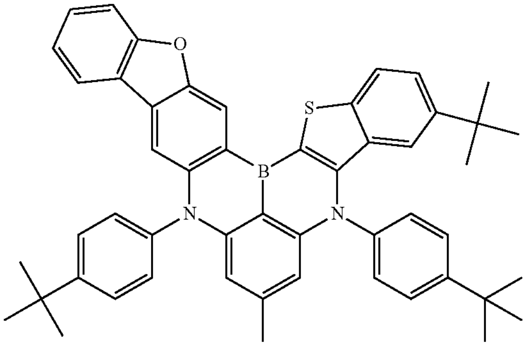
155
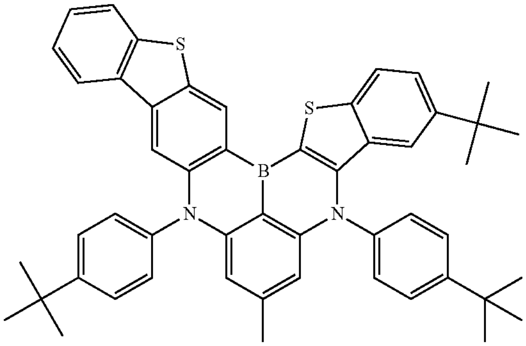

-continued
156
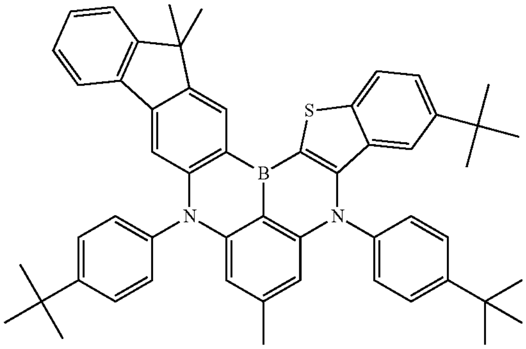
157
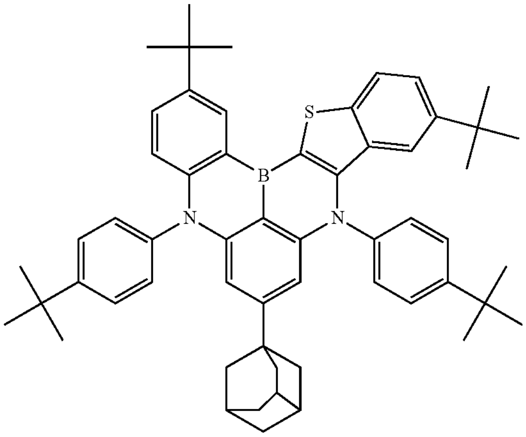
158
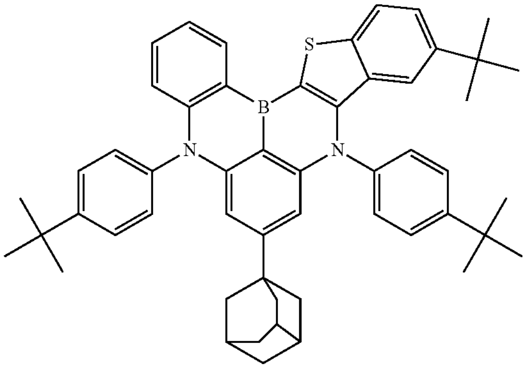
159
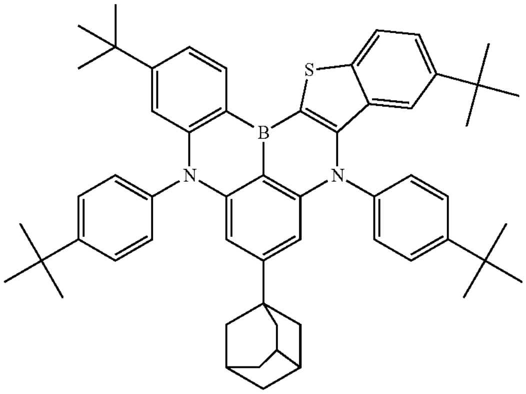
-continued
160
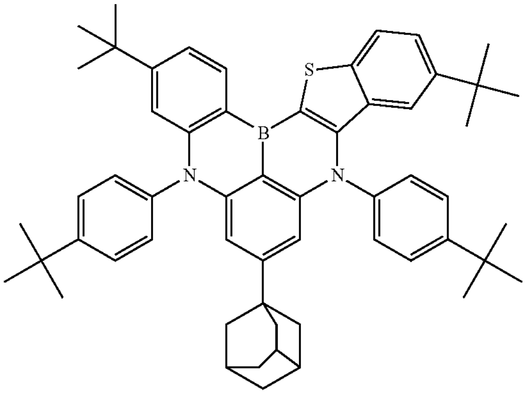
161
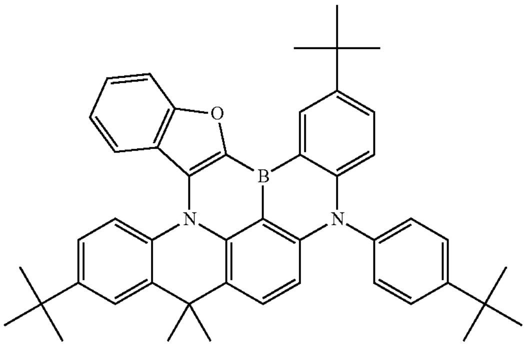
162
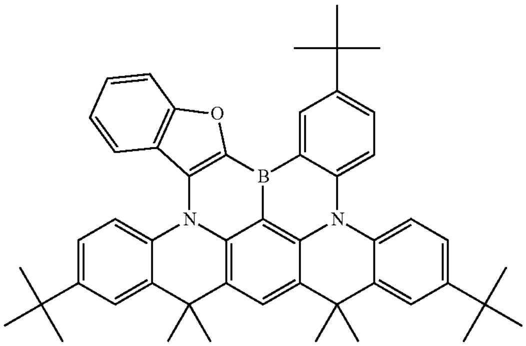
163
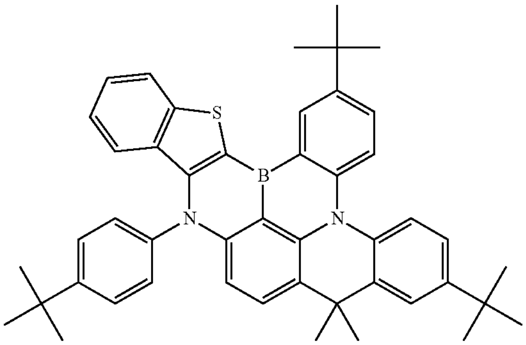

-continued
164
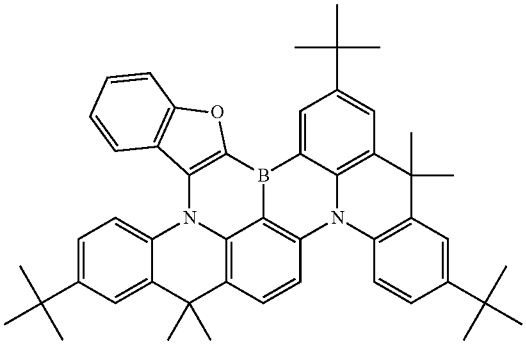
165
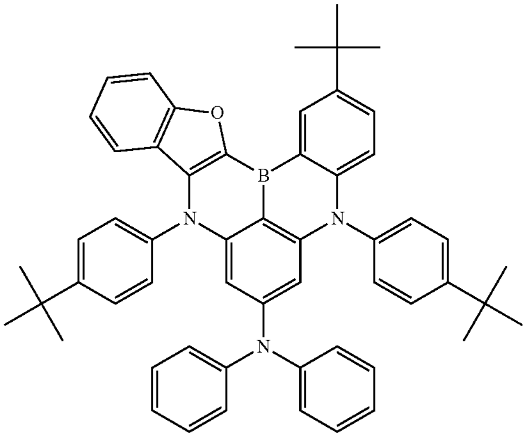
166
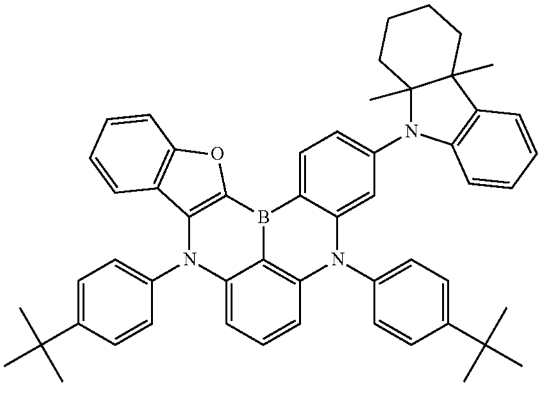
-continued
167
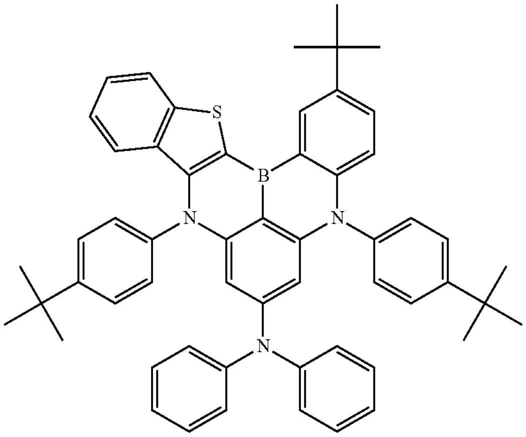
168
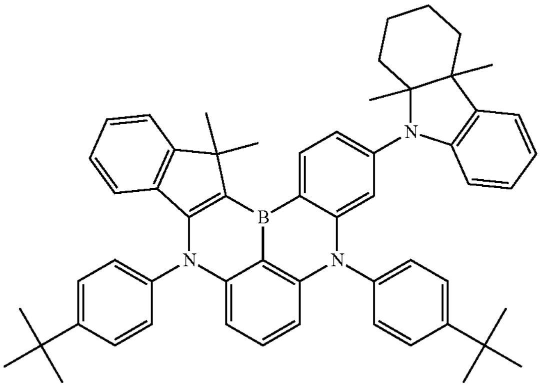
169
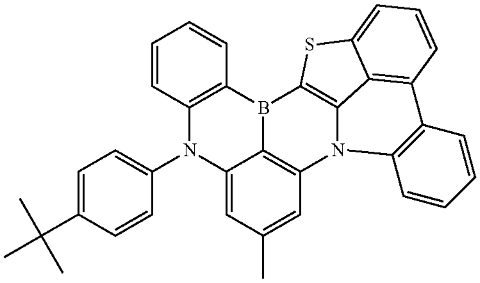
170
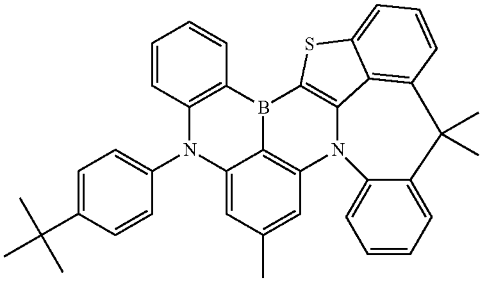

-continued

171

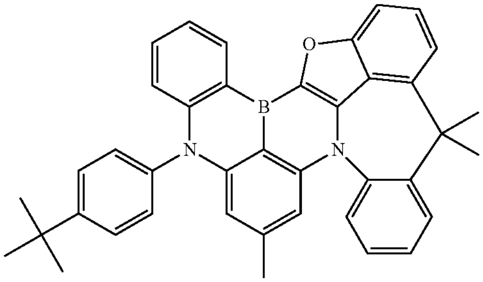

172

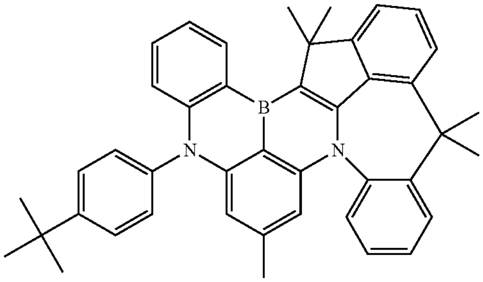

173

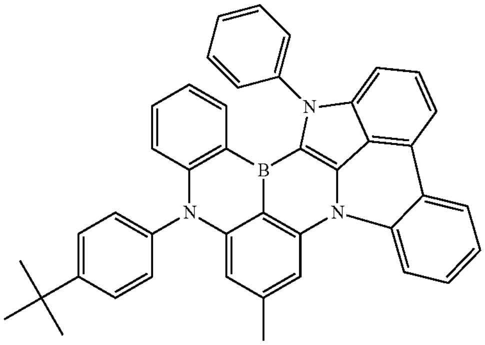

174

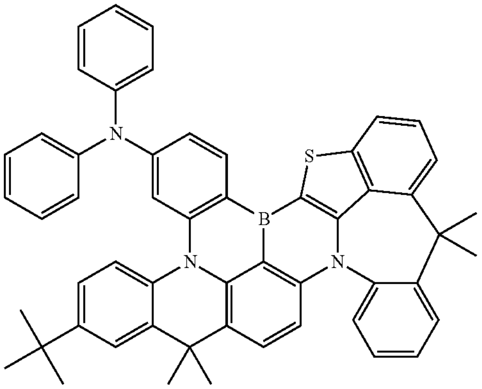

-continued

175

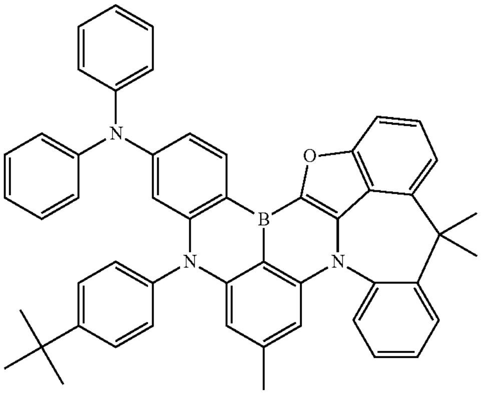

176

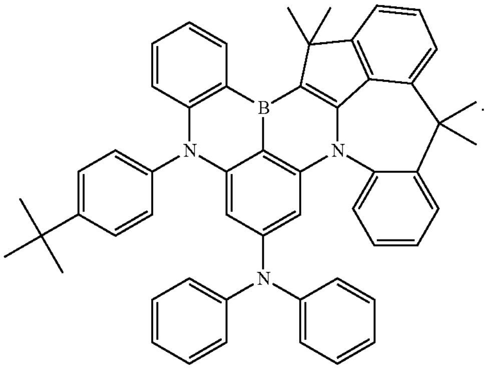

20. The organic light-emitting device according to claim 12, further comprising at least one of a functional layer capable of injecting and/or transporting holes, an electron transport layer, an electron injection layer, a functional layer capable of transporting and injecting electrons, an electron blocking layer, a hole blocking layer and a hole auxiliary layer, in addition to the light-emitting layer, the hole injection layer and the hole transport layer.

* * * * *